United States Patent
Ko et al.

(10) Patent No.: US 12,101,600 B2
(45) Date of Patent: Sep. 24, 2024

(54) VIBRATION APPARATUS AND APPARATUS AND VEHICULAR APPARATUS COMPRISING THE SAME

(71) Applicant: LG Display Co., Ltd., Seoul (KR)

(72) Inventors: Sungwook Ko, Paju-si (KR); Kyungyeol Ryu, Paju-si (KR); Taehyung Kim, Paju-si (KR); MinHo Sohn, Paju-si (KR); SeulKi Nam, Paju-si (KR); Jeonggoo Kang, Paju-si (KR); JunSeok Oh, Paju-si (KR); SeungRyull Park, Paju-si (KR); Chiwan Kim, Paju-si (KR); GyungBo Ha, Paju-si (KR); Uihyeon Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 207 days.

(21) Appl. No.: 17/845,444

(22) Filed: Jun. 21, 2022

(65) Prior Publication Data
US 2023/0007404 A1 Jan. 5, 2023

(30) Foreign Application Priority Data
Jun. 30, 2021 (KR) .................. 10-2021-0086153

(51) Int. Cl.
*H04R 17/00* (2006.01)
*H04R 1/28* (2006.01)
(Continued)

(52) U.S. Cl.
CPC ........... *H04R 17/00* (2013.01); *H04R 1/2803* (2013.01); *H10N 30/20* (2023.02); *H10N 30/708* (2024.05);
(Continued)

(58) Field of Classification Search
CPC .. H04R 2430/00; H04R 17/00; H04R 1/2803; H04R 2499/13; H04R 1/288; H04R 2499/15; H04R 7/10; H04R 7/125; H04R 17/005; H04R 2307/021; H04R 2307/029; H04R 7/045; H04R 2307/00; H04R 2307/027; H10N 30/20; H10N 30/708;
(Continued)

(56) References Cited

U.S. PATENT DOCUMENTS

2010/0219722 A1 9/2010 Onishi et al.
2013/0201796 A1 8/2013 Onishi et al.
(Continued)

FOREIGN PATENT DOCUMENTS

JP 2006229648 A 8/2006
JP 2013055249 A 3/2013
(Continued)

OTHER PUBLICATIONS

Extended European Search Report of Application No. 22181039.3, dated Mar. 23, 2023, 20 pages.
(Continued)

*Primary Examiner* — Tuan D Nguyen
(74) *Attorney, Agent, or Firm* — Morgan, Lewis & Bockius LLP

(57) ABSTRACT

A vibration apparatus may include a vibration device and an adhesive member at a surface of the vibration device. A modulus of the vibration device may be equal to a modulus of the adhesive member or may be greater than the modulus of the adhesive member.

41 Claims, 34 Drawing Sheets

(51) Int. Cl.
*H10N 30/00* (2023.01)
*H10N 30/20* (2023.01)

(52) U.S. Cl.
CPC ...... *H04R 2430/00* (2013.01); *H04R 2499/13* (2013.01)

(58) Field of Classification Search
CPC .. H10N 30/2047; H10N 30/80; B06B 1/0276; B06B 2201/55; B06B 1/0629; B60Q 9/00
See application file for complete search history.

(56) References Cited

U.S. PATENT DOCUMENTS

| | | |
|---|---|---|
| 2013/0223657 A1 | 8/2013 | Onishi et al. |
| 2016/0005952 A1 | 1/2016 | Tanaka et al. |
| 2016/0014521 A1 | 1/2016 | Kim et al. |
| 2018/0041839 A1 | 2/2018 | Abe et al. |
| 2019/0350555 A1 | 11/2019 | Wakabayashi |
| 2020/0059735 A1 | 2/2020 | Kim |
| 2020/0162802 A1 | 5/2020 | Kim |
| 2020/0204924 A1 | 6/2020 | Kim et al. |
| 2020/0314557 A1 | 10/2020 | Ryu et al. |

FOREIGN PATENT DOCUMENTS

| | | |
|---|---|---|
| JP | 2016139970 A | 8/2016 |
| JP | 2016149737 A | 8/2016 |
| KR | 20190030413 A | 3/2019 |
| WO | 97/16048 A1 | 5/1997 |
| WO | 2011/108441 A1 | 9/2011 |

OTHER PUBLICATIONS

Office Action of Taiwan Application No. 111123243, dated May 18, 2023, 12 pages.
Office Action of Japanese Application No. 2022-100203, dated Jul. 6, 2023, 5 pages.
Partial European Search Report of Application No. 22181039.3, dated Nov. 24, 2022, 12 pages.

VIBRATION APPARATUS AND APPARATUS AND VEHICULAR APPARATUS COMPRISING THE SAME

CROSS-REFERENCE TO RELATED APPLICATION

This application claims the benefit of and priority to Korean Patent Application No. 10-2021-0086153 filed on Jun. 30, 2021, the entirety of which is hereby incorporated by reference for all purposes.

TECHNICAL FIELD

The present disclosure relates to an apparatus and particularly to, for example, without limitation, a vibration apparatus, an apparatus including the same, and a vehicular apparatus including the vibration apparatus.

BACKGROUND

Vibration apparatuses may vibrate to output a sound based on a type such as a coil type including a magnet and a coil or a piezoelectric type using a piezoelectric device.

Piezoelectric-type vibration apparatuses may be easily damaged by an external impact due to a fragile characteristic of a piezoelectric device, and as a result, there may be a problem where the reliability of sound reproduction is low.

Moreover, comparing with the coil type, because a piezoelectric constant of piezoelectric devices are low, the piezoelectric-type vibration apparatuses may be low in sound characteristic and/or sound pressure level characteristic in a low-pitched sound band.

The description provided in the background section should not be assumed to be prior art merely because it is mentioned in or associated with the background section. The background section may include information that describes one or more aspects of the subject technology.

SUMMARY

The inventors have recognized the problems described above, performed various experiments for implementing a vibration apparatus having the enhanced reliability of sound reproduction, and performed various experiments for implementing a vibration apparatus capable of additionally enhancing a sound characteristic and/or a sound pressure level characteristic in a low-pitched sound band. The inventors have invented a new vibration apparatus where the reliability of sound reproduction is enhanced through various experiments, and moreover, have invented a new vibration apparatus where the sound characteristic and/or the sound pressure level characteristic in the low-pitched sound band is enhanced.

One or more aspects of the present disclosure are directed to providing a vibration apparatus having the enhanced reliability of sound reproduction, an apparatus including the same, and a vehicular apparatus including the vibration apparatus.

One or more aspects of the present disclosure are directed to providing a vibration apparatus where a sound characteristic and/or a sound pressure level characteristic in a low-pitched sound band may be enhanced, an apparatus including the same, and a vehicular apparatus including the vibration apparatus.

Additional features and aspects of the disclosure are set forth in part in the description that follows and in part will become apparent from the description or may be learned by practice of the inventive concepts provided herein. Other features and aspects of the inventive concepts may be realized and attained by the structures pointed out in the present disclosure, or derivable therefrom, and the claims hereof as well as the appended drawings.

To achieve these and other aspects of the present disclosure, as embodied and broadly described herein, a vibration apparatus may comprise a vibration device, and an adhesive member at a surface of the vibration device. A modulus of the vibration device may be equal to a modulus of the adhesive member or may be greater than the modulus of the adhesive member.

In one or more aspects of the present disclosure, an apparatus may comprise a vibration member, and one or more vibration generating apparatuses connected to the vibration member. The one or more vibration generating apparatuses may comprise a vibration apparatus. The vibration apparatus may comprise a vibration device, and an adhesive member at a surface of the vibration device. A modulus of the vibration device may be equal to a modulus of the adhesive member or may be greater than the modulus of the adhesive member.

In one or more aspects of the present disclosure, a vehicular apparatus may comprise an exterior material covering a main structure, an interior material covering one or more of the main structure and the exterior material, a garnish member covering a portion of the interior material, and one or more sound generating apparatuses between at least two of the main structure, the exterior material, and interior material or between the garnish member and the interior member. The one or more sound generating apparatuses may comprise a vibration apparatus. The vibration apparatus may comprise a vibration device, and an adhesive member at a rear surface of the vibration device. A modulus of the vibration device may be equal to a modulus of the adhesive member or may be greater than a modulus of the adhesive member. The one or more of the interior material, the exterior material, and the garnish member may output sounds based on vibrations of the one or more sound generating apparatuses.

According to an example embodiment of the present disclosure, a vibration apparatus having the enhanced reliability of sound reproduction, an apparatus including the same, and a vehicular apparatus including the vibration apparatus may be provided.

According to an example embodiment of the present disclosure, a vibration apparatus where a sound characteristic and/or a sound pressure level characteristic in a low-pitched sound band may be enhanced, an apparatus including the same, and a vehicular apparatus including the vibration apparatus may be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory, and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects and embodiments of the disclosure and together with the description serve to explain principles of the disclosure.

Figure 1:
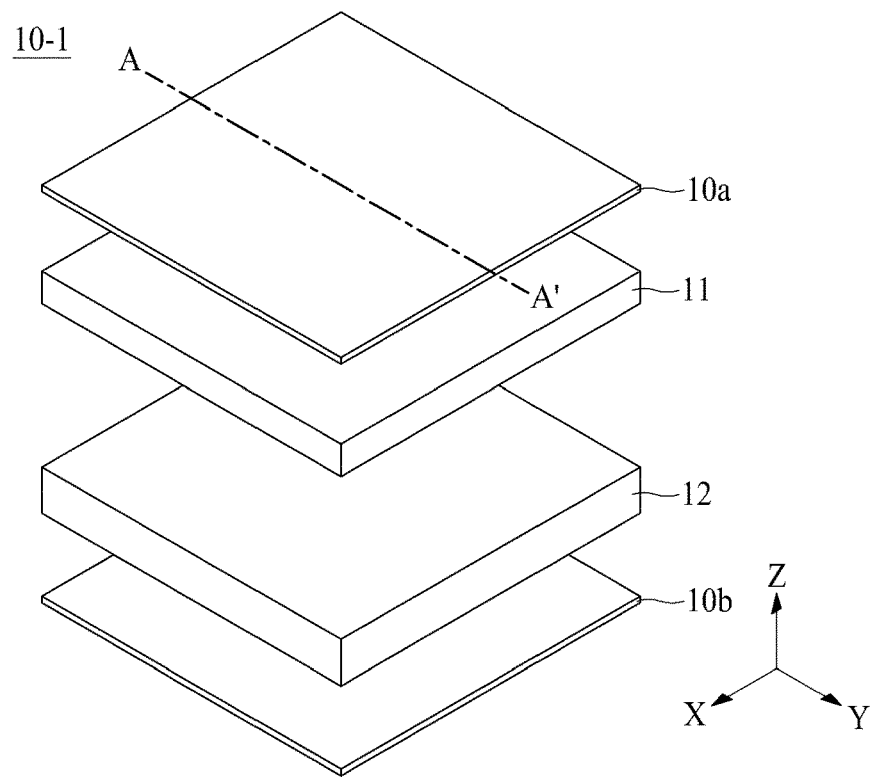
FIG. 1 is an exploded perspective view illustrating a vibration apparatus according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Same reference numerals designate same elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure is thorough and complete, and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details. Like reference numerals refer to like elements throughout. In the following description, when the detailed description of the relevant known function or configuration is determined to unnecessarily obscure aspects of the present disclosure, the detailed description may be omitted. When the term "comprise," "have," "include," "contain," "constitute," "make up of," "formed of," or the like is used, one or more other elements may be added unless the term, such as "only" is used. The terms of a singular form may include plural forms unless the context clearly indicates otherwise. Any implementation described herein as an "example" is not necessarily to be construed as preferred or advantageous over other implementations.

In construing an element, the element is construed as including an error or tolerance range even where no explicit description of such an error or tolerance range is provided.

Where positional relationships are described, for example, where the positional relationship between two parts is described using "on," "over," "under," "above," "below," "beneath," "near," "close to," or "adjacent to," "beside," "next to," or the like, one or more other parts may be located between the two parts unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which one or more additional structures are disposed or interposed therebetween. Furthermore, the terms "left," "right," "top," "bottom, "downward," "upward," "upper," "lower," and the like refer to an arbitrary frame of reference.

In describing a temporal relationship, for example, when the temporal order is described as, for example, "after," "subsequent," "next," or "before," a case that is not continuous may be included unless a more limiting term, such as "just," "immediate(ly)," or "direct(ly)" is used.

It will be understood that, although the term "first," "second," or the like may be used herein to describe various elements, these elements should not be limited by these terms. These terms are only used to distinguish one element from another. For example, a first element could be a second element, and, similarly, a second element could be a first element, without departing from the scope of the present disclosure.

In describing elements of the present disclosure, the terms "first," "second," "A," "B," "(a)," "(b)," or the like may be used. These terms are intended to identify the corresponding elements from the other elements, and basis, order, or number of the corresponding elements should not be limited by these terms.

For the expression that an element or layer is "connected," "coupled," or "adhered" to another element or layer, the element or layer can not only be directly connected, coupled or adhered to another element or layer, but also be indirectly connected, coupled or adhered to another element or layer with one or more intervening elements or layers disposed or interposed between the elements or layers, unless otherwise specified.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or wholly coupled to or combined with each other, and may be variously inter-operated, linked or driven together. The embodiments of the present disclosure may be carried out independently from each other, or may be carried out together in co-dependent or related relationship.

Hereinafter, a vibration apparatus, an apparatus including the same, and a vehicular apparatus including the vibration apparatus according to example embodiments of the present disclosure are described in detail with reference to the accompanying drawings. In adding reference numerals to elements of each of the drawings, although the same elements may be illustrated in other drawings, like reference numerals may refer to like elements. In addition, for convenience of description, a scale, size and thickness of each of the elements illustrated in the accompanying drawings may differ from an actual scale, size and thickness, and thus, embodiments of the present disclosure are not limited to a scale, size and thickness, illustrated in the drawings.

Figure 2:
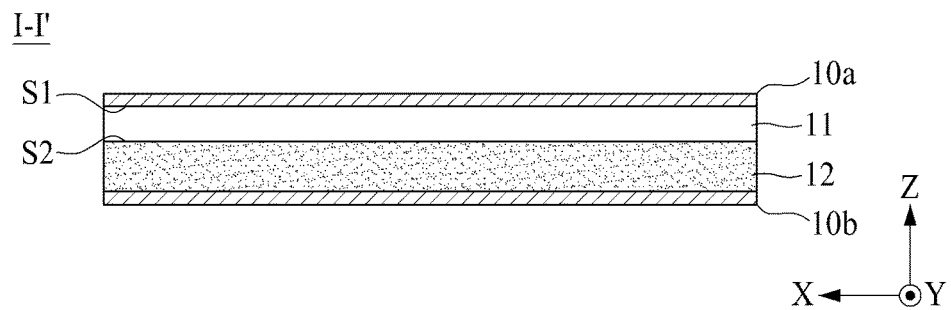
FIG. 2 is an example of a cross-sectional view taken along line A-A' illustrated in FIG. 1.

FIG. 1 is an exploded perspective view illustrating a vibration apparatus according to an example embodiment of the present disclosure, and FIG. 2 is an example of a cross-sectional view taken along line A-A' illustrated in FIG. 1.

With reference to FIGS. 1 and 2, the vibration apparatus 10-1 according to an example embodiment of the present disclosure may include a vibration device 11 and an adhesive member 12.

The vibration device 11 may be configured to autonomously vibrate (or displace or drive) based on an electrical signal (or a voice signal) applied thereto, or may be configured to vibrate (or displace or drive) a vibration member (or a vibration plate or a vibration object). For example, the vibration device 11 may be referred to as a vibration structure, a vibrator, a vibration generating device, a vibration generating apparatus, a vibration generator, a sounder, a sound device, a sound apparatus, a sound generating device, a sound generating apparatus, or a sound generator, or the like, but embodiments of the present disclosure are not limited thereto.

The vibration device 11 according to an example embodiment of the present disclosure may include a piezoelectric material (or an electroactive material) having a piezoelectric characteristic. The vibration device 11 may autonomously vibrate (or displace or drive) based on a vibration (or a displacement or drive) of a piezoelectric material generated by an electrical signal (or a voice signal) applied thereto, or may vibrate (or displace or drive) a vibration member (or a vibration plate or a vibration object). For example, the vibration device 11 may vibrate (or displace or drive) as contraction and expansion are alternately repeated by a piezoelectric effect (or a piezoelectric characteristic). For example, the vibration device 11 may vibrate (or displace or drive) in a vertical direction (or a thickness direction) Z as contraction and expansion are alternately repeated by an inverse piezoelectric effect. The vibration device 11 according to an example embodiment of the present disclosure may be a piezoelectric-type vibration device. For example, the vibration device 11 according to an example embodiment of the present disclosure may be referred to as a piezoelectric-type vibration structure, a piezoelectric-type vibrator, a piezoelectric-type vibration generating device, a piezoelectric-type vibration generator, a piezoelectric-type sounder, a piezoelectric-type sound device, a piezoelectric-type sound generating device, a piezoelectric-type sound generator, a piezoelectric-type actuator, a piezoelectric-type exciter, or a piezoelectric-type transducer, or the like, but embodiments of the present disclosure are not limited thereto.

The vibration device 11 according to an example embodiment of the present disclosure may be configured to have flexibility. For example, the vibration device 11 may be configured to be bent in a non-planar shape including a curved surface. Therefore, the vibration device 11 according to an example embodiment of the present disclosure may be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible exciter, or a flexible transducer, or the like, but embodiments of the present disclosure are not limited thereto.

The vibration device 11 according to an example embodiment of the present disclosure may include a tetragonal shape which has a first length parallel to a first direction X and a second length parallel to a second direction Y intersecting with the first direction X. For example, the vibration device 11 may include a square shape where the first length is the same as the second length. However, embodiments of the present disclosure are not limited thereto, and the vibration device 11 may include a rectangular shape where one of the first length and the second length is greater than the other length, a non-tetragonal shape, a circular shape, or an oval shape.

The adhesive member 12 may be connected or coupled to one of a first surface S1 and a second surface S2, which is different from (or opposite to) the first surface S1, of the vibration device 11. For example, the first surface S1 of the vibration device 11 may be referred to as a top surface, a forward surface, a front surface, or an upper surface of the vibration device 11, but embodiments of the present disclosure are not limited thereto. The second surface S2 of the vibration device 11 may be referred to as a bottom surface, a backside surface, a rear surface, a lower surface, or a backward surface of the vibration device 11, but embodiments of the present disclosure are not limited thereto. For example, in the vibration device 11, the first surface S1 may be disposed closer to a front surface (or a top surface, or an upper surface, or a forward surface) of a vibration apparatus 10-1 than the second surface S2.

The adhesive member 12 according to an example embodiment of the present disclosure may be connected or coupled to the second surface S2 of the vibration device 11. For example, the adhesive member 12 may have the same size as that of the vibration device 11. For example, the adhesive member 12 may be connected or coupled to the entirety of the second surface S2 of the vibration device 11, but embodiments of the present disclosure are not limited thereto, and the adhesive member 12 may be connected or coupled to at least a portion of the second surface S2 of the vibration device 11.

The adhesive member 12 according to an example embodiment of the present disclosure may include an adhesive layer (or a tacky layer) which is good in adhesive force or attaching force. For example, the adhesive member 12 may include a double-sided adhesive tape, a double-sided foam pad, or a tacky sheet. For example, when the adhesive member 12 includes a tacky sheet (or a tacky layer), the adhesive member 12 may include only an adhesive layer or a tacky layer without a base member such as a plastic material or the like.

The adhesive layer (or a tacky layer) of the adhesive member 12 according to an example embodiment of the present disclosure may include epoxy, acrylic, silicone, or urethane, but embodiments of the present disclosure are limited thereto.

The adhesive layer (or a tacky layer) of the adhesive member 12 according to another example embodiment of the present disclosure may include a pressure sensitive adhesive (PSA), an optically clear adhesive (OCA), or an optically clear resin (OCR), but embodiments of the present disclosure are limited thereto.

The adhesive member 12 according to an example embodiment of the present disclosure may connect or couple the vibration device 11 to a vibration member. For example, the adhesive member 12 may be disposed between the vibration device 11 and the vibration member. For example, the adhesive member 12 may include a first surface (or a top surface) connected or coupled to the second surface S2 of the vibration device 11 and a second surface (or a rear surface) which is different from (or opposite to) the first surface.

The vibration member according to an example embodiment of the present disclosure may include a structure which vibrates based on a vibration of the vibration device 11. The vibration member may have a size which is relatively greater than that of the vibration device 11. The vibration member may have hardness which is relatively smaller than that of the vibration device 11. For example, the vibration member may be referred to as a vibration plate, a vibration object, a vibration target, a sound vibration plate, or a sound output member, or the like, but embodiments of the present disclosure are not limited thereto. For example, the vibration member may also have hardness which is relatively larger than that of the vibration device 11.

The vibration member according to an example embodiment of the present disclosure may include one or more of a planar portion (or a flat portion) and a curved portion. The vibration device 11 may be connected or coupled to at least a partial region of the vibration member including the curved portion by the adhesive member 12. Therefore, the vibration device 11 may be configured to be bent in a shape based on a shape (or a surface shape) of the vibration member, and thus, the reliability of sound reproduction may be enhanced and a sound characteristic and/or a sound pressure level characteristic in a low-pitched sound band may be enhanced. For example, the vibration device 11 may be configured to be bent in an equiangular shape (or a conformal shape) which conforms to the contour of a curvature of the vibration member. For example, when the vibration member includes various curved portions, the vibration device 11 may be configured to be bent in various curved shapes corresponding to various curved portions of the vibration member. For example, when the vibration member includes the planar portion and the curved portion which is convex from the planar portion, the vibration device 11 may be configured to be bent in a shape which includes a planar surface and a convex curved surface corresponding to the planar portion and the convex curved portion of the vibration member.

According to an example embodiment of the present disclosure, the vibration device 11 may have a modulus (or a young's modulus) which is greater than or equal to that of the adhesive member 12, so that the vibration device 11 may be bent in a curved shape. For example, the vibration device 11 may have the same modulus as that of the adhesive member 12, or may have a modulus which is greater than or equal to that of the adhesive member 12. Accordingly, in the vibration apparatus 10-1 according to an example embodiment of the present disclosure, the reliability of sound reproduction may be enhanced, and a sound characteristic and/or a sound pressure level characteristic in the low-pitched sound band may be enhanced. For example, the vibration apparatus 10-1 according to an example embodiment of the present disclosure may have a sound pressure level of 55 dB to 91 dB in a pitched sound band of 200 Hz to 20 kHz and may output a sound having flatness of about 35 dB.

According to an example embodiment of the present disclosure, when the vibration member includes the convex curved portion, the vibration device 11 may have a modulus which is greater than that of the adhesive member 12. Therefore, the vibration apparatus 10-1 according to an example embodiment of the present disclosure may be bent to include a curved portion corresponding to the convex curved portion of the vibration member, and thus, may have the high reliability of sound reproduction. In addition, in the vibration apparatus 10-1 according to an example embodiment of the present disclosure, an adhesive force between the vibration device 11 and the vibration member adhered to each other by the adhesive member 12 may be enhanced and a vibration of the vibration device 11 may be transferred to the vibration member by the adhesive member 12, and thus, a sound characteristic and/or a sound pressure level characteristic in the low-pitched sound band generated based on a vibration of the vibration member may be enhanced.

According to an example embodiment of the present disclosure, when a modulus of the adhesive member 12 is greater than that of the vibration device 11, the vibration device 11 may be difficult to be bent in a shape corresponding to the convex curved portion of the vibration member by the adhesive member 12, and adhesive properties between the vibration device 11 and the vibration member using the adhesive member 12 may be reduced, and as a result, the reliability of sound reproduction of the vibration apparatus 10-1 may be reduced and a sound characteristic and/or a sound pressure level characteristic in the low-pitched sound band may be reduced.

The vibration apparatus 10-1 according to an example embodiment of the present disclosure may further include a first auxiliary member (or a first secondary member) 10a and a second auxiliary member (or a second secondary member) 10b.

The first auxiliary member 10a may be configured to protect the vibration device 11. For example, the first auxiliary member 10a may be disposed at the first surface S1 of the vibration device 11. For example, the first auxiliary member 10a may be configured to cover the entire first surface S1 of the vibration device 11. The first auxiliary member 10a may prevent or minimize the damage of the vibration device 11 from an external impact, or may prevent the pollution or damage of the vibration device 11 caused by external particles. For example, the first auxiliary member 10a may be referred to as a first peeling film, a first peeling sheet, a first release member, a first release film, or a first release sheet, or the like, but embodiments of the present disclosure are not limited thereto.

The second auxiliary member 10b may be configured to protect the adhesive member 12. For example, the second auxiliary member 10b may be disposed at the second surface of the adhesive member 12. For example, the second auxiliary member 10b may be configured to cover the entire second surface of the adhesive member 12. The second auxiliary member 10b may prevent or minimize the damage of the adhesive member 12 from an external impact, or may prevent the pollution or damage of the adhesive member 12 caused by external particles. In addition, the second auxiliary member 10b may prevent the natural curing of the adhesive member 12, and thus, may maintain adhesive properties (or tacky properties) of the adhesive member 12. For example, the second auxiliary member 10b may be referred to as a second peeling film, a second peeling sheet, a second release member, a second release film, or a second release sheet, or the like, but embodiments of the present disclosure are not limited thereto.

According to an example embodiment of the present disclosure, when the vibration apparatus 10-1 is disposed (or installed) in the vibration member, the first auxiliary member 10a may be peeled from the vibration device 11, and the second auxiliary member 10b may be peeled from the adhesive member 12. For example, the second auxiliary member 10b may be peeled from the adhesive member 12 immediately before an assembly process of connecting or coupling the vibration apparatus 10-1 to the vibration member, and the first auxiliary member 10a may be peeled from the vibration device 11 or may not be peeled therefrom but may maintain a state where the first auxiliary member 10a is coupled to the vibration device 11, after an assembly process performed on the vibration apparatus 10-1.

In the vibration apparatus 10-1 according to an example embodiment of the present disclosure, the vibration device 11 may have a modulus which is greater than that of the adhesive member 12, and thus, may be applied to an operation of vibrating the vibration member including a curved portion and having hardness which is relatively greater or smaller than that of the vibration device 11. For example, when the vibration device 11 has a modulus which is smaller than that of the adhesive member 12, the vibration device 11 may have a limitation in vibrating the vibration member including a curved portion and having relatively large or small hardness because of adhesive properties corresponding to the vibration member including the curved portion and having relatively large or small hardness.

Therefore, in the vibration apparatus 10-1 according to an example embodiment of the present disclosure, the vibration device 11 may have a modulus which is greater than that of the adhesive member 12, and thus, may easily vibrate the vibration member including various curved portions and having hardness which is relatively greater or smaller than that of the vibration device 11. Accordingly, the reliability of sound reproduction may be enhanced, and a sound characteristic and/or a sound pressure level characteristic in the low-pitched sound band generated based on a vibration of the vibration member may be enhanced.

Figure 3:
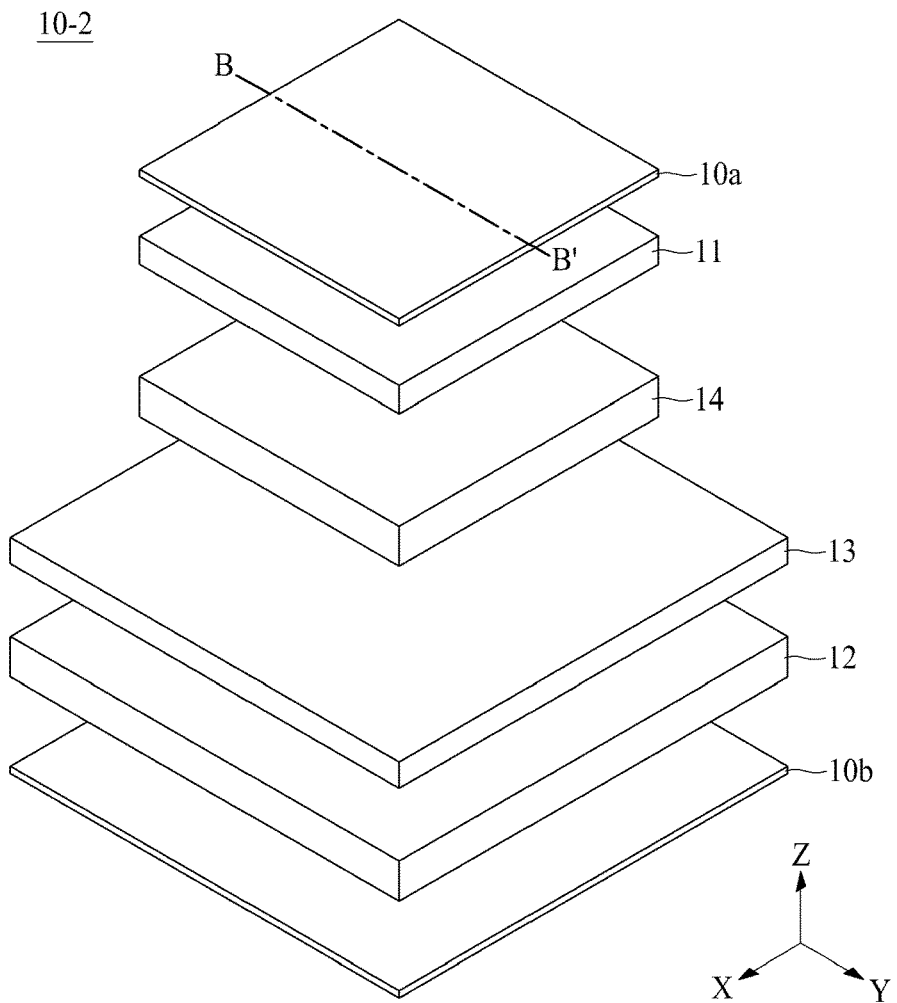
FIG. 3 is an exploded perspective view illustrating a vibration apparatus 10-2 according to another example embodiment of the present disclosure
Figure 4:
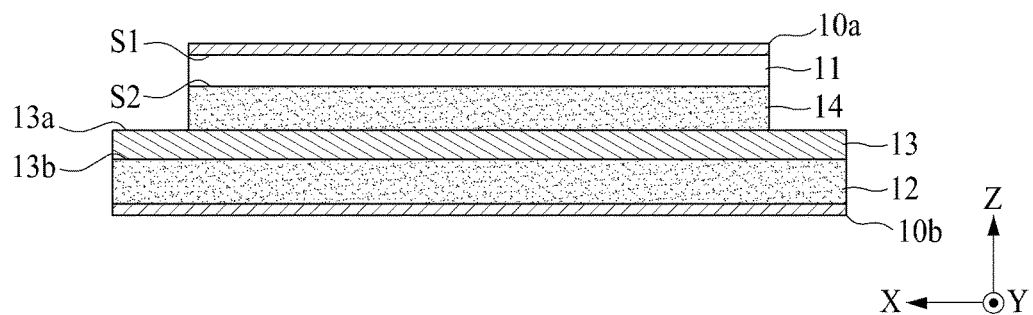
FIG. 4 is an example of a cross-sectional view taken along line B-B' illustrated in FIG. 3.

FIG. 3 is an exploded perspective view illustrating a vibration apparatus according to another example embodiment of the present disclosure, and FIG. 4 is an example of a cross-sectional view taken along line B-B' illustrated in FIG. 3.

With reference to FIGS. 3 and 4, the vibration apparatus 10-2 according to another example embodiment of the present disclosure may include a vibration device 11, a reinforcing member 13, a middle adhesive member 14, and an adhesive member 12.

The vibration device 11 may be substantially the same as the vibration device 11 illustrated in FIGS. 1 and 2, and thus, a like reference numeral refers to a like element, and the repetitive description thereof may be omitted for brevity.

The reinforcing member 13 may be disposed under the vibration device 11. For example, the reinforcing member 13 may be disposed on a second surface S2 of the vibration device 11. For example, the reinforcing member 13 may be connected or coupled to the second surface S2 of the vibration device 11 by the middle adhesive member 14.

The reinforcing member 13 according to an example embodiment of the present disclosure may have a size which is greater than that of the vibration device 11, or may have an area which is greater than that of the vibration device 11. For example, the reinforcing member 13 may have a size which is greater than that of each of the vibration device 11 and the middle adhesive member 14. A center portion of the vibration device 11 may be disposed at a center portion of the reinforcing member 13 or aligned on a center portion of the reinforcing member 13.

The middle adhesive member 14 (or a second adhesive member or an intermediate adhesive member) may be disposed between the vibration device 11 and the reinforcing member 13. A first surface (or a top surface or an upper surface) of the middle adhesive member 14 may be connected or coupled to the second surface S2 of the vibration device 11. A second surface (or a rear surface) of the middle adhesive member 14 may be connected or coupled to a first surface (or a top surface or an upper surface) 13a of the reinforcing member 13. The middle adhesive member 14 may have the same size as that of the vibration device 11. For example, the middle adhesive member 14 may include the same material or configuration as that of the adhesive member 12 illustrated in FIGS. 1 and 2, and thus, the repetitive description thereof may be omitted for brevity.

The adhesive member (or a first adhesive member) 12 may be connected or coupled to a second surface (or a rear surface) 13b, which is different from (or opposite to) the first surface (or the top surface or the upper surface) 13a, of the reinforcing member 13. For example, the adhesive member 12 may have the same size as that of the reinforcing member 13. For example, the adhesive member 12 may be connected or coupled to the entire second surface 13b of the reinforcing member 13, but embodiments of the present disclosure are not limited thereto and the adhesive member 12 may be connected or coupled to at least a portion of the second surface 13b of the reinforcing member 13. Except that the adhesive member 12 is connected or coupled to the second surface 13b of the reinforcing member 13 instead of the vibration device 11, the adhesive member 12 may be substantially the same as the adhesive member 12 illustrated in FIGS. 1 and 2, and thus, like reference numerals refer to like elements, and the repetitive description thereof may be omitted for brevity.

According to an example embodiment of the present disclosure, the vibration device 11 may have a modulus which is greater than that of each of the adhesive member 12, the middle adhesive member 14, and the reinforcing member 13 or may have a modulus which is equal to that of each of the adhesive member 12 and the middle adhesive member 14 and is greater than that of the reinforcing member 13, so that the vibration device 11 is bent in a curved shape and a vibration of the vibration device 11 is transferred to the vibration member. For example, the vibration device 11 may have a modulus which is greater than that of the reinforcing member 13 and is greater than or equal to that of each of the adhesive member 12 and the middle adhesive member 14.

According to an example embodiment of the present disclosure, the reinforcing member 13 may include material (e.g., a nonmetal material or a composite nonmetal material) having a material characteristic suitable for that the vibration device 11 is capable of being bent in a curved shape and a vibration of the vibration device 11 is transferred to the vibration member. For example, the reinforcing member 13 may include a material, having hardness which is higher than or equal to that of the vibration member, among nonmetal materials or composite nonmetal materials. For example, the nonmetal material or the composite nonmetal material may include one or more of a plastic, a fiber, a leather, wood, a cloth, and a paper, but embodiments of the present disclosure are not limited thereto.

Therefore, when the vibration member includes a convex curved portion, the vibration device 11 may have a modulus which is greater than that of the reinforcing member 13 and is greater than or equal to that of each of the adhesive member 12 and the middle adhesive member 14. Accordingly, the vibration apparatus 10-2 according to another example embodiment of the present disclosure may be bent to include a curved portion corresponding to the convex curved portion of the vibration member, and thus, may have the high reliability of sound reproduction. In addition, in the vibration apparatus 10-2 according to another example embodiment of the present disclosure, adhesive properties between the vibration device 11 and the vibration member adhered to each other by the middle adhesive member 14, the reinforcing member 13, and the adhesive member 12 may be enhanced and a vibration of the vibration device 11 may be transferred to the vibration member through the middle adhesive member 14, the reinforcing member 13, and the adhesive member 12, and thus, a sound characteristic and/or a sound pressure level characteristic in the low-pitched sound band generated based on the vibration of the vibration member may be enhanced. For example, the vibration apparatus 10-2 according to another example embodiment of the present disclosure may have a sound pressure level of 53 to 86 dB in a pitched sound band of 200 Hz to 20 kHz and may output a sound having flatness of about 33 dB.

According to an example embodiment of the present disclosure, when a modulus of at least one of the middle adhesive member 14, the reinforcing member 13, and the adhesive member 12 is greater than that of the vibration device 11, the vibration device 11 may be difficult to be bent in a shape corresponding to the convex curved portion of the vibration member, and adhesive properties between the vibration device 11 and the vibration member adhered to each other by the middle adhesive member 14, the reinforcing member 13, and the adhesive member 12 may be reduced, and as a result, the reliability of sound reproduction of the vibration apparatus 10-2 may be reduced, and a sound characteristic and/or a sound pressure level characteristic in the low-pitched sound band may be reduced.

The vibration apparatus 10-2 according to another example embodiment of the present disclosure may further include a first auxiliary member 10a and a second auxiliary member 10b.

The first auxiliary member 10a may be disposed at the first surface S1 of the vibration device 11. For example, the first auxiliary member 10a may be configured to cover the entire first surface S1 of the vibration device 11. The first auxiliary member 10a may be substantially the same as the first auxiliary member 10a illustrated in FIGS. 1 and 2, and thus, like reference numerals refer to like elements, and the repetitive description thereof may be omitted for brevity.

The second auxiliary member 10b may be disposed at the second surface of the adhesive member 12. For example, the second auxiliary member 10b may be configured to cover the entire second surface of the adhesive member 12. The second auxiliary member 10b may be substantially the same as the second auxiliary member 10b illustrated in FIGS. 1 and 2, and thus, like reference numerals refer to like elements, and the repetitive description thereof may be omitted for brevity.

As described above, in the vibration apparatus 10-2 according to another example embodiment of the present disclosure, the vibration device 11 may have a modulus which is greater than that of the reinforcing member 13 and is greater than or equal to that of the adhesive member 12 and the middle adhesive member 14, and thus, as illustrated in FIGS. 1 and 2, the vibration device 11 may easily vibrate the vibration member including various curved portions and having hardness which is relatively greater or smaller than that of the vibration device 11. Accordingly, the reliability of sound reproduction may be enhanced, and a sound characteristic and/or a sound pressure level characteristic in the low-pitched sound band generated based on a vibration of the vibration member may be enhanced.

Figure 5:
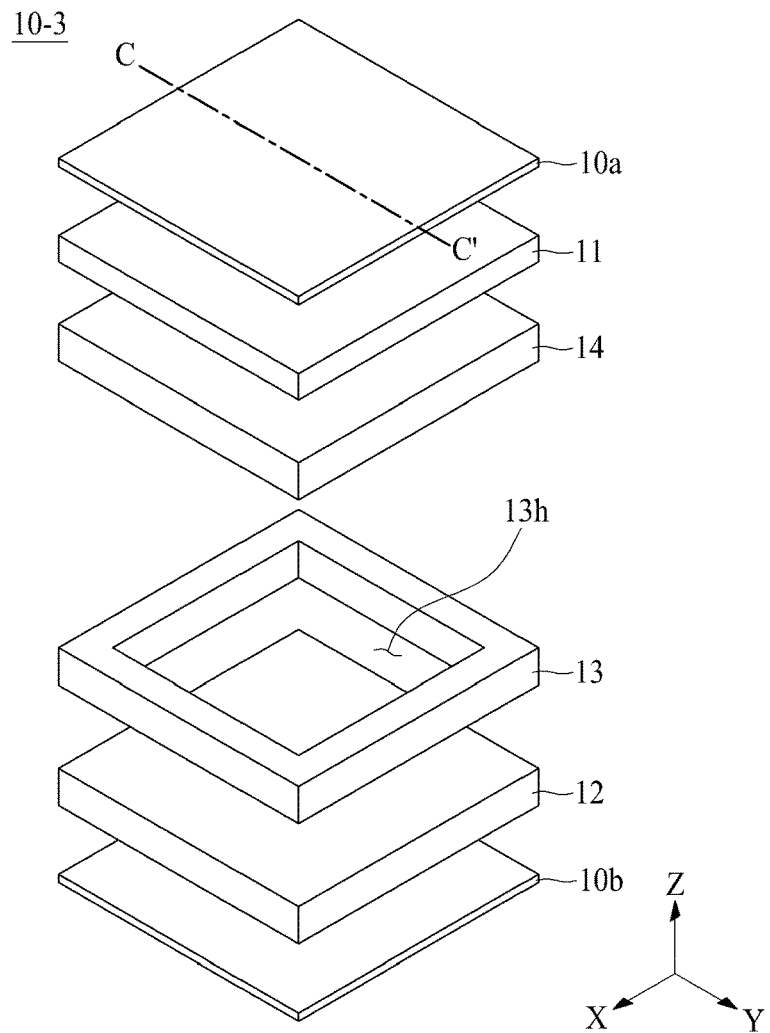
FIG. 5 is an exploded perspective view illustrating a vibration apparatus according to another example embodiment of the present disclosure.
Figure 6:
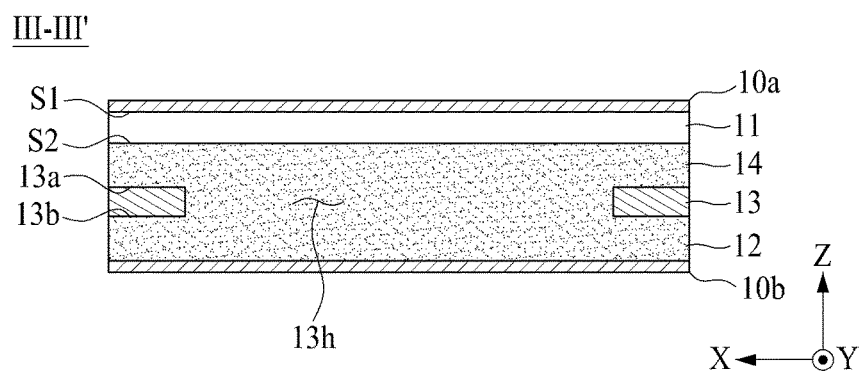
FIG. 6 is an example of a cross-sectional view taken along line C-C' illustrated in FIG.

FIG. 5 is an exploded perspective view illustrating a vibration apparatus according to another example embodiment of the present disclosure, and FIG. 6 is an example of a cross-sectional view taken along line C-C' illustrated in FIG. 5. FIGS. 5 and 6 illustrate an example embodiment where a vibration apparatus is implemented by modifying the reinforcing member in the vibration apparatus 10-2 illustrated in FIGS. 3 and 4. In the following description, therefore, the elements except a reinforcing member and relevant elements are referred to by like reference numerals, and their repetitive descriptions may be omitted for brevity or will be briefly given.

With reference to FIGS. 5 and 6, the vibration apparatus 10-3 according to another example embodiment of the present disclosure may include a vibration device 11, a reinforcing member 13, a middle adhesive member 14, and an adhesive member 12.

The vibration device 11 may be substantially the same as the vibration device 11 illustrated in FIGS. 3 and 4, and thus, a like reference numeral refers to a like element, and the repetitive description thereof may be omitted for brevity.

The reinforcing member 13 may be disposed under a rear periphery portion of the vibration device 11. For example, the reinforcing member 13 may be disposed at a periphery portion of a second surface S2 of the vibration device 11. For example, the reinforcing member 13 may be connected or coupled to the periphery portion of the second surface S2 of the vibration device 11 by the middle adhesive member 14. For example, the reinforcing member 13 may have an area which is smaller than that of the vibration device 11.

The reinforcing member 13 according to an example embodiment of the present disclosure may include a hole 13h. The hole 13h may overlap a portion, other than the periphery portion, of the vibration device 11. The hole 13h may be configured to pass through the reinforcing member 13 in a thickness direction Z of the reinforcing member 13. A center portion of the hole 13h may be disposed at a center portion of the vibration device 11 or aligned on a center portion of the vibration device 11. The hole 13h may have a shape corresponding to a shape of the vibration device 11. For example, the hole 13h may include a tetragonal band or a tetragonal ring shape, but embodiments of the present disclosure are not limited thereto. For example, an area, occupied by the hole 13h, of the reinforcing member 13 may be greater than or equal to the other area, except the hole 13h, of the reinforcing member 13. For example, an area, occupied by the hole 13h, of the reinforcing member 13 may be one or more times the other area, except the hole 13h, of the reinforcing member 13, but embodiments of the present disclosure are not limited thereto. For example, the hole 13h may be referred to as an opening portion, a hollow portion, or a through portion, but embodiments of the present disclosure are not limited thereto.

In FIGS. 5 and 6, the reinforcing member 13 is illustrated as including one hole 13h, but embodiments of the present disclosure are not limited thereto, and the reinforcing member 13 may include a plurality of holes 13h. The plurality of holes 13h may have a circular shape, an oval shape, or a polygonal shape, but embodiments of the present disclosure are not limited thereto. Therefore, the reinforcing member 13 according to an example embodiment of the present disclosure may include one or more holes 13h. For example, the one or more holes 13h may have a circular shape, an oval shape, or a polygonal shape, but embodiments of the present disclosure are not limited thereto. An area, occupied by the one or more holes 13h in the reinforcing member 13 may be one or more times the other area, except the one or more holes 13h, of the reinforcing member 13, but embodiments of the present disclosure are not limited thereto.

The reinforcing member 13 according to an example embodiment of the present disclosure may be disposed at the periphery portion of the vibration device 11 or an edge portion of the vibration device 11, and thus, flatness of a sound pressure level in a reproduction frequency band of a sound generated based on a vibration of the vibration device 11 may be constant. For example, flatness of a sound pressure level may represent a deviation between a highest sound pressure level (or a peak sound pressure level) and a lowest sound pressure level (or a dip sound pressure level) in a reproduction frequency band of a sound. For example, the reinforcing member 13 may act as a mass disposed at the periphery portion of the vibration device 11, and thus, may increase a sound pressure level of a low-pitched sound band and a middle-pitched sound band of a sound generated based on a vibration of the vibration device 11, thereby enhancing flatness of a sound pressure level in a reproduction frequency band of a sound. For example, the reinforcing member 13 may be disposed at the periphery portion of the vibration device 11 and may enhance a sound characteristic and/or a sound pressure level characteristic in a high-pitched sound band. Accordingly, the reinforcing member 13 may be applied to an apparatus requiring a sound of the high-pitched sound band.

The middle adhesive member 14 (or a second adhesive member or an intermediate adhesive member) may be connected or coupled to the vibration device 11 and the reinforcing member 13. For example, the middle adhesive member 14 may be disposed between the vibration device 11 and the reinforcing member 13. A first surface (or a top surface or an upper surface) of the middle adhesive member 14 may be connected or coupled to the second surface S2 of the vibration device 11. A second surface (or a rear surface or a lower surface) of the middle adhesive member 14 may be connected or coupled to a first surface (or a top surface or an upper surface) 13a of the reinforcing member 13. The middle adhesive member 14 may have the same size as that of the vibration device 11. The middle adhesive member 14 according to an example embodiment of the present disclosure may include substantially the same material or configuration as that of the adhesive member 12 illustrated in FIGS. 1 and 2, and thus, the repetitive description thereof may be omitted for brevity.

The middle adhesive member 14 according to an example embodiment of the present disclosure may be inserted or accommodated into the one or more holes 13h configured in the reinforcing member 13. For example, the middle adhesive member 14 may be filled into at least a portion of the one or more holes 13h configured in the reinforcing member 13. For example, the middle adhesive member 14 may be filled into all of the one or more holes 13h configured in the reinforcing member 13. For example, the middle adhesive member 14 may be configured to surround a portion, other than a second surface 13b and an outer surface, of the reinforcing member 13.

According to an example embodiment of the present disclosure, the reinforcing member 13 and the middle adhesive member 14 may be implemented as one body (or an integration structure). According to an example embodiment of the present disclosure, the reinforcing member 13 may be inserted (or buried) into a periphery portion of the middle adhesive member 14 and may be configured as one body with the middle adhesive member 14. According to another example embodiment of the present disclosure, the middle adhesive member 14 may surround the portion, other than the second surface 13b and the outer surface, of the reinforcing member 13, and thus, may be provided as one body with the reinforcing member 13. The integrated reinforcing member 13 and middle adhesive member 14 may be implemented as one element configuring the vibration apparatus 10-3, and thus, a manufacturing process performed on the vibration apparatus 10-3 may be easier.

The adhesive member (or a first adhesive member) 12 may be connected or coupled to the reinforcing member 13. For example, the adhesive member 12 may be connected or coupled to a second surface (or a rear surface) 13b of the reinforcing member 13. For example, the adhesive member 12 may have the same size as that of the vibration device 11. For example, the adhesive member 12 may be connected or coupled to the second surface 13b of the reinforcing member 13 and the middle adhesive member 14. Except that the adhesive member 12 is connected or coupled to the second surface 13b of the reinforcing member 13 instead of the vibration device 11, the adhesive member 12 may be substantially the same as the adhesive member 12 illustrated in FIGS. 1 and 2, and thus, a like reference numeral refers to a like element, and the repetitive description thereof may be omitted for brevity.

The adhesive member 12 according to an example embodiment of the present disclosure may be inserted or accommodated into the one or more holes 13h configured in the reinforcing member 13. For example, the adhesive member 12 may be filled into at least a portion of the one or more holes 13h configured in the reinforcing member 13. For example, the adhesive member 12 may be filled into all of the one or more holes 13h configured in the reinforcing member 13. The adhesive member 12 may be connected or coupled to the middle adhesive member 14 in the one or more holes 13h configured in the reinforcing member 13. For example, the adhesive member 12 and the middle adhesive member 14 may be connected or coupled to each other in the one or more holes 13h configured in the reinforcing member 13.

According to an example embodiment of the present disclosure, the reinforcing member 13 may be implemented as one body (or an integration structure) with the adhesive member 12 instead of the middle adhesive member 14. According to an example embodiment of the present disclosure, the reinforcing member 13 may be disposed at a periphery portion of the adhesive member 12 and may be integrated as one body with the adhesive member 12. According to another example embodiment of the present disclosure, the adhesive member 12 may surround a portion, other than a first surface 13a and the outer surface, of the reinforcing member 13, and thus, may be integrated as one body with the reinforcing member 13. The integrated reinforcing member 13 and adhesive member 12 may be implemented as one element configuring the vibration apparatus 10-3, and thus, the manufacturing process performed on the vibration apparatus 10-3 may be easier.

According to an example embodiment of the present disclosure, the middle adhesive member 14, the reinforcing member 13, and the adhesive member 12 may be implemented as one body (or an integration structure). For example, the reinforcing member 13 may be inserted (or buried) between the adhesive member 12 and the middle adhesive member 14. For example, the adhesive member 12 and the middle adhesive member 14 may be connected or coupled to each other to surround a portion, other than the outer surface, of the reinforcing member 13. The integrated middle adhesive member 14, the reinforcing member 13, and adhesive member 12 may be implemented as one element configuring the vibration apparatus 10-3, and thus, the manufacturing process performed on the vibration apparatus 10-3 may be easier.

The vibration apparatus 10-3 according to another example embodiment of the present disclosure may further include a first auxiliary member 10a and a second auxiliary member 10b.

The first auxiliary member 10a may be disposed at the vibration device 11. For example, the first auxiliary member 10a may be disposed at the first surface S1 of the vibration device 11. For example, the first auxiliary member 10a may be configured to cover all of the first surface S1 of the vibration device 11. The first auxiliary member 10a may be substantially the same as the first auxiliary member 10a illustrated in FIGS. 1 and 2, and thus, a like reference numeral refers to a like element, and the repetitive description thereof may be omitted for brevity.

The second auxiliary member 10b may be disposed at the adhesive member 12. For example, the second auxiliary member 10b may be disposed at the second surface of the adhesive member 12. For example, the second auxiliary member 10b may be configured to cover all of the second surface of the adhesive member 12. The second auxiliary member 10b may be substantially the same as the second auxiliary member 10b illustrated in FIGS. 1 and 2, and thus, a like reference numeral refers to a like element, and the repetitive description thereof may be omitted for brevity.

As described above, like the vibration apparatus 10-2 described above with reference to FIGS. 3 and 4, in the vibration apparatus 10-3 according to another example embodiment of the present disclosure, the reliability of sound reproduction may be enhanced, a sound characteristic and/or a sound pressure level characteristic in the low-pitched sound band generated based on a vibration of the vibration member may be enhanced, flatness of a sound pressure level in a reproduction frequency band of a sound may be constant or enhanced, and a manufacturing process may be easier based on an integration structure of elements. For example, the vibration apparatus 10-3 according to another example embodiment of the present disclosure may have a sound pressure level of 53 dB to 86 dB in a pitched sound band of 200 Hz to 20 kHz and may output a sound having flatness of about 33 dB.

Figure 7:
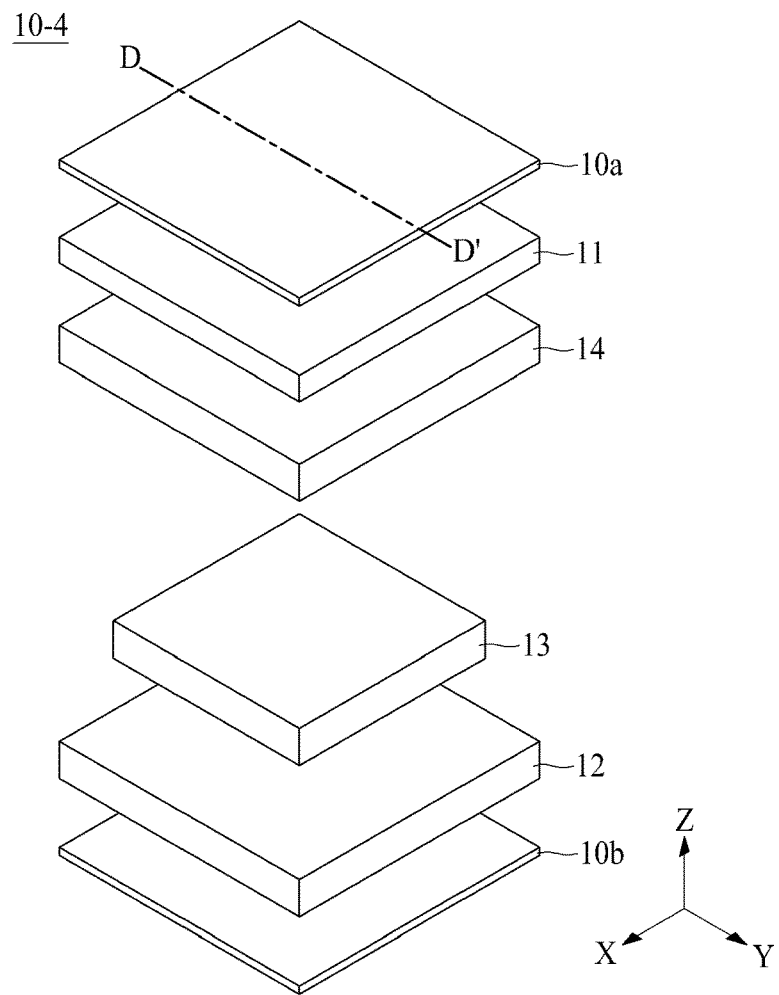
FIG. 7 is an exploded perspective view illustrating a vibration apparatus according to another example embodiment of the present disclosure.
Figure 8:
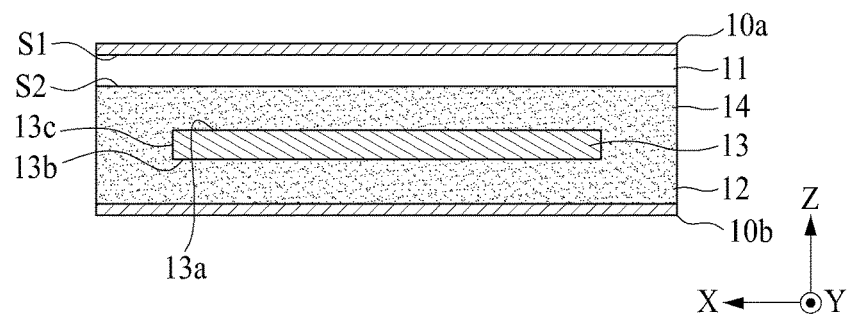
FIG. 8 is an example of a cross-sectional view taken along line D-D' illustrated in FIG. 7.

FIG. 7 is an exploded perspective view illustrating a vibration apparatus according to another example embodiment of the present disclosure, and FIG. 8 is an example of a cross-sectional view taken along line D-D' illustrated in FIG. 7. FIGS. 7 and 8 illustrate an example embodiment where a vibration apparatus is implemented by modifying the reinforcing member in the vibration apparatus 10-3 illustrated in FIGS. 5 and 6. In the following description, therefore, the elements except a reinforcing member and relevant elements are referred to by like reference numerals, and their repetitive descriptions may be omitted for brevity or will be briefly given.

With reference to FIGS. 7 and 8, in the vibration apparatus 10-4 according to another example embodiment of the present disclosure, a reinforcing member 13 may be disposed under a center portion (or a central portion) of a vibration device 11. For example, the reinforcing member 13 may be disposed at a center portion of a second surface S2 of the vibration device 11. For example, the reinforcing member 13 may be connected or coupled to the center portion, other than a periphery portion (or an edge portion), of the second surface S2 of the vibration device 11 by the middle adhesive member 14. For example, the reinforcing member 13 may have an area or a size which is smaller than that of the vibration device 11.

The reinforcing member 13 according to an example embodiment of the present disclosure may be disposed at the center portion of the vibration device 11, and thus, flatness of a sound pressure level in a reproduction frequency band of a sound generated based on a vibration of the vibration device 11 may be constant. For example, the reinforcing member 13 may act as a mass disposed at the center portion of the vibration device 11, and thus, may increase a sound pressure level of a low-pitched sound band and a middle-pitched sound band of a sound generated based on a vibration of the vibration device 11, thereby enhancing flatness of a sound pressure level in a reproduction frequency band of a sound. For example, the reinforcing member 13 may be disposed at the central portion or the center portion of the vibration device 11, thereby enhancing a sound characteristic and/or a sound pressure level characteristic in a low-pitched sound band.

The middle adhesive member 14 (or a second adhesive member) may be connected or coupled to the vibration device 11 and the reinforcing member 13. For example, the middle adhesive member 14 may be disposed between the vibration device 11 and the reinforcing member 13. A first surface (or a top surface or an upper surface) of the middle adhesive member 14 may be connected or coupled to the second surface S2 of the vibration device 11. A second surface (or a rear surface) of the middle adhesive member 14 may be connected or coupled to a first surface (or a top surface or an upper surface) 13a and lateral surfaces 13c of the reinforcing member 13. The middle adhesive member 14 may have the same size as that of the vibration device 11. The middle adhesive member 14 may be configured to surround a first surface 13a and lateral surfaces 13c, other than a second surface 13b, of the reinforcing member 13. For example, the middle adhesive member 14 may include the same material or configuration as that of the adhesive member 12 illustrated in FIGS. 1 and 2, and thus, the repetitive description thereof may be omitted for brevity.

According to an example embodiment of the present disclosure, the reinforcing member 13 and the middle adhesive member 14 may be implemented as one body (or an integration structure). According to an example embodiment of the present disclosure, the reinforcing member 13 may be inserted (or buried) into a center portion of the middle adhesive member 14 and may be provided as one body with the middle adhesive member 14. According to another example embodiment of the present disclosure, the middle adhesive member 14 may surround a first surface 13a and lateral surfaces 13c, other than a second surface 13b, of the reinforcing member 13, and thus, may be provided as one body with the reinforcing member 13. The integrated reinforcing member 13 and middle adhesive member 14 may be implemented as one element configuring the vibration apparatus 10-4, and thus, a manufacturing process performed on the vibration apparatus 10-4 may be easier.

The adhesive member (or a first adhesive member) 12 may be connected or coupled to the reinforcing member 13. For example, the adhesive member 12 may be connected or coupled to a second surface (or a rear surface) 13b of the reinforcing member 13. For example, the adhesive member 12 may have the same size as that of the vibration device 11. For example, the adhesive member 12 may be connected or coupled to the second surface 13b of the reinforcing member 13 and the middle adhesive member 14. Except that the adhesive member 12 is connected or coupled to the second surface 13b of the reinforcing member 13 instead of the vibration device 11, the adhesive member 12 may be substantially the same as the adhesive member 12 illustrated in FIGS. 1 and 2, and thus, a like reference numeral refers to a like element, and the repetitive description thereof may be omitted for brevity.

The adhesive member 12 according to an example embodiment of the present disclosure may surround at least a portion of the lateral surfaces 13c of the reinforcing member 13. For example, the adhesive member 12 may surround the entirety of the lateral surfaces 13c of the reinforcing member 13. The adhesive member 12 may be connected or coupled to the middle adhesive member 14 at a periphery portion of the vibration device 11. For example, the adhesive member 12 and the middle adhesive member 14 may be connected or coupled to each other at the periphery portion of the vibration device 11. For example, one or more of the adhesive member 12 and the middle adhesive member 14 may surround at least a portion of the lateral surfaces 13c of the reinforcing member 13.

According to an example embodiment of the present disclosure, the reinforcing member 13 may be implemented as one body (or an integration structure) with the adhesive member 12 instead of the middle adhesive member 14. According to an example embodiment of the present disclosure, the reinforcing member 13 may be disposed at a center portion of the adhesive member 12 and may be integrated as one body with the adhesive member 12. According to another example embodiment of the present disclosure, the adhesive member 12 may surround lateral surfaces 13c, and a second surface 13b other than a first surface 13a, of the reinforcing member 13, and thus, may be integrated as one body with the reinforcing member 13. The integrated reinforcing member 13 and adhesive member 12 may be implemented as one element configuring the vibration apparatus 10-4, and thus, the manufacturing process performed on the vibration apparatus 10-4 may be easier.

According to an example embodiment of the present disclosure, the middle adhesive member 14, the reinforcing member 13, and the adhesive member 12 may be implemented as one body (or an integration structure). For example, the reinforcing member 13 may be inserted (or buried) between the adhesive member 12 and the middle adhesive member 14. For example, the adhesive member 12 and the middle adhesive member 14 may be connected or coupled to each other to completely surround the reinforcing member 13 with the reinforcing member 13 therebetween. The integrated middle adhesive member 14, reinforcing member 13, and adhesive member 12 may be implemented as one element configuring the vibration apparatus 10-4, and thus, a manufacturing process performed on the vibration apparatus 10-4 may be easier.

The vibration apparatus 10-4 according to another example embodiment of the present disclosure may further include a first auxiliary member 10a and a second auxiliary member 10b.

The first auxiliary member 10a may be disposed at the vibration device 11. For example, the first auxiliary member 10a may be disposed at the first surface S1 of the vibration device 11. For example, the first auxiliary member 10a may be configured to cover all of the first surface S1 of the vibration device 11. The first auxiliary member 10a may be substantially the same as the first auxiliary member 10a illustrated in FIGS. 1 and 2, and thus, a like reference numeral refers to a like element, and the repetitive description thereof may be omitted for brevity.

The second auxiliary member 10b may be disposed at the adhesive member 12. For example, the second auxiliary member 10b may be disposed at the second surface of the adhesive member 12. For example, the second auxiliary member 10b may be configured to cover all of the second surface of the adhesive member 12. The second auxiliary member 10b may be substantially the same as the second auxiliary member 10b illustrated in FIGS. 1 and 2, and thus, a like reference numeral refers to a like element, and the repetitive description thereof may be omitted for brevity.

As described above, like the vibration apparatus 10-3 described above with reference to FIGS. 5 and 6, in the vibration apparatus 10-4 according to another example embodiment of the present disclosure, the reliability of sound reproduction may be enhanced, a sound characteristic and/or a sound pressure level characteristic in the low-pitched sound band generated based on a vibration of the vibration member may be enhanced, flatness of a sound pressure level in a reproduction frequency band of a sound may be constant or enhanced, and a manufacturing process may be easier based on an integration structure of elements.

For example, the vibration apparatus 10-4 according to another example embodiment of the present disclosure may have a sound pressure level of 53 dB to 86 dB in a pitched sound band of 200 Hz to 20 kHz and may output a sound having flatness of about 33 dB.

Figure 9:
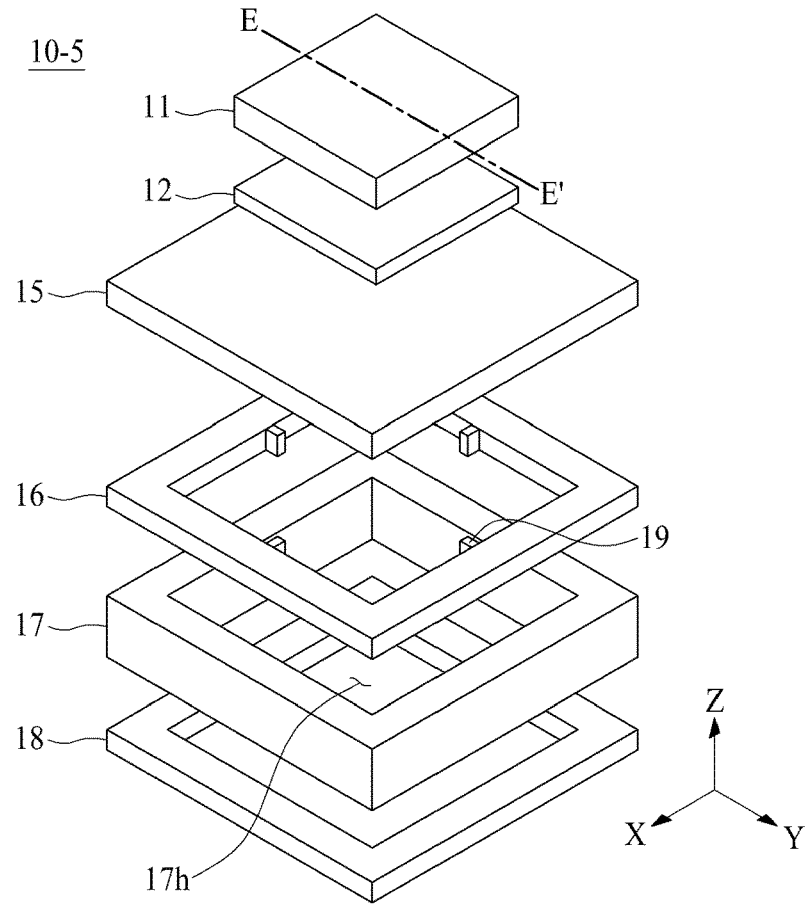
FIG. 9 is an exploded perspective view illustrating a vibration apparatus according to another example embodiment of the present disclosure.
Figure 10:
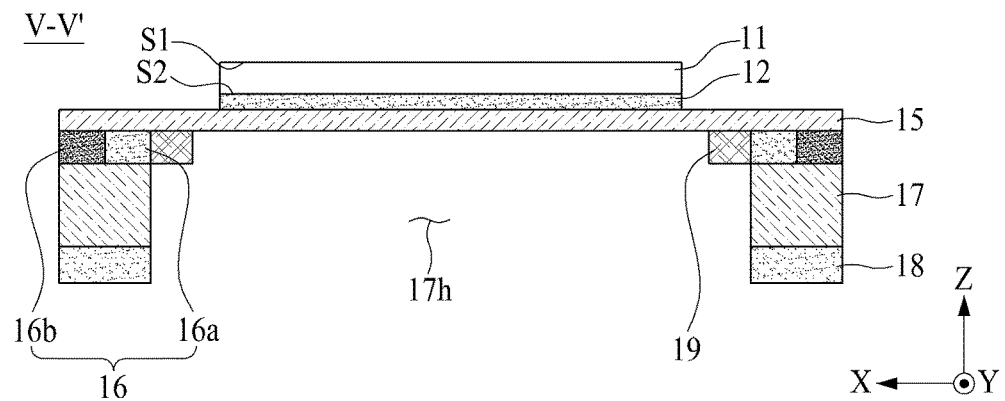
FIG. 10 is an example of a cross-sectional view taken along line E-E' illustrated in FIG. 9.

FIG. 9 is an exploded perspective view illustrating a vibration apparatus according to another example embodiment of the present disclosure, and FIG. 10 is an example of a cross-sectional view taken along line E-E' illustrated in FIG. 9. FIGS. 9 and 10 illustrate an example embodiment where a vibration plate and a supporting member are added to the vibration apparatus 10-1 described above with reference to FIGS. 1 and 2.

With reference to FIGS. 9 and 10, the vibration apparatus 10-5 according to another example embodiment of the present disclosure may include a vibration device 11, an adhesive member 12, a vibration plate 15, and a supporting member 17.

The vibration device 11 may be substantially the same as the vibration device 11 illustrated in FIGS. 1 and 2, and thus, a like reference numeral refers to a like element, and the repetitive description thereof may be omitted for brevity.

The adhesive member 12 may be connected or coupled to any one surface of a first surface S1 and a second surface S2, which is different from (or opposite to) the first surface S1, of the vibration device 11. The adhesive member 12 may be substantially the same as the adhesive member 12 illustrated in FIGS. 1 and 2, and thus, a like reference numeral refers to a like element, and the repetitive description thereof may be omitted for brevity.

The vibration plate 15 may be connected or coupled to the vibration device 11. For example, the vibration plate 15 may be disposed at a second surface (or a rear surface) S2 of the vibration device 11. For example, the vibration plate 15 may be connected or coupled to the second surface S2 of the vibration device 11 by the adhesive member 12. For example, a first surface of the vibration plate 15 may be connected or coupled to the second surface S2 of the vibration device 11 by the adhesive member 12.

The vibration plate 15 according to an example embodiment of the present disclosure may include a plate structure having a thickness of 0.1 mm to 2 mm, but embodiments of the present disclosure are not limited thereto. For example, the plate structure may have a thickness smaller than 0.1 mm or larger than 2 mm. For example, the vibration plate 15 may have a tetragonal shape, but embodiments of the present disclosure are not limited thereto, and may have a non-tetragonal shape, a circular shape, an oval shape, or a polygonal shape. The vibration plate 15 may have a size which is greater than that of the vibration device 11, or may have an area which is wider than that of the vibration device 11. For example, a center portion of the vibration device 11 may overlap a center portion of the vibration plate 15. For example, a center portion of the vibration device 11 may be disposed at a center portion of the vibration plate 15 or aligned on a center portion of the vibration plate 15. But embodiments of the present disclosure are not limited thereto. For example, the center portion of the vibration device 11 may be not aligned on a center portion of the vibration plate 15.

The vibration plate 15 according to an example embodiment of the present disclosure may vibrate based on a vibration of the vibration device 11. For example, the vibration plate 15 may vibrate based on a vibration of the vibration device 11 to generate or output a sound (or a vibration sound). The vibration plate 15 may have a material characteristic suitable for outputting a sound characteristic and/or a sound pressure level characteristic of a sound needed for the vibration device 11 or the vibration apparatus 10-5. The vibration plate 15 according to an example embodiment of the present disclosure may include a metal material or a nonmetal material (or a composite nonmetal material). For example, the metal material of the vibration plate 15 may include any one or more materials of stainless steel, aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the vibration plate 15 may include one or more of a plastic, a fiber, a leather, wood, a cloth, and a paper, but embodiments of the present disclosure are not limited thereto. For example, the vibration plate 15 including a plastic or a metal material may output a sound having a sound pressure level of 60 dB or more in a sound band of 21 Hz to 21 kHz based on a vibration. For example, the vibration plate 15 including a paper material may output a sound having a sound pressure level of 60 dB or more in a sound band of 210 Hz to 21 kHz based on a vibration. For example, a material of the vibration plate 15 may be replaced with a material optimized for a sound characteristic needed for the vibration apparatus 10-5, and thus, the vibration apparatus 10-5 according to another example embodiment of the present disclosure may output a desired sound of a sound band based on only replacing or changing a material of the vibration plate 15.

The supporting member 17 may be connected or coupled to the vibration plate 15. For example, the supporting member 17 may be connected or coupled to a periphery portion of a second surface, which is different from (or opposite to) a first surface, of the vibration plate 15. For example, the supporting member 17 may be connected or coupled to the vibration member and may support the vibration plate 15 connected to the vibration device 11. For example, the supporting member 17 may be disposed between the vibration plate 15 and the vibration member, and thus, the vibration plate 15 may be spaced apart from the vibration member. For example, the vibration plate 15 may be spaced apart from the vibration member by the supporting member 17, and thus, may not directly contact the vibration member, thereby preventing or minimizing a reduction in sound characteristic and/or sound pressure level characteristic caused by a contact between the vibration plate 15 and the vibration member. For example, the supporting member 17 may be referred to as a jig, a supporting jig, a fixing member, a fixing jig, a fixing bracket, or a fixing frame, but embodiments of the present disclosure are not limited thereto.

The supporting member 17 according to an example embodiment of the present disclosure may include a hole 17h. For example, the supporting member 17 according to an example embodiment of the present disclosure may include a tetragonal band shape or a tetragonal ring shape including a hole 17h, but embodiments of the present disclosure are not limited thereto, and the supporting member 17 may have a shape corresponding to a shape of the vibration plate 15. For example, the supporting member 17 may include a material which does not affect a vibration of the vibration plate 15 and may stably support the vibration plate 15. For example, the supporting member 17 may include one or more materials of a metal material and a nonmetal material (or a composite nonmetal material), but embodiments of the present disclosure are not limited thereto. For example, a material of the supporting member 17 may include one or more of a metal, a plastic, and wood, but embodiments of the present disclosure are not limited thereto.

The vibration apparatus 10-5 according to another example embodiment of the present disclosure may further include a connection member 16. For example, the vibration apparatus 10-5 may further include a connection member 16 disposed between the vibration plate 15 and the supporting member 17.

The connection member 16 may be disposed between a periphery portion of the second surface of the vibration plate 15 and the supporting member 17. For example, the supporting member 17 may be connected or coupled to the vibration plate 15 by the connection member 16. For example, a first surface of the connection member 16 may be connected or coupled to the periphery portion of the second surface of the vibration plate 15. A second surface, which is different from (or opposite to) the first surface, of the connection member 16 may be connected or coupled to the supporting member 17.

The connection member 16 according to an example embodiment of the present disclosure may be configured to minimize or prevent the transfer of a vibration of the vibration plate 15 to the supporting member 17. The connection member 16 may include a material suitable for blocking a vibration. For example, the connection member 16 may include a material having an elasticity. For example, the connection member 16 may include a material having an elasticity for vibration absorption (or impact absorption). The connection member 16 according to an example embodiment may include a polyurethane material or a polyolefin material, but embodiments of the present disclosure are not limited thereto. The connection member 16 according to an example embodiment may include one or more of an adhesive, a double-sided tape, a double-sided foam tape, and a double-sided cushion tape, but embodiments of the present disclosure are not limited thereto.

The connection member 16 according to an example embodiment of the present disclosure may be configured to have a thickness which is relatively thicker than the vibration plate 15. For example, the connection member 16 may have a thickness for minimizing or preventing the transfer of a vibration of the vibration plate 15 to the supporting member 17. The connection member 16 may absorb a vibration of the vibration plate 15 based on a thickness and an elasticity, thereby minimizing or preventing the transfer of a vibration of the vibration plate 15 to the supporting member 17. In addition, the connection member 16 may prevent a physical contact (or friction) between the vibration plate 15 and the supporting member 17, and thus, may prevent the occurrence of noise (or a noise sound) caused by the physical contact (or friction) between the vibration plate 15 and the supporting member 17. For example, the connection member 16 may be referred to as a middle member, a buffer member, an elastic member, a damping member, a vibration absorption member, or a vibration blocking member, but embodiments of the present disclosure are not limited thereto.

The connection member 16 according to another example embodiment of the present disclosure may be configured to minimize or prevent the transfer of a vibration of the vibration plate 15 to the supporting member 17 and to decrease the reflection of a sound wave which is generated and input based on a vibration of the vibration plate 15. For example, the connection member 16 according to another example embodiment of the present disclosure may include a first connection member 16a and a second connection member 16b.

The first connection member 16a may be disposed between the vibration plate 15 and the supporting member 17 so as to be surrounded by the second connection member 16b. For example, the first connection member 16a may be disposed inward (or an inner portion) from the second connection member 16b. The first connection member 16a may be configured to have hardness which is lower than that of the second connection member 16b. For example, the first connection member 16a may include one or more of a double-sided polyurethane tape, a double-sided polyurethane foam tape, or a double-sided sponge tape, or the like, but embodiments of the present disclosure are not limited thereto.

The second connection member 16b may be disposed between the vibration plate 15 and the supporting member 17 to surround the first connection member 16a. For example, the second connection member 16b may be disposed outward (or an outer portion) from the first connection member 16a. The second connection member 16b may be configured to have hardness which is higher than that of the first connection member 16a. For example, the second connection member 16b may include one or more of a double-sided polyolefin tape, a double-sided polyolefin foam tape, a double-sided acrylic tape, or a double-sided acrylic foam tape, or the like, but embodiments of the present disclosure are not limited thereto.

The connection member 16 according to another example embodiment of the present disclosure may absorb a sound which is generated and input based on a vibration of the vibration plate 15 by the first connection member 16a which is relatively soft and is disposed inward from the second connection member 16b which is relatively stiff (or hard), and thus, a reflected sound (or a reflected wave) generated by the connection member 16 may be minimized. Accordingly, each of a highest sound pressure level and a lowest sound pressure level generated in a reproduction frequency band of a sound generated based on a vibration of the vibration device 11 may be reduced, and thus, flatness of a sound pressure level may be improved.

In the connection member 16 according to another example embodiment of the present disclosure, the second connection member 16b which is relatively stiff may be disposed inward from the first connection member 16a which is relatively soft. In this example embodiment, a sound pressure level in a specific sound band of a sound may be reduced. For example, a sound pressure level in a sound band of 2 kHz to 5 kHz and 7 kHz to 12 kHz may be reduced due to a reflected sound (or a reflected wave) generated by the second connection member 16b having a relatively stiff. Accordingly, when a reduction in a sound pressure level in a sound band of 2 kHz to 5 kHz and 7 kHz to 12 kHz is needed based on a shape and a size of the vibration plate 15, the relatively stiff second connection member 16b may be disposed inward from the first connection member 16a having a relatively soft, and flatness of a sound pressure level may be improved based on a reduction in a sound pressure level in a sound band of 2 kHz to 5 kHz and 7 kHz to 12 kHz generated by the second connection member 16b.

The vibration apparatus 10-5 according to another example embodiment of the present disclosure may further include a coupling member 18 coupled to the supporting member 17.

The coupling member 18 may be connected or coupled to a rear surface of the supporting member 17. For example, the coupling member 18 may be configured to connect or couple the supporting member 17 or the vibration apparatus 10-5 to any one of the vibration member and a peripheral mechanism disposed near or adjacent to the vibration member.

Except that the coupling member 18 according to an example embodiment of the present disclosure is connected or coupled to the rear surface of the supporting member 17 instead of the vibration device 11, the coupling member 18 may be substantially the same as the adhesive member 12 illustrated in FIGS. 1 and 2, and thus, a like reference numeral refers to a like element, and the repetitive description thereof may be omitted for brevity. The coupling member 18 according to another example embodiment of the present disclosure may be substantially the same as the connection member 16 or the first connection member 16a of the connection member 16, and thus, the repetitive description thereof may be omitted for brevity. Therefore, the supporting member 17 or the vibration apparatus 10-5 may be connected or coupled to one of the vibration member and a peripheral mechanism disposed near or adjacent to the vibration member by the coupling member 18.

According to an example embodiment of the present disclosure, the connection member 16 and the coupling member 18 may be provided as one body with the supporting member 17. The integrated connection member 16, supporting member 17, and coupling member 18 may be implemented as one element configuring the vibration apparatus 10-5, and thus, a manufacturing process performed on the vibration apparatus 10-5 may be easier.

The vibration apparatus 10-5 according to another example embodiment of the present disclosure may further include a first auxiliary member covering the entirety of the first surface S1 of the vibration device 11 and a second auxiliary member covering the coupling member 18. The first auxiliary member may be substantially the same as the first auxiliary member 10a described above with reference to FIGS. 1 and 2, and thus, the repetitive description thereof may be omitted for brevity. The second auxiliary member may be substantially the same as the second auxiliary member 10b described above with reference to FIGS. 1 and 2, and thus, the repetitive description thereof may be omitted for brevity.

As described above, the vibration apparatus 10-5 according to another example embodiment of the present disclosure may output a sound based on a vibration of the vibration plate 15 based on a vibration of the vibration device 11 and may include the vibration plate 15 having a material optimized for a sound characteristic and/or a sound pressure level characteristic generated based on a vibration of the vibration device 11. In addition, the vibration apparatus 10-5 according to another example embodiment of the present disclosure may be connected or fixed to the vibration member through the supporting member 17, and thus, a contact area (or a fixed area) corresponding to the vibration member may be minimized, whereby the vibration apparatus 10-5 may be easily connected or fixed to the vibration member including a curved portion.

Additionally, the vibration apparatus 10-5 according to another example embodiment of the present disclosure may further include one or more pads 19 disposed at a periphery portion of the vibration plate 15.

The one or more pads 19 may be disposed at a periphery portion of the second surface of the vibration plate 15. The one or more pads 19 may be disposed to face the vibration device 11 or toward the vibration device 11. For example, the one or more pads 19 may protrude toward the vibration device 11 from the connection member 16, but embodiments of the present disclosure are not limited thereto. For example, the one or more pads 19 may be disposed at a periphery portion of the first surface of the vibration plate 15 to face the vibration device 11 or toward the vibration device 11.

The vibration apparatus 10-5 according to another example embodiment of the present disclosure may include four pads 19 which are disposed or protrude toward a center portion of the vibration device 11 from each side of the connection member 16, but embodiments of the present disclosure are not limited thereto. For example, two or more pads 19 may be disposed at each side of the connection member 16. For example, one or more pads 19 disposed at each side of the connection member 16 may be disposed to be symmetrical with respect to the vibration device 11. For example, the one or more pads 19 may include a sharp portion facing or toward the vibration device 11.

The one or more pads 19 or a plurality of pads 19 according to an example embodiment of the present disclosure may include polyurethane or polyolefin, but embodiments of the present disclosure are not limited thereto. For example, the one or more pads 19 or the plurality of pads 19 may include one or more of a single-sided tape, a single-sided foam tape, a single-sided cushion tape, or a single-sided sponge tape, or the like, but embodiments of the present disclosure are not limited thereto.

According to an example embodiment of the present disclosure, the one or more pads 19 may trap a reflected wave, and thus, may reduce a phenomenon where a sound pressure level is reduced by a standing wave. For example, a sound wave (or a sound vibration) which is generated when the vibration plate 15 is vibrating by the vibration device 11 may spread and travel radially from the vibration device 11. The sound wave may be referred to as a progressive wave. The progressive wave may be reflected by the connection member 16 to generate a reflected wave, and the reflected wave may travel in a direction opposite to the progressive wave. The reflected wave overlaps and interferes in the progressive wave and does not travel, thereby generating a standing wave which stands at a certain position. A sound pressure level may be reduced by the standing wave, and thus, a sound characteristic may decrease. Accordingly, the one or more pads 19 may trap the reflected wave, and thus, a reduction in a sound pressure level characteristic caused by the standing wave generated based on interference of the reflected wave and the progressive wave may be prevented or minimized.

The vibration apparatus 10-5 according to another example embodiment of the present disclosure may further include the one or more pads 19, and thus, a sound characteristic and/or a sound pressure level characteristic may be further enhanced.

Figure 11:
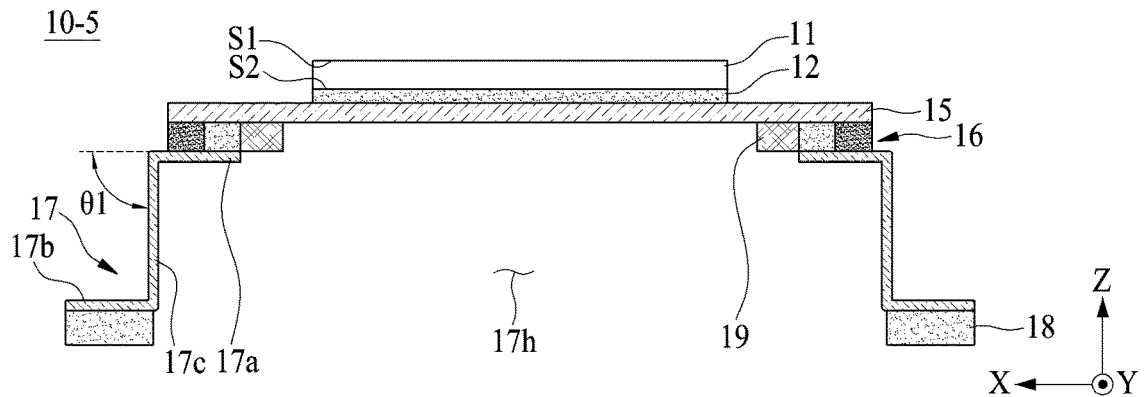
FIG. 11 is a cross-sectional view illustrating a vibration apparatus according to another example embodiment of the present disclosure.

FIG. 11 is a cross-sectional view illustrating a vibration apparatus according to another example embodiment of the present disclosure. FIG. 11 illustrates an example embodiment implemented by modifying the supporting member illustrated in FIG. 9. In the following description, therefore, the elements except a supporting member and relevant elements are referred to by like reference numerals, and their repetitive descriptions may be omitted for brevity or will be briefly given.

With reference to FIG. 11, in the vibration apparatus 10-5 according to another example embodiment of the present disclosure, a supporting member 17 may include a bending structure for securing the stiffness of the vibration apparatus 10-5.

The supporting member 17 according to an example embodiment of the present disclosure may include a first supporting portion 17a, a second supporting portion 17b, and a third supporting portion 17c.

The first supporting portion 17a may be connected or coupled to a periphery portion of a second surface of a vibration plate 15. For example, the first supporting portion 17a may be connected or coupled to the periphery portion of the second surface of a vibration plate 15 by a connection member 16. The first supporting portion 17a may include a tetragonal band shape or a tetragonal ring shape including a hole 17h, but embodiments of the present disclosure are not limited thereto and may have a shape corresponding to a shape of the vibration plate 15.

The second supporting portion 17b may be disposed in parallel with the first supporting portion 17a. For example, the second supporting portion 17b may be disposed under the first supporting portion 17a so as to be parallel to the first supporting portion 17a. For example, the second supporting portion 17b may be disposed not to overlap the first supporting portion 17a. For example, the second supporting portion 17b may be disposed to be staggered with the first supporting portion 17a. For example, the second supporting portion 17b may be disposed in a shape surrounding the first supporting portion 17a.

The third supporting portion 17c may be connected or coupled between the first supporting portion 17a and the second supporting portion 17b, thereby increasing the stiffness of the supporting member 17. The third supporting portion 17c may be connected or coupled between a first side (or a first portion) of the first supporting portion 17a and a second side (or a second portion) of the second supporting portion 17b. For example, a first side (or a first portion) of the third supporting portion 17c may be connected or coupled to the first side of the first supporting portion 17a, and a second side (or a second portion) of the third supporting portion 17c may be connected or coupled to the second side of the second supporting portion 17b. Therefore, a connection portion (or a bending portion) between the first side of the first supporting portion 17a and the first side of the third supporting portion 17c and a connection portion (or a bending portion) between the second side of the second supporting portion 17b and the second side of the third supporting portion 17c may increase the stiffness of the supporting member 17, and thus, the supporting member 17 may further stably support the vibration plate 15.

The third supporting portion 17c according to an example embodiment of the present disclosure may be configured between the first supporting portion 17a and the second supporting portion 17b so as to be parallel to a third direction (or a thickness direction of the vibration plate) Z or to be inclined from the third direction Z. For example, the third supporting portion 17c may be bent by 90 degrees or less from the first side of the first supporting portion 17a so as to be parallel to the third direction Z. In addition, the second supporting portion 17b may be bent by 90 degrees from the second side of the third supporting portion 17c so as to be parallel to a first direction X or a second direction Y. For example, an angle θ1 between the first supporting portion 17a and the third supporting portion 17c may be smaller than 90 degrees, or may be an acute angle.

According to an example embodiment of the present disclosure, in the supporting member 17, an angle θ1 between the first supporting portion 17a and the third supporting portion 17c may be an acute angle and the first supporting portion 17a may not overlap the second supporting portion 17b, and thus, a sound generated based on a vibration of the vibration plate 15 may not be reflected by the second supporting portion 17b and/or the third supporting portion 17c and may travel in a downward direction with respect to the vibration plate 15, thereby preventing or minimizing the occurrence of a noise sound or noise caused by a reflected sound (or a reflected wave) reflected by the second supporting portion 17b and/or the third supporting portion 17c. When an angle θ1 between the first supporting portion 17a and the third supporting portion 17c is an obtuse angle and the first supporting portion 17a overlaps the second supporting portion 17b, a noise sound or noise may occur because a portion of a sound generated based on a vibration of the vibration plate 15 is reflected by the second supporting portion 17b and/or the third supporting portion 17c, causing a reduction in sound characteristic and/or sound pressure level characteristic.

The vibration apparatus 10-5 according to another example embodiment of the present disclosure may further include a coupling member 18 coupled to a rear surface of the supporting member 17.

The coupling member 18 may be connected or coupled to the second supporting portion 17b of the supporting member 17. For example, the coupling member 18 may be configured to connect or couple the supporting member 17 or the vibration apparatus 10-5 to any one of the vibration member and a peripheral mechanism disposed near or adjacent to the vibration member.

The coupling member 18 according to an example embodiment of the present disclosure may be connected or coupled to a rear surface of the second supporting portion 17b of the supporting member 17. For example, except that the coupling member 18 is connected or coupled to the second supporting portion 17b of the supporting member 17 instead of the vibration device 11, the coupling member 18 may be substantially the same as the adhesive member 12 illustrated in FIGS. 1 and 2, and thus, the repetitive description thereof may be omitted for brevity. The coupling member 18 according to another example embodiment of the present disclosure may be substantially the same as the connection member 16 or the first connection member 16a of the connection member 16, and thus, the repetitive description thereof may be omitted for brevity. Therefore, the supporting member 17 or the vibration apparatus 10-5 may be connected or coupled to any one of the vibration member and a peripheral mechanism disposed near or adjacent to the vibration member by the coupling member 18. For example, the connection member 16 and the coupling member 18 according to an example embodiment of the present disclosure may be integrated as one body with the supporting member 17. The integrated connection member 16, supporting member 17, and coupling member 18 may be implemented as one element configuring the vibration apparatus 10-5, and thus, a manufacturing process performed on the vibration apparatus 10-5 may be easier.

A coupling member 18 according to another example embodiment of the present disclosure may include one or more screws or bolts fastened to the second supporting portion 17b of the supporting member 17. For example, a screw thread of the coupling member 18 may pass through the second supporting portion 17b of the supporting member 17 and may be fastened or coupled to any one of a vibration member and a peripheral mechanism disposed near or adjacent to the vibration member. For example, an elastic member may be disposed between the second supporting portion 17b of the supporting member 17 and the vibration member (or the peripheral mechanism). The elastic member may be configured to block or minimize a vibration transferred from the supporting member 17 to the vibration member (or the peripheral mechanism).

The vibration apparatus 10-5 according to another example embodiment of the present disclosure may further include a first auxiliary member covering the entirety of the first surface S1 of the vibration device 11 and a second auxiliary member covering a rear surface of the coupling member 18. The first auxiliary member may be substantially the same as the first auxiliary member 10a described above with reference to FIGS. 1 and 2, and thus, a like reference numeral refers to a like element, and the repetitive description thereof may be omitted for brevity. The second auxiliary member may be substantially the same as the second auxiliary member 10b described above with reference to FIGS. 1 and 2, and thus, a like reference numeral refers to a like element, and the repetitive description thereof may be omitted for brevity.

As described above, like the vibration apparatus 10-5 described above with reference to FIGS. 9 and 10, the vibration apparatus 10-5 according to another example embodiment of the present disclosure may output a sound based on a vibration of the vibration plate 15, may enhance a sound characteristic and/or a sound pressure level characteristic, and may be easily connected or fixed to a vibration member including a curved portion.

Figure 12:
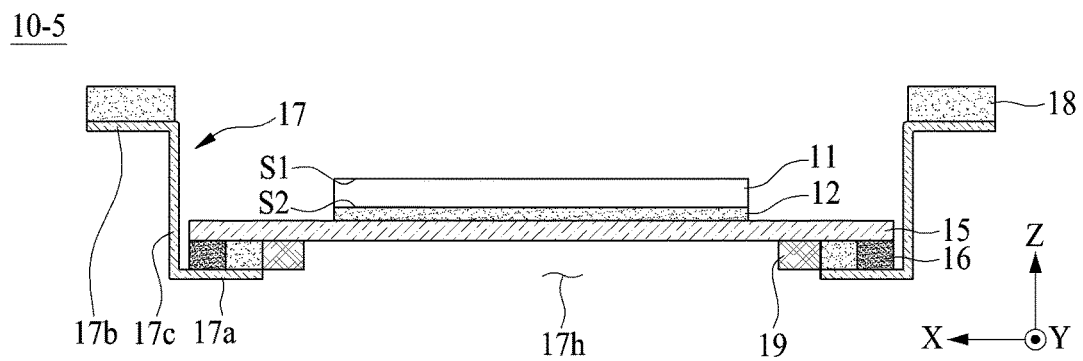
FIG. 12 is a cross-sectional view illustrating a vibration apparatus according to another example embodiment of the present disclosure.

FIG. 12 is a cross-sectional view illustrating a vibration apparatus according to another example embodiment of the present disclosure. FIG. 12 illustrates an example embodiment implemented by modifying the supporting member illustrated in FIG. 9 or 11. In the following description, therefore, the elements except a supporting member and relevant elements are referred to by like reference numerals, and their repetitive descriptions may be omitted for brevity or will be briefly given.

With reference to FIG. 12, in the vibration apparatus 10-5 according to another example embodiment of the present disclosure, a supporting member 17 may include a bending structure for securing the stiffness of the vibration apparatus 10-5 and a protection structure for protecting a vibration device 11.

The supporting member 17 according to an example embodiment of the present disclosure may include a first supporting portion 17a, a second supporting portion 17b, and a third supporting portion 17c.

The first supporting portion 17a may be connected or coupled to a periphery portion of a second surface of a vibration plate 15. For example, the first supporting portion 17a may be connected or coupled to the periphery portion of the second surface of a vibration plate 15 by a connection member 16. The first supporting portion 17a may include a tetragonal band shape or a tetragonal ring shape including a hole 17h, but embodiments of the present disclosure are not limited thereto and may have a shape corresponding to a shape of the vibration plate 15.

The second supporting portion 17b may be disposed in parallel with the first supporting portion 17a. For example, the second supporting portion 17b may be disposed above the first supporting portion 17a so as to be parallel to the first supporting portion 17a. For example, the second supporting portion 17b may be disposed not to overlap the first supporting portion 17a. For example, the second supporting portion 17b may be disposed to be staggered with the first supporting portion 17a. For example, the second supporting portion 17b may be disposed in a shape surrounding the first supporting portion 17a.

The third supporting portion 17c may be connected or coupled between the first supporting portion 17a and the second supporting portion 17b, thereby increasing the stiffness of the supporting member 17. The third supporting portion 17c may be connected or coupled between a first side (a first portion) of the first supporting portion 17a and a second side of the second supporting portion 17b. For example, a first side of the third supporting portion 17c may be connected or coupled to the first side of the first supporting portion 17a, and a second side (or a second portion) of the third supporting portion 17c may be connected or coupled to the second side of the second supporting portion 17b. Therefore, a connection portion (or a bending portion) between the first side of the first supporting portion 17a and the first side of the third supporting portion 17c and a connection portion (or a bending portion) between the second side of the second supporting portion 17b and the second side of the third supporting portion 17c may increase the stiffness of the supporting member 17, and thus, the supporting member 17 may further stably support the vibration plate 15.

The third supporting portion 17c according to an example embodiment of the present disclosure may be configured between the first supporting portion 17a and the second supporting portion 17b so as to be parallel to a third direction (or a thickness direction of the vibration plate) Z or to be inclined from the third direction Z. For example, the third supporting portion 17c may be bent by 90 degrees or less from the first side (or the first portion) of the first supporting portion 17a so as to be parallel to the third direction Z. In addition, the second supporting portion 17b may be bent by 90 degrees from the second side (or the second portion) of the third supporting portion 17c so as to be parallel to a first direction X or a second direction Y. For example, an angle between the first supporting portion 17a and the third supporting portion 17c may be smaller than 90 degrees, or may be an acute angle.

A third supporting portion 17c according to an example embodiment of the present disclosure may be configured between a first supporting portion 17a and a second supporting portion 17b to surround lateral surfaces of each of a connection member 16, a vibration plate 15, an adhesive member 12, and the vibration device 11. For example, with respect to a third direction (or a thickness direction of a vibration plate) Z, a height of the third supporting portion 17c may be higher (or greater) than a height between a rear surface of the connection member 16 and a first surface S1 of the vibration device 11. For example, a height of the third supporting portion 17c may protrude to an upper portion with respect to the first surface S1 of the vibration device 11 so as to prevent a physical contact between an external structure and the vibration device 11, and thus, the first surface S1 of the vibration device 11 may be disposed under the second supporting portion 17b. For example, with respect to the third direction Z, the third supporting portion 17c may be connected to the first supporting portion 17a or may be bent from the first supporting portion 17a to surround the vibration device 11, and thus, an accommodating space may be defined on the first supporting portion 17a. Accordingly, each of the connection member 16, the vibration plate 15, the adhesive member 12, and the vibration device 11 may be received or accommodated into the accommodating space defined on the first supporting portion 17a by the third supporting portion 17c, and thus, may be protected from an external impact.

According to an example embodiment of the present disclosure, the supporting member 17 or the vibration apparatus 10-5 may be connected or coupled to any one of a vibration member and a peripheral mechanism disposed near or adjacent to the vibration member through a coupling member 18. For example, the vibration apparatus 10-5 may be connected or coupled to any one of the vibration member and the peripheral mechanism disposed near or adjacent to the vibration member by the coupling member 18 fastened or coupled to the second supporting portion 17b of the supporting member 17.

The vibration apparatus 10-5 according to another example embodiment of the present disclosure may further include a first auxiliary member coupled to the coupling member 18 to cover the first surface S1 of the vibration device 11 and a second auxiliary member coupled to the first supporting portion 17a of the supporting member 17 to cover a rear surface of the vibration plate 15. The first auxiliary member may be substantially the same as the first auxiliary member 10a described above with reference to FIGS. 1 and 2, and thus, the repetitive description thereof may be omitted for brevity. The second auxiliary member may be substantially the same as the second auxiliary member 10b described above with reference to FIGS. 1 and 2, and thus, the repetitive description thereof may be omitted for brevity.

As described above, like the vibration apparatus 10-5 described above with reference to FIG. 10 or 11, the vibration apparatus 10-5 according to another example embodiment of the present disclosure may output a sound based on a vibration of the vibration plate 15, may enhance a sound characteristic and/or a sound pressure level characteristic, and may be easily connected or fixed to a vibration member including a curved portion. Moreover, the vibration apparatus 10-5 according to another example embodiment of the present disclosure may include the supporting member 17 configured to surround lateral surfaces of the vibration plate 15 and the vibration device 11, and thus, the vibration device 11 may be prevented from being damaged from an external impact and a total thickness of the vibration apparatus 10-5 may be reduced, whereby the vibration apparatus 10-5 may be slimmed.

Figure 13:
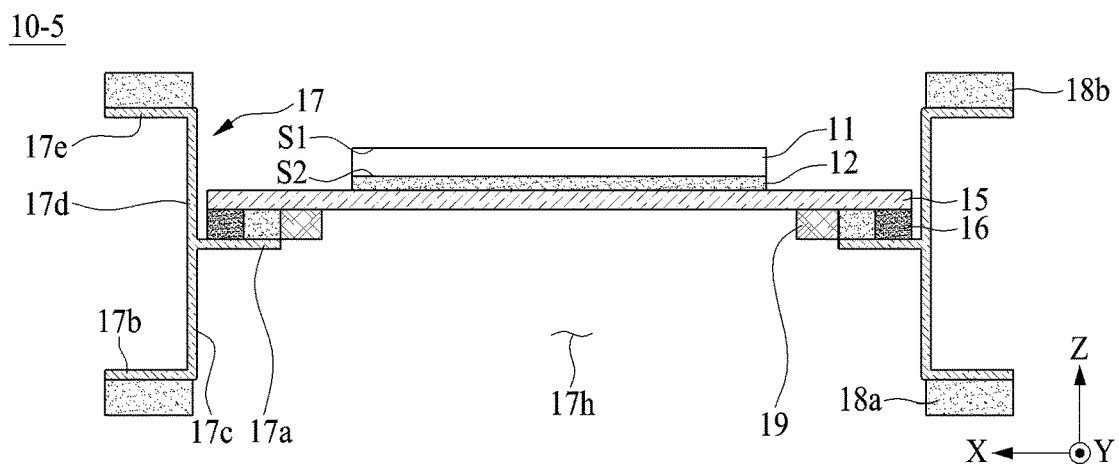
FIG. 13 is a cross-sectional view illustrating a vibration apparatus according to another example embodiment of the present disclosure.

FIG. 13 is a cross-sectional view illustrating a vibration apparatus according to another example embodiment of the present disclosure. FIG. 13 illustrates an example embodiment implemented by combining the supporting member illustrated in FIGS. 11 and 12. In the following description, therefore, the elements except a supporting member and relevant elements are referred to by like reference numerals, and their repetitive descriptions may be omitted for brevity or will be briefly given.

With reference to FIG. 13, in the vibration apparatus 10-5 according to another example embodiment of the present disclosure, a supporting member 17 may include a bending structure for securing the stiffness of the vibration apparatus 10-5 and a protection structure for protecting a vibration device 11.

The supporting member 17 according to an example embodiment of the present disclosure may include a first supporting portion 17a, a second supporting portion 17b, a third supporting portion 17c, a fourth supporting portion 17d, and a fifth supporting portion 17e.

The first supporting portion 17a, the second supporting portion 17b, and the third supporting portion 17c may each be substantially the same as the first supporting portion 17a, the second supporting portion 17b, and the third supporting portion 17c of the supporting member 17 described above with reference to FIG. 11, and thus, like reference numerals refer to like elements, and their repetitive descriptions may be omitted for brevity.

The fourth supporting portion 17d may be disposed in parallel with a third direction (or a thickness direction of a vibration plate) Z and may be connected or coupled to the first supporting portion 17a. For example, the fourth supporting portion 17d may extend long from the third supporting portion 17c in the third direction Z.

The fourth supporting portion 17d according to an example embodiment of the present disclosure may be connected or coupled to the first supporting portion 17a to surround lateral surfaces of each of the connection member 16, the vibration plate 15, the adhesive member 12, and the vibration device 11. For example, with respect to the third direction Z, a height of the fourth supporting portion 17d may be higher (or greater) than a height between a rear surface of the connection member 16 and a first surface S1 of the vibration device 11. For example, a height of the fourth supporting portion 17d may protrude to an upper portion with respect to the first surface S1 of the vibration device 11 so as to prevent a physical contact between an external structure and the vibration device 11, and thus, the first surface S1 of the vibration device 11 may be disposed under an upper portion of the fourth supporting portion 17d. For example, the fourth supporting portion 17d may be connected to the first supporting portion 17a to surround the vibration device 11, and thus, an accommodating space may be defined on the first supporting portion 17a. Accordingly, each of the connection member 16, the vibration plate 15, the adhesive member 12, and the vibration device 11 may be received or accommodated into the accommodating space defined on the first supporting portion 17a by the fourth supporting portion 17d, and thus, may be protected from an external impact.

The fifth supporting portion 17e may be disposed in parallel to face the second supporting portion 17b. For example, the fifth supporting portion 17e may be connected to the fourth supporting portion 17d to face the second supporting portion 17b. For example, the fifth supporting portion 17e may be disposed not to overlap the first supporting portion 17a and to overlap the second supporting portion 17b.

The fifth supporting portion 17e may be bent from a second side (or a second portion) of the fourth supporting portion 17d to face the second supporting portion 17b, and thus, may increase the stiffness of the supporting member 17. Therefore, a connection portion (or a bending portion) between a first side of the first supporting portion 17a and a first side (or a first portion) of the third supporting portion 17c, a connection portion (or a bending portion) between a second side of the second supporting portion 17b and a second side (or a second portion) of the third supporting portion 17c, a connection portion between the first side (or the first portion) of the first supporting portion 17a and a first side of the fourth supporting portion 17d, and a connection portion (or a bending portion) between a second side (or a second portion) of the fourth supporting portion 17d and a second side (or a second portion) of the fifth supporting portion 17e may increase the stiffness of the supporting member 17, and thus, the supporting member 17 may further stably support the vibration plate 15.

According to an example embodiment of the present disclosure, the supporting member 17 or the vibration apparatus 10-5 may be connected or coupled to a vibration member and a peripheral mechanism disposed near or adjacent to the vibration member through a first coupling member 18a and a second coupling member 18b. For example, the supporting member 17 or the vibration apparatus 10-5 may be connected or coupled between the vibration member and the peripheral mechanism. For example, the vibration apparatus 10-5 may be connected or coupled to the vibration member by the first coupling member 18 *a* fastened or coupled to the second supporting portion 17*b* of the supporting member 17. Furthermore, the vibration apparatus 10-5 may be connected or coupled to the peripheral mechanism disposed near the vibration member by the second coupling member 18*b* fastened or coupled to the fifth supporting portion 17*e* of the supporting member 17.

The vibration apparatus 10-5 according to another example embodiment of the present disclosure may further include a first auxiliary member coupled to the second coupling member 18*b* to cover the first surface S1 of the vibration device 11 and a second auxiliary member coupled to the first coupling member 18 *a* to cover a rear surface of the vibration plate 15. The first auxiliary member may be substantially the same as the first auxiliary member 10*a* described above with reference to FIGS. 1 and 2, and thus, the repetitive description thereof may be omitted for brevity. The second auxiliary member may be substantially the same as the second auxiliary member 10*b* described above with reference to FIGS. 1 and 2, and thus, the repetitive description thereof may be omitted for brevity.

As described above, like the vibration apparatus 10-5 described above with reference to FIGS. 11 and 12, the vibration apparatus 10-5 according to another example embodiment of the present disclosure may output a sound based on a vibration of the vibration plate 15, may enhance a sound characteristic and/or a sound pressure level characteristic, and may be easily connected or fixed to a vibration member including a curved portion. Moreover, the vibration apparatus 10-5 according to another example embodiment of the present disclosure may include the supporting member 17 configured to surround lateral surfaces of the vibration plate 15 and the vibration device 11, and thus, the vibration device 11 may be prevented from being damaged from an external impact.

Figure 14:
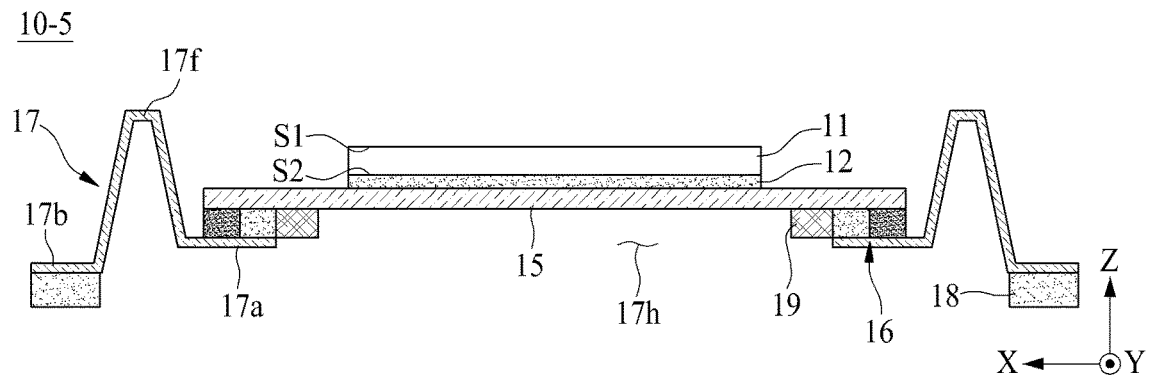
FIG. 14 is a cross-sectional view illustrating a vibration apparatus according to another example embodiment of the present disclosure.

FIG. 14 is a cross-sectional view illustrating a vibration apparatus according to another example embodiment of the present disclosure. FIG. 14 illustrates an example embodiment implemented by modifying the supporting member illustrated in FIG. 11. In the following description, therefore, the elements except a supporting member and relevant elements are referred to by like reference numerals, and their repetitive descriptions may be omitted for brevity or will be briefly given.

With reference to FIG. 14, the vibration apparatus 10-5 according to another example embodiment of the present disclosure may include a bending structure for securing the stiffness of the vibration apparatus 10-5, a protection structure for protecting a vibration device 11, and a vibration suppression structure of a supporting member 17.

The supporting member 17 according to an example embodiment of the present disclosure may include a first supporting portion 17*a*, a second supporting portion 17*b*, and a vibration blocking portion (or a vibration isolation portion or a vibration reduction portion) 17*f*.

Each of the first supporting portion 17*a* and the second supporting portion 17*b* may be substantially the same as the first supporting portion 17*a* and the second supporting portion 17*b* of the supporting member 17 described above with reference to FIG. 11, and thus, like reference numerals refer to like elements, and their repetitive descriptions may be omitted for brevity.

According to an example embodiment of the present disclosure, the first supporting portion 17*a* and the second supporting portion 17*b* may be disposed to be stepped in a third direction Z with the vibration blocking portion 17*f* therebetween. For example, the second supporting portion 17*b* may be disposed under the first supporting portion 17*a*. Therefore, the first supporting portion 17*a* of the supporting member 17 may be spaced apart from a vibration member, and thus, a physical contact between the first supporting portion 17*a* and the vibration member may be prevented, thereby preventing a sound characteristic generated based on a vibration of a vibration plate 15 from being reduced by a noise sound (or noise) caused by the physical contact between the first supporting portion 17*a* and the vibration member.

The vibration blocking portion 17*f* may be configured to increase the stiffness of the supporting member 17 and to prevent (or suppress) a vibration of the supporting member 17 based on a vibration of the vibration device 11.

The vibration blocking portion 17*f* according to an example embodiment of the present disclosure may be configured between the first supporting portion 17*a* and the second supporting portion 17*b* to include one or more bending portions for increasing the stiffness of the supporting member 17. For example, the vibration blocking portion 17*f* may be disposed between the first supporting portion 17*a* and the second supporting portion 17*b* to surround lateral surfaces of the vibration device 11. For example, the vibration blocking portion 17*f* may protrude convexly in the third direction Z between the first supporting portion 17*a* and the second supporting portion 17*b* to surround the lateral surfaces of the vibration device 11. For example, the vibration blocking portion 17*f* may include a tetragonal shape, a trapezoid shape, or a convex curved shape. Accordingly, when the vibration plate 15 vibrates based on a vibration of the vibration device 11, the vibration blocking portion 17*f* may prevent or minimize the transfer of a vibration, transferred to the first supporting portion 17*a*, to the second supporting portion 17*b* through the connection member 16, thereby preventing or suppressing at a minimum the transfer of a vibration of the vibration plate 15 to the vibration member.

According to an example embodiment of the present disclosure, with respect to a third direction Z, a height of the vibration blocking portion 17*f* may be higher (or greater) than a height between a rear surface of the connection member 16 and a first surface S1 of the vibration device 11. For example, a height of the vibration blocking portion 17*f* may protrude to an upper portion with respect to the first surface S1 of the vibration device 11 so as to prevent a physical contact between an external structure and the vibration device 11, and thus, the first surface S1 of the vibration device 11 may be disposed under an upper portion of the vibration blocking portion 17*f*. For example, the vibration blocking portion 17*f* may be connected to the first supporting portion 17*a* to surround the vibration device 11, and thus, may define an accommodating space on the first supporting portion 17*a*. Accordingly, each of the connection member 16, the vibration plate 15, the adhesive member 12, and the vibration device 11 may be received or accommodated into the accommodating space defined on the first supporting portion 17*a* by the vibration blocking portion 17*f*, and thus, may be protected from an external impact.

According to an example embodiment of the present disclosure, the supporting member 17 or the vibration apparatus 10-5 may be connected or coupled to any one of a vibration member and a peripheral mechanism disposed near the vibration member through a coupling member 18. For example, the vibration apparatus 10-5 may be connected or coupled to any one of the vibration member and the peripheral mechanism disposed near the vibration member by the coupling member 18 fastened or coupled to the second supporting portion 17b of the supporting member 17.

The vibration apparatus 10-5 according to another example embodiment of the present disclosure may further include a first auxiliary member coupled to the vibration blocking portion 17f of the supporting member 17 to cover a first surface S1 of the vibration device 11 and a second auxiliary member coupled to the coupling member 18 to cover a rear surface of the vibration plate 15. The first auxiliary member may be substantially the same as the first auxiliary member 10a described above with reference to FIGS. 1 and 2, and thus, the repetitive description thereof may be omitted for brevity. The second auxiliary member may be substantially the same as the second auxiliary member 10b described above with reference to FIGS. 1 and 2, and thus, the repetitive description thereof may be omitted for brevity.

As described above, like the vibration apparatus 10-5 described above with reference to FIG. 11, the vibration apparatus 10-5 according to another example embodiment of the present disclosure may output a sound based on a vibration of the vibration plate 15, may enhance a sound characteristic and/or a sound pressure level characteristic, and may be easily connected or fixed to a vibration member including a curved portion, thereby preventing the damage of the vibration device 11 from an external impact. In addition, the vibration apparatus 10-5 according to another example embodiment of the present disclosure may prevent or suppress at a minimum the transfer of a vibration of the vibration plate 15 to the vibration member due to the vibration blocking portion 17f of the supporting member 17, and thus, a sound characteristic and/or a sound pressure level characteristic may be further enhanced. For example, the vibration apparatus 10-5 according to another example embodiment of the present disclosure may have a sound pressure level of 56 dB to 84 dB in a pitched sound band of 200 Hz to 20 kHz and may output a sound having flatness of about 28 dB.

Figure 15:
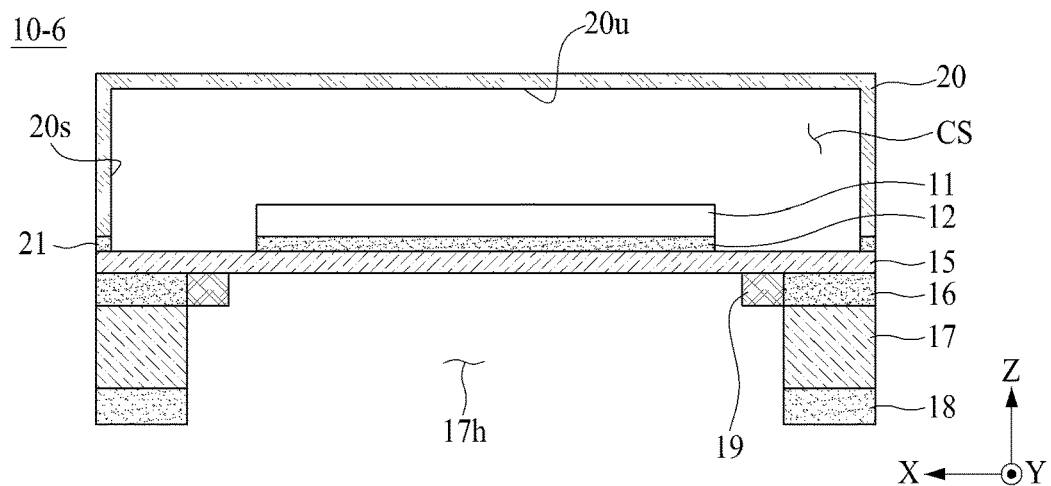
FIG. 15 is a cross-sectional view illustrating a vibration apparatus according to another example embodiment of the present disclosure.

FIG. 15 is a cross-sectional view illustrating a vibration apparatus according to another example embodiment of the present disclosure. FIG. 15 illustrates an example embodiment implemented by adding an enclosure to the vibration apparatus illustrated in FIG. 9.

With reference to FIG. 15, the vibration apparatus 10-6 according to another example embodiment of the present disclosure may include a vibration device 11, an adhesive member 12, a vibration plate 15, a supporting member 17, one or more pads 19, and an enclosure 20.

The vibration device 11, the adhesive member 12, the vibration plate 15, the supporting member 17, and the one or more pads 19 may be substantially the same as the vibration device 11, the adhesive member 12, the vibration plate 15, the supporting member 17, and the one or more pads 19 described above with reference to FIGS. 9 and 10, and thus, like reference numerals refer to like elements, and their repetitive descriptions may be omitted for brevity.

The vibration apparatus 10-6 according to another example embodiment of the present disclosure may further include the enclosure 20 which is connected to the vibration plate 15 to surround the vibration device 11.

The enclosure 20 may be connected or coupled to a periphery portion of a first surface of the vibration plate 15 to cover the vibration device 11. For example, the enclosure 20 may be connected or coupled to the periphery portion of the first surface of the vibration plate 15 by a coupling member 21. The enclosure 20 may provide a closed space CS, which covers or surrounds the vibration device 11, at the first surface of the vibration plate 15. For example, the enclosure 20 may be referred to as a closed member, a closed gap, a closed box, or a sound box, or the like, but embodiments of the present disclosure are not limited thereto. The closed space CS may be referred to as an air gap, a vibration space, a sound space, or a sound box, or the like, but embodiments of the present disclosure are not limited thereto.

The enclosure 20 may include a cover portion (or a ceiling portion or a floor portion or a bottom portion) 20u, which covers the vibration device 11, and a sidewall 20s which is connected to the cover portion 20u to define the closed space CS. The sidewall 20s of the enclosure 20 may be connected or coupled to the vibration plate 15 by the coupling member 21. For example, the enclosure 20 may have a box shape including the closed space CS where one side (or one portion) thereof is opened, but embodiments of the present disclosure are not limited thereto. For example, the enclosure 20 may have a shape which is the same as or different from that of the vibration device 11. For example, when the vibration device 11 has a square shape, the enclosure 20 may include a square shape having a size which is relatively greater than that of the vibration device 11, but embodiments of the present disclosure are not limited thereto and the enclosure 20 may have a polygonal shape for covering or surrounding the vibration device 11 or may have a non-tetragonal shape including a circular shape or an oval shape. For example, the enclosure 20 may include one or more of a metal material and a nonmetal material (or a composite nonmetal material), but embodiments of the present disclosure are not limited thereto. For example, the enclosure 20 may include one or more materials of a metal, a plastic, and wood, but embodiments of the present disclosure are not limited thereto.

The enclosure 20 according to an example embodiment of the present disclosure may maintain an impedance component based on air which acts on the vibration plate 15 when the vibration plate 15 vibrates. For example, air near the vibration plate 15 may resist a vibration of the vibration plate 15 and may act as an impedance component having a reactance component and a different resistance based on a frequency. Therefore, the enclosure 20 may configure the closed space CS, which surrounds the vibration device 11, in the first surface of the vibration plate 15, and thus, may maintain an impedance component (or an air impedance or an acoustic impedance) which acts on the vibration plate 15 due to air, thereby enhancing a sound characteristic and/or a sound pressure level characteristic of a low-pitched sound band and enhancing the quality of a sound of a high-pitched sound band.

In FIG. 15, the enclosure 20 is illustrated as having a closed structure, but embodiments of the present disclosure are not limited thereto, and the enclosure 20 may be configured to have a bass-reflex or an open-baffle structure.

The vibration apparatus 10-6 according to another example embodiment of the present disclosure may further include a first auxiliary member coupled to the cover portion 20u of the enclosure 20 and a second auxiliary member coupled to the coupling member 18 to cover a rear surface of the vibration plate 15. The first auxiliary member may be substantially the same as the first auxiliary member 10a described above with reference to FIGS. 1 and 2, and thus, the repetitive description thereof may be omitted for brevity. The second auxiliary member may be substantially the same as the second auxiliary member 10b described above with reference to FIGS. 1 and 2, and thus, the repetitive description thereof may be omitted for brevity.

In another example embodiment, the supporting member 17, the connection member 16, and the coupling member 18 illustrated in FIG. 15 may be replaced with the supporting member 17, the connection member 16, and the coupling member 18 illustrated in one of FIGS. 11 to 14, and their repetitive descriptions may be omitted for brevity.

As described above, like the vibration apparatus 10-5 described above with reference to FIGS. 9 and 10, the vibration apparatus 10-6 according to another example embodiment of the present disclosure may output a sound based on a vibration of the vibration plate 15, may enhance a sound characteristic and/or a sound pressure level characteristic, and may be easily connected or fixed to a vibration member including a curved portion. Moreover, in the vibration apparatus 10-6 according to another example embodiment of the present disclosure, a sound characteristic and/or a sound pressure level characteristic of the low-pitched sound band may be enhanced by the enclosure 20, and the quality of a sound of the high-pitched sound band may be enhanced by the enclosure 20. For example, the vibration apparatus 10-6 according to another example embodiment of the present disclosure may have a sound pressure level of 30 dB to 66 dB in a pitched sound band of 200 Hz to 20 kHz and may output a sound having flatness of about 36 dB.

Figure 16:
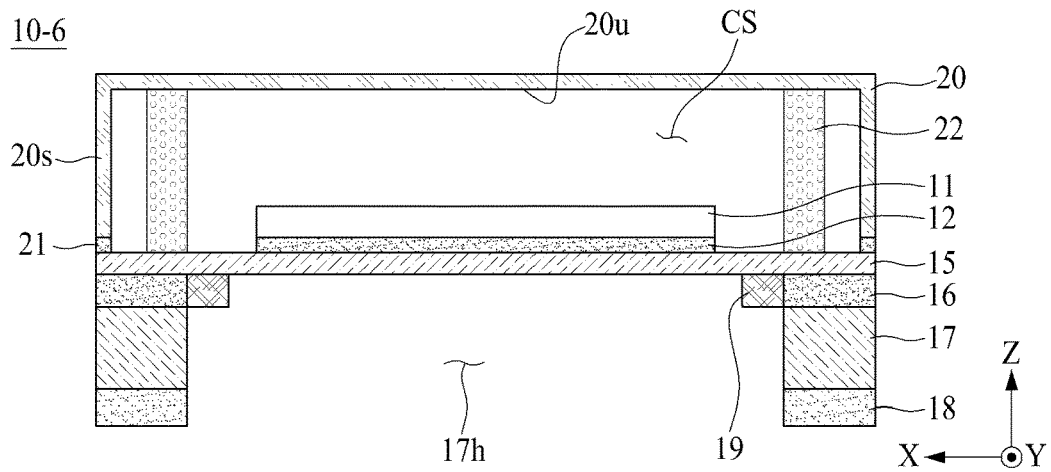
FIG. 16 is a cross-sectional view illustrating a vibration apparatus according to another example embodiment of the present disclosure.

FIG. 16 is a cross-sectional view illustrating a vibration apparatus according to another example embodiment of the present disclosure and illustrates an example embodiment implemented by adding an elastic connection member to the vibration apparatus illustrated in FIG. 15. In the following description, therefore, the elements except an elastic connection member and relevant elements are referred to by like reference numerals, and their repetitive descriptions may be omitted for brevity.

With reference to FIG. 16, the vibration apparatus 10-6 according to another example embodiment of the present disclosure may further include one or more elastic connection members (or connection members) 22.

The one or more elastic connection members 22 may be configured to prevent or minimize a vibration (or shaking) of the enclosure 20 caused by a pressure of the closed space CS based on a vibration of the vibration device 11 or the vibration plate 15. For example, the one or more elastic connection members 22 may prevent or minimize a reduction in sound characteristic and/or sound pressure level characteristic caused by a noise sound (or noise) which occurs due to a vibration (or shaking or undesired vibration) of the enclosure 20 caused by a vibration of the vibration device 11 or the vibration plate 15.

The one or more elastic connection members 22 according to an example embodiment of the present disclosure may be configured or connected between the vibration plate 15 and the enclosure 20. For example, the one or more elastic connection members 22 according to an example embodiment of the present disclosure may be connected between a periphery portion of the vibration plate 15 and the enclosure 20. For example, the one or more elastic connection members 22 may be connected between the cover portion 20u of the enclosure 20 facing the vibration device 11 and the vibration plate 15. In the one or more elastic connection members 22, a first side (or a first portion) thereof may be connected or coupled to an inner surface of the cover portion 20u of the enclosure 20, and a second side (or a second portion) thereof which is different from (or opposite to) the first side may be connected to the vibration plate 15.

The one or more elastic connection members 22 may connect the cover portion 20u of the enclosure 20 to the vibration plate 15, thereby preventing or minimizing a vibration (or shaking or undesired vibration) of the cover portion 20u of the enclosure 20. In addition, the one or more elastic connection members 22 may trap a sound wave and/or a reflected wave in a corner portion and a sidewall of the enclosure 20 and/or the vibration plate 15, thereby preventing or minimizing a reduction in sound characteristic and/or sound pressure level characteristic caused by a reflected wave generated in the corner portion and the sidewall of the enclosure 20 and/or the vibration plate 15.

The one or more elastic connection members 22 according to an example embodiment of the present disclosure may include a material having elasticity for vibration absorption (or impact absorption). For example, the one or more elastic connection members 22 may include one or more of a double-sided foam tape, a double-sided cushion tape, a double-sided sponge tape, a double-sided polyurethane tape, and a double-sided polyurethane foam tape, but embodiments of the present disclosure are not limited thereto. For example, the one or more elastic connection members 22 may have elasticity, and thus, may be referred to as a vibration prevention member, a vibration suppression member, an elastic supporter, an elastic supporting member, or an elastic supporting portion, but embodiments of the present disclosure are not limited thereto.

According to an example embodiment of the present disclosure, the one or more elastic connection members 22 may be configured at the vibration plate 15 between the sidewall 20s of the enclosure 20 and the vibration device 11. For example, the one or more elastic connection members 22 may be configured at the vibration plate 15 to overlap at least a portion of the supporting member 17, so that an adverse effect of a vibration of the vibration plate 15 is relatively less applied thereto and a vibration (or shaking or undesired vibration) of the enclosure 20 is prevented or minimized.

The one or more elastic connection members 22 according to an example embodiment of the present disclosure may be configured to surround lateral surfaces of the vibration device 11. For example, the one or more elastic connection members 22 may be configured in a closed loop line shape which surrounds the lateral surfaces of the vibration device 11. For example, the one or more elastic connection members 22 may be configured in a circular shape, an oval shape, or a polygonal shape, but embodiments of the present disclosure are not limited thereto.

According to an example embodiment of the present disclosure, the elastic connection member 22 having a closed loop line shape may be configured in a one-line shape which is continued without disconnection, or may be configured to have a plurality of line patterns which are arranged to be continuously adhered to one another without an interval or a distance along a closed loop line so as to have a closed loop line shape. For example, when the elastic connection member 22 has a tetragonal shape, the elastic connection member 22 may include four line patterns respectively facing four lateral surfaces of the vibration device 11.

As described above, like the vibration apparatus 10-6 described above with reference to FIG. 15, the vibration apparatus 10-6 according to another example embodiment of the present disclosure may output a sound based on a vibration of the vibration plate 15, may enhance a sound characteristic and/or a sound pressure level characteristic, and may be easily connected or fixed to a vibration member including a curved portion, a sound characteristic and/or a sound pressure level characteristic of the low-pitched sound band may be enhanced by the enclosure 20, and the quality of a sound of the high-pitched sound band may be enhanced by the enclosure 20. Furthermore, in the vibration apparatus 10-6 according to another example embodiment of the present disclosure, a vibration (or shaking) of the enclosure 20 may be prevented or minimized by the one or more elastic connection members 22, and thus, a reduction of a sound characteristic and/or a sound pressure level characteristic may be prevented or minimized.

Figure 17:
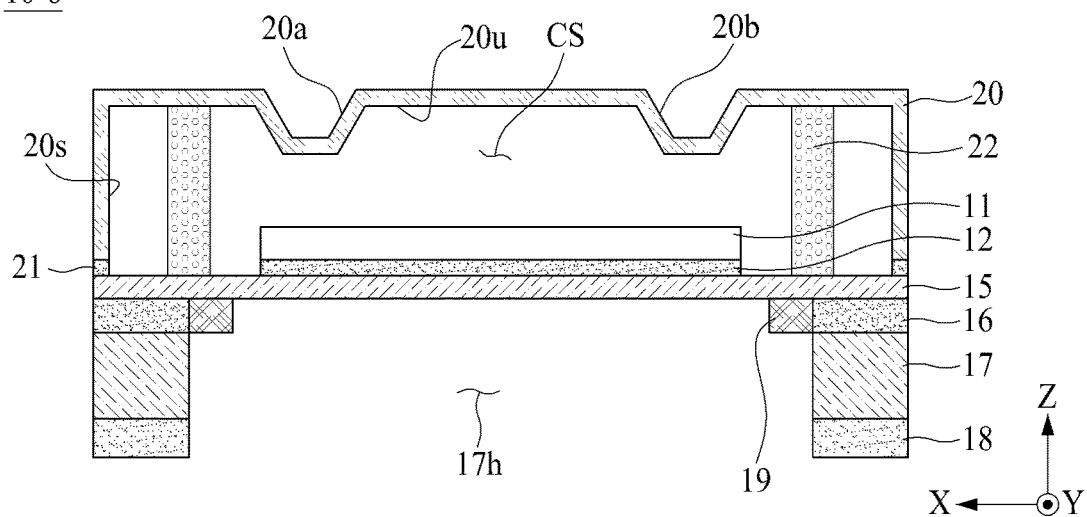
FIG. 17 is a cross-sectional view illustrating a vibration apparatus according to another example embodiment of the present disclosure.

FIG. 17 is a cross-sectional view illustrating a vibration apparatus according to another example embodiment of the present disclosure. FIG. 17 illustrates an example embodiment implemented by modifying a structure of the enclosure in the vibration apparatus illustrated in FIG. 15. In the following description, therefore, the elements except an enclosure and relevant elements are referred to by like reference numerals, and their repetitive descriptions may be omitted for brevity.

With reference to FIG. 17, in the vibration apparatus 10-6 according to another example embodiment of the present disclosure, an enclosure 20 may include one or more reinforcing portions 20a and 20b.

The one or more reinforcing portions 20a and 20b may be configured to increase the stiffness of the enclosure 20. The one or more reinforcing portions 20a and 20b may increase the stiffness of the enclosure 20, and thus, may prevent or minimize a vibration (or shaking or undesired vibration) of the enclosure 20 caused by a pressure of a closed space CS based on a vibration of a vibration device 11 or a vibration plate 15, thereby preventing or minimizing a reduction in sound characteristic and/or sound pressure level characteristic caused by a vibration (or shaking or undesired vibration) of the enclosure 20.

The one or more reinforcing portions 20a and 20b may be configured at a cover portion 20u of the enclosure 20 facing the vibration device 11.

The one or more reinforcing portions 20a and 20b according to an example embodiment of the present disclosure may protrude toward the vibration device 11 from the cover portion 20u of the enclosure 20, but embodiments of the present disclosure are not limited thereto. For example, the one or more reinforcing portions 20a and 20b may protrude in a direction which is different from (or opposite to) a direction toward the vibration device 11 from the cover portion 20u of the enclosure 20.

The one or more reinforcing portions 20a and 20b according to an example embodiment of the present disclosure may be configured in a line form or a closed loop line form.

According to an example embodiment of the present disclosure, the enclosure 20 may include a plurality of reinforcing portions 20a and 20b, and each of the plurality of reinforcing portions 20a and 20b may be configured in a line form or a closed loop line form having a certain interval.

Each of the plurality of reinforcing portions 20a and 20b according to an example embodiment of the present disclosure may be configured in a concentric circle shape. For example, each of the plurality of reinforcing portions 20a and 20b may be configured in a circular shape, an oval shape, or a polygonal shape.

Each of the plurality of reinforcing portions 20a and 20b according to another example embodiment of the present disclosure may be configured to intersect with each other. For example, each of the plurality of reinforcing portions 20a and 20b may be configured in a "+"-shape, an "×"-shape, or a "*"-shape.

In another example embodiment, the vibration apparatus 10-6 according to another example embodiment of the present disclosure may further include one or more elastic connection members 22 described above with reference to FIG. 16. The one or more elastic connection members 22 may be provided between a vibration plate 15 and the enclosure 20. The one or more elastic connection members 22 may be substantially the same as the one or more elastic connection members 22 described above with reference to FIG. 16, and thus, a like reference numeral refers to a like element, and the repetitive description thereof may be omitted for brevity.

As described above, like the vibration apparatus 10-6 described above with reference to FIG. 15 or FIG. 16, the vibration apparatus 10-6 according to another example embodiment of the present disclosure may output a sound based on a vibration of the vibration plate 15, may enhance a sound characteristic and/or a sound pressure level characteristic, and may be easily connected or fixed to a vibration member including a curved portion, a sound characteristic and/or a sound pressure level characteristic of the low-pitched sound band may be enhanced by the enclosure 20, and the quality of a sound of the high-pitched sound band may be enhanced by the enclosure 20. Furthermore, in the vibration apparatus 10-6 according to another example embodiment of the present disclosure, a vibration (or shaking or undesired vibration) of the enclosure 20 may be prevented or minimized by the one or more reinforcing portions 20a and 20b and/or the one or more elastic connection members 22, and thus, a sound characteristic and/or a sound pressure level characteristic may be enhanced.

Figure 18:
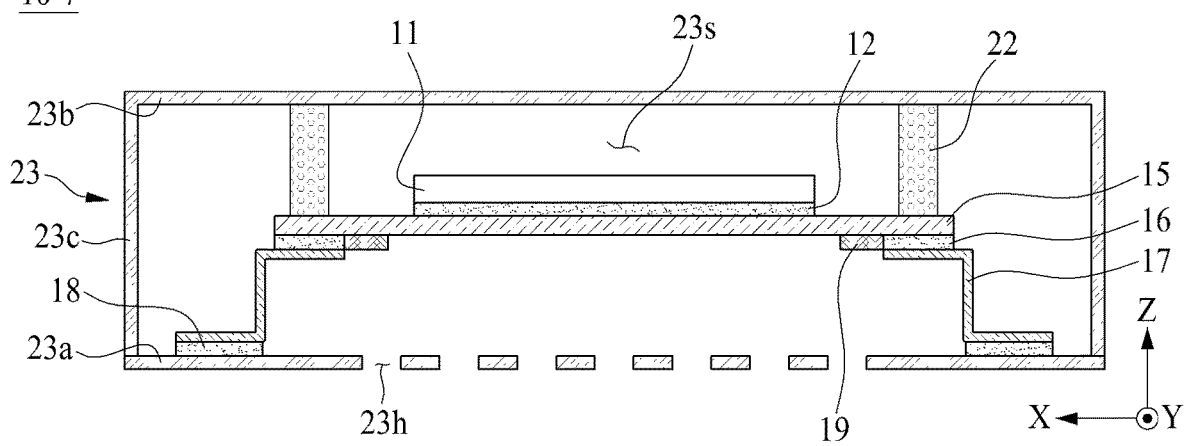
FIG. 18 is a cross-sectional view illustrating a vibration apparatus according to another example embodiment of the present disclosure.

FIG. 18 is a cross-sectional view illustrating a vibration apparatus according to another example embodiment of the present disclosure. FIG. 18 illustrates an example embodiment implemented by adding a housing to the vibration apparatus illustrated in FIG. 11.

With reference to FIG. 18, the vibration apparatus 10-7 according to another example embodiment of the present disclosure may include a vibration device 11, an adhesive member 12, a vibration plate 15, a supporting member 17, one or more pads 19, and a housing 23.

Each of the vibration device 11, the adhesive member 12, the vibration plate 15, the supporting member 17, and the one or more pads 19 may be substantially the same as the vibration device 11, the adhesive member 12, the vibration plate 15, the supporting member 17, and the one or more pads 19 described above with reference to FIGS. 9 and 11, and thus, like reference numerals refer to like elements, and their repetitive descriptions may be omitted for brevity.

The vibration apparatus 10-7 according to another example embodiment of the present disclosure may further include the housing 23 which receives or accommodates the vibration device 11, the adhesive member 12, the vibration plate 15, and the supporting member 17.

The housing 23 may have a box shape including an internal space (or an inner space) 23s for receiving or accommodating the vibration device 11, the adhesive member 12, the vibration plate 15, and the supporting member 17. The housing 23 may include one or more of a metal material and a nonmetal material (or a composite nonmetal material), but embodiments of the present disclosure are not limited thereto. For example, the housing 23 may include one or more materials of a metal material, a plastic, and wood, but embodiments of the present disclosure are not limited thereto. For example, the housing 23 may be referred to as a case, an outer case, a case member, a housing member, or a cabinet, or the like, but embodiments of the present disclosure are not limited thereto.

The housing 23 according to an example embodiment of the present disclosure may include a first housing member 23a, a second housing member 23b, and a housing sidewall 23c.

The first housing member 23a may be disposed at a second surface of the vibration plate 15. For example, the first housing member 23a may be disposed spaced apart from the vibration plate 15 to face the vibration plate 15. For example, the first housing member 23a may include a plate shape, but embodiments of the present disclosure are not limited thereto.

The second housing member 23b may be disposed at a first surface of the vibration plate 15. For example, the second housing member 23b may be disposed spaced apart from the vibration device 11 and face the vibration device 11. The second housing member 23b may be disposed in parallel with the first housing member 23a with the vibration device 11 and the vibration plate 15 therebetween. For example, the second housing member 23b may include a plate shape, but embodiments of the present disclosure are not limited thereto.

The housing sidewall 23c may be connected between the first housing member 23a and the second housing member 23b. The housing sidewall 23c may be connected between a periphery portion of the first housing member 23a and a periphery portion of the second housing member 23b. In the housing sidewall 23c, a first side (or a lower side) thereof may be connected to the periphery portion of the first housing member 23a, and a second side (or an upper side) thereof may be connected to the periphery portion of the second housing member 23b.

The housing sidewall 23c may provide an internal space 23s in the housing 23 by surrounding a space between the first housing member 23a and the second housing member 23b. For example, the housing sidewall 23c may be integrated into one of the first housing member 23a and the second housing member 23b. For example, the housing sidewall 23c and the first housing member 23a may be integrated as one body, and thus, the internal space 23s surrounded by the housing sidewall 23c may be provided on the first housing member 23a. For example, the second housing member 23b may be connected or coupled to the second side (or the second portion) of the housing sidewall 23c by a double-sided tape, an adhesive, or a screw. Accordingly, the first housing member 23a, the second housing member 23b, and the housing sidewall 23c may have a box shape.

According to an example embodiment of the present disclosure, the supporting member 17 connected to the vibration plate 15 may be connected or coupled to an inner surface of the housing 23 by a coupling member 18. For example, the supporting member 17 may be connected or coupled to the inner surface of the first housing member 23a facing the vibration plate 15 by the coupling member 18.

The housing 23 according to an example embodiment of the present disclosure may receive or accommodate all of the vibration device 11, the adhesive member 12, the vibration plate 15, the connection member 16, and the supporting member 17. For example, a coupling configuration (or an assembly configuration) between the vibration device 11, the adhesive member 12, the vibration plate 15, the connection member 16, and the supporting member 17 may be configured as one element. For example, the coupling configuration between the vibration device 11, the adhesive member 12, the vibration plate 15, the connection member 16, and the supporting member 17 may be referred to as a sound element, a sound apparatus, a sound device, a sound generating structure, a sound generating assembly, a vibration element, a vibration assembly, a vibration generating assembly, or a vibration generating structure, or the like, but embodiments of the present disclosure are not limited thereto.

According to an example embodiment of the present disclosure, a sound apparatus configured by a combination of the vibration device 11, the adhesive member 12, the vibration plate 15, the connection member 16, and the supporting member 17 may be received or accommodated into the internal space 23s of the housing 23. Therefore, the sound apparatus accommodated into the internal space 23s of the housing 23 may be surrounded by the housing 23, and thus, may be protected from an external impact. In addition, the housing 23 according to an example embodiment of the present disclosure may provide an internal space 23s (or closed space) near the vibration device 11 and the vibration plate 15, and thus, like the enclosure 20 described above with reference to FIGS. 15 to 17, the housing 23 may maintain an impedance component based on air which acts on the vibration plate 15 when the vibration plate 15 vibrates, thereby enhancing a sound characteristic and/or a sound pressure level characteristic of a low-pitched sound band and enhancing the quality of a sound of a high-pitched sound band.

The vibration apparatus 10-7 according to another example embodiment of the present disclosure may further include one or more holes 23h for an effective output of a sound generated by a vibration of the vibration plate 15.

The one or more holes 23h may be provided at the first housing member 23a of the housing 23. The one or more holes 23h may be provided at the first housing member 23a of the housing 23 to overlap the vibration plate 15. For example, the one or more holes 23h may be configured to pass through the first housing member 23a of the housing 23 in a thickness (or height) direction Z of the housing 23. The one or more holes 23h may be a path (or a sound path, or a sound output path) through which the sound generated by the vibration of the vibration plate 15 is output to the outside. In addition, the one or more holes 23h may decease a pressure (or an air pressure) of the internal space 23s of the housing 23, and thus, extend a band of the low-pitched sound band, thereby improving a sound characteristic of the low-pitched sound band. For example, the pressure (or the air pressure) of the internal space 23s of the housing 23 may be reduced by the one or more holes 23h, and thus, a vibration displacement amount (or a bending force) of the vibration plate 15 disposed in the internal space 23s of the housing 23 may increase, thereby extending a band of the low-pitched sound band and a sound characteristic and/or a sound pressure level characteristic of the low-pitched sound band.

The vibration apparatus 10-7 according to another example embodiment of the present disclosure may include one hole 23h which overlaps the vibration plate 15 and has a size smaller than that of the vibration plate 15. For example, the one hole 23h may have a shape corresponding to the vibration plate 15, but embodiments of the present disclosure are not limited thereto. For example, when the vibration plate 15 has a tetragonal shape, the one hole 23h may have a tetragonal shape which is smaller than the vibration plate 15, and a center portion of the one hole 23h may be disposed at or aligned on a center portion of the vibration plate 15.

The vibration apparatus 10-7 according to another example embodiment of the present disclosure may include a plurality of holes 23h which overlap the vibration plate 15 and has a size smaller than that of the vibration plate 15. For example, each of the plurality of holes 23h may have a circular shape, an oval shape, or a slit shape, but embodiments of the present disclosure are not limited thereto.

According to an example embodiment of the present disclosure, the plurality of holes 23h may be disposed to have a certain interval along one or more of a first direction X and a second direction Y. For example, the plurality of holes 23h may be arranged in a lattice form or a radial form at a certain interval along one or more of a first direction X and a second direction Y, but embodiments of the present disclosure are not limited thereto. For example, each of the plurality of holes 23h may have the same size, but embodiments of the present disclosure are not limited thereto and may have a size which increases or decreases progressively in a direction from a center portion of the vibration plate 15 to a periphery portion of the vibration plate 15.

According to an example embodiment of the present disclosure, a unit-area density of the plurality of holes 23h may increase progressively in a direction from the center portion of the vibration plate 15 to the periphery portion of the vibration plate 15. For example, when the first housing member 23a includes a first region overlapping the center portion of the vibration plate 15 and a second region overlapping the periphery portion of the vibration plate 15, a sound wave (or vibration) having first intensity generated based on a vibration of the vibration plate 15 reaches the first region, and a sound wave (or vibration) having second intensity which is smaller than the first intensity reaches the second region, a density of the plurality of holes 23h disposed in the second region may be greater than a density of the plurality of holes 23h disposed in the first region.

The vibration apparatus 10-7 according to another example embodiment of the present disclosure may further include one or more elastic connection members (or one or more connection members) 22.

The one or more elastic connection members 22 may be connected between the vibration plate 15 and the housing 23. For example, the one or more elastic connection members 22 may be connected between the periphery portion of the vibration plate 15 and the second housing member 23b of the housing 23. The one or more elastic connection members 22 may be substantially the same as the one or more elastic connection members 22 illustrated in FIG. 16 or FIG. 17, and thus, a like reference numeral refers to a like element, and the repetitive description thereof may be omitted for brevity.

The vibration apparatus 10-7 according to another example embodiment of the present disclosure may further include a first coupling member coupled to the first housing member 23a of the housing 23, a first auxiliary member covering the first coupling member, and a second auxiliary member covering the second housing member 23b of the housing 23.

The first coupling member may be connected or coupled to a rear surface of the first housing member 23a. The first coupling member may be coupled to the rear surface of the first housing member 23a by bypassing the one or more holes 23h, or may be configured to include one or more other holes overlapping the one or more holes 23h and may be coupled to the rear surface of the first housing member 23a. For example, the first coupling member may be configured to connect or couple the housing 23 or the vibration apparatus 10-5 to any one of a vibration member and a peripheral mechanism disposed near the vibration member.

The first auxiliary member may be substantially the same as the first auxiliary member 10a illustrated in FIGS. 1 and 2, and thus, the repetitive description thereof may be omitted for brevity. Except that the second auxiliary member is coupled to the second housing member 23b, the second auxiliary member may be substantially the same as the second auxiliary member 10b illustrated in FIGS. 1 and 2, and thus, the repetitive description thereof may be omitted for brevity.

The vibration apparatus 10-7 according to another example embodiment of the present disclosure may further include a second coupling member disposed between the second housing member 23b of the housing 23 and the second auxiliary member. The second coupling member may be connected or coupled to a whole front surface of the second housing member 23b. One or more of the first coupling member and the second coupling member may be omitted based on a coupling type (or a coupling structure) where the vibration apparatus 10-7 is coupled to any one of the vibration member and the peripheral mechanism disposed near the vibration member. For example, when the vibration apparatus 10-7 is connected or coupled to the vibration member by the first coupling member, the second coupling member may be omitted. In addition, when the vibration apparatus 10-7 is connected or coupled to a peripheral mechanism by the second coupling member, the first coupling member may be omitted.

The vibration apparatus 10-7 according to another example embodiment of the present disclosure may further include the first coupling member coupled to the first housing member 23a of the housing 23, the first auxiliary member covering the first coupling member, a second coupling member coupled to the second housing member 23b of the housing 23, and the second auxiliary member covering the second coupling member. The first auxiliary member may be substantially the same as the first auxiliary member 10a described above with reference to FIGS. 1 and 2, and thus, the repetitive description thereof may be omitted for brevity. The second auxiliary member may be substantially the same as the second auxiliary member 10b described above with reference to FIGS. 1 and 2, and thus, the repetitive description thereof may be omitted for brevity.

Additionally, in the vibration apparatus 10-7 according to another example embodiment of the present disclosure, the housing 23 may further include one or more reinforcing portions configured at the second housing member 23b. The one or more reinforcing portions may reinforce the stiffness of the housing 23, and thus, may better prevent or more minimize a vibration (or shaking or undesired vibration) of the second housing member 23b caused by a vibration of the vibration plate 15. The one or more reinforcing portions may be substantially the same as the one or more reinforcing portions provided in the enclosure 20 illustrated in FIG. 17, and thus, the repetitive description thereof may be omitted for brevity.

In another example embodiment, in the vibration apparatus 10-7 according to another example embodiment of the present disclosure, the supporting member 17 may be replaced with the supporting member 17 described above with reference to FIGS. 9 and 10 or may be replaced with the supporting member 17 described above with reference to FIG. 14, and the repetitive description thereof may be omitted for brevity. In another example embodiment, in the vibration apparatus 10-7 according to another example embodiment of the present disclosure, the supporting member 17 may be replaced with the supporting member 17 described above with reference to FIG. 13, and the repetitive description thereof may be omitted for brevity. For example, the supporting member 17 illustrated in FIG. 13 may be connected to the first housing member 23a of the housing 23 illustrated in FIG. 18 by the first coupling member 18 a and may be connected to the second housing member 23b of the housing 23 illustrated in FIG. 18 by the second coupling member 18b.

As described above, in the vibration apparatus 10-7 according to another example embodiment of the present disclosure, each of the vibration device 11, the adhesive member 12, the vibration plate 15, the connection member 16, and the supporting member 17 may be received or accommodated into the internal space 23s of the housing 23, and thus, the damage of the vibration device 11 caused by an external impact may be prevented and a sound characteristic and/or a sound pressure level characteristic of the low-pitched sound band may be enhanced. In addition, the vibration apparatus 10-7 according to another example embodiment of the present disclosure may be easily assembled with or coupled to the supporting member and/or the peripheral mechanism.

Figure 19:
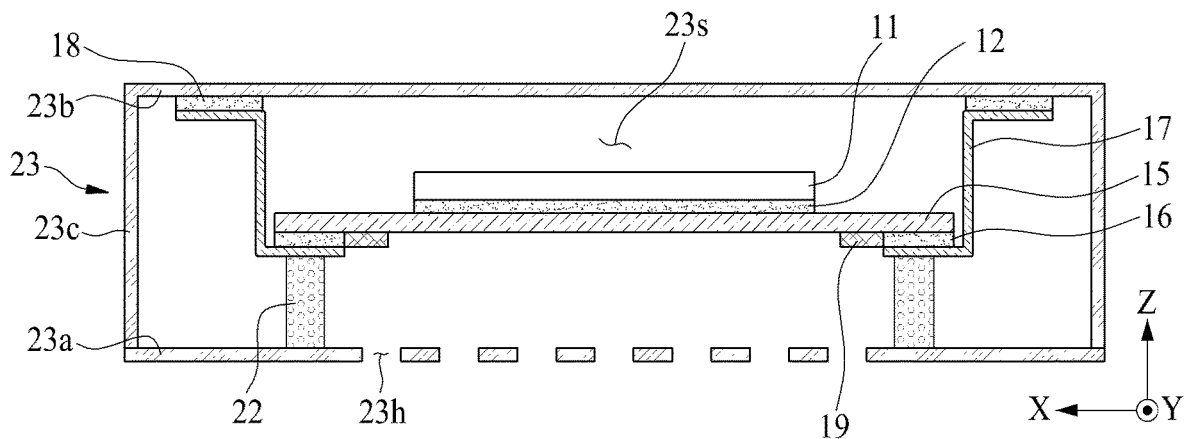
FIG. 19 is a cross-sectional view illustrating a vibration apparatus according to another example embodiment of the present disclosure.

FIG. 19 is a cross-sectional view illustrating a vibration apparatus 10-7 according to another example embodiment of the present disclosure. FIG. 19 illustrates an example embodiment implemented by replacing the supporting member of the vibration apparatus illustrated in FIG. 18 with the supporting member illustrated in FIG. 12. In the following description, therefore, the elements except a supporting member and relevant elements are referred to by like reference numerals, and their repetitive descriptions may be omitted for brevity.

With reference to FIG. 19, in the vibration apparatus 10-7 according to another example embodiment of the present disclosure, a supporting member 17 accommodated into an internal space 23s of a housing 23 may be connected or coupled to a second housing member 23b of the housing 23. For example, the supporting member 17 may be connected or coupled to an inner surface of the second housing member 23b by a coupling member 18. Therefore, the supporting member 17 may be spaced apart from a first housing member 23a of the housing 23, and thus, may prevent the occurrence of a noise sound (or noise) caused by a vibration which is transferred to the first housing member 23a through the supporting member 17 when the vibration plate 15 vibrates.

The vibration apparatus 10-7 according to another example embodiment of the present disclosure may further include one or more elastic connection members (or one or more connection members) 22.

The one or more elastic connection members 22 may be connected between the supporting member 17 and the housing 23. For example, the one or more elastic connection members 22 may be connected between the periphery portion of the supporting member 17 and the first housing member 23a of the housing 23. Except that the one or more elastic connection members 22 is connected between the periphery portion of the supporting member 17 and the first housing member 23a of the housing 23, the one or more elastic connection members 22 may be substantially the same as the elastic connection members 22 illustrated in FIG. 16 or FIG. 18, and thus, like reference numerals refer to like elements, and their repetitive descriptions may be omitted for brevity.

Additionally, in the vibration apparatus 10-7 according to another example embodiment of the present disclosure, the housing 23 may further include one or more reinforcing portions provided in the second housing member 23b. The one or more reinforcing portions may reinforce the stiffness of the housing 23, and thus, may further prevent or further minimize a vibration (or shaking or undesired vibration) of the second housing member 23b caused by a vibration of the vibration plate 15. The one or more reinforcing portions may be substantially the same as the one or more reinforcing portions provided in the enclosure 20 illustrated in FIG. 17, and thus, the repetitive description thereof may be omitted for brevity.

As described above, like the vibration apparatus described above with reference to FIG. 18, the vibration apparatus 10-7 according to another example embodiment of the present disclosure may be prevented from being damaged from an external impact and may enhance a sound characteristic and/or a sound pressure level characteristic in the low-pitched sound band. Furthermore, the vibration apparatus 10-7 according to another example embodiment of the present disclosure may be easily assembled with or coupled to the supporting member and/or the peripheral mechanism.

Figure 20:
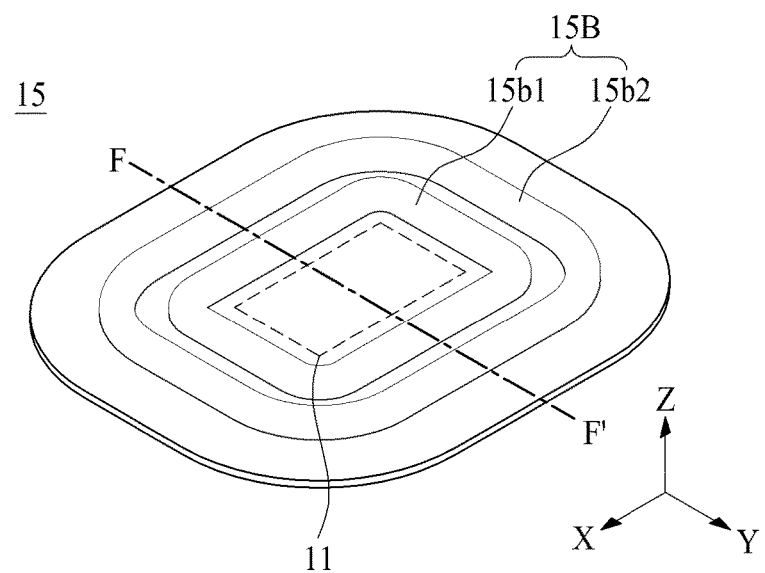
FIG. 20 is a perspective view illustrating a vibration plate according to another example embodiment of the present disclosure.
Figure 21:
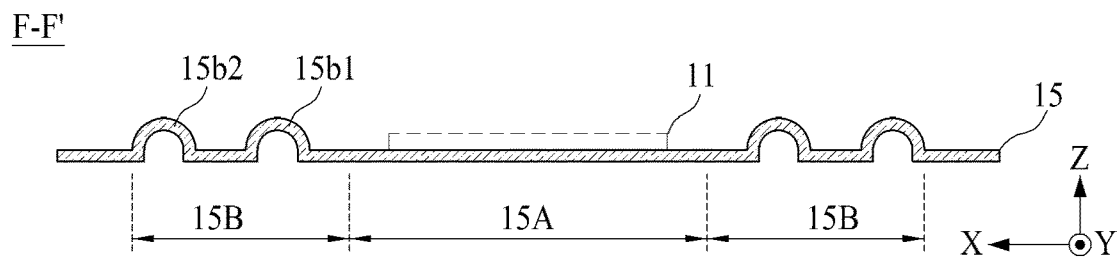
FIG. 21 is an example of a cross-sectional view taken along line F-F' illustrated in FIG. 20.
Figure 22A:
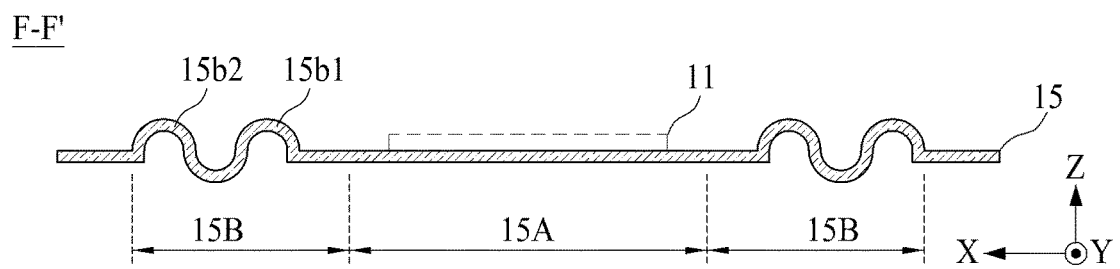
FIG. 22A is an example of another cross-sectional views taken along line F-F' illustrated in FIG. 20.
Figure 22B:
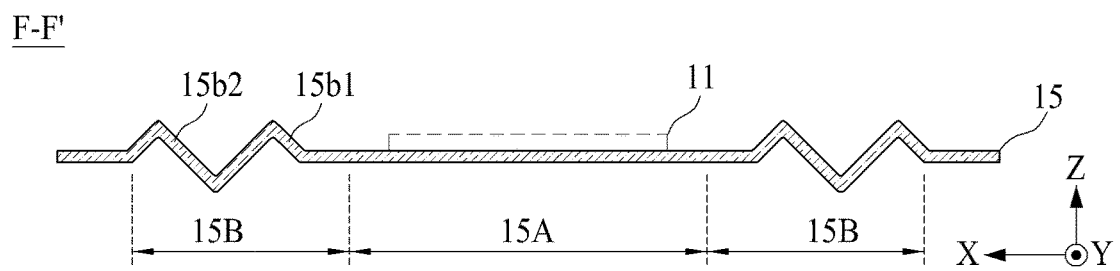
FIG. 22B is an example of another cross-sectional views taken along line F-F' illustrated in FIG. 20.

FIG. 20 is a perspective view illustrating a vibration plate 15 according to another example embodiment of the present disclosure. FIG. 21 is an example of a cross-sectional view taken along line F-F' illustrated in FIG. 20. FIGS. 22A and 22B are examples of other cross-sectional views taken along line F-F' illustrated in FIG. 20. FIGS. 20, 21, 22A, and 22B illustrate modified example embodiments of the vibration plate illustrated in FIGS. 9 to 19.

With reference to FIGS. 20 and 21, the vibration plate 15 according to another example embodiment of the present disclosure may include a plurality of regions 15A and 15B. For example, a vibration device 11 may overlap one or more of the plurality of regions 15A and 15B.

The vibration plate 15 according to another example embodiment of the present disclosure may include a first region 15A and a second region 15B.

The first region 15A may include a center portion of a vibration plate 15. For example, the first region 15A may include a region where the vibration device 11 is disposed. For example, the first region 15A may be referred to as a first stiff region, a flat portion, a flat region, or a vibration region, but embodiments of the present disclosure are not limited thereto.

The second region 15B may include a peripheral region adjacent to the first region 15A. For example, the second region 15B may include a region between a periphery portion of the vibration plate 15 and the first region 15A. The second region 15B may include a region which surrounds the first region 15A. The second region 15B may be referred to as a second stiff region, a flexural portion, a non-flat region, a flexural region, a bellows region, an elastic region, a deformation region, a crease region, or a stretchable region, but embodiments of the present disclosure are not limited thereto.

The second region 15B according to an example embodiment of the present disclosure may include one or more flexural portions 15b1 and 15b2. The one or more flexural portions 15b1 and 15b2 may be configured in a closed loop line form which surrounds the first region 15A.

The second region 15B according to an example embodiment of the present disclosure may include a plurality of flexural portions 15b1 and 15b2 configured in a closed loop line form which surrounds the first region 15A. For example, the second region 15B may include a first flexural portion 15b1 surrounding the first region 15A and a second flexural portion 15b2 surrounding the first flexural portion 15b1. For example, the second region 15B may have a stiffness which is lower than that of the first region 15A based on the one or more flexural portions (or a plurality of flexural portions) 15b1 and 15b2.

The one or more flexural portions (or the plurality of flexural portions) 15b1 and 15b2 according to an example embodiment of the present disclosure may protrude to a portion above a first surface of the vibration plate 15 in the second region 15B of the vibration plate 15, with respect to a thickness direction Z of the vibration plate 15. The one or more flexural portions (or the plurality of flexural portions) 15b1 and 15b2 may protrude convexly to include a curved surface. For example, a cross-sectional structure of the second region 15B may have a cross-sectional structure having a semicircular shape or an oval shape, but embodiments of the present disclosure are not limited thereto. For example, the first surface of the vibration plate 15 corresponding to the second region 15B may include one or more convex portions (or protrusion portions). A second surface of the vibration plate 15 corresponding to the second region 15B may include one or more concave portions (or recessed portions).

The one or more flexural portions (or the plurality of flexural portions) 15b1 and 15b2 according to another example embodiment of the present disclosure may alternately protrude in a direction toward the first surface and the second surface of the vibration plate 15. For example, the one or more flexural portions (or the plurality of flexural portions) 15b1 and 15b2 may have a wave shape as illustrated in FIG. 22A or may have a zigzag line form as illustrated in FIG. 22B, but embodiments of the present disclosure are not limited thereto and may include an arbitrary structure where the second region 15B is capable of increasing or decreasing.

The one or more flexural portions (or the plurality of flexural portions) 15b1 and 15b2 according to another example embodiment of the present disclosure may be deformed based on a vibration of the vibration plate 15 or a vibration of the first region 15A, and thus, may increase a length (or an area) of the second region 15B. For example, the one or more flexural portions (or the plurality of flexural portions) 15b1 and 15b2 may contract or expand based on a vibration of the first region 15A, and thus, a vibration of the vibration plate 15 or the first region 15A may be smoothly performed. In addition, the one or more flexural portions (or the plurality of flexural portions) 15b1 and 15b2 may trap a reflected wave reflected from a connection member connected to the vibration plate 15.

The vibration plate 15 according to another example embodiment of the present disclosure may include a flexible material, for deformation of the one or more flexural portions (or the plurality of flexural portions) 15b1 and 15b2 caused by a vibration of the first region 15A. For example, the vibration plate 15 may include one or more materials of a plastic, a fiber, a leather, a cloth, and a paper. For example, the second region 15B (i.e., the one or more flexural portions (or the plurality of flexural portions) 15b1 and 15b2) of the vibration plate 15 may be implemented by a molding process using a mold having a flexural pattern corresponding to the one or more flexural portions (or the plurality of flexural portions) 15b1 and 15b2, but embodiments of the present disclosure are not limited thereto.

As described above, a vibration displacement amount (or a bending force) of the vibration plate 15 according to another example embodiment of the present disclosure may increase by the one or more flexural portions 15b1 and 15b2, and thus, a sound characteristic and/or a sound pressure level characteristic of a middle-low-pitched sound band generated based on a vibration of the vibration device 11 may be enhanced.

Figure 23:
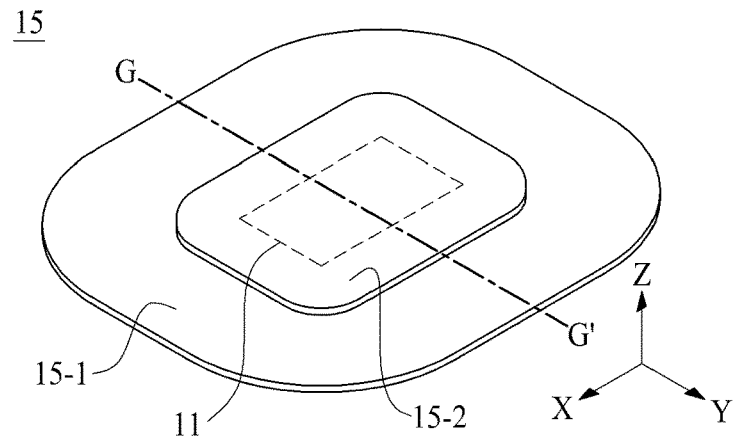
FIG. 23 is a perspective view illustrating a vibration plate according to another example embodiment of the present disclosure.
Figure 24A:
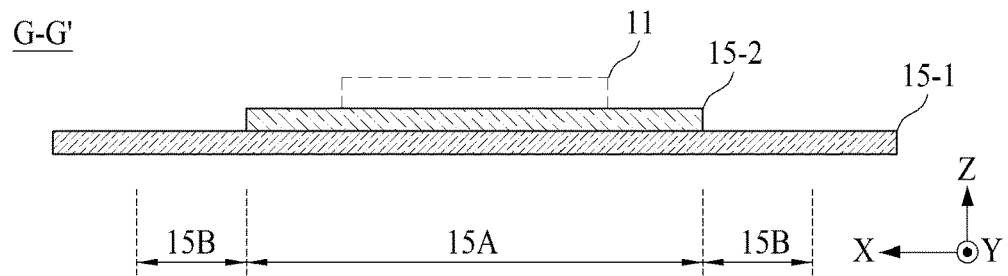
FIG. 24A is an example of a cross-sectional view taken along line G-G' illustrated in FIG. 23.
Figure 24B:
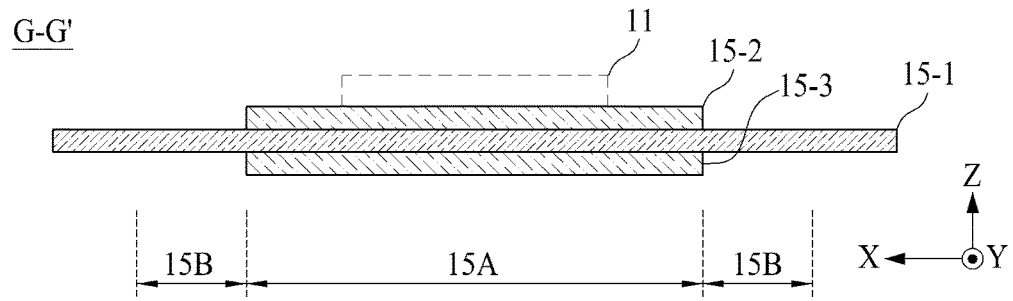
FIG. 24B is an example of another cross-sectional view taken along line G-G' illustrated in FIG. 23.

FIG. 23 is a perspective view illustrating a vibration plate 15 according to another example embodiment of the present disclosure. FIG. 24A is an example of a cross-sectional view taken along line G-G' illustrated in FIG. 23. FIG. 24B is an example of another cross-sectional view taken along line G-G' illustrated in FIG. 23. FIGS. 23, 24A, and 24B illustrate modified example embodiments of the vibration plate illustrated in FIGS. 9 to 19.

With reference to FIGS. 23 and 24A, a vibration plate 15 according to another example embodiment of the present disclosure may include a first plate 15-1 and a second plate 15-2 overlapping the first plate 15-1.

The first plate 15-1 may include a plate structure having a certain thickness. The first plate 15-1 according to an example embodiment of the present disclosure may include one or more materials of a plastic, a fiber, a leather, a cloth, and a paper.

The second plate 15-2 may be connected or coupled to any one surface of a first surface of the first plate 15-1 and a second surface thereof opposite to the first surface and may be connected or coupled to the vibration device 11. The second plate 15-2 may include a plate structure having a certain thickness and a size which is smaller than that of the first plate 15-1. For example, the second plate 15-2 may be connected or coupled to a center portion other than a periphery portion of the first plate 15-1. The second plate 15-2 according to another example embodiment of the present disclosure may include one or more materials of a metal material and a nonmetal material (or a composite nonmetal material), but embodiments of the present disclosure are not limited thereto. For example, the metal material of the second plate 15-2 may include any one or more materials of stainless steel, aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the second plate 15-2 may include one or more of a plastic, a fiber, a leather, wood, a cloth, and a paper, but embodiments of the present disclosure are not limited thereto. For example, the second plate 15-2 may include a material which is the same as or different from that of the first plate 15-1.

The vibration plate 15 according to another example embodiment of the present disclosure may include a first region 15A and a second region 15B.

The first region 15A may include a center portion of the vibration plate 15. For example, the first region 15A may include a region where the vibration device 11 is disposed. The first region 15A may be a region corresponding to the second plate 15-2, or may be a stacked region of the first plate 15-1 and the second plate 15-2. For example, the first region 15A may be referred to as a first stiff region, a vibration region, or a multi-layer region, but embodiments of the present disclosure are not limited thereto.

The second region 15B may include a region surrounding the first region 15A. The second region 15B may be included in a periphery portion of the vibration plate 15. For example, the second region 15B may include a region between the first region 15A and the periphery portion of the vibration plate 15 or the first plate 15-1. The second region 15B may be referred to as a second stiff region, an elastic region, or a single-layer region, but embodiments of the present disclosure are not limited thereto.

The first region 15A of the vibration plate 15 may have a stiffness which is higher than that of the second region 15B. For example, the first region 15A of the vibration plate 15 may have a stiffness which is higher than that of the second region 15B based on a stacked structure (or an overlapped structure) of the first plate 15-1 and the second plate 15-2. Therefore, the first region 15A of the vibration plate 15 may have a stiffness which is relatively higher than that of the second region 15B, and thus, may prevent or minimize a divisional vibration (or a break-up vibration) of the vibration device 11, thereby enhancing a sound characteristic and/or a sound pressure level characteristic generated based on a vibration of the vibration device 11.

The second region 15B of the vibration plate 15 may have a stiffness which is relatively lower than that of the first region 15A, and thus, may be deformed based on a vibration of the vibration device 11. Accordingly, the second region 15B of the vibration plate 15 may enable a vibration of the vibration plate 15 or the first region 15A to be smoothly performed or may increase a vibration displacement amount (or a bending force) of the vibration plate 15 or the first region 15A, thereby enhancing a sound characteristic and/or a sound pressure level characteristic of a middle-low-pitched sound band generated based on a vibration of the vibration device 11 overlapping the second plate 15-2.

With reference to FIG. 24B, a vibration plate according to another example embodiment of the present disclosure may further include a third plate 15-3. The vibration plate according to another example embodiment of the present disclosure may further include a third plate 15-3 for further increasing the stiffness of a first region 15A.

The third plate 15-3 may be configured to overlap a second plate 15-2 with a first plate 15-1 therebetween. For example, when the second plate 15-2 is connected or coupled to a first surface of the first plate 15-1, the third plate 15-3 may be connected or coupled to a second surface, which is opposite to the first surface, of the first plate 15-1.

The third plate 15-3 according to another example embodiment of the present disclosure may include one or more of a metal material and a nonmetal material (or a composite nonmetal material), but embodiments of the present disclosure are not limited thereto. For example, the third plate 15-3 may include one or more material, which are the same as or different from those of the second plate 15-2, among a metal material and a nonmetal material (or a composite nonmetal material).

The first region 15A of the vibration plate 15 may have a stiffness which is higher than that of the second region 15B based on the stacked structure (or the overlapped structure) of the first plate 15-1, the second plate 15-2, and the third plate 15-3, and thus, may prevent or further minimize a divisional vibration (or a break-up vibration) of the vibration device 11, thereby enhancing a sound characteristic and/or a sound pressure level characteristic generated based on a vibration of the vibration device 11.

The second region 15B of the vibration plate 15 may have a stiffness which is relatively lower than that of the first region 15A, and thus, may be deformed more (e.g., deformed more than the first region 15A) based on a vibration of the vibration device 11. Accordingly, the second region 15B of the vibration plate 15 may enable a vibration of the vibration plate 15 or the first region 15A to be further smoothly performed or may further increase a vibration displacement amount (or a bending force) of the vibration plate 15 or the first region 15A, thereby further enhancing a sound characteristic and/or a sound pressure level characteristic of a middle-low-pitched sound band generated based on a vibration of the vibration device 11

Additionally, in FIGS. 24A and 24B, it is illustrated that the first region 15A of the vibration plate 15 is configured in a stacked structure (or an overlapped structure) of two plates or three plates, but embodiments of the present disclosure are not limited thereto, and the first region 15A of the vibration plate 15 may be configured in a stacked structure (or an overlapped structure) of three or more plates. Accordingly, the first region 15A of the vibration plate 15 may be configured in a stacked structure (or an overlapped structure) of two or more plates.

As described above, in the vibration plate 15 according to another example embodiment of the present disclosure, the stiffness of the first region 15A where the vibration device 11 is disposed may have a stiffness which is higher than that of the second region 15B of the vibration plate 15 surrounding the first region 15A, and thus, a sound characteristic and/or a sound pressure level characteristic of the middle-low-pitched sound band generated based on a vibration of the vibration device 11 may be enhanced. For example, the vibration apparatuses 10-5, 10-6, and 10-7 including the vibration plate 15 according to another example embodiment of the present disclosure may have a sound pressure level of 56 dB to 85 dB in a pitched sound band of 200 Hz to 20 kHz and may output a sound having flatness of about 29 dB.

Figure 25:
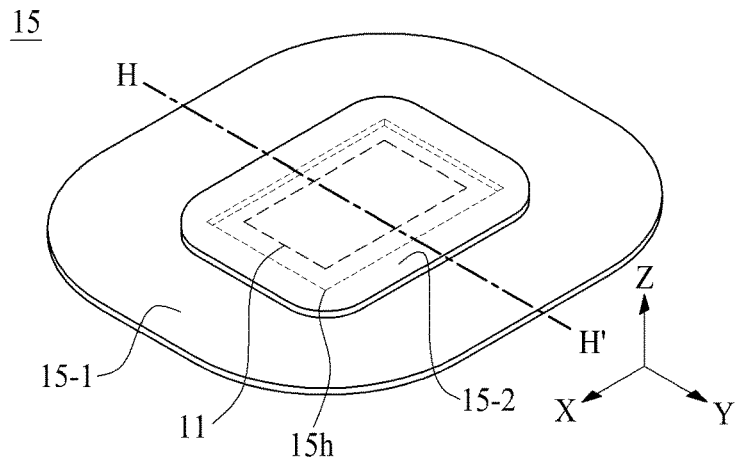
FIG. 25 is a perspective view illustrating a vibration plate according to another example embodiment of the present disclosure.
Figure 26:
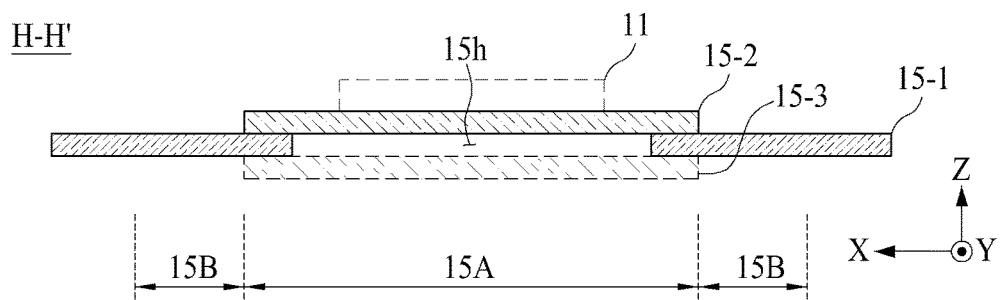
FIG. 26 is an example of a cross-sectional view taken along line H-H' illustrated in FIG. 25.

FIG. 25 is a perspective view illustrating a vibration plate 15 according to another example embodiment of the present disclosure. FIG. 26 is an example of a cross-sectional view taken along line H-H' illustrated in FIG. 25. FIGS. 25 and 26 illustrate an example embodiment where a structure of the first plate in the vibration plate illustrated in FIGS. 23, 24A, and 24B is modified.

With reference to FIGS. 25 and 26, the vibration plate 15 according to another example embodiment of the present disclosure may include a first plate 15-1 and a second plate 15-2 overlapping the first plate 15-1.

The first plate 15-1 may include a plate structure which has a certain thickness and includes a hollow portion 15h. The first plate 15-1 according to an embodiment of the present disclosure may include one or more materials of a plastic, a fiber, a leather, a cloth, and a paper, but embodiments of the present disclosure are not limited thereto.

The hollow portion 15h of the first plate 15-1 may be configured at a center portion of the first plate 15-1. The hollow portion 15h may be configured to have a size which is greater than that of a vibration device 11 and is smaller than that of the second plate 15-2.

The second plate 15-2 may include a plate structure which has a certain thickness and has a size which is smaller than that of the first plate 15-1 and is greater than that of the hollow portion 15h of the first plate 15-1. For example, the second plate 15-2 may be connected or coupled to the center portion of the first plate 15-1 to cover the hollow portion 15h of the first plate 15-1. The second plate 15-2 according to an example embodiment of the present disclosure may include one or more of a metal material and a nonmetal material (or a composite nonmetal material) having stiffness which is higher than that of the first plate 15-1, but embodiments of the present disclosure are not limited thereto. For example, the metal material of the second plate 15-2 may include any one or more materials of a stainless steel, an aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the second plate 15-2 may include one or more of a plastic, a fiber, a leather, wood, a cloth, and a paper, having stiffness which is higher than that of the first plate 15-1, but is embodiments of the present disclosure are not limited thereto.

The second plate 15-2 according to an example embodiment of the present disclosure may reinforce a mass of the vibration device 11 and decrease a resonance frequency of the vibration device 11 based on an increase in mass, thereby increasing a sound characteristic and/or a sound pressure level characteristic of a low-pitched sound band generated based on a vibration of the vibration device 11 and enhancing the flatness of a sound characteristic.

The vibration plate 15 according to another example embodiment of the present disclosure may include a first region 15A and a second region 15B.

The first region 15A and the second region 15B may include different materials. For example, the first region 15A and the second region 15B may have different stiffnesses. For example, the first region 15A and the second region 15B may include different materials of a metal, a plastic, a fiber, a leather, wood, a cloth, and a paper, but embodiments of the present disclosure are not limited thereto. The stiffness of each of the first region 15A and the second region 15B may increase in a direction from the periphery portion of the vibration plate 15 to a center portion of the vibration plate 15.

The first region 15A may include a region where the vibration device 11 is disposed. The first region 15A may be a region corresponding to the second plate 15-2, or may be a region including the hollow portion 15h of the first plate 15-1.

The second region 15B may include a region surrounding the first region 15A. The second region 15B may be included in the periphery portion of the vibration plate 15. For example, the second region 15B may include a region between the first region 15A and the periphery portion of the first plate 15-1 or the vibration plate 15.

The first region 15A of the vibration plate 15 may have a stiffness which is higher than that of the second region 15B by the second plate 15-2. Therefore, the first region 15A of the vibration plate 15 may have a stiffness which is relatively higher than that of the second region 15B, and thus, may prevent or minimize a divisional vibration (or a break-up vibration) of the vibration device 11, thereby enhancing a sound characteristic and/or a sound pressure level characteristic generated based on a vibration of the vibration device 11. Furthermore, the first region 15A of the vibration plate 15 may reinforce a mass of the vibration device 11 and decrease a resonance frequency of the vibration device 11 based on an increase in mass, thereby increasing a sound characteristic and/or a sound pressure level characteristic of a low-pitched sound band generated based on a vibration of the vibration device 11 and enhancing the flatness of a sound characteristic.

The second region 15B of the vibration plate 15 may have a stiffness which is relatively lower than that of the first region 15A, and thus, may be deformed based on a vibration of the vibration device 11. Accordingly, the second region 15B of the vibration plate 15 may enable a vibration of the vibration plate 15 or the first region 15A to be smoothly performed or may increase a vibration displacement amount (or a bending force) of the vibration plate 15 or the first region 15A, thereby enhancing a sound characteristic and/or a sound pressure level characteristic of a middle-low-pitched sound band generated based on a vibration of the vibration device 11.

Additionally, a vibration plate 15 according to another example embodiment of the present disclosure may further include a third plate 15-3 (dotted line). The vibration plate 15 according to another example embodiment of the present disclosure may further include a third plate 15-3 (dotted line) for further increasing the stiffness of a first region 15A.

The third plate 15-3 may be configured to overlap a second plate 15-2 with a first plate 15-1 therebetween. For example, when the second plate 15-2 is connected or coupled to a first surface of the first plate 15-1, the third plate 15-3 may be connected or coupled to a second surface, which is opposite to the first surface, of the first plate 15-1.

The third plate 15-3 according to another example embodiment of the present disclosure may include one or more materials of a metal material and a nonmetal material (or a composite nonmetal material), but embodiments of the present disclosure are not limited thereto. For example, the third plate 15-3 may include one or more materials, which are the same as or different from those of the second plate 15-2, among a metal material and a nonmetal material (or a composite nonmetal material), but embodiments of the present disclosure are not limited thereto.

The first region 15A of the vibration plate 15 may have a stiffness which is higher than that of the second region 15B by the stacked structure (or the overlapped structure) of the second plate 15-2 and the third plate 15-3, and thus, may prevent or more minimize a divisional vibration (or a break-up vibration) of the vibration device 11, thereby further enhancing a sound characteristic and/or a sound pressure level characteristic generated based on a vibration of the vibration device 11.

The second region 15B of the vibration plate 15 may have a stiffness which is relatively lower than that of the first region 15A, and thus, may be deformed more based on a vibration of the vibration device 11. Accordingly, the second region 15B of the vibration plate 15 may further enable a vibration of the vibration plate 15 or the first region 15A to be further smoothly performed or may more increase a vibration displacement amount (or a bending force) of the vibration plate 15 or the first region 15A, thereby further enhancing a sound characteristic and/or a sound pressure level characteristic of a middle-low-pitched sound band generated based on a vibration of the vibration device 11.

Additionally, it is illustrated that the first region 15A of the vibration plate 15 is configured in a stacked structure (or an overlapped structure) of one plate or two plates, but embodiments of the present disclosure are not limited thereto and the first region 15A of the vibration plate 15 may be configured in a stacked structure (or an overlapped structure) of three or more plates. Accordingly, the first region 15A of the vibration plate 15 may be configured in a stacked structure (or an overlapped structure) of two or more plates.

As described above, in the vibration plate 15 according to another example embodiment of the present disclosure, the stiffness of the first region 15A where the vibration device 11 is disposed may have a stiffness which is higher than that of the second region 15B of the vibration plate 15 surrounding the first region 15A, and thus, a sound characteristic and/or a sound pressure level characteristic of the middle-low-pitched sound band generated based on a vibration of the vibration device 11 may be enhanced.

Figure 27:
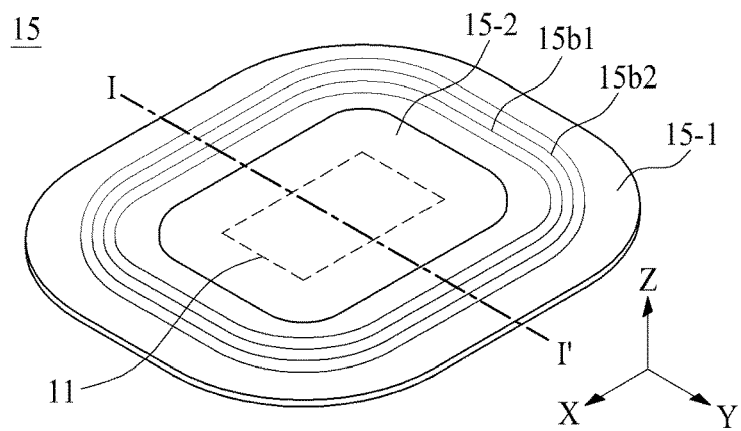
FIG. 27 is a perspective view illustrating a vibration plate according to another example embodiment of the present disclosure.
Figure 28:
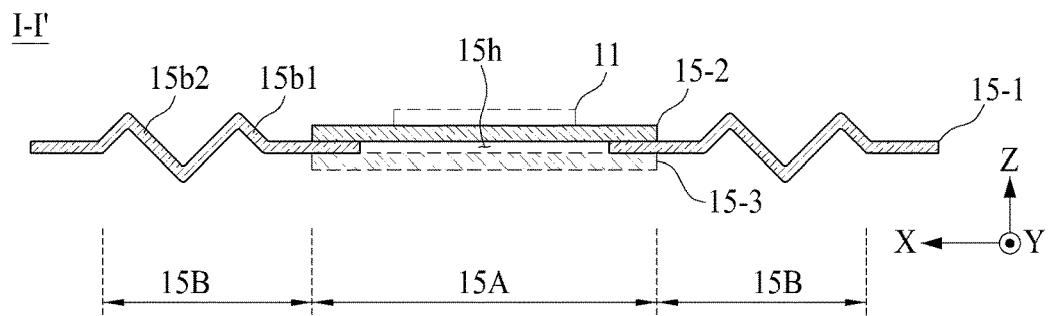
FIG. 28 is an example of a cross-sectional view taken along line I-I' illustrated in FIG. 27.

FIG. 27 is a perspective view illustrating a vibration plate 15 according to another example embodiment of the present disclosure. FIG. 28 is an example of a cross-sectional view taken along line I-I' illustrated in FIG. 27. FIGS. 27 and 28 illustrate an example embodiment where a structure of the first plate in the vibration plate illustrated in FIGS. 25 and 28 is modified. In the following description, therefore, the elements except a first plate and relevant elements are referred to by like reference numerals, and their repetitive descriptions may be omitted for brevity.

With reference to FIGS. 27 and 28, in the vibration plate 15 according to another example embodiment of the present disclosure, a first plate 15-1 may include a plate structure having a certain thickness and may include a hollow portion 15h provided in a first region 15A of the vibration plate 15, and one or more flexural portions (or a plurality of flexural portions) 15b1 and 15b2 provided in a second region 15B of the vibration plate 15.

The hollow portion 15h of the first plate 15-1 may be configured at a center portion of the first plate 15-1. The hollow portion 15h may be configured to have a size which is greater than that of a vibration device 11 and is smaller than that of the second plate 15-2.

The one or more flexural portions (or the plurality of flexural portions) 15b1 and 15b2 may be configured in a closed loop line form which surrounds the first region 15A or the hollow portion 15h. For example, the second region 15B may include a first flexural portion 15b1 surrounding the first region 15A and a second flexural portion 15b2 surrounding the first flexural portion 15b1. For example, the second region 15B may have a stiffness which is lower than that of the first region 15A by the one or more flexural portions (or the plurality of flexural portions) 15b1 and 15b2. The one or more flexural portions (or the plurality of flexural portions) 15b1 and 15b2 may be substantially the same as the one or more flexural portions (or the plurality of flexural portions) 15b1 and 15b2 illustrated in FIGS. 21, 22A, and 22B, and thus, like reference numerals refer to like elements, and their repetitive descriptions may be omitted for brevity.

The one or more flexural portions (or the plurality of flexural portions) 15b1 and 15b2 may be deformed based on a vibration of the vibration device 11. Accordingly, the second region 15B of the vibration plate 15 may enable a vibration of the vibration plate 15 or the first region 15A to be smoothly performed or may increase a vibration displacement amount (or a bending force) of the vibration plate 15 or the first region 15A, thereby enhancing a sound characteristic and/or a sound pressure level characteristic of a middle-low-pitched sound band generated based on a vibration of the vibration device 11.

As described above, a vibration displacement amount (or a bending force) of the vibration plate 15 according to another example embodiment of the present disclosure may increase by the one or more flexural portions 15b1 and 15b2, and thus, a sound characteristic and/or a sound pressure level characteristic of a middle-pitched sound band generated based on a vibration of the vibration device 11 may be enhanced. For example, the vibration apparatuses 10-5, 10-6, and 10-7 including the vibration plate 15 according to another example embodiment of the present disclosure may have a sound pressure level of 56 dB to 85 dB in a pitched sound band of 200 Hz to 20 kHz and may output a sound having flatness of about 29 dB.

Figure 29:
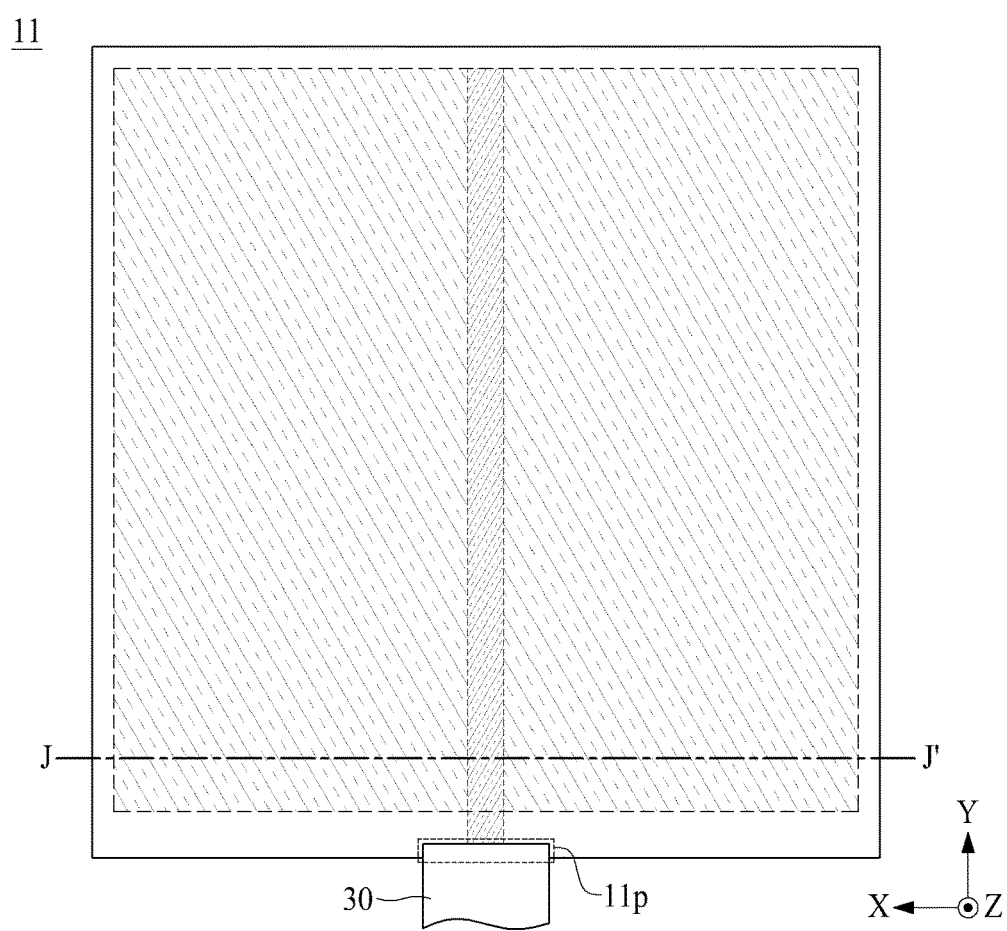
FIG. 29 illustrates a vibration device according to an example embodiment of the present disclosure.
Figure 30:
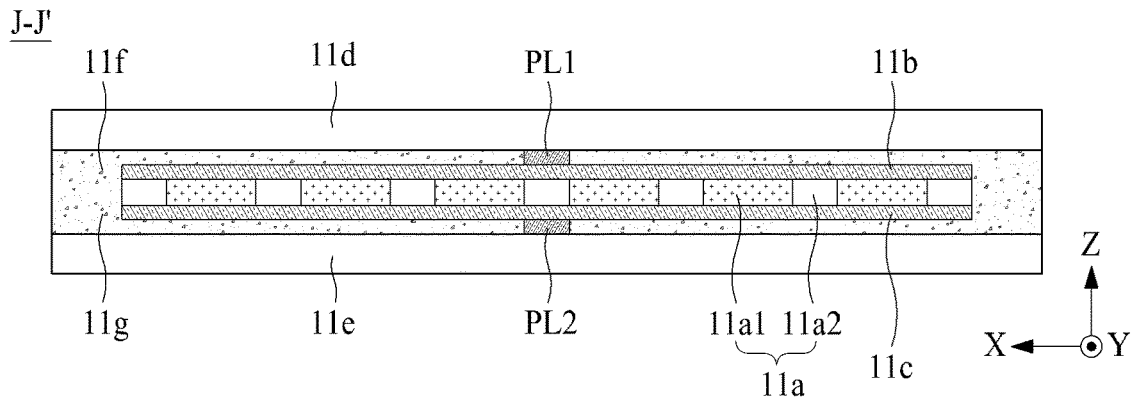
FIG. 30 is an example of a cross-sectional view taken along line J-J' illustrated in FIG. 29.
Figure 31:
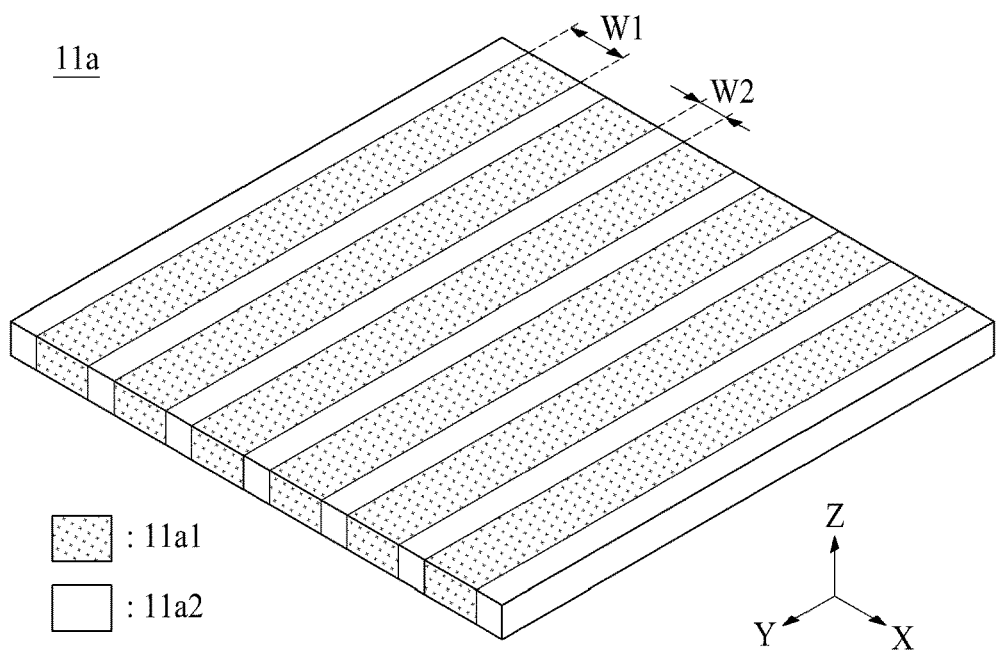
FIG. 31 is an example of a perspective view illustrating a piezoelectric vibration portion illustrated in FIG. 30.

FIG. 29 illustrates a vibration device according to an example embodiment of the present disclosure. FIG. 30 is an example of a cross-sectional view taken along line J-J' illustrated in FIG. 29. FIG. 31 illustrates an example of a piezoelectric vibration portion illustrated in FIG. 30. FIGS. 29 to 31 illustrate another example embodiment of a vibration device illustrated in one or more of FIGS. 1 to 19.

With reference to FIGS. 29 to 31, a vibration device 11 according to an example embodiment of the present disclosure may be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film-type piezoelectric composite actuator, a film speaker, a film-type piezoelectric speaker, or a film-type piezoelectric composite speaker, or the like, but embodiments of the present disclosure are not limited thereto.

The vibration device 11 according to an example embodiment of the present disclosure may include a vibration generating portion which has a piezoelectric vibration portion 11a, a first electrode portion 11b, and a second electrode portion 11c.

The piezoelectric vibration portion 11a may include a piezoelectric material (or an electroactive material) which includes a piezoelectric effect. For example, the piezoelectric material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. The piezoelectric vibration portion 11a may be referred to as a vibration layer, a piezoelectric layer, a piezoelectric material layer, an electroactive layer, a vibration portion, a piezoelectric material portion, an electroactive portion, a piezoelectric structure, a piezoelectric composite layer, a piezoelectric composite, or a piezoelectric ceramic composite, or the like, but embodiments of the present disclosure are not limited thereto. The piezoelectric vibration portion 11a may be formed of a transparent, semitransparent, or opaque piezoelectric material (or an electroactive material) and may be transparent, semitransparent, or opaque.

The piezoelectric vibration portion 11a according to an example embodiment of the present disclosure may include a plurality of first portions 11a1 and a plurality of second portions 11a2. For example, the plurality of first portions 11a1 and the plurality of second portions 11a2 may be alternately and repeatedly arranged along a first direction X (or a second direction Y). For example, the first direction X may be a widthwise direction of the piezoelectric vibration portion 11a, the second direction Y may be a lengthwise direction of the piezoelectric vibration portion 11a, but embodiments of the present disclosure are not limited thereto. For example, the first direction X may be the lengthwise direction of the piezoelectric vibration portion 11a, and the second direction Y may be the widthwise direction of the piezoelectric vibration portion 11a.

Each of the plurality of first portions 11a1 may be configured as an inorganic material portion. The inorganic material portion may include a piezoelectric material, a composite piezoelectric material, or an electroactive material which includes a piezoelectric effect. For example, the first portions 11a1 may be referred to as a piezoelectric portion, a piezoelectric material portion, a composite piezoelectric material portion, an active portion, or an electroactive portion, but embodiments of the present disclosure are not limited thereto.

Each of the plurality of first portions 11a1 may be configured as a ceramic-based material for generating a relatively high vibration, or may be configured as a piezoelectric ceramic having a perovskite crystalline structure.

The perovskite crystalline structure may have a piezoelectric effect and an inverse piezoelectric effect, and may be a plate-shaped structure having orientation. The perovskite crystalline structure may be represented by a chemical formula "$ABO_3$." In the chemical formula, "A" may include a divalent metal element, and "B" may include a tetravalent metal element. For example, in the chemical formula "$ABO_3$," "A," and "B" may be cations, and "O" may be anions. For example, each of the plurality of first portions 11a1 may include one of lead (II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

The first portions 11a1 of the piezoelectric vibration portion 11a according to an example embodiment of the present disclosure may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but embodiments of the present disclosure are not limited thereto. In addition, the first portions 11a1 of the piezoelectric vibration portion 11a may include at least one or more of calcium titanate ($CaTiO_3$), $BaTiO_3$, and $SrTiO_3$, without lead (Pb), but embodiments of the present disclosure are not limited thereto.

Each of the plurality of first portions 11a1 according to an example embodiment of the present disclosure may be disposed between the plurality of second portions 11a2 and may have a first width W1 parallel to the first direction X (or the second direction Y) and a length parallel to the second direction Y (or the first direction X). Each of the plurality of second portions 11a2 may have a second width W2 parallel to the first direction X (or the second direction Y) and may have a length parallel to the second direction Y (or the first direction X). The first width W1 may be the same as or different from the second width W2. For example, the first width W1 may be greater than the second width W2. For example, the first portion 11a1 and the second portion 11a2 may include a line shape or a stripe shape which has the same size or different sizes. Therefore, the piezoelectric vibration portion 11a may include a 2-2 composite structure having a piezoelectric characteristic of a 2-2 vibration mode, and thus, may have a resonance frequency of 20 kHz or less, but embodiments of the present disclosure are not limited thereto. For example, a resonance frequency of the piezoelectric vibration portion 11a may vary based on at least one or more of a shape, a length, and a thickness, or the like.

In the piezoelectric vibration portion 11a, each of the plurality of first portions 11a1 and the plurality of second portions 11a2 may be disposed (or arranged) at the same plane (or the same layer) in parallel. Each of the plurality of second portions 11a2 may be configured to fill a gap between two adjacent first portions of the plurality of first portions 11a1 and may be connected or adhered to a second portion 11a2 adjacent thereto. Therefore, the piezoelectric vibration portion 11a may extend by a desired size or length based on the side coupling (or connection) of the first portion 11a1 and the second portion 11a2.

In the piezoelectric vibration portion 11a, a width (or a size) W2 of each of the plurality of second portions 11a2 may progressively decrease in a direction from a center portion to both peripheries (or both ends) of the piezoelectric vibration portion 11a or the vibration device 11.

According to an example embodiment of the present disclosure, a second portion 11a2, having a largest width W2 among the plurality of second portions 11a2, may be located at a portion at which a highest stress may concentrate when the piezoelectric vibration portion 11a or the vibration device 11 is vibrating in a vertical direction Z (or a thickness direction). A second portion 11a2, having a smallest width W2 among the plurality of second portions 11a2, may be located at a portion where a relatively low stress may occur when the piezoelectric vibration portion 11a or the vibration device 11 is vibrating in the vertical direction Z. For example, the second portion 11a2, having the largest width W2 among the plurality of second portions 11a2, may be disposed at the center portion of the piezoelectric vibration portion 11a, and the second portion 11a2, having the smallest width W2 among the plurality of second portions 11a2 may be disposed at each of the both peripheries of the piezoelectric vibration portion 11a. Therefore, when the piezoelectric vibration portion 11a or the vibration device 11 is vibrating in the vertical direction Z, interference of a sound wave or overlapping of a resonance frequency, each occurring in the portion on which the highest stress concentrates, may be reduced or minimized. Thus, a dip phenomenon of a sound pressure level occurring in the low-pitched sound band may be reduced, thereby improving flatness of a sound characteristic in the low-pitched sound band.

In the piezoelectric vibration portion 11a, each of the plurality of first portions 11a1 may have different sizes (or widths). For example, a size (or a width) of each of the plurality of first portions 11a1 may progressively decrease or increase in a direction from the center portion to the both peripheries (or both ends) of the piezoelectric vibration portion 11a or the vibration device 11. For example, in the piezoelectric vibration portion 11a, a sound pressure level characteristic of a sound may be enhanced and a sound reproduction band may increase or extend, based on various natural vibration frequencies according to a vibration of each of the plurality of first portions 11a1 having different sizes.

The plurality of second portions 11a2 may be disposed between the plurality of first portions 11a1. Therefore, in the piezoelectric vibration portion 11a or the vibration device 11, vibration energy by a link in a unit lattice of the first portion 11a1 may increase by a corresponding second portion 11a2, and thus, a vibration characteristic may increase, and a piezoelectric characteristic and flexibility may be secured. For example, the second portion 11a2 may include one or more of an epoxy-based polymer, an acrylic-based polymer, and a silicone-based polymer, but embodiments of the present disclosure are not limited thereto.

The plurality of second portions 11a2 according to an example embodiment of the present disclosure may be configured as an organic material portion. For example, the organic material portion may be disposed between the inorganic material portions, and thus, may absorb an impact applied to the inorganic material portion (or the first portion), may release a stress concentrating on the inorganic material portion to enhance the total durability of the piezoelectric vibration portion 11a or the vibration device 11, and may provide flexibility to the piezoelectric vibration portion 11a or the vibration device 11.

The plurality of second portions 11a2 according to an example embodiment of the present disclosure may have modulus (or Young's modulus) and viscoelasticity that are lower than those of each first portion 11a1, and thus, the second portion 11a2 may enhance the reliability of each first portion 11a1 vulnerable to an impact due to a fragile characteristic. For example, the second portion 11a2 may be configured as a material having a loss coefficient of about 0.01 to about 1 and modulus of about 0.1 GPa (Giga Pascal) to about 10 GPa (Giga Pascal).

The organic material portion configured at the second portion 11a2 may include one or more of an organic material, an organic polymer, an organic piezoelectric material, or an organic non-piezoelectric material that has a flexible characteristic in comparison with the inorganic material portion of the first portions 11a1. For example, the second portion 11a2 may be referred to as an adhesive portion, an elastic portion, a bending portion, a damping portion, or a flexible portion each having flexibility, but embodiments of the present disclosure are not limited thereto.

The plurality of first portions 11a1 and the second portion 11a2 may be disposed on (or connected to) the same plane, and thus, the piezoelectric vibration portion 11a according to an example embodiment of the present disclosure may have a single thin film-type. For example, the piezoelectric vibration portion 11a may have a structure in which a plurality of first portions 11a1 are connected to one side (or one portion). For example, the plurality of first portions 11a1 may have a structure connected to an entirety of the piezoelectric vibration portion 11a. For example, the piezoelectric vibration portion 11a may be vibrated in a vertical direction by the first portion 11a1 having a vibration characteristic and may be bent in a curved shape by the second portion 11a2 having flexibility. In addition, in the piezoelectric vibration portion 11a according to an example embodiment of the present disclosure, a size of the first portion 11a1 and a size of the second portion 11a2 may be adjusted based on a piezoelectric characteristic and flexibility needed for the piezoelectric vibration portion 11a or the vibration device 11. As an example embodiment of the present disclosure, when the piezoelectric vibration portion 11a needs a piezoelectric characteristic rather than flexibility, a size of the first portion 11a1 may be adjusted to be greater than that of the second portion 11a2. As another example embodiment of the present disclosure, when the piezoelectric vibration portion 11a needs flexibility rather than a piezoelectric characteristic, a size of the second portion 11a2 may be adjusted to be greater than that of the first portion 11a1. Accordingly, a size of the piezoelectric vibration portion 11a may be adjusted based on a characteristic needed therefor, and thus, the piezoelectric vibration portion 11a may be easy to design.

The first electrode portion 11b may be disposed at a first surface (or an upper surface) of the piezoelectric vibration portion 11a. The first electrode portion 11b may be disposed at or coupled to a first surface of each of a plurality of first portions 11a1 and a first surface of each of a plurality of second portions 11a2 in common and may be electrically connected to the first surface of each of the plurality of first portions 11a1. For example, the first electrode portion 11b may be a single-body electrode (or a common electrode) shape which is disposed at a whole first surface of the piezoelectric vibration portion 11a. For example, the first electrode portion 11b may have substantially the same shape as that of the piezoelectric vibration portion 11a, but embodiments of the present disclosure are not limited thereto.

The first electrode portion 11b according to an example embodiment of the present disclosure may be formed of a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include an aluminum (Al), a copper (Cu), a gold (Au), a silver (Ag), a molybdenum (Mo), a magnesium (Mg), or the like, or an alloy thereof, but embodiments of the present disclosure are not limited thereto.

The second electrode portion 11c may be disposed at a second surface (or a rear surface) different from (or opposite to) the first surface of the piezoelectric vibration portion 11a. The second electrode portion 11c may be disposed at or coupled to a second surface of each of a plurality of first portions 11a1 and the second surface of each of a plurality of second portions 11a2 in common and may be electrically connected to a second surface of each of the plurality of first portions 11a1. For example, the second electrode portion 11c may be a single-body electrode (or a common electrode) shape which is disposed at a whole second surface of the piezoelectric vibration portion 11a. The second electrode portion 11c may have the same shape as the piezoelectric vibration portion 11a, but embodiments of the present disclosure are not limited thereto. The second electrode portion 11c according to an example embodiment of the present disclosure may be formed of a transparent conductive material, a semitransparent conductive material, or an opaque conductive material. For example, the second electrode portion 11c may be formed of the same material as the first electrode portion 11b, but embodiments of the present disclosure are not limited thereto. As another example embodiment of the present disclosure, the second electrode portion 11c may be formed of a different material than the first electrode portion 11b.

The piezoelectric vibration portion 11a may be polarized (or poling) by a certain voltage applied to the first electrode portion 11b and the second electrode portion 11c in a certain temperature atmosphere, or a temperature atmosphere that may be changed from a high temperature to a room temperature, but embodiments of the present disclosure are not limited thereto. For example, the piezoelectric vibration portion 11a may alternately and repeatedly contract and expand based on an inverse piezoelectric effect according to a sound signal (or a voice signal) applied to the first electrode portion 11b and the second electrode portion 11c from the outside to vibrate. For example, the piezoelectric vibration portion 11a may vibrate based on a vertical-direction vibration d33 and a planar direction vibration d31 by the first electrode portion 11b and the second electrode portion 11c. The piezoelectric vibration portion 11a may increase the displacement of a vibration member (or a vibration plate or a vibration object) by contraction and expansion of the planar direction, thereby further improving the vibration.

The vibration device 11 according to an example embodiment of the present disclosure may further include a first cover member 11d and a second cover member 11e.

The first cover member 11d may be disposed at the first surface of the vibration device 11. For example, the first cover member 11d may be configured to cover the first electrode portion 11b. Accordingly, the first cover member 11d may protect the first electrode portion 11b and/or the piezoelectric vibration portion 11a.

The second cover member 11e may be disposed at the second surface of the vibration device 11. For example, the second cover member 11e may be configured to cover the second electrode portion 11c. Accordingly, the second cover member 11e may protect the second electrode portion 11c and/or the piezoelectric vibration portion 11a.

The first cover member 11d and the second cover member 11e according to an example embodiment of the present disclosure may each include one or more material of a plastic, a fiber, and wood, but embodiments of the present disclosure are not limited thereto. For example, each of the first cover member 11d and the second cover member 11e may include the same or different material. For example, each of the first cover member 11d and the second cover member 11e may be a polyimide (PI) film or a polyethylene terephthalate (PET) film, but embodiments of the present disclosure are not limited thereto.

The first cover member 11d according to an example embodiment of the present disclosure may be connected or coupled to the first electrode portion 11b by a first adhesive layer 11f. For example, the first cover member 11d may be connected or coupled to the first electrode portion 11b by a film laminating process using the first adhesive layer 11f.

The second cover member 11e according to an example embodiment of the present disclosure may be connected or coupled to the second electrode portion 11c by a second adhesive layer 11g. For example, the second cover member 11e may be connected or coupled to the second electrode portion 11c by a film laminating process using the second adhesive layer 11g.

The first adhesive layer 11f may be disposed between the first electrode portion 11b and the first cover member 11d. The second adhesive layer 11g may be disposed between the second electrode portion 11c and the second cover member 11e. For example, the first adhesive layer 11f and second adhesive layer 11g may be configured between the first cover member 11d and the second cover member 11e to completely surround the piezoelectric vibration portion 11a, the first electrode portion 11b, and the second electrode portion 11c. For example, the piezoelectric vibration portion 11a, the first electrode portion 11b, and the second electrode portion 11c may be embedded or built-in between the first adhesive layer 11f and the second adhesive layer 11g.

Each of the first adhesive layer 11f and second adhesive layer 11g according to an example embodiment of the present disclosure may include an electric insulating material which has adhesiveness and is capable of compression and decompression. For example, each of the first adhesive layer 11f and the second adhesive layer 11g may include an epoxy resin, an acrylic resin, a silicone resin, or a urethane resin, but embodiments of the present disclosure are not limited thereto.

According to an example embodiment of the present disclosure, any one of the first cover member 11d and the second cover member 11e may be attached to or coupled to the vibration member (or the vibration plate or the vibration object) by an adhesive member. For example, any one of the first cover member 11d and the second cover member 11e may be attached to or coupled to the vibration member (or the vibration plate or the vibration object) by the adhesive member 12 as described above with reference to FIGS. 1 to 8, or may be attached to or coupled to the vibration plate by the adhesive member 12 as described above with reference to FIGS. 9 to 19.

The vibration device 11 according to an example embodiment of the present disclosure may further include a first power supply line PL1, a second power supply line PL2, and a pad part 11p.

The first power supply line PL1 may be disposed between the first electrode portion 11b and the first cover member 11d and may be electrically connected to the first electrode portion 11b. For example, the first power supply line PL1 may be disposed at the first cover member 11d. The first power supply line PL1 may be extended long in the second direction Y and may be electrically connected to a central portion of the first electrode portion 11b. As an example embodiment of the present disclosure, the first power supply line PL1 may be electrically connected to the first electrode portion 11b by an anisotropic conductive film. As another example embodiment of the present disclosure, the first power supply line PL1 may be electrically connected to the first electrode portion 11b through a conductive material (or particle) included in the first adhesive layer 11f.

The second power supply line PL2 may be disposed between the second electrode portion 11c and the second cover member 11e and may be electrically connected to the second electrode portion 11c. For example, the second power supply line PL2 may be disposed at the second cover member 11e. The second power supply line PL2 may be extended long along the second direction Y and may be electrically connected to a central portion of the second electrode portion 11c. As an example embodiment of the present disclosure, the second power supply line PL2 may be electrically connected to the second electrode portion 11c by an anisotropic conductive film. As another example embodiment of the present disclosure, the second power supply line PL2 may be electrically connected to the second electrode portion 11c through a conductive material (or particle) included in the second adhesive layer 11g. For example, the second power supply line PL2 may be disposed not to overlap the first power supply line PL1. When the second power supply line PL2 is disposed not to overlap the first power supply line PL1, a short circuit (or a short) between the first power supply line PL1 and the second power supply line PL2 may be prevented.

The pad part 11p may be configured to be electrically connected to the first power supply line PL1 and the second power supply line PL2. The pad part 11p may be configured at one periphery portion of any one of the first cover member 11d and the second cover member 11e to be electrically connected to one portion (or one end) of each of the first power supply line PL1 and the second power supply line PL2.

The pad part 11p according to an example embodiment of the present disclosure may include a first pad electrode electrically connected to one end of the first power supply line PL1, and a second pad electrode electrically connected to one end of the second power supply line PL2.

The first pad electrode may be disposed at one periphery portion of any one of the first cover member 11d and the second cover member 11e to be electrically connected to one portion of the first power supply line PL1. For example, the first pad electrode may pass through any one of the first cover member 11d and the second cover member 11e and may be electrically connected to one portion of the first power supply line PL1.

The second pad electrode may be disposed in parallel with the first pad electrode and may be electrically connected to one portion of the second power supply line PL2. For example, the second pad electrode may pass through any one of the first cover member 11d and the second cover member 11e and may be electrically connected to one portion of the second power supply line PL2.

According to an example embodiment of the present disclosure, each of the first power supply line PL1, the second power supply line PL2, and the pad part 11p may be configured to be transparent, translucent, or opaque.

The pad part 11p according to another example embodiment of the present disclosure may be electrically connected to a signal cable 30.

The signal cable 30 may be electrically connected to the pad part 11p disposed at the vibration device 11 and may supply the vibration device 11 with vibration driving signals (or a sound signal or a voice signal) provided from a sound processing circuit. The signal cable 30 according to an example embodiment of the present disclosure may include a first terminal electrically connected to a first pad electrode of the pad part 11p and a second terminal electrically connected to a second pad electrode of the pad part 11p. For example, the signal cable 30 may be configured as a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The sound processing circuit may generate an alternating current (AC) vibration driving signal including a first vibration driving signal and a second vibration driving signal based on a sound data provided from an external sound data generating circuit part. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode portion 11b through a first terminal of the signal cable 30, the first pad electrode of the pad part 11p, and the first power supply line PL1. The second vibration driving signal may be supplied to the second electrode portion 11c through a second terminal of the signal cable 30, the second pad electrode of the pad part 11p, and the second power supply line PL2.

According to an example embodiment of the present disclosure, the signal cable 30 may be configured to be transparent, semitransparent, or opaque.

As described above, the vibration device 11 according to an example embodiment of the present disclosure may be implemented as a thin film where the first portion 11a1 having a piezoelectric characteristic and a second portion 11a2 having flexibility are alternately repeated and connected, and thus, may be bent in a shape corresponding to a shape of the vibration member or the vibration object. For example, when the vibration device 11 is connected or coupled to the vibration member including various curved portions by an adhesive member, the vibration device 11 may be bent in a curved shape along a shape of a curved portion of the vibration member and reliability against damage or breakdown may not be reduced despite being bent in a curved shape. In addition, the vibration device 11 according to an example embodiment of the present disclosure may have a modulus which is greater than that of the adhesive member, and thus, may easily vibrate the vibration member including the various curved portions. Accordingly, the reliability of sound reproduction may be enhanced, and a sound characteristic and/or a sound pressure level characteristic in the low-pitched sound band generated based on a vibration of the vibration member may be enhanced.

FIGS. 32A to 32D are perspective views illustrating a piezoelectric vibration portion according to other example embodiments of the present disclosure, in a vibration device according to an example embodiment of the present disclosure.

Figure 32A:
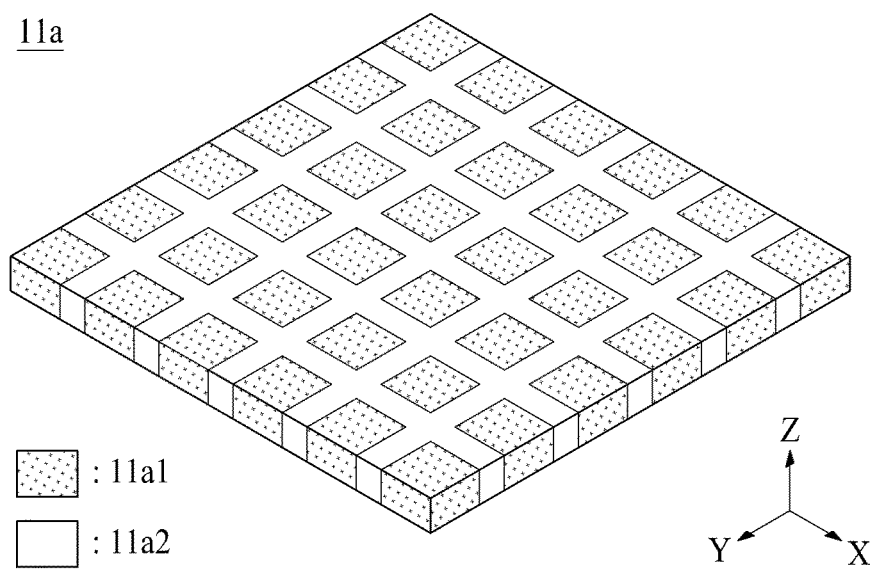
FIG. 32A illustrates a piezoelectric portion according to another example embodiment of the present disclosure.

With reference to FIG. 32A, the piezoelectric vibration portion 11a according to another example embodiment of the present disclosure may include a plurality of first portions 11a1, which are spaced apart from one another along a first direction X and a second direction Y, and a second portion 11a2 (or one or more second portions) disposed between the plurality of first portions 11a1.

Each of the plurality of first portions 11a1 may be disposed to be spaced apart from one another along the first direction X and the second direction Y. For example, each of the plurality of first portions 11a1 may have a hexahedral shape (or a six-sided object shape) having the same size and may be disposed in a lattice shape. Each of the plurality of first portions 11a1 may include a piezoelectric material which is substantially the same as the first portion 11a1 described above with reference to FIGS. 29 to 31, and thus, like reference numerals refer to like elements, and their repetitive descriptions may be omitted for brevity.

The second portion 11a2 may be disposed between the plurality of first portions 11a1 along each of the first direction X and the second direction Y. The second portion 11a2 may be configured to fill a gap or a space between two adjacent first portions 11a1 or to surround each of the plurality of first portions 11a1, and thus, may be connected or adhered to an adjacent first portion 11a1. According to an example embodiment of the present disclosure, a width of a second portion 11a2 disposed between two first portions 11a1 adjacent to each other along the first direction X may be the same as or different from a width of the first portion 11a1, and the width of a second portion 11a2 disposed between two first portions 11a1 adjacent to each other along the second direction Y may be the same as or different from the width of the first portion 11a1. The second portion 11a2 may include an organic material which is substantially the same as the second portion 11a2 described above with reference to FIGS. 29 to 31, and thus, like reference numerals refer to like elements, and their repetitive descriptions may be omitted for brevity.

As described above, the piezoelectric vibration portion 11a according to another example embodiment of the present disclosure may include a 1-3 composite structure having a piezoelectric characteristic of a 1-3 vibration mode, and thus, may have a resonance frequency of 30 MHz or less, but embodiments of the present disclosure are not limited thereto. For example, a resonance frequency of the piezoelectric vibration portion 11a may vary based on at least one or more of a shape, a length, and a thickness, or the like.

Figure 32B:
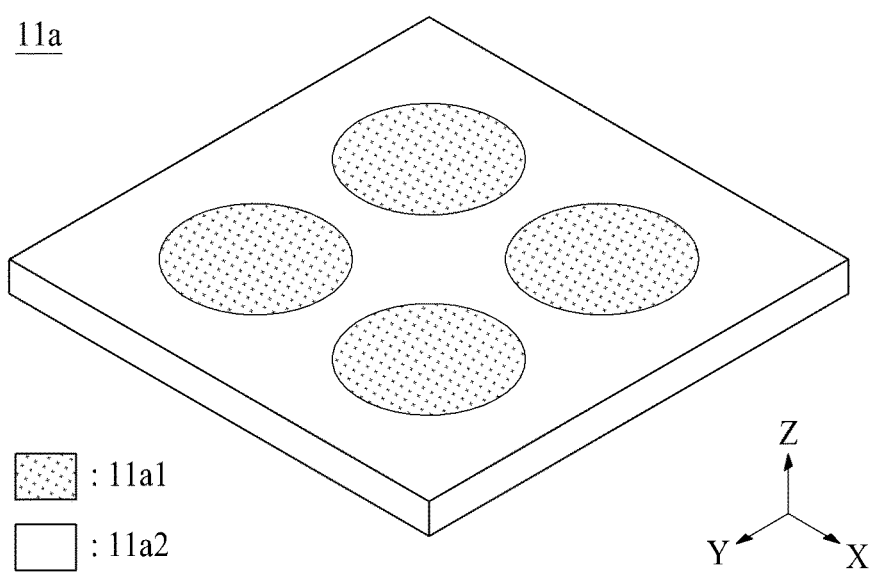
FIG. 32B illustrates a piezoelectric portion according to another example embodiment of the present disclosure.

With reference to FIG. 32B, the piezoelectric vibration portion 11a according to another example embodiment of the present disclosure may include a plurality of first portions 11a1, which are spaced apart from one another along a first direction X and a second direction Y, and a second portion (or one or more second portions) 11a2 disposed between the plurality of first portions 11a1.

Each of the plurality of first portions 11a1 may have a flat structure of a circular shape. For example, each of the plurality of first portions 11a1 may have a circular plate shape, but embodiments of the present disclosure are not limited thereto. For example, each of the plurality of first portions 11a1 may have a dot shape including an oval shape, a polygonal shape, or a donut shape. Each of the plurality of first portions 11a1 may include a piezoelectric material which is substantially the same as the first portion 11a1 described above with reference to FIGS. 29 to 31, and thus, like reference numerals refer to like elements, and their repetitive descriptions may be omitted for brevity.

The second portion 11a2 may be disposed between the plurality of first portions 11a1 along each of the first direction X and the second direction Y. The second portion 11a2 may be configured to surround each of the plurality of first portions 11a1, and thus, may be connected or adhered to a side surface of each of the plurality of first portions 11a1. Each of the plurality of first portions 11a1 and the second portion 11a2 may be disposed (or arranged) in parallel on the same plane (or the same layer). The second portion 11a2 may include an organic material which is substantially the same as the second portion 11a2 described above with reference to FIGS. 29 to 31, and thus, like reference numerals refer to like elements, and their repetitive descriptions may be omitted for brevity.

Figure 32C:
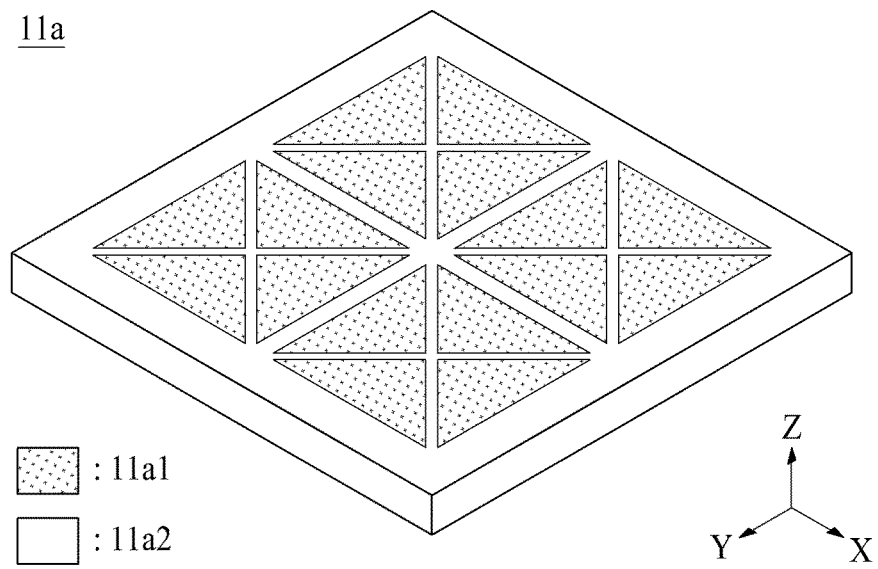
FIG. 32C illustrates a piezoelectric portion according to another example embodiment of the present disclosure.

With reference to FIG. 32C, the piezoelectric vibration portion 11a according to another example embodiment of the present disclosure may include a plurality of first portions 11a1, which are spaced apart from one another along a first direction X and a second direction Y, and a second portion (or one or more second portions) 11a2 disposed between the plurality of first portions 11a1.

Each of the plurality of first portions 11a1 may have a flat structure of a triangular shape. For example, each of the plurality of first portions 11a1 may have a triangular plate shape, but embodiments of the present disclosure are not limited thereto. Each of the plurality of first portions 11a1 may include a piezoelectric material which is substantially the same as the first portion 11a1 described above with reference to FIGS. 29 to 31, and thus, like reference numerals refer to like elements, and their repetitive descriptions may be omitted for brevity.

According to an example embodiment of the present disclosure, four adjacent first portions 11a1 among the plurality of first portions 11a1 may be adjacent to one another to form a tetragonal (or quadrilateral shape or a square shape). Vertices of the four adjacent first portions 11a1 forming a tetragonal shape may be adjacent to one another in a center portion (or a central portion) of the tetragonal shape.

The second portion 11a2 may be disposed between the plurality of first portions 11a1 along each of the first direction X and the second direction Y. The second portion 11a2 may be configured to surround each of the plurality of first portions 11a1, and thus, may be connected or adhered to a side surface of each of the plurality of first portions 11a1. Each of the plurality of first portions 11a1 and the second portion 11a2 may be disposed (or arranged) in parallel on the same plane (or the same layer). The second portion 11a2 may include an organic material which is substantially the same as the second portion 11a2 described above with reference to FIGS. 29 to 31, and thus, like reference numerals refer to like elements, and their repetitive descriptions may be omitted for brevity.

Figure 32D:
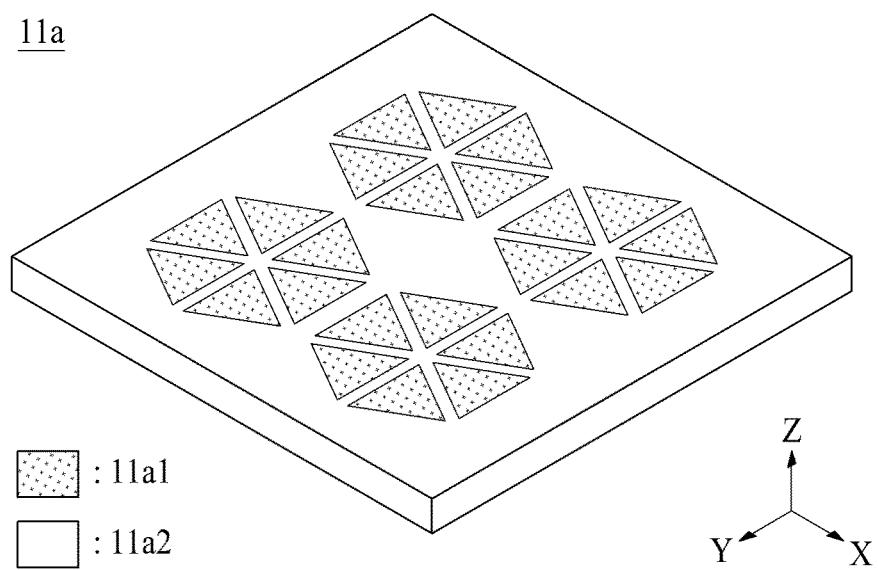
FIG. 32D illustrates a piezoelectric portion according to another example embodiment of the present disclosure.

With reference to FIG. 32D, the piezoelectric vibration portion 11a according to another example embodiment of the present disclosure may include a plurality of first portions 11a1, which are spaced apart from one another along a first direction X and a second direction Y, and a second portion (or one or more second portions) 11a2 disposed between the plurality of first portions 11a1.

Each of the plurality of first portions 11a1 may have a flat structure of a triangular shape. For example, each of the plurality of first portions 11a1 may have a triangular plate shape, but embodiments of the present disclosure are not limited thereto. Each of the plurality of first portions 11a1 may include a piezoelectric material which is substantially the same as the first portion 11a1 described above with reference to FIGS. 29 to 31, and thus, like reference numerals refer to like elements, and their repetitive descriptions may be omitted for brevity.

According to another example embodiment of the present disclosure, six adjacent first portions 11a1 of the plurality of first portions 11a1 may be adjacent to one another to form a hexagonal shape (or a regularly hexagonal shape). Vertices of the six adjacent first portions 11a1 forming a hexagonal shape may be adjacent to one another in a center portion (or a central portion) of the hexagonal shape.

The second portion 11a2 may be disposed between the plurality of first portions 11a1 along each of the first direction X and the second direction Y. The second portion 11a2 may be configured to surround each of the plurality of first portions 11a1, and thus, may be connected or adhered to a side surface of each of the plurality of first portions 11a1. Each of the plurality of first portions 11a1 and the second portion 11a2 may be disposed (or arranged) in parallel on the same plane (or the same layer). The second portion 11a2 may include an organic material which is substantially the same as the second portion 11a2 described above with reference to FIGS. 29 to 31, and thus, like reference numerals refer to like elements, and their repetitive descriptions may be omitted for brevity.

Figure 33:
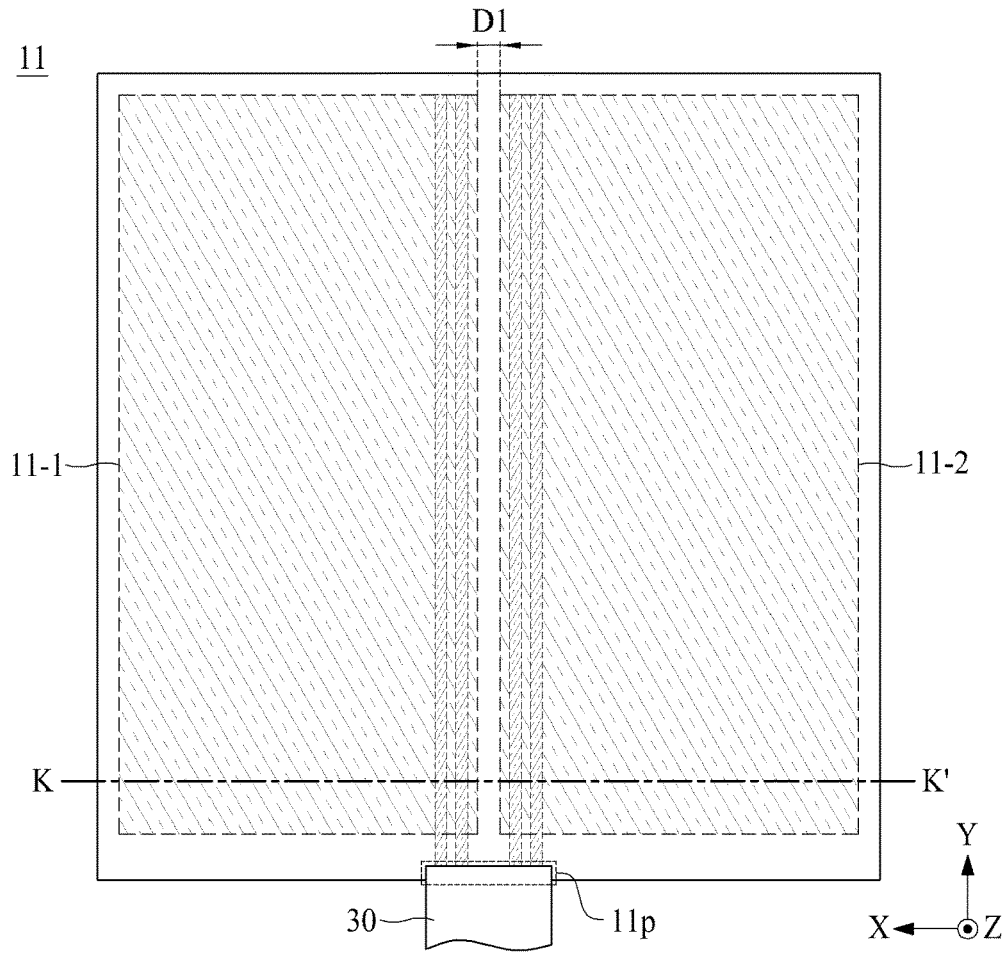
FIG. 33 illustrates a vibration device according to another example embodiment of the present disclosure.
Figure 34:
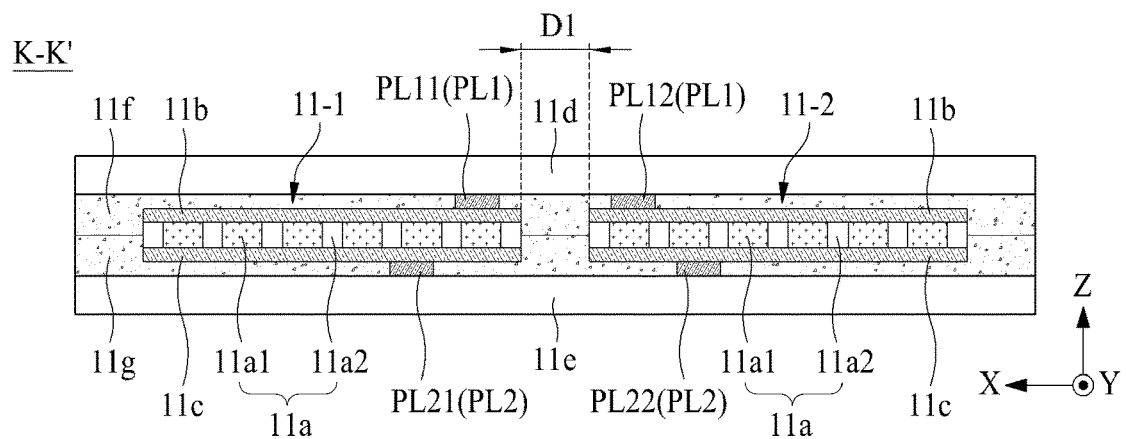
FIG. 34 is an example of a cross-sectional view taken along line K-K' illustrated in FIG. 33.

FIG. 33 illustrates a vibration device according to another example embodiment of the present disclosure, and FIG. 34 is an example of a cross-sectional view taken along line K-K' illustrated in FIG. 33. FIGS. 33 and 34 illustrate another example embodiment where the vibration device illustrated in one or more of FIGS. 1 to 19 is modified.

With reference to FIGS. 33 and 34, the vibration device 11 according to another example embodiment of the present disclosure may include first and second vibration generating portions 11-1 and 11-2.

The first and second vibration generating portions 11-1 and 11-2 may be electrically separated and disposed while being spaced apart from each other along a first direction X. The first and second vibration generating portions 11-1 and 11-2 may alternately and repeatedly contract and/or expand based on a piezoelectric effect to vibrate. For example, the first and second vibration generating portions 11-1 and 11-2 may be disposed or tiled at a certain interval (or distance) D1 along the first direction X. Thus, the vibration device 11 in which the first and second vibration generating portions 11-1 and 11-2 are tiled may be a vibration array, a vibration array portion, a vibration module array portion, a vibration array structure, a tiling vibration array, a tiling vibration array module, or a tiling vibration film, but embodiments of the present disclosure are not limited thereto.

Each of the first and second vibration generating portions 11-1 and 11-2 according to an example embodiment of the present disclosure may have a tetragonal shape. For example, each of the first and second vibration generating portions 11-1 and 11-2 may have a tetragonal shape having a width of about 5 cm or more. For example, each of the first and second vibration generating portions 11-1 and 11-2 may have a square shape having a size of 5 cm×5 cm or more, but embodiments of the present disclosure are not limited thereto.

Each of the first and second vibration generating portions 11-1 and 11-2 may be arranged or tiled on the same plane, and thus, the vibration device 11 may have an enlarged area by tiling of the first and second vibration generating portions 11-1 and 11-2 having a relatively small size.

Each of the first and second vibration generating portions 11-1 and 11-2 may be arranged or tiled at a certain interval (or distance) D1, and thus, may be implemented as one vibration apparatus (or a single vibration apparatus) which is driven as one complete single-body without being independently driven. According to an example embodiment of the present disclosure, with respect to the first direction X, a first separation distance (or first distance or first interval) D1 between the first and second vibration generating portions

11-1 and 11-2 may be 0.1 mm or more and less than 3 cm, but embodiments of the present disclosure are not limited thereto.

According to an example embodiment of the present disclosure, each of the first and second vibration generating portions 11-1 and 11-2 may be disposed or tiled to have the first separation distance (or an interval) D1 of 0.1 mm or more and less than 3 cm, and thus, may be driven as one vibration apparatus, thereby increasing a reproduction band of a sound and a sound pressure level characteristic of a sound which is generated by interconnecting a single-body vibration of the first and second vibration generating portions 11-1 and 11-2. For example, the first and second vibration generating portions 11-1 and 11-2 may be disposed in an first separation distance (or an interval) D1 of 0.1 mm or more and less than 5 mm, in order to increase a reproduction band of a sound generated by interconnecting a single-body vibration of the first and second vibration generating portions 11-1 and 11-2 and to increase a sound of a low-pitched sound band (for example, a sound pressure level characteristic in 500 Hz or less).

According to an example embodiment of the present disclosure, when the first and second vibration generating portions 11-1 and 11-2 are disposed in the first separation distance (or an interval) D1 of less than 0.1 mm or without the first separation distance (or an interval) D1, the reliability of the first and second vibration generating portions 11-1 and 11-2 or the vibration device 11 may be reduced due to damage or a crack caused by a physical contact therebetween which occurs when each of the first and second vibration generating portions 11-1 and 11-2 vibrates.

According to an example embodiment of the present disclosure, when the first and second vibration generating portions 11-1 and 11-2 are disposed in the first separation distance (or an interval) D1 of 3 cm or more, the first and second vibration generating portions 11-1 and 11-2 may not be driven as one vibration apparatus due to an independent vibration of each of the first and second vibration generating portions 11-1 and 11-2. Therefore, a reproduction band of a sound and a sound pressure level characteristic of a sound which is generated by vibrations of the first and second vibration generating portions 11-1 and 11-2 may be reduced. For example, when the first and second vibration generating portions 11-1 and 11-2 are disposed in the first separation distance (or an interval) D1 of 3 cm or more, a sound characteristic and a sound pressure level characteristic of the low-pitched sound band (for example, in 500 Hz or less) may each be reduced.

According to an example embodiment of the present disclosure, when the first and second vibration generating portions 11-1 and 11-2 are disposed in an interval of 5 mm, each of the first and second vibration generating portions 11-1 and 11-2 may not be driven as one vibration apparatus, and thus, a sound characteristic and a sound pressure level characteristic of the low-pitched sound band (for example, in 200 Hz or less) may each be reduced.

According to another example embodiment of the present disclosure, when the first and second vibration generating portions 11-1 and 11-2 are disposed in an interval of 1 mm, each of the first and second vibration generating portions 11-1 and 11-2 may be driven as one vibration apparatus, and thus, a reproduction band of a sound may increase and a sound of the low-pitched sound band (for example, a sound pressure level characteristic in 500 Hz or less) may increase. For example, when the first and second vibration generating portions 11-1 and 11-2 are disposed in an interval of 1 mm, the vibration device 11 may be implemented as a large-area vibrator which is enlarged based on optimization of a separation distance between the first and second vibration generating portions 11-1 and 11-2. Therefore, the vibration device 11 may be driven as a large-area vibrator based on a single-body vibration of the first and second vibration generating portions 11-1 and 11-2, and thus, a sound characteristic and a sound pressure level characteristic in the low-pitched sound of a sound generated by interconnecting a large-area vibration of the vibration device 11 may each increase or a reproduction band may be enhanced.

Therefore, to implement a single-body vibration (or one vibration apparatus) of the first and second vibration generating portions 11-1 and 11-2, a first separation distance D1 between the first and second vibration generating portions 11-1 and 11-2 may be adjusted to 0.1 mm or more and less than 3 cm. In addition, to implement a single-body vibration (or one vibration apparatus) of the first and second vibration generating portions 11-1 and 11-2 and to increase a sound pressure level characteristic of a sound of the low-pitched sound band, the first separation distance D1 between the first and second vibration generating portions 11-1 and 11-2 may be adjusted to 0.1 mm or more and less than 5 mm.

Each of the first and second vibration generating portions 11-1 and 11-2 according to an example embodiment of the present disclosure may include a piezoelectric vibration portion 11a, a first electrode portion 11b, and a second electrode portion 11c.

The piezoelectric vibration portion 11a of each of the first and second vibration generating portions 11-1 and 11-2 may include a piezoelectric material (or an electroactive material) including a piezoelectric effect. For example, the piezoelectric vibration portion 11a of each of the first and second vibration generating portions 11-1 and 11-2 may be configured substantially the same as any one of the piezoelectric vibration portion 11a described above with reference to FIGS. 31, and 32A to 32D, and thus, a like reference numeral refers to a like element, and the repetitive description thereof may be omitted for brevity.

According to an example embodiment of the present disclosure, each of the first and second vibration generating portions 11-1 and 11-2 may include any one piezoelectric vibration portion 11a of the piezoelectric vibration portion 11a described above with reference to FIGS. 31, and 32A to 32D, or may include different piezoelectric vibration portion 11a.

The first electrode portion 11b may be disposed at a first surface of the piezoelectric vibration portion 11a and may be electrically connected to the first surface of the piezoelectric vibration portion 11a. For example, the first electrode portion 11b may be substantially the same as the first electrode portion 11b described above with reference to FIG. 30, and thus, a like reference numeral refers to a like element, and the repetitive description thereof may be omitted for brevity.

The second electrode portion 11c may be disposed at a second surface of the piezoelectric vibration portion 11a and electrically connected to the second surface of the piezoelectric vibration portion 11a. The second electrode portion 11c may be substantially the same as the second electrode portion 11c described above with reference to FIG. 30, and thus, a like reference numeral refers to a like element, and the repetitive description thereof may be omitted for brevity.

The vibration device 11 according to an example embodiment of the present disclosure may further include a first cover member 11d and a second cover member 11e.

The first cover member 11d may be disposed at the first surface of the vibration device 11. For example, the first cover member 11d may cover the first electrode portion 11b which is disposed at a first surface of each of the first and second vibration generating portions 11-1 and 11-2, and thus, the first cover member 11d may be commonly connected to the first surface of each of the first and second vibration generating portions 11-1 and 11-2 or may commonly support the first surface of each of the first and second vibration generating portions 11-1 and 11-2. Accordingly, the first cover member 11d may protect the first surface or the first electrode portion 11b of each of the first and second vibration generating portions 11-1 and 11-2.

The second cover member 11e may be disposed at the second surface of the vibration device 11. For example, the second cover member 11e may cover the second electrode portion 11c which is disposed at a second surface of each of the first and second vibration generating portions 11-1 and 11-2, and thus, the second cover member 11e may be commonly connected to the second surface of each of the first and second vibration generating portions 11-1 and 11-2 or may commonly support the second surface of each of the first and second vibration generating portions 11-1 and 11-2. Accordingly, the second cover member 11e may protect the second surface or the second electrode portion 11c of each of the first and second vibration generating portions 11-1 and 11-2.

The first cover member 11d and the second cover member 11e according to an example embodiment of the present disclosure may each include one or more materials of a plastic, a fiber, and wood, but embodiments of the present disclosure are not limited thereto. For example, each of the first cover member 11d and the second cover member 11e may include the same material or different material. For example, each of the first cover member 11d and the second cover member 11e may be a polyimide (PI) film or a polyethylene terephthalate (PET) film, but embodiments of the present disclosure are not limited thereto.

The first cover member 11d according to an example embodiment of the present disclosure may be disposed at the first surface of each of the first and second vibration generating portions 11-1 and 11-2 by a first adhesive layer 11f. For example, the first cover member 11d may be directly disposed at the first surface of each of the first and second vibration generating portions 11-1 and 11-2 by a film laminating process using the first adhesive layer 11f. Accordingly, each of the first and second vibration generating portions 11-1 and 11-2 may be integrated (or disposed) or tiled with the first cover member 11d to have the certain first separation distance (or an interval) D1.

The second cover member 11e according to an example embodiment of the present disclosure may be disposed at the second surface of each of the first and second vibration generating portions 11-1 and 11-2 by a second adhesive layer 11g. For example, the second cover member 11e may be directly disposed at the second surface of each of the first and second vibration generating portions 11-1 and 11-2 by a film laminating process using the second adhesive layer 11g. Accordingly, each of the first and second vibration generating portions 11-1 and 11-2 may be integrated (or disposed) or tiled with the second cover member 11e to have the certain first separation distance (or an interval) D1.

The first adhesive layer 11f may be disposed between the first and second vibration generating portions 11-1 and 11-2 and disposed at the first surface of each of the first and second vibration generating portions 11-1 and 11-2. For example, the first adhesive layer 11f may be formed at a rear surface (or an inner surface) of the first cover member 11d facing the first surface of each of the first and second vibration generating portions 11-1 and 11-2, filled between the first and second vibration generating portions 11-1 and 11-2, and filled between the first cover member 11d and the first surface of each of the first and second vibration generating portions 11-1 and 11-2.

The second adhesive layer 11g may be disposed between the first and second vibration generating portions 11-1 and 11-2 and disposed at the second surface of each of the first and second vibration generating portions 11-1 and 11-2. For example, the second adhesive layer 11g may be formed at a front surface (or an inner surface) of the second cover member 11e facing the second surface of each of the first and second vibration generating portions 11-1 and 11-2, filled between the first and second vibration generating portions 11-1 and 11-2, and filled between the second cover member 11e and the second surface of each of the first and second vibration generating portions 11-1 and 11-2.

The first and second adhesive layers 11f and 11g may be connected or coupled to each other between the first and second vibration generating portions 11-1 and 11-2. Therefore, each of the first and second vibration generating portions 11-1 and 11-2 may be surrounded by the first and second adhesive layers 11f and 11g. For example, the first and second adhesive layers 11f and 11g may be configured between the first cover member 11d and the second cover member 11e to completely surround the first and second vibration generating portions 11-1 and 11-2. For example, each of the first and second vibration generating portions 11-1 and 11-2 may be embedded or built-in between the first adhesive layer 11f and the second adhesive layer 11g.

Each of the first and second adhesive layers 11f and 11g according to an example embodiment of the present disclosure may include an electrically insulating material which has adhesiveness and is capable of compression and decompression. For example, each of the first and second adhesive layers 11f and 11g may include an epoxy resin, an acrylic resin, a silicone resin, or a urethane resin, but embodiments of the present disclosure are not limited thereto. Each of the first and second adhesive layers 11f and 11g may be configured to be transparent, translucent, or opaque.

The vibration device 11 according to another example embodiment of the present disclosure may further include a first power supply line PL1, a second power supply line PL2, and a pad part 11p.

The first power supply line PL1 may be disposed at the first cover member 11d. The first power supply line PL1 may be disposed at the rear surface of the first cover member 11d facing the first surface of each of the first and second vibration generating portions 11-1 and 11-2. The first power supply line PL1 may be electrically connected to the first electrode portion 11b of each of the first and second vibration generating portions 11-1 and 11-2. For example, the first power supply line PL1 may be electrically and directly connected to the first electrode portion 11b of each of the first and second vibration generating portions 11-1 and 11-2. As an example embodiment of the present disclosure, the first power supply line PL1 may be electrically connected to the first electrode portion 11b of each of the first and second vibration generating portions 11-1 and 11-2 by an anisotropic conductive film. As another example embodiment of the present disclosure, the first power supply line PL1 may be electrically connected to the first electrode portion 11b of each of the first and second vibration generating portions 11-1 and 11-2 through a conductive material (or particle) included in the first adhesive layer 11f.

The first power supply line PL1 according to an example embodiment of the present disclosure may include first and second upper power lines PL11 and PL12 disposed along a second direction Y. For example, the first upper power line PL11 may be electrically connected to the first electrode portion 11b of the first vibration generating portion 11-1. The second upper power line PL12 may be electrically connected to the first electrode portion 11b of the second vibration generating portion 11-2.

The second power supply line PL2 may be disposed at the second cover member 11e. The second power supply line PL2 may be disposed at the front surface of the second cover member 11e facing the second surface of each of the first and second vibration generating portions 11-1 and 11-2. The second power supply line PL2 may be electrically connected to the second electrode portion 11c of each of the first and second vibration generating portions 11-1 and 11-2. For example, the second power supply line PL2 may be electrically and directly connected to the second electrode portion 11c of each of the first and second vibration generating portions 11-1 and 11-2. As an example embodiment of the present disclosure, the second power supply line PL2 may be electrically connected to the second electrode portion 11c of each of the first and second vibration generating portions 11-1 and 11-2 by an anisotropic conductive film. As another example embodiment of the present disclosure, the second power supply line PL2 may be electrically connected to the second electrode portion 11c of each of the first and second vibration generating portions 11-1 and 11-2 through a conductive material (or particle) included in the second adhesive layer 11g.

The second power supply line PL2 according to an example embodiment of the present disclosure may include first and second lower power lines PL21 and PL22 disposed along a second direction Y. For example, the first lower power line PL21 may be electrically connected to the second electrode portion 11c of the first vibration generating portion 11-1. For example, the first lower power line PL21 may be overlapped by the first upper power line PL11. For example, the first lower power line PL21 may be disposed not to overlap the first upper power line PL11. When the first lower power line PL21 is disposed not to overlap the first upper power line PL11, a short circuit (or a short) between the first power supply line PL1 and the second power supply line PL2 may be prevented. The second lower power line PL22 may be electrically connected to the second electrode portion 11c of the second vibration generating portion 11-2. For example, the second lower power line PL22 may be overlapped by the second upper power line PL12. For example, the second lower power line PL22 may be disposed not to overlap the second upper power line PL12. When the second lower power line PL22 is disposed not to overlap the second upper power line PL12, a short circuit between the first power supply line PL1 and the second power supply line PL2 may be prevented.

The pad part 11p may be configured to be electrically connected to the first power supply line PL1 and the second power supply line PL2. The pad part 11p may be configured at one periphery portion of any one of the first cover member 11d and the second cover member 11e to be electrically connected to one portion (or one end) of each of the first power supply line PL1 and the second power supply line PL2.

The pad part 11p according to an example embodiment of the present disclosure may include a first pad electrode electrically connected to one end of the first power supply line PL1, and a second pad electrode electrically connected to one end of the second power supply line PL2.

The first pad electrode may be commonly connected to one portion of each of the first and second upper power lines PL11 and PL12 of the first power supply line PL1. For example, the one portion of each of the first and second upper power lines PL11 and PL12 may branch from the first pad electrode. The second pad electrode may be commonly connected to one portion of each of the first and second lower power lines PL21 and PL22 of the second power supply line PL2. For example, the one portion of each of the first and second lower power lines PL21 and PL22 may branch from the second pad electrode.

The vibration device 11 according to another example embodiment of the present disclosure may further include a signal cable 30.

The signal cable 30 may be electrically connected to the pad part 11p disposed at the vibration device 11 and may supply the vibration device 11 with a vibration driving signal (or a sound signal or a voice signal) provided from a sound processing circuit. The signal cable 30 according to an example embodiment of the present disclosure may include a first terminal electrically coupled to the first pad electrode of the pad part 11p and a second terminal electrically coupled to the second pad electrode of the pad part 11p. For example, the signal cable 30 may be configured as a flexible printed circuit cable, a flexible flat cable, a single-sided flexible printed circuit, a single-sided flexible printed circuit board, a flexible multilayer printed circuit, or a flexible multilayer printed circuit board, but embodiments of the present disclosure are not limited thereto.

The sound processing circuit may generate an alternating current (AC) vibration driving signal including a first vibration driving signal and a second vibration driving signal based on a sound data. The first vibration driving signal may be any one of a positive (+) vibration driving signal and a negative (−) vibration driving signal, and the second vibration driving signal may be any one of a positive (+) vibration driving signal and a negative (−) vibration driving signal. For example, the first vibration driving signal may be supplied to the first electrode portion 11b of each of the first and second vibration generating portions 11-1 and 11-2 through a first terminal of the signal cable 30, the first pad electrode of the pad part 11p, and the first power supply line PL1. The second vibration driving signal may be supplied to the second electrode portion 11c of each of the first and second vibration generating portions 11-1 and 11-2 through a second terminal of the signal cable 30, the second pad electrode of the pad part 11p, and the second power supply line PL2.

As described above, like the vibration device 11d described above with reference to FIGS. 29 to 31, the vibration device 11 according to another example embodiment of the present disclosure may be implemented as a thin film type, and thus, may be bent in a shape corresponding to a shape of the vibration member or the vibration object, may easily vibrate the vibration member including various curved portions, and may enhance a sound characteristic and/or a sound pressure level characteristic in the low-pitched sound band generated based on a vibration of the vibration member. In addition, the vibration device 11 according to another example embodiment of the present disclosure may include the first and second vibration generating portions 11-1 and 11-2 which are arranged (or tiled) at a certain first separation distance (or an interval) D1, so as to be implemented as a single vibration body without being independently driven, and thus, may be driven as a large-area vibration body (or a large-area vibrator) based on a single-body vibration of the first and second vibration generating portions 11-1 and 11-2.

Figure 35:
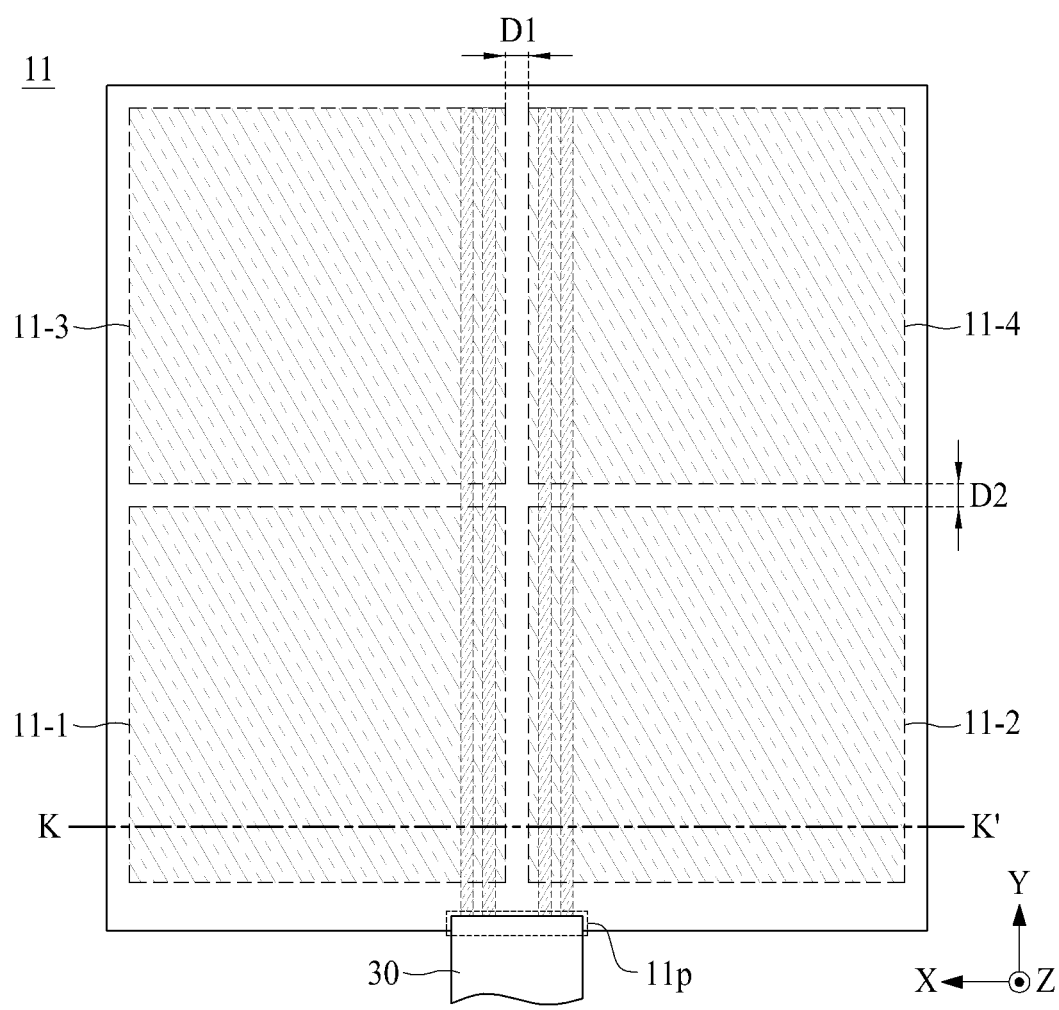
FIG. 35 illustrates a vibration device according to another example embodiment of the present disclosure.

FIG. 35 illustrates a vibration device according to another example embodiment of the present disclosure. FIG. 35 illustrates an example embodiment where four vibration generating portions are provided in the vibration device illustrated in FIGS. 33 and 34. Hereinafter, therefore, the elements except four vibration generating portions and relevant elements are referred to by like reference numerals, and their repetitive descriptions may be omitted for brevity or will be briefly given. A cross-sectional surface taken along line K-K' illustrated in FIG. 35 is illustrated in FIG. 34.

With reference to FIG. 35 in conjunction with FIG. 34, the vibration device 11 according to another example embodiment of the present disclosure may include a plurality of vibration generating portions 11-1 to 11-4.

The plurality of vibration generating portions 11-1 to 11-4 may be electrically disconnected and disposed spaced apart from one another along a first direction X and a second direction Y. For example, the plurality of vibration generating portions 11-1 to 11-4 may be arranged or tiled in an i×j form on the same plane, and thus, the vibration device 11 may be implemented to have a large area by tiling of the plurality of vibration generating portions 11-1 to 11-4 having a relatively small size. For example, i may be the number of vibration generating portions disposed in the first direction X and may be a natural number of 2 or more, and j may be the number of vibration generating portions disposed along the second direction Y and may be a natural number of 2 or more which is the same as or different from i. For example, the plurality of vibration generating portions 11-1 to 11-4 may be arranged or tiled in a 2×2 form, but embodiments of the present disclosure are not limited thereto. Hereinafter, an example where the vibration device 11 includes first to fourth vibration generating portions 11-1 to 11-4 will be described.

According to an example embodiment of the present disclosure, the first and second vibration generating portions 11-1 and 11-2 may be spaced apart from each other along the first direction X. The third and fourth vibration generating portions 11-3 and 11-4 may be spaced apart from each other along the first direction X and may be spaced apart from each of the first and second vibration generating portions 11-1 and 11-2 along the second direction Y. The first and third vibration generating portions 11-1 and 11-3 may be spaced apart from each other along the second direction Y to face each other. The second and fourth vibration generating portions 11-2 and 11-4 may be spaced apart from each other along the second direction Y to face each other.

The first to fourth vibration generating portions 11-1 to 11-4 may be disposed between the first cover member 11d and the second cover member 11e. For example, each of the first cover member 11d and the second cover member 11e may be connected to the first to fourth vibration generating portions 11-1 to 11-4 in common or may support the first to fourth vibration generating portions 11-1 to 11-4 in common, and thus, may drive the first to fourth vibration generating portions 11-1 to 11-4 as one vibration apparatus (or a single vibration apparatus). For example, the first to fourth vibration generating portions 11-1 to 11-4 may be tiled in a certain interval by the cover members 11d and 11e, and thus, may be driven as one vibration apparatus (or a single vibration apparatus).

According to an example embodiment of the present disclosure, as described above with reference to FIGS. 33 and 34, to a complete single body vibration or a large-area vibration, the first to fourth vibration generating portions 11-1 to 11-4 may be disposed (or tiled) at the intervals of 0.1 mm or more and less than 3 cm or may be disposed (or tiled) at 0.1 mm or more and less than 5 mm along each of the first direction X and the second direction Y.

Each of the first to fourth vibration generating portions 11-1 to 11-4 may include a piezoelectric vibration portion 11a, a first electrode portion 11b, and a second electrode portion 11c.

The piezoelectric vibration portion 11a of each of the first to fourth vibration generating portions 11-1 to 11-4 may include a piezoelectric material (or an electroactive material) including a piezoelectric effect. The piezoelectric vibration portion 11a of each of the first to fourth vibration generating portions 11-1 to 11-4 may be configured substantially the same as any one of the piezoelectric vibration portion 11a described above with reference to FIGS. 31, and 32A to 32D, and thus, a like reference numeral refers to a like element, and the repetitive description thereof may be omitted for brevity.

According to an example embodiment of the present disclosure, each of the first to fourth vibration generating portions 11-1 to 11-4 may include any one piezoelectric vibration portion 11a of the piezoelectric vibration portion 11a described above with reference to FIGS. 31, and 32A to 32D, or may include different piezoelectric vibration portion 11a.

According to another example embodiment of the present disclosure, one or more of the first to fourth vibration generating portions 11-1 to 11-4 may include a same or different piezoelectric vibration portion 11a of the piezoelectric vibration portion 11a described above with reference to FIGS. 31 and 32A to 32D.

The first electrode portion 11b may be disposed at a first surface of the corresponding piezoelectric vibration portion 11a and electrically connected to the first surface of the piezoelectric vibration portion 11a. The first electrode portion 11b may be substantially the same as the first electrode portion 11b described above with reference to FIG. 30, and thus, a like reference numeral refers to a like element, and the repetitive description thereof may be omitted for brevity.

The second electrode portion 11c may be disposed at a second surface of the corresponding piezoelectric vibration portion 11a and electrically connected to the second surface of the piezoelectric vibration portion 11a. The second electrode portion 11c may be substantially the same as the second electrode portion 11c described above with reference to FIG. 30, and thus, a like reference numeral refers to a like element, and the repetitive description thereof may be omitted for brevity.

According to an example embodiment of the present disclosure, the first and second adhesive layers 11f and 11g may be connected or coupled to each other between the first to fourth vibration generating portions 11-1 to 11-4. Therefore, each of the first to fourth vibration generating portions 11-1 to 11-4 may be surrounded by the first and second adhesive layers 11f and 11g. For example, the first and second adhesive layers 11f and 11g may be configured between a first cover member 11d and a second cover member 11e to completely surround each of the first to fourth vibration generating portions 11-1 to 11-4. For example, each of the first to fourth vibration generating portions 11-1 to 11-4 may be embedded or built-in between the first adhesive layer 11f and the second adhesive layer 11g.

The vibration device 11 according to another example embodiment of the present disclosure may further include a first power supply line PL1, a second power supply line PL2, and a pad part 11p.

Except for an electrical connection structure between the first and second power supply lines PL1 and PL2 and the first to fourth vibration generating portions 11-1 to 11-4, the first and second power supply lines PL1 and PL2 may be substantially the same as the first and second power supply lines PL1 and PL2 described above with reference to FIGS. 33 and 34, and thus, only the electrical connection structure between the first and second power supply lines PL1 and PL2 and the first to fourth vibration generating portions 11-1 to 11-4 will be briefly described below.

The first power supply line PL1 according to an example embodiment of the present disclosure may include first and second upper power lines PL11 and PL12 disposed along a second direction Y. For example, the first upper power line PL11 may be electrically connected to the first electrode portion 11b of each of the first and third vibration generating portions 11-1 and 11-3 (or a first group or a first vibration generating group) disposed at a first row parallel to a second direction Y among the first to fourth vibration generating portions 11-1 to 11-4. The second upper power line PL12 may be electrically connected to the first electrode portion 11b of each of the second and fourth vibration generating portions 11-2 and 11-4 (or a second group or a second vibration generating group) disposed at a second row parallel to the second direction Y among the first to fourth vibration generating portions 11-1 to 11-4.

The second power supply line PL2 according to an example embodiment of the present disclosure may include first and second lower power lines PL21 and PL22 disposed along a second direction Y. For example, the first lower power line PL21 may be electrically connected to the second electrode portion 11c of each of the first and third vibration generating portions 11-1 and 11-3 (or the first group or the first vibration generating group) disposed at the first row parallel to the second direction Y among the first to fourth vibration generating portions 11-1 to 11-4. The second lower power line PL22 may be electrically connected to the second electrode portion 11c of each of the second and fourth vibration generating portions 11-2 and 11-4 (or the second group or the second vibration generating group) disposed at the second row parallel to the second direction Y among the first to fourth vibration generating portions 11-1 to 11-4.

The pad part 11p may be configured at one periphery portion of one of the first cover member 11d and the second cover member 11e so as to be electrically connected to one side (or one end) of each of the first and second power supply lines PL1 and PL2. The pad part 11p may be substantially the same as the pad part 11p illustrated in FIGS. 33 and 34, and thus, a like reference numeral refers to a like element, and the repetitive description thereof may be omitted for brevity.

As described above, the vibration device 11 according to another example embodiment of the present disclosure may have the same effect as that of the vibration device 11d described above with reference to FIGS. 29 to 34, and thus, the repetitive description thereof may be omitted for brevity.

Figure 36:
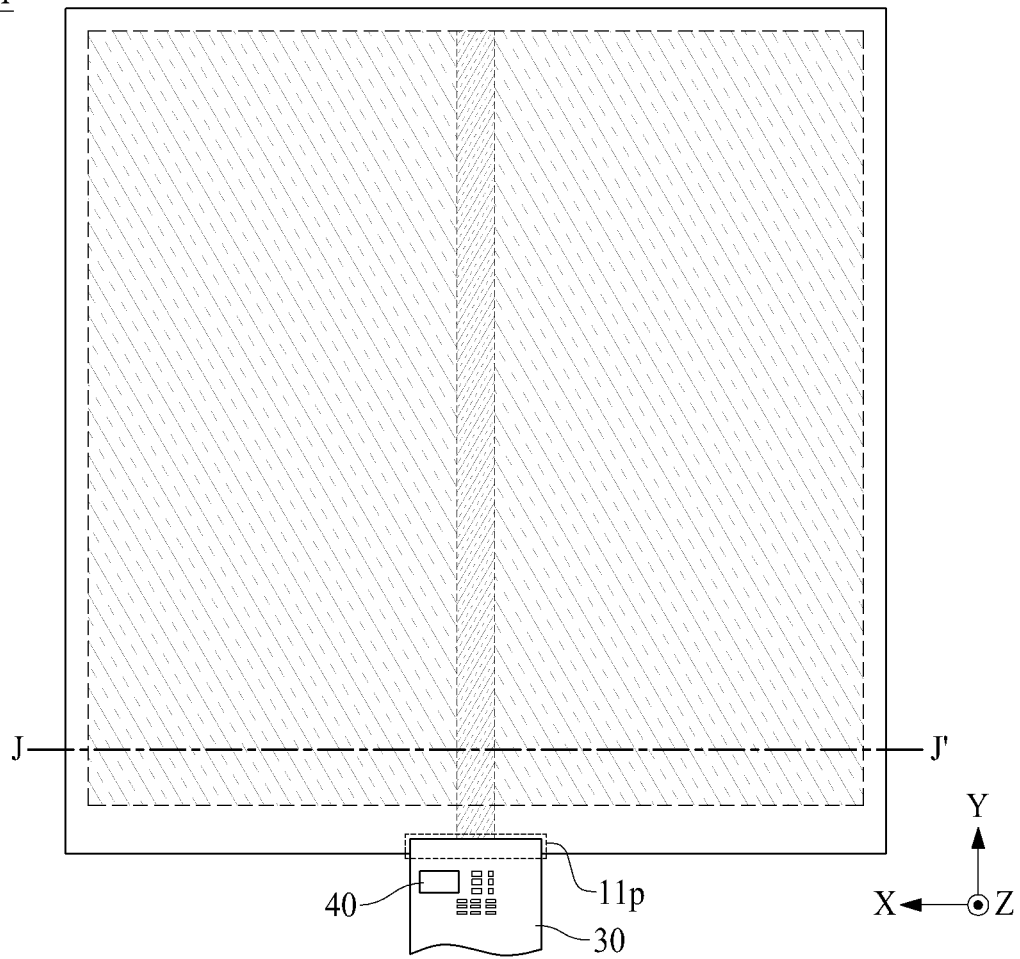
FIG. 36 illustrates a vibration device according to another example embodiment of the present disclosure.

FIG. 36 illustrates a vibration device according to another example embodiment of the present disclosure. FIG. 36 illustrates an example embodiment implemented by modifying the signal cable of the vibration device illustrated in FIGS. 29 to 35. Hereinafter, therefore, the elements except a signal cable and relevant elements are referred to by like reference numerals, and their repetitive descriptions may be omitted for brevity or will be briefly given. An example of a cross-sectional surface taken along line J-J' illustrated in FIG. 36 is illustrated in FIG. 30.

With reference to FIG. 36 in conjunction with FIG. 30, in the vibration device 11 according to another example embodiment of the present disclosure, a signal cable 30 may include a sound processing circuit 40.

The sound processing circuit 40 may be mounted on the signal cable 30. For example, the sound processing circuit 40 may be mounted on a periphery portion of the signal cable 30 adjacent to a pad part 11p of the vibration device 11. The sound processing circuit 40 may be integrated into (or mounted on) the signal cable 30, and thus, the sound processing circuit 40 and the signal cable 30 may be implemented as one element.

The signal cable 30 may be configured as a double-sided flexible printed circuit, but embodiments of the present disclosure are not limited thereto, and may be configured as a flexible printed circuit cable, a flexible flat cable, a single-sided flexible printed circuit, a single-sided flexible printed circuit board, a flexible multilayer printed circuit, or a flexible multilayer printed circuit board.

The signal cable 30 according to an example embodiment of the present disclosure may include a line layer (or a wire layer) on a base film, a lower film coupled to a first surface of the line layer by an adhesive, an upper film coupled to a second surface of the line layer by the adhesive, and a plurality of contact pads and first and second terminals disposed on the upper film and connected to the line layer.

The line layer may include a plurality of signal lines and first and second driving signal supply lines, or the like which are formed at one or more of a front surface and a bottom surface (or a lower surface) of the base film. For example, the plurality of signal lines and the first and second driving signal supply lines, or the like may include a conductive material which includes a copper (Cu), an aluminum (Al), a silver (Ag), or an alloy material of a copper (Cu) and a silver (Ag), but embodiments of the present disclosure are not necessarily limited thereto.

Each of the plurality of contact pads may be disposed at one of a lower film and an upper film and may be selectively connected to the plurality of signal lines and the first and second driving signal supply lines, or the like through a via hole.

The first and second terminals may be electrically connected to first and second pad electrodes of the pad part 11p configured in the vibration device 11, respectively.

The sound processing circuit 40 may be mounted on the signal cable 30 and may be electrically connected to the plurality of contact pads. The sound processing circuit 40 may receive sound data (or digital sound data), a clock, an enable signal, and various driving voltages, or the like supplied from an external sound data generating circuit part through some of the plurality of contact pads. The sound processing circuit 40 may generate first and second vibration driving signals based on the sound data and may respectively output the generated first and second vibration driving signals to the first and second terminals through corresponding contact pads and corresponding driving signal supply lines. Accordingly, the vibration device 11 may vibrate based on the first and second vibration driving signals supplied through each of the signal lines, the first and second terminals, the pad part 11p, and the first and second power supply lines PL1 and PL2 of the signal cable 30 from the sound processing circuit 40 mounted on the signal cable 30.

The sound processing circuit 40 according to an example embodiment of the present disclosure may include a decoding part which receives the sound data supplied from the external sound data generating circuit part, an audio amplifier circuit which generates and outputs the first and second vibration driving signals based on the sound data supplied from the decoding part, a memory circuit which stores a setting value of the audio amplifier circuit, a control circuit which controls an operation of each of the decoding part, the audio amplifier circuit, and the memory circuit, and a passive element such as a resistor, or the like.

The audio amplifier circuit may include a pre-amplifier circuit which generates the first and second vibration driving signals based on the sound data and a power amplifier circuit which converts a voltage and/or a current of each of the first and second vibration driving signals into a level suitable for driving of the vibration device 11, but embodiments of the present disclosure are not limited thereto.

Each of the decoding part, the audio amplifier circuit, the memory circuit, and the control circuit may be implemented as an integrated circuit (IC) and may be mounted on the signal cable 30. For example, the decoding part, the audio amplifier circuit, the memory circuit, and the control circuit may be implemented as one integrated circuit (IC) or one semiconductor chip.

As described above, because the vibration device 11 according to another example embodiment of the present disclosure includes the sound processing circuit 40 mounted on the signal cable 30, a connection structure among the vibration device 11, the sound processing circuit 40, the signal cable 30, and the sound data generating circuit part may be simplified, and as the sound processing circuit 40 is disposed adjacent to the vibration device 11, a filter circuit including an inductor and a capacitor for preventing electromagnetic interference (EMI) occurring due to a length of the signal cable 30 based on a distance between the sound processing circuit 40 and the vibration device 11 may be omitted, but embodiments of the present disclosure are not limited thereto.

Additionally, in the vibration device 11 according to another example embodiment of the present disclosure, the signal cable 30 with the sound processing circuit 40 integrated therein or mounted thereon may also be applied to the vibration device 11d described above with reference to one or more of FIGS. 29, 33 and 35. For example, the signal cable 30 of the vibration device 11 described above with reference to one or more of FIGS. 29, 33 and 35 may include the sound processing circuit 40, and thus, the repetitive description thereof may be omitted for brevity.

Figure 37:
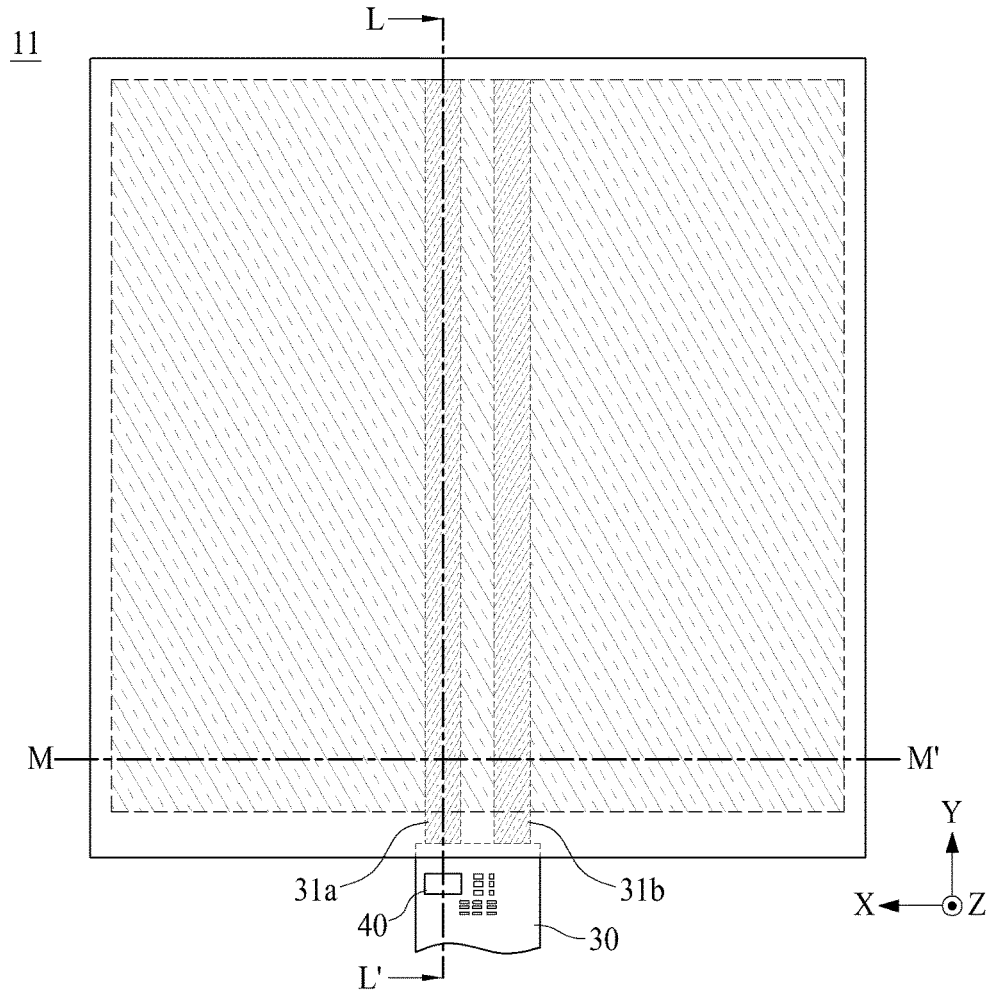
FIG. 37 illustrates a vibration device according to another example embodiment of the present disclosure.
Figure 38:
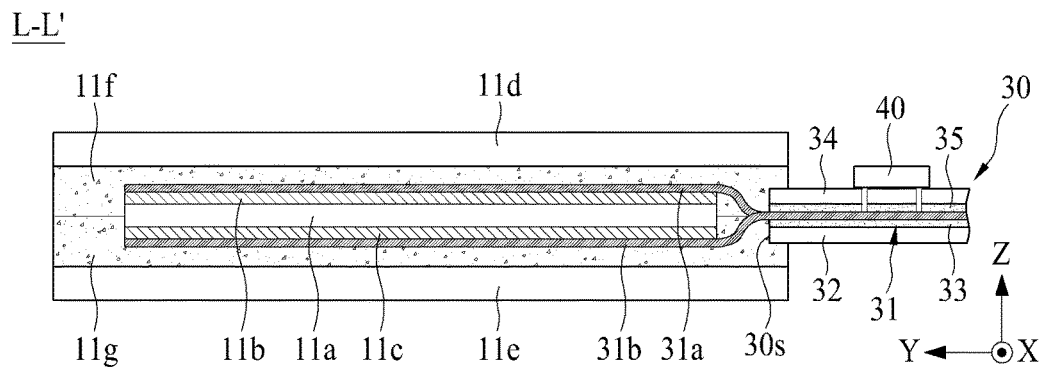
FIG. 38 is an example of a cross-sectional view taken along line L-L' illustrated in FIG. 37.
Figure 39:
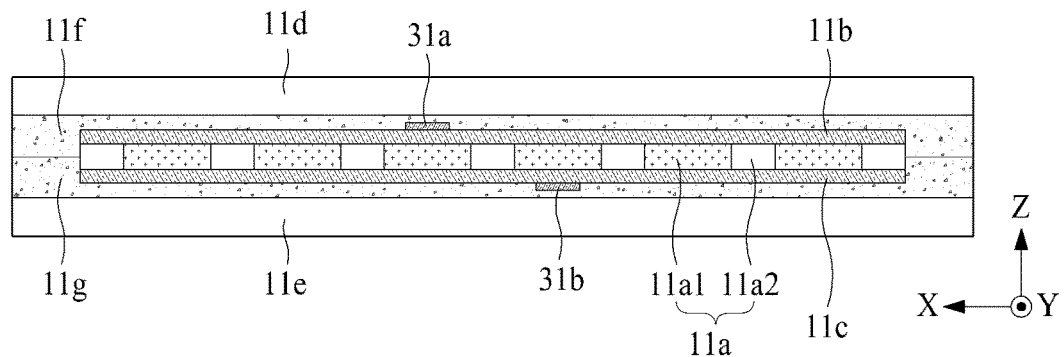
FIG. 39 is an example of a cross-sectional view taken along line M-M' illustrated in FIG. 37.

FIG. 37 illustrates a vibration device according to another example embodiment of the present disclosure. FIG. 38 is an example of a cross-sectional view taken along line L-L' illustrated in FIG. 37. FIG. 39 is an example of a cross-sectional view taken along line M-M' illustrated in FIG. 37. FIGS. 37 to 39 illustrate another example embodiment of the vibration device illustrated in one or more of FIGS. 1 to 19 and illustrate an example embodiment implemented by modifying a connection structure between the electrode portion and the signal cable illustrated in FIG. 36.

With reference to FIGS. 37 to 39, the vibration device 11 (vibration plate) according to another example embodiment of the present disclosure may include a vibration generating portion and a signal cable 30.

The vibration generating portion may include a piezoelectric vibration portion 11a, a first electrode portion 11b, and a second electrode portion 11c. The vibration generating portion may be substantially the same as the vibration generating portion of vibration device 11d described above with reference to FIGS. 29 to 32D, and thus, like reference numerals refer to like elements, and their repetitive descriptions may be omitted for brevity.

The signal cable 30 may be electrically connected to the first and second electrode portions 11b and 11c at one side (or one portion) of the vibration device 11, and thus, may be integrated into the vibration generating portion. For example, the signal cable 30 may be electrically and directly connected to the first and second electrode portions 11b and 11c. For example, the signal cable 30 may not pass through the power supply line and the pad part described above with reference to FIGS. 29 to 32D and may be electrically connected or electrically and directly connected to the first and second electrode portions 11b and 11c.

The signal cable 30 according to an example embodiment of the present disclosure may include first and second protrusion lines 31a and 31b. For example, the first protrusion line 31a may overlap at least a portion of the first electrode portion 11b and may be electrically connected or electrically and directly connected to the first electrode portion 11b. The second protrusion line 31b may overlap at least a portion of the second electrode portion 11c and may be electrically connected or electrically and directly connected to the second electrode portion 11c. For example, each of the first and second protrusion lines 31a and 31b may be bent toward a corresponding electrode portion of the first and second electrode portions 11b and 11c, but embodiments of the present disclosure are not limited thereto. For example, each of the first and second protrusion lines 31a and 31b may be referred to as a protrusion electrode, an extension line, an extension electrode, a flexible protrusion electrode, a flexible connection line, a flexible conductive line, a finger line, or a finger electrode, but embodiments of the present disclosure are not limited thereto.

The signal cable 30 according to an example embodiment of the present disclosure may include a body portion, first and second protrusion lines 31a and 31b, and a sound processing circuit 40.

The body portion may be configured as a flexible printed circuit cable, a flexible flat cable, a single-sided flexible printed circuit, a single-sided flexible printed circuit board, a flexible multilayer printed circuit, or a flexible multilayer printed circuit board.

The body portion according to an example embodiment of the present disclosure may include a line layer (or a wire layer) 31 on a base film, a lower film 32 which is coupled to a first surface of a line layer 31 by a first adhesive 33, an upper film 34 which is coupled to a second surface of the line layer 31 by a second adhesive 35, and a plurality of contact pads which are disposed on the upper film 34 and are connected to the line layer 31.

The line layer 31 may include a plurality of signal lines and first and second driving signal supply lines, or the like which are formed at one or more of a front surface and a bottom surface of the base film. For example, the plurality of signal lines and the first and second driving signal supply lines, or the like may include a conductive material which includes a copper (Cu), an aluminum (Al), a silver (Ag), or an alloy material of a copper (Cu) and a silver (Ag), but embodiments of the present disclosure are not necessarily limited thereto.

Each of the plurality of contact pads may be disposed at one of a lower film and an upper film and may be selectively connected to the plurality of signal lines and the first and second driving signal supply lines, or the like through a via hole.

Each of the first and second protrusion lines 31a and 31b may be electrically connected to the first and second driving signal supply lines disposed at the line layer 31, or may pass through one lateral surface 30s of the body portion from each of the first and second driving signal supply lines and may extend or protrude to the outside. Each of the first and second protrusion lines 31a and 31b may protrude to have a certain length from the one lateral surface 30s of the body portion. For example, each of the first and second protrusion lines 31a and 31b may extend or protrude along a second direction Y from the one lateral surface 30s of the body portion to have a length overlapping at least a portion of each of the first and second electrode portions 11b and 11c.

The first protrusion line 31a may be bent to the first electrode portion 11b from the one lateral surface 30s of the body portion (or one side of the vibration device 11) and may be electrically connected to at least a portion of the first electrode portion 11b. For example, the first protrusion line 31a may be electrically and directly connected to or may electrically contact at least a portion of the first electrode portion 11b. For example, the first protrusion line 31a may be electrically connected to the first electrode portion 11b by a conductive member such as a conductive ball or a conductive double-sided tape.

The second protrusion line 31b may be bent to the second electrode portion 11c from one lateral surface 30s of the body portion (or one side of the vibration device 11 or one portion of the vibration device 11) and may be electrically connected to at least a portion of the second electrode portion 11c. For example, the second protrusion line 31b may be electrically and directly connected to or may electrically contact at least a portion of the second electrode portion 11c. For example, the second protrusion line 31b may be electrically connected to the second electrode portion 11c by a conductive member such as a conductive ball or a conductive double-sided tape.

The sound processing circuit 40 may be mounted on the signal cable 30 and may be electrically connected to the plurality of contact pads. The sound processing circuit 40 may receive sound data (or digital sound data), a clock, an enable signal, and various driving voltages, or the like supplied from an external sound data generating circuit part through some of the plurality of contact pads. The sound processing circuit 40 may generate first and second vibration driving signals based on the sound data and may respectively output the generated first and second vibration driving signals to the first and second protrusion lines 31a and 31b through corresponding contact pads and corresponding driving signal supply lines. Accordingly, the vibration device 11 may vibrate based on the first and second vibration driving signals supplied through each of the first and second protrusion lines 31a and 31b, the first and second driving signal supply lines, and the signal lines of the signal cable 30 from the sound processing circuit 40 mounted on the signal cable 30.

The sound processing circuit 40 according to an example embodiment of the present disclosure may include a decoding part, an audio amplifier circuit, a memory circuit, a control circuit, and a passive element such as a resistor, or the like. The elements of the sound processing circuit 40 may be substantially the same as the elements of the sound processing circuit 40 described above with reference to FIG. 36, and thus, like reference numerals refer to like elements, and their repetitive descriptions may be omitted for brevity.

The signal cable 30 according to an example embodiment of the present disclosure may directly supply a vibration driving signal to each of the first and second electrode portions 11b and 11c through each of the first and second protrusion lines 31a and 31b, and thus, a voltage drop by a surface resistance characteristic of each of the first and second electrode portions 11b and 11c may decrease, an electrical characteristic of each of the first and second electrode portions 11b and 11c may be complemented, and the degree of freedom in selecting a conductive material used in the first and second electrode portions 11b and 11c may increase.

The vibration device 11 according to another example embodiment of the present disclosure may further include a first cover member 11d and a second cover member 11e.

The first cover member 11d may be disposed at a first surface of the vibration device 11. For example, the first cover member 11d may be configured to cover the first protrusion line 31a of the signal cable 30 and the first electrode portion 11b. Accordingly, the first cover member 11d may protect the first protrusion line 31a of the signal cable 30 and the first electrode portion 11b and may electrically connect the first protrusion line 31a of the signal cable 30 to the first electrode portion 11b or may maintain an electrical connection state between the first protrusion line 31a of the signal cable 30 and the first electrode portion 11b.

The second cover member 11e may be disposed at a second surface of the vibration device 11. For example, the second cover member 11e may be configured to cover the second protrusion line 31b of the signal cable 30 and the second electrode portion 11c. Accordingly, the second cover member 11e may protect the second protrusion line 31b of the signal cable 30 and the second electrode portion 11c, and may electrically connect the second protrusion line 31b of the signal cable 30 to the second electrode portion 11c or may maintain an electrical connection state between the second protrusion line 31b of the signal cable 30 and the second electrode portion 11c.

The first cover member 11d and the second cover member 11e according to an example embodiment of the present disclosure may each include one or more material of a plastic, a fiber, and wood, but embodiments of the present disclosure are not limited thereto. For example, each of the first and second cover member 11d and 11e may include the same or different material. For example, each of the first cover member 11d and the second cover member 11e may be a polyimide (PI) film or a polyethylene terephthalate (PET) film, but embodiments of the present disclosure are not limited thereto.

The first cover member 11d according to an example embodiment of the present disclosure may be connected or coupled to the first protrusion line 31a of the signal cable 30 and the first electrode portion 11b by a first adhesive layer 11f. For example, the first cover member 11d may be connected or coupled to the first protrusion line 31a of the signal cable 30 and the first electrode portion 11b by a film laminating process using the first adhesive layer 11f. Accordingly, the first protrusion line (or a first finger line) 31a of the signal cable 30 may be disposed between the first electrode portion 11b and the first cover member 11d, and may be provided as one body with the vibration device 11.

The second cover member 11e according to an example embodiment of the present disclosure may be connected or coupled to the second protrusion line 31b of the signal cable 30 and the second electrode portion 11c by a second adhesive layer 11g. For example, the second cover member 11e may be connected or coupled to the second protrusion line 31b of the signal cable 30 and the second electrode portion 11c by a film laminating process using the second adhesive layer 11g. Accordingly, the second protrusion line (or a second finger line) 31b of the signal cable 30 may be disposed between the second electrode portion 11c and the second cover member 11e, and may be provided as one body with the vibration device 11.

Each of the first and second cover members 11d and 11e according to an example embodiment of the present disclosure may not include or need a pad part and a power supply line for receiving the vibration driving signal from the signal cable 30, and thus, may be an insulation film or a protection film for protecting the piezoelectric vibration portion 11a and the first and second electrode portions 11b and 11c. For example, each of the first and second cover member 11d and 11e may be a polyimide (PI) film or a polyethylene terephthalate (PET) film, but embodiments of the present disclosure are not limited thereto.

Each of the first and second cover members 11d and 11e according to another example embodiment of the present disclosure may be insulated from the first and second electrode portions 11b and 11c by the adhesive layers 11f and 11g, and thus, one or more of the first and second cover members 11d and 11e may include a metal film, a metal layer, or a metal plate including a metal material. Each of the first and second cover members 11d and 11e including a metal material may reinforce a mass of the vibration device 11 or the piezoelectric vibration portion 11a and decrease a resonance frequency of the vibration device 11 or the piezoelectric vibration portion 11a by an increase in mass, thereby increasing a sound characteristic and/or a sound pressure level characteristic of a low-pitched sound band generated based on a vibration of the vibration device 11 or the piezoelectric vibration portion 11a. For example, the metal material included in each of the first and second cover members 11d and 11e may include any one or more materials of a stainless steel, an aluminum (Al), an Al alloy, a magnesium (Mg), a Mg alloy, and a magnesium-lithium (Mg—Li) alloy, but embodiments of the present disclosure are not limited thereto.

According to an example embodiment of the present disclosure, each of the first and second adhesive layers 11f and 11g may include an electrically insulating material which has adhesiveness and is capable of compression and decompression. For example, each of the first and second adhesive layers 11f and 11g may include an epoxy resin, an acrylic resin, a silicone resin, or a urethane resin, but embodiments of the present disclosure are not limited thereto.

In another example embodiment, at least a portion of the signal cable 30 may be disposed or inserted between the first cover member 11d and the second cover member 11e. For example, the one side surface 30s of the body portion of the signal cable 30 (or one periphery portion of the body portion) and the first and second protrusion lines 31a and 31b may be disposed or inserted between the first cover member 11d and the second cover member 11e. For example, the one side surface 30s of the body portion of the signal cable 30 and the first and second protrusion lines 31a and 31b may be accommodated or inserted into (or inside) the vibration device 11. Therefore, at least a portion of each of the signal cable 30 and the first and second protrusion lines 31a and 31b may not be exposed at the outside of each of the first cover member 11d and the second cover member 11e, and thus, disconnections of the first and second protrusion lines 31a and 31b caused by a stress such as the movement or bending of the signal cable 30 may be prevented.

As described above, in the vibration device 11 according to another example embodiment of the present disclosure, a patterning process of forming the power supply line and the pad part in the first and second cover members 11d and 11e and a soldering process between the pad part and the signal cable 30 may not be needed based on an integration structure between the first and second electrode portions 11b and 11c and the signal cable 30, and thus, a structure and a manufacturing process may be simplified. In addition, in the vibration device 11 according to another example embodiment of the present disclosure, the vibration driving signal may be directly supplied to the first and second electrode portions 11b and 11c through the protrusion lines 31a and 31b protruding from the signal cable 30, and thus, an electrical characteristic of each of the first and second electrode portions 11b and 11c may be complemented. Furthermore, because the vibration device 11 according to another example embodiment of the present disclosure includes the sound processing circuit 40 mounted on the signal cable 30, a connection structure among the vibration device 11, the sound processing circuit 40, the signal cable 30, and the sound data generating circuit part may be simplified, and as the sound processing circuit 40 is disposed adjacent to the vibration device 11, a filter circuit including an inductor and a capacitor for preventing EMI occurring due to a length of the signal cable 30 based on a distance between the sound processing circuit 40 and the vibration device 11 may be omitted for brevity.

Figure 40:
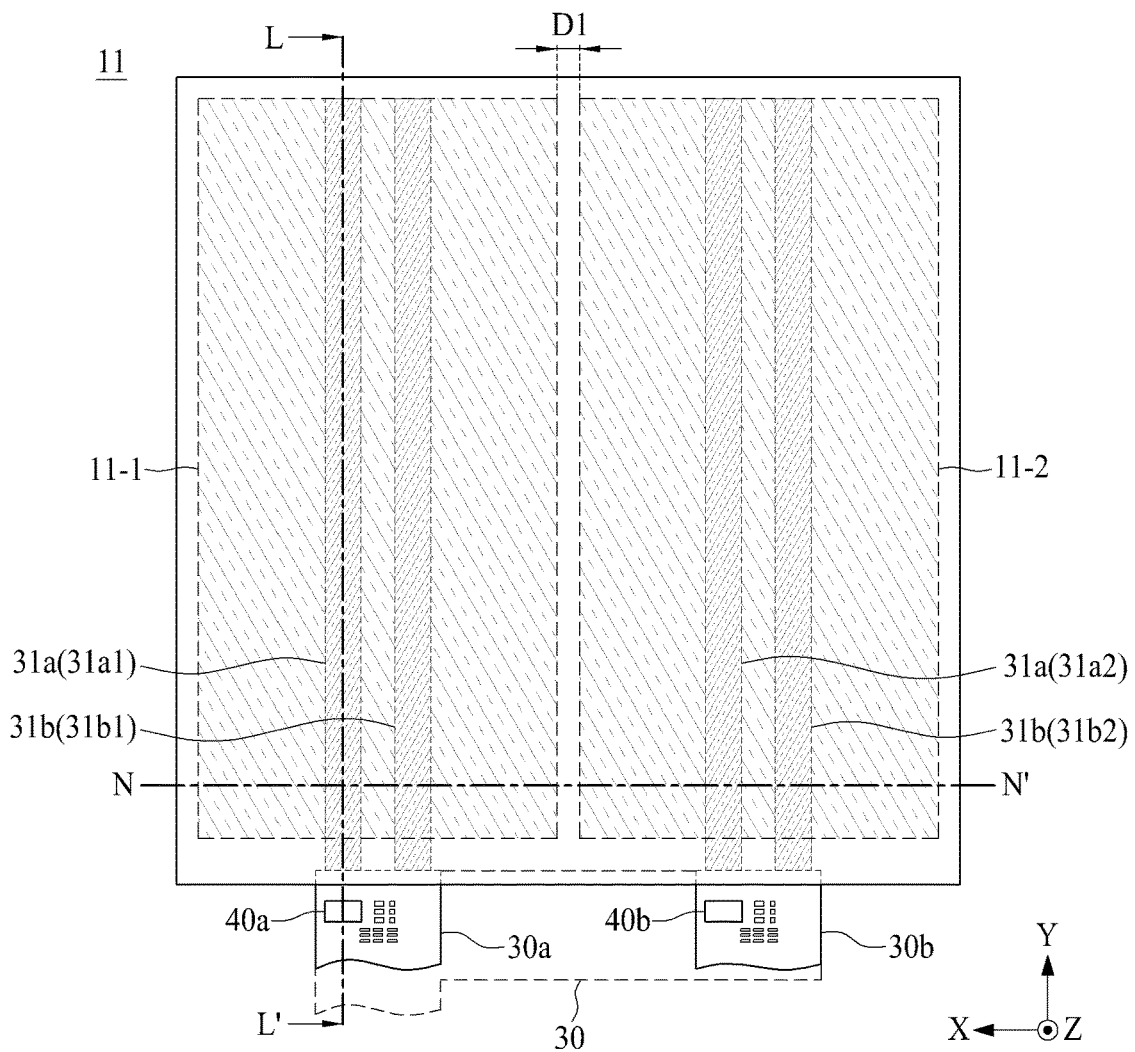
FIG. 40 illustrates a vibration device according to another example embodiment of the present disclosure.
Figure 41:
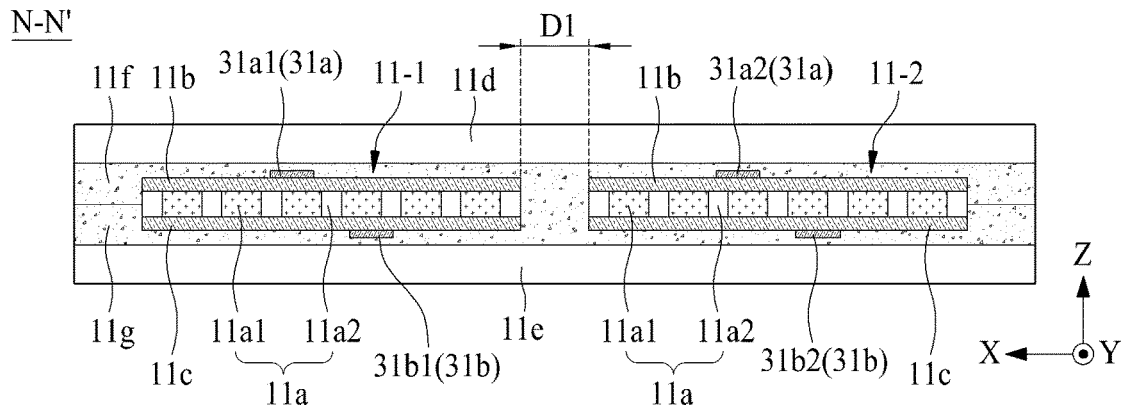
FIG. 41 is an example of a cross-sectional view taken along line N-N' illustrated in FIG. 40.

FIG. 40 illustrates a vibration device according to another example embodiment of the present disclosure. FIG. 41 is an example of a cross-sectional view taken along line N-N' illustrated in FIG. 40. An example of a cross-sectional surface taken along line L-L' illustrated in FIG. 40 is illustrated in FIG. 38. FIGS. 40 and 41 illustrate another example embodiment of the vibration device illustrated in one or more of FIGS. 1 to 19 and illustrate an example embodiment implemented by modifying a connection structure between the electrode portion and the signal cable illustrated in FIG. 35. Hereinafter, therefore, the elements except an electrode portion, a signal cable, and relevant elements are referred to by like reference numerals, and their repetitive descriptions may be omitted for brevity or will be briefly given.

With reference to FIGS. 40 and 41, the vibration device 11 (vibration plate) according to another example embodiment of the present disclosure may include first and second vibration generating portions 11-1 and 11-2, a first signal cable 30a, and a second signal cable 30b.

The first and second vibration generating portions 11-1 and 11-2 may be electrically disconnected and disposed spaced apart from each other along a first direction X. Each of the first and second vibration generating portions 11-1 and 11-2 may include a piezoelectric vibration portion 11a, a first electrode portion 11b, and a second electrode portion 11c. Each of the first and second vibration generating portions 11-1 and 11-2 may be substantially the same as each of the first and second vibration generating portions 11-1 and 11-2 of the vibration device 11d described above with reference to FIGS. 33 and 34, and thus, like reference numerals refer to like elements, and their repetitive descriptions may be omitted for brevity.

The first signal cable 30a may be electrically connected, or electrically and directly connected to the first and second electrode portions 11b and 11c at one side (or one portion) of the vibration device 11, and thus, may be integrated into the first vibration generating portion 11-1. For example, the first signal cable 30a may not pass through the power supply line and the pad part described above with reference to FIGS. 33 and 34 and may be electrically connected to the first and second electrode portions 11b and 11c of the first vibration generating portion 11-1.

The second signal cable 30b may be electrically connected, or electrically and directly connected to the first and second electrode portions 11b and 11c at one side (or one portion) of the vibration device 11, and thus, may be integrated into the second vibration generating portion 11-2. For example, the second signal cable 30b may not pass through the power supply line and the pad part described above with reference to FIGS. 33 and 34 and may be electrically connected to the first and second electrode portions 11b and 11c of the second vibration generating portion 11-2.

Each of the first and second signal cables 30a and 30b may include first and second protrusion lines 31a and 31b. For example, each of the first and second protrusion lines 31a and 31b may be referred to as a protrusion electrode, an extension line, an extension electrode, a flexible protrusion electrode, a flexible connection line, a flexible conductive line, a finger line, or a finger electrode, but embodiments of the present disclosure are not limited thereto.

The first protrusion line 31a of the first signal cable 30a (or a first upper protrusion line 31a1) may overlap at least a portion of the first electrode portion 11b of the first vibration generating portion 11-1 and may be electrically connected or electrically and directly connected to the first electrode portion 11b. The second protrusion line 31b of the first signal cable 30a (or a first lower protrusion line 31b1) may overlap at least a portion of the second electrode portion 11c of the first vibration generating portion 11-1 and may be electrically connected or electrically and directly connected to the second electrode portion 11c. For example, each of the first and second protrusion lines 31a and 31b of the first signal cable 30a may be bent toward a corresponding electrode portion of the first and second electrode portions 11b and 11c of the first vibration generating portion 11-1, but embodiments of the present disclosure are not limited thereto.

The first protrusion line 31a of the second signal cable 30b (or a second upper protrusion line 31a2) may overlap at least a portion of the first electrode portion 11b of the second vibration generating portion 11-2 and may be electrically connected, or electrically and directly connected to the first electrode portion 11b. The second protrusion line 31b of the second signal cable 30b (or a second lower protrusion line 31b2) may overlap at least a portion of the second electrode portion 11c of the second vibration generating portion 11-2 and may be electrically connected, or electrically and directly connected to the second electrode portion 11c. For example, each of the first and second protrusion lines 31a and 31b of the second signal cable 30b may be bent toward a corresponding electrode portion of the first and second electrode portions 11b and 11c of the second vibration generating portion 11-2, but embodiments of the present disclosure are not limited thereto.

Each of the first and second signal cables 30a and 30b according to an example embodiment of the present disclosure may include a body portion, first and second protrusion lines 31a and 31b, and sound processing circuits 40a and 40b. Each of the first and second signal cables 30a and 30b may be substantially the same as the signal cable 30 described above with reference to FIGS. 37 to 39, and thus, like reference numerals refer to like elements, and their repetitive descriptions may be omitted for brevity or will be briefly given.

The sound processing circuit (or a first sound processing circuit) 40a mounted on or integrated into the first signal cable 30a may generate first and second vibration driving signals based on sound data supplied from an external sound data generating circuit part and may supply the first and second vibration driving signals to the first and second electrode portions 11b and 11c of the first vibration generating portion 11-1 through the first and second protrusion lines 31a and 31b. The sound processing circuit 40a mounted on the first signal cable 30a may include a decoding part, an audio amplifier circuit, a memory circuit, a control circuit, and a passive element such as a resistor, or the like. The elements of the sound processing circuit 40a may be substantially the same as the elements of the sound processing circuit 40 described above with reference to FIG. 36 or 38, and thus, like reference numerals refer to like elements, and the repetitive description thereof may be omitted for brevity.

The sound processing circuit (or a second sound processing circuit) 40b mounted on or integrated into the second signal cable 30b may generate first and second vibration driving signals based on sound data supplied from an external sound data generating circuit part and may supply the first and second vibration driving signals to the first and second electrode portions 11b and 11c of the second vibration generating portion 11-2 through the first and second protrusion lines 31a and 31b. The sound processing circuit 40b mounted on the second signal cable 30b may include a decoding part, an audio amplifier circuit, a memory circuit, a control circuit, and a passive element such as a resistor, or the like. The elements of the sound processing circuit 40b may be substantially the same as the elements of the sound processing circuit 40 described above with reference to FIG. 36 or 38, and thus, like reference numerals refer to like elements, and the repetitive description thereof may be omitted for brevity.

The vibration device 11 according to another example embodiment of the present disclosure may further include a first cover member 11d and a second cover member 11e. Except that the first and second cover member 11d and 11e are configured to respectively cover the first and second vibration generating portions 11-1 and 11-2 and the first and second protrusion lines 31a and 31b of each of the first and second signal cables 30a and 30b, the first and second cover member 11d and 11e may be substantially the same as the first and second cover member 11d and 11e described above with reference to FIGS. 33 and 34, or 37 to 39, and thus, like reference numerals refer to like elements, and their repetitive descriptions may be omitted for brevity or will be briefly given.

The first cover member 11d may be disposed at the first surface of the vibration device 11. For example, the first cover member 11d may be configured to cover the first electrode portion 11b of each of the first and second vibration generating portions 11-1 and 11-2 and the first protrusion line 31a of each of the first and second signal cables 30a and 30b.

The second cover member 11e may be disposed at the second surface of the vibration device 11. For example, the second cover member 11e may be configured to cover the second electrode portion 11c of each of the first and second vibration generating portions 11-1 and 11-2 and the second protrusion line 31b of each of the first and second signal cables 30a and 30b.

The first cover member 11d according to an example embodiment of the present disclosure may be connected or coupled to the first electrode portion 11b of each of the first and second vibration generating portions 11-1 and 11-2 and the first protrusion line 31a of each of the first and second signal cables 30a and 30b by a first adhesive layer 11f.

Accordingly, the first protrusion line (or a first finger line) 31*a* of each of the first and second signal cables 30*a* and 30*b* may be disposed between the first electrode portion 11*b* and the first cover member 11*d* of each of the first and second vibration generating portions 11-1 and 11-2 and may be provided as one body with the vibration device 11.

The second cover member 11*e* according to an example embodiment of the present disclosure may be connected or coupled to the second electrode portion 11*c* of each of the first and second vibration generating portions 11-1 and 11-2 and the second protrusion line 31*b* of each of the first and second signal cables 30*a* and 30*b* by a second adhesive layer 11*g*. Accordingly, the second protrusion line (or a second finger line) 31*b* of each of the first and second signal cables 30*a* and 30*b* may be disposed between the second electrode portion 11*c* and the second cover member 11*e* of each of the first and second vibration generating portions 11-1 and 11-2 and may be provided as one body with the vibration device 11.

The first adhesive layer 11*f* may be disposed between the first and second vibration generating portions 11-1 and 11-2 and disposed at a first surface of each of the first and second vibration generating portions 11-1 and 11-2. The second adhesive layer 11*g* may be disposed between the first and second vibration generating portions 11-1 and 11-2 and disposed at a second surface of each of the first and second vibration generating portions 11-1 and 11-2. For example, the first and second adhesive layers 11*f* and 11*g* may be configured between the first cover member 11*d* and the second cover member 11*e* to completely surround each of the first and second vibration generating portions 11-1 and 11-2. The first and second adhesive layers 11*f* and 11*g* may be connected or coupled to each other between the first and second vibration generating portions 11-1 and 11-2.

In another example embodiment of the present disclosure, as described above with reference to FIGS. 37 to 39, at least a portion of each of the first and second signal cables 30*a* and 30*b* may be disposed or inserted between the first cover member 11*d* and the second cover member 11*e*, and thus, disconnections of the first and second protrusion lines 31*a* and 31*b* caused by a stress such as the movement or bending of the signal cable 30 may be prevented.

As described above, like the vibration device 11*d* described above with reference to FIGS. 33 and 34, the vibration device 11 according to another example embodiment of the present disclosure may be driven as a large-area vibration body (or a large-area vibrator) based on a single-body vibration of the first and second vibration generating portions 11-1 and 11-2. But embodiments of the present disclosure are not limited thereto. For example, the first and second vibration generating portions 11-1 and 11-2 could be also independently driven by a corresponding sound processing circuit. In addition, like the vibration device 11*d* described above with reference to FIGS. 37 to 39, in the vibration device 11 according to another example embodiment of the present disclosure, a structure and a manufacturing process may be simplified, an electrical characteristic of each of the first and second electrode portions 11*b* and 11*c* may be complemented, a connection structure between the vibration generating portions 11-1 and 11-2, the sound processing circuits 40*a* and 40*b*, the signal cables 30*a* and 30*b*, and the sound data generating circuit part may be simplified, and a filter circuit including an inductor and a capacitor for preventing EMI may be omitted.

In another example embodiment of the present disclosure, in the vibration device 11 according to another example embodiment of the present disclosure, as in a dotted line illustrated in FIG. 40, the first and second signal cables 30*a* and 30*b* may be modified or configured as one signal cable 30. The one signal cable 30 according to an example embodiment of the present disclosure may be configured as one without modifying a structure of the first and second signal cables 30*a* and 30*b*, and thus, may have a width which is wider than a sum of the widths of the first and second signal cables 30*a* and 30*b*. The one signal cable 30 according to an example embodiment of the present disclosure may be configured so that one periphery portion of a body portion with the first and second sound processing circuits 40*a* and 40*b* mounted thereon has a relatively wide width and the other portion, except the one periphery portion, of the body portion has the same width as that of one of the first and second signal cables 30*a* and 30*b*. But embodiments of the present disclosure are not limited thereto. For example, the one signal cable 30 could include only one sound processing circuit shared between the first and second vibration generating portions 11-1 and 11-2. In this case, the one signal cable 30 may have a width which is the same as or similar with a width of each of the first and second signal cables 30*a* and 30*b*.

Figure 42:
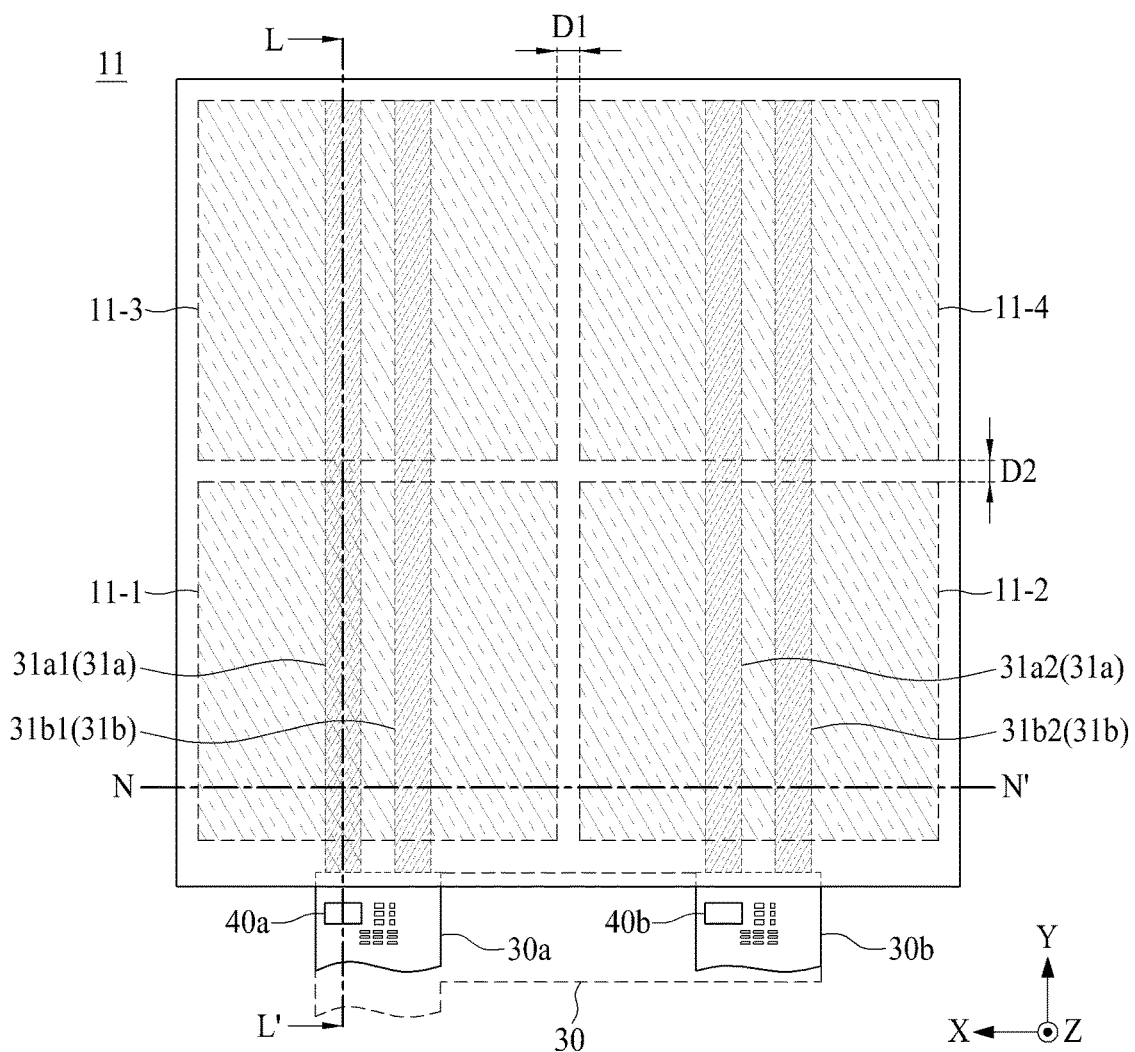
FIG. 42 illustrates a vibration device according to another example embodiment of the present disclosure.

FIG. 42 illustrates a vibration device according to another example embodiment of the present disclosure. FIG. 42 illustrates an example embodiment where four vibration generating portions are provided in the vibration device illustrated in FIGS. 40 and 41. Hereinafter, therefore, the elements except four vibration generating portions and relevant elements are referred to by like reference numerals, and their repetitive descriptions may be omitted for brevity or will be briefly given. An example of a cross-sectional surface taken along line L-L' illustrated in FIG. 42 is illustrated in FIG. 38, and an example of a cross-sectional surface taken along line N-N' illustrated in FIG. 42 is illustrated in FIG. 41.

With reference to FIG. 42 in conjunction with FIGS. 38 and 41, the vibration device 11 (vibration plate) according to another example embodiment of the present disclosure may include a plurality of vibration generating portions 11-1 to 11-4, a first signal cable 30*a*, and a second signal cable 30*b*.

The plurality of vibration generating portions 11-1 to 11-4 may be electrically disconnected and disposed spaced apart from one another along a first direction X and a second direction Y. For example, the plurality of vibration generating portions 11-1 to 11-4 may be arranged or tiled in an i×j form on the same plane. Each of the plurality of vibration generating portions 11-1 to 11-4 may include a piezoelectric vibration portion 11*a*, a first electrode portion 11*b*, and a second electrode portion 11*c*. Each of the plurality of vibration generating portions 11-1 to 11-4 may be substantially the same as each of the plurality of vibration generating portions 11-1 to 11-4 of the vibration device 11*d* described above with reference to FIG. 35, and thus, like reference numerals refer to like elements, and their repetitive descriptions may be omitted for brevity. Hereinafter, an example where the vibration device 11 includes first to fourth vibration generating portions 11-1 to 11-4 will be described.

The first signal cable 30*a* may be electrically connected, or electrically and directly connected to the first and second electrode portions 11*b* and 11*c* of each of the first and third vibration generating portions 11-1 and 11-3 at one side of the vibration device 11, and thus, may be integrated into the first and third vibration generating portions 11-1 and 11-3. For example, the first signal cable 30*a* may not pass through the power supply line and the pad part described above with reference to FIG. 35 and may be electrically connected to the first and second electrode portions 11b and 11c of each of the first and third vibration generating portions 11-1 and 11-3.

The second signal cable 30b may be electrically connected, or electrically and directly connected to the first and second electrode portions 11b and 11c of each of the second and fourth vibration generating portions 11-2 and 11-4 at one side of the vibration device 11, and thus, may be integrated into the second and fourth vibration generating portions 11-2 and 11-4. For example, the second signal cable 30b may not pass through the power supply line and the pad part described above with reference to FIG. 35 and may be electrically connected to the first and second electrode portions 11b and 11c of each of the second and fourth vibration generating portions 11-2 and 11-4.

Each of the first and second signal cables 30a and 30b according to an example embodiment of the present disclosure may include first and second protrusion lines 31a and 31b. For example, each of the first and second protrusion lines 31a and 31b may be referred to as a protrusion electrode, an extension line, an extension electrode, a flexible protrusion electrode, a flexible connection line, a flexible conductive line, a finger line, or a finger electrode, but embodiments of the present disclosure are not limited thereto.

The first protrusion line 31a of the first signal cable 30a (or a first upper protrusion line 31a1) may overlap at least a portion of the first electrode portion 11b of each of the first and third vibration generating portions 11-1 and 11-3 and may be electrically connected, or electrically and directly connected to the first electrode portion 11b. The second protrusion line 31b of the first signal cable 30a (or a first lower protrusion line 31b1) may overlap at least a portion of the second electrode portion 11c of each of the first and third vibration generating portions 11-1 and 11-3 and may be electrically connected, or electrically and directly connected to the second electrode portion 11c. For example, each of the first and second protrusion lines 31a and 31b of the first signal cable 30a may be bent toward a corresponding electrode portion of the first and second electrode portions 11b and 11c of each of the first and third vibration generating portions 11-1 and 11-3, but embodiments of the present disclosure are not limited thereto.

The first protrusion line 31a of the second signal cable 30b (or a second upper protrusion line 31a2) may overlap at least a portion of the first electrode portion 11b of each of the second and fourth vibration generating portions 11-2 and 11-4 and may be electrically connected or electrically and directly connected to the first electrode portion 11b. The second protrusion line 31b of the second signal cable 30b (or a second lower protrusion line 31b2) may overlap at least a portion of the second electrode portion 11c of each of the second and fourth vibration generating portions 11-2 and 11-4 and may be electrically connected or electrically and directly connected to the second electrode portion 11c. For example, each of the first and second protrusion lines 31a and 31b of the second signal cable 30b may be bent toward a corresponding electrode portion of the first and second electrode portions 11b and 11c of each of the second and fourth vibration generating portions 11-2 and 11-4, but embodiments of the present disclosure are not limited thereto.

Each of the first and second signal cables 30a and 30b according to an example embodiment of the present disclosure may include a body portion, the first and second protrusion lines 31a and 31b, and sound processing circuits 40a and 40b. Each of the first and second signal cables 30a and 30b may be substantially the same as the signal cable 30 described above with reference to FIGS. 37 to 39, and thus, like reference numerals refer to like elements, and their repetitive descriptions may be omitted for brevity or will be briefly given.

The sound processing circuit (or a first sound processing circuit) 40a mounted on or integrated into the first signal cable 30a may generate first and second vibration driving signals based on sound data supplied from an external sound data generating circuit part and may supply the first and second vibration driving signals to the first and second electrode portions 11b and 11c of each of the first and third vibration generating portions 11-1 and 11-3 through the first and second protrusion lines 31a and 31b. The sound processing circuit 40a mounted on the first signal cable 30a may include a decoding part, an audio amplifier circuit, a memory circuit, a control circuit, and a passive element such as a resistor, or the like. The elements of the sound processing circuit 40a may be substantially the same as the elements of the sound processing circuit 40 described above with reference to FIG. 36 or 38, and thus, like reference numerals refer to like elements, and the repetitive description thereof may be omitted for brevity.

The sound processing circuit (or a second sound processing circuit) 40b mounted on or integrated into the second signal cable 30b may generate first and second vibration driving signals based on sound data supplied from an external sound data generating circuit part and may supply the first and second vibration driving signals to the first and second electrode portions 11b and 11c of each of the second and fourth vibration generating portions 11-2 and 11-4 through the first and second protrusion lines 31a and 31b. The sound processing circuit 40b mounted on the second signal cable 30b may include a decoding part, an audio amplifier circuit, a memory circuit, a control circuit, and a passive element such as a resistor, or the like. The elements of the sound processing circuit 40b may be substantially the same as the elements of the sound processing circuit 40 described above with reference to FIG. 36 or 38, and thus, like reference numerals refer to like elements, and the repetitive description thereof may be omitted for brevity.

The vibration device 11 according to another example embodiment of the present disclosure may further include a first cover member 11d and a second cover member 11e. Except that the first and second cover member 11d and 11e are configured to respectively cover the first to fourth vibration generating portions 11-1 to 11-4 and the first and second protrusion lines 31a and 31b of each of the first and second signal cables 30a and 30b, the first and second cover member 11d and 11e may be substantially the same as the first and second cover member 11d and 11e described above with reference to FIG. 35 or 37 to 39, and thus, like reference numerals refer to like elements, and their repetitive descriptions may be omitted for brevity or will be briefly given.

The first cover member 11d may be disposed at the first surface of the vibration device 11. For example, the first cover member 11d may be configured to cover the first electrode portion 11b of each of the first to fourth vibration generating portions 11-1 to 11-4 and the first protrusion line 31a of each of the first and second signal cables 30a and 30b.

The second cover member 11e may be disposed at the second surface of the vibration device 11. For example, the second cover member 11e may be configured to cover the second electrode portion 11c of each of the first to fourth vibration generating portions 11-1 to 11-4 and the second protrusion line 31b of each of the first and second signal cables 30a and 30b.

The first cover member 11d according to an example embodiment of the present disclosure may be connected or coupled to the first electrode portion 11b of each of the first to fourth vibration generating portions 11-1 to 11-4 and the first protrusion line 31a of each of the first and second signal cables 30a and 30b by a first adhesive layer 11f. Accordingly, the first protrusion line (or a first finger line) 31a of each of the first and second signal cables 30a and 30b may be disposed between the first electrode portion 11b and the first cover member 11d of each of the first to fourth vibration generating portions 11-1 to 11-4 and may be provided as one body with the vibration device 11.

The second cover member 11e according to an example embodiment of the present disclosure may be connected or coupled to the second electrode portion 11c of each of the first to fourth vibration generating portions 11-1 to 11-4 and the second protrusion line 31b of each of the first and second signal cables 30a and 30b by a second adhesive layer 11g. Accordingly, the second protrusion line (or a second finger line) 31b of each of the first and second signal cables 30a and 30b may be disposed between the second electrode portion 11c and the second cover member 11e of each of the first to fourth vibration generating portions 11-1 to 11-4 and may be provided as one body with the vibration device 11.

The first adhesive layer 11f may be disposed between the first to fourth vibration generating portions 11-1 to 11-4 and disposed at a first surface of each of the first to fourth vibration generating portions 11-1 to 11-4. The second adhesive layer 11g may be disposed between the first to fourth vibration generating portions 11-1 to 11-4 and disposed at a second surface of each of the first to fourth vibration generating portions 11-1 to 11-4. For example, the first and second adhesive layers 11f and 11g may be configured between the first cover member 11d and the second cover member 11e to completely surround each of the first to fourth vibration generating portions 11-1 to 11-4. The first and second adhesive layers 11f and 11g may be connected or coupled to each other between the first to fourth vibration generating portions 11-1 to 11-4.

In another example of the present disclosure, as described above with reference to FIGS. 37 to 39, at least a portion of each of the first and second signal cables 30a and 30b may be disposed or inserted between the first cover member 11d and the second cover member 11e, and thus, disconnections of the first and second protrusion lines 31a and 31b caused by a stress such as the movement or bending of the signal cable 30 may be prevented.

As described above, like the vibration device 11d described above with reference to FIG. 35, the vibration device 11 according to another example embodiment of the present disclosure may be driven as a large-area vibration body (or a large-area vibrator) based on a single-body vibration of the first to fourth vibration generating portions 11-1 to 11-4. In addition, like the vibration device 11d described above with reference to FIGS. 37 to 39, in the vibration device 11 according to another example embodiment of the present disclosure, a structure and a manufacturing process may be simplified, an electrical characteristic of each of the first and second electrode portions 11b and 11c may be complemented, a connection structure between the first to fourth vibration generating portions 11-1 to 11-4, the sound processing circuits 40a and 40b, the signal cables 30a and 30b, and the sound data generating circuit part may be simplified, and a filter circuit including an inductor and a capacitor for preventing EMI may be omitted.

According to another example embodiment of the present disclosure, in the vibration device 11 according to another example embodiment of the present disclosure, as in a dotted line illustrated in FIG. 42, the first and second signal cables 30a and 30b may be modified or configured as one signal cable 30. The one signal cable 30 according to an example embodiment of the present disclosure may be configured as one without modifying a structure of the first and second signal cables 30a and 30b, and thus, may have a width which is wider than a sum of the widths of the first and second signal cables 30a and 30b. The one signal cable 30 according to an example embodiment of the present disclosure may be configured so that one periphery portion of a body portion with the first and second sound processing circuits 40a and 40b mounted thereon has a relatively wide width and the other portion, except the one periphery portion, of the body portion has the same width as that of one of the first and second signal cables 30a and 30b.

Figure 43:
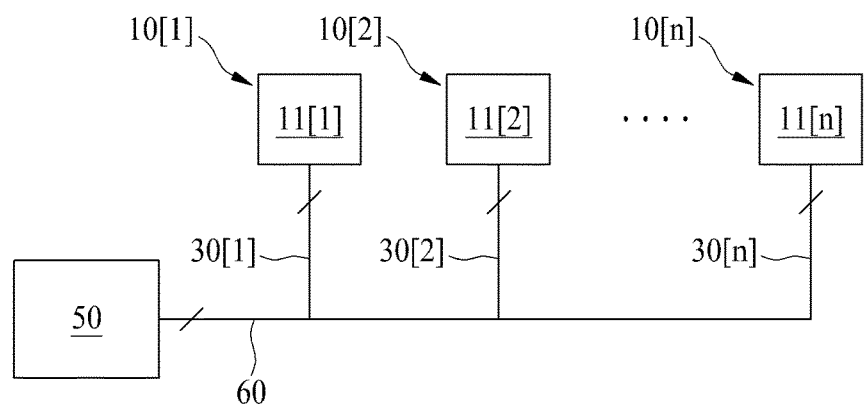
FIG. 43 illustrates an apparatus according to an example embodiment of the present disclosure.
Figure 44:
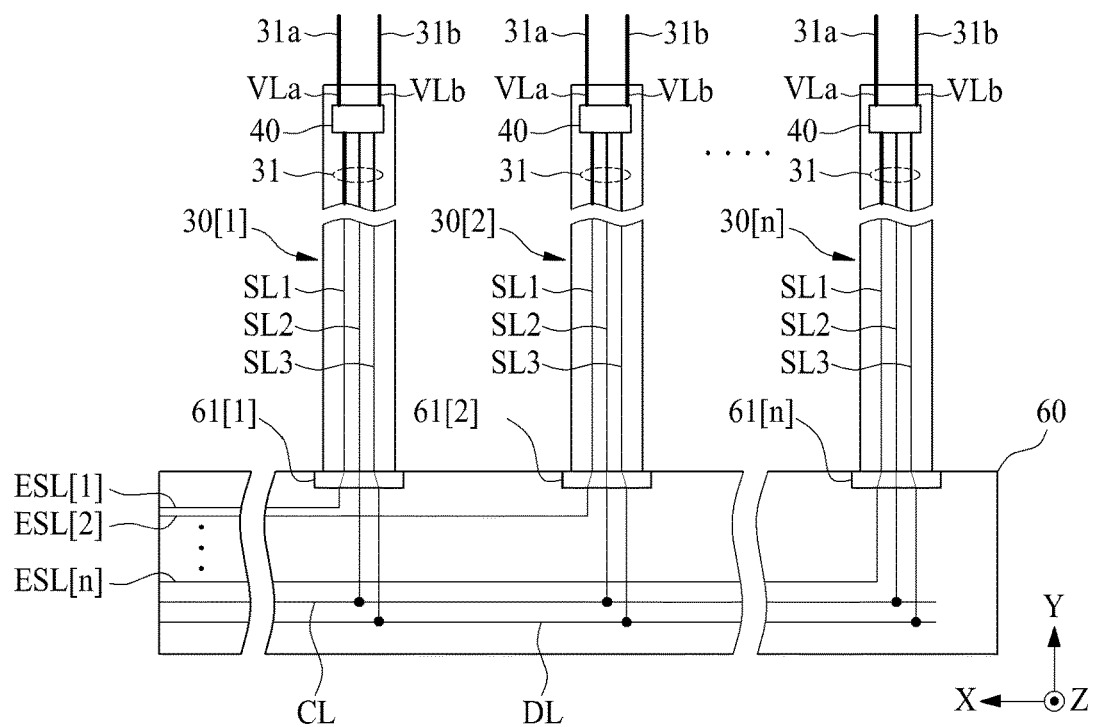
FIG. 44 illustrates an example of a main cable and first to nth signal cables illustrated in FIG. 43.
Figure 45:
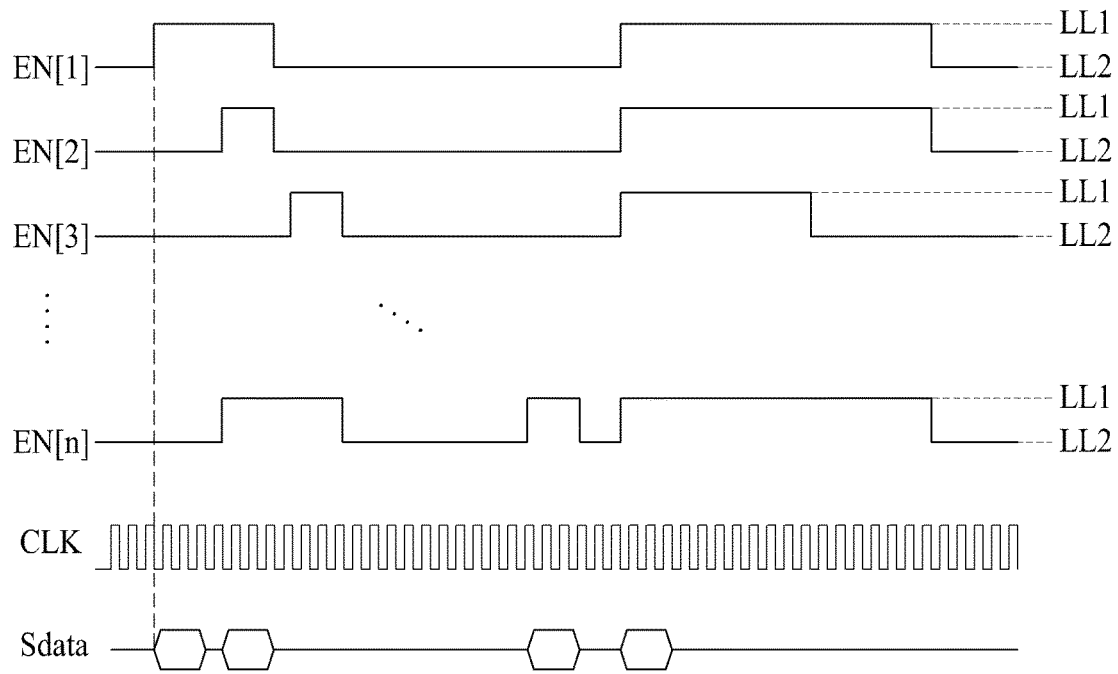
FIG. 45 is an example of a waveform diagram showing an output signal of the sound data generating circuit part illustrated in FIG. 43.

FIG. 43 illustrates an apparatus according to an example embodiment of the present disclosure. FIG. 44 illustrates an example of a main cable and first to nth signal cables illustrated in FIG. 43. FIG. 45 is an example of a waveform diagram showing an output signal of the sound data generating circuit part illustrated in FIG. 43. FIGS. 43 to 45 illustrate an example of an apparatus including or applying the vibration apparatus illustrated in one or more of FIGS. 1 to 42.

With reference to FIGS. 43 to 45, the apparatus according to an example embodiment of the present disclosure may include first to nth vibration apparatuses 10[1] to 10[n], a sound data generating circuit part 50, a main cable 60, and first to nth signal cables 30[1] to 30[n].

Each of the first to nth vibration apparatuses 10[1] to 10[n] may be any one of the vibration apparatuses 10-1 to 10-7 described above with reference to FIGS. 1 to 42. For example, the first to nth vibration apparatuses 10[1] to 10[n] may be the same or different from each other. One or more of the first to nth vibration apparatuses 10[1] to 10[n] may differ from one another. Therefore, the repetitive description of each of the first to nth vibration apparatuses 10[1] to 10[n] may be omitted for brevity.

Each of the first to nth vibration apparatuses 10[1] to 10[n] may include a vibration device 11[1] to 11[n]. Each of the vibration device 11[1] to 11 [n] of the first to nth vibration apparatuses 10[1] to 10[n] may include any one of the vibration device 11d described above with reference to FIGS. 36 to 42. For example, the vibration device 11[1] to 11[n] of the first to nth vibration apparatuses 10[1] to 10[n] may be the same or different from one another. One or more of the vibration device 11[1] to 11[n] among the first to nth vibration apparatuses 10[1] to 10[n] may differ from one another. Therefore, the repetitive description of the vibration device 11[1] to 11 [n] of the first to nth vibration apparatuses 10[1] to 10[n] may be omitted for brevity.

The sound data generating circuit part 50 (or a sound card) may generate sound data Sdata based on a sound source (or a digital sound source). The sound data generating circuit part 50 may generate first to nth enable signals EN[1] to EN[n] corresponding to a driving mode of the apparatus based on the sound source or the sound data. The sound data generating circuit part 50 may encode a reference clock CLK, the sound data Sdata, and the first to nth enable signals EN[1] to EN[n] based on a predetermined serial interface type (or a digital serial interface type) and may supply the encoded reference clock CLK, sound data Sdata, and first to nth enable signals EN[1] to EN[n] to the first to nth vibration apparatuses 10[1] to 10[n]. For example, the sound data generating circuit part 50 may transfer the sound data Sdata corresponding to each of the first to nth vibration apparatuses 10[1] to 10[n] based on the serial interface type. For example, the serial interface type may be an integrated interchip sound (I2S), but embodiments of the present disclosure are not limited thereto.

The main cable 60 may be connected to the sound data generating circuit part 50. For example, the main cable 60 may have a length corresponding to a longest distance between the sound data generating circuit part 50 and each of the first to nth vibration apparatuses 10[1] to 10[n].

The main cable 60 according to an example embodiment of the present disclosure may include first to nth enable signal lines ESL[1] to ESL[n], a clock line CL, and a data line DL.

The sound data generating circuit part 50 may supply the first to nth enable signals EN[1] to EN[n] respectively corresponding to the first to nth enable signal lines ESL[1] to ESL[n], supply the reference clock CLK to the clock line CL, and supply the sound data Sdata to the data line DL.

Each of the first to nth signal cables 30[1] to 30[n] may be connected between the main cable 60 and a corresponding vibration apparatus of the first to nth vibration apparatuses 10[1] to 10[n].

Each of the first to nth signal cables 30[1] to 30[n] according to an example embodiment of the present disclosure may branch or extend from the main cable 60 to a corresponding vibration apparatus of the first to nth vibration apparatuses 10[1] to 10[n]. For example, each of the first to nth signal cables 30[1] to 30[n] may branch or extend from the main cable 60 and may be individually connected to a corresponding vibration apparatus of the first to nth vibration apparatuses 10[1] to 10[n].

According to another example embodiment of the present disclosure, each of the first to nth signal cables 30[1] to 30[n] may be connected to the main cable 60 based on a connector scheme. For example, the main cable 60 may further include first to nth connectors 61[1] to 61[n].

Each of the first to nth connectors 61[1] to 61[n] may include first to third connection terminals. The first connection terminal of each of the first to nth connectors 61[1] to 61[n] may be electrically connected to a corresponding enable signal line of the first to nth enable signal lines ESL[1] to ESL[n]. The second connection terminal of each of the first to nth connectors 61[1] to 61[n] may be electrically connected to the clock line CL in common. The third connection terminal of each of the first to nth connectors 61[1] to 61[n] may be electrically connected to the data line DL in common.

According to an example embodiment of the present disclosure, at least a portion of each of the first to nth signal cables 30[1] to 30[n] connected to the main cable 60 by the connector scheme may be inserted between the first and second cover members 11d and 11e of the vibration device 11 as described above with reference to FIG. 38, and repetitive descriptions thereof may be omitted for brevity.

Each of the first to nth signal cables 30[1] to 30[n] according to an example embodiment of the present disclosure may include a body portion, first and second protrusion lines 31a and 31b, and a sound processing circuit 40.

The body portion, as illustrated in FIG. 38, may include a line layer 31 on a based film, a lower film 32 coupled to a first surface of the line layer 31 by a first adhesive 33, an upper film 34 coupled to a second surface of the line layer 31 by a second adhesive 35, and a plurality of contact pads disposed at the upper film 34 and connected to the line layer 31.

The line layer 31 may include first to third signal lines SL1 to SL3 and first and second driving signal supply lines VLa and VLb.

The first to third signal lines SL1 to SL3 may be disposed to be parallel to each other.

The first signal line SL1 of each of the first to nth signal cables 30[1] to 30[n] may be individually connected to a corresponding enable signal line of the first to nth enable signal lines ESL[1] to ESL[n] of the main cable 60. For example, the first signal line SL1 of the first signal cable 30[1] may be electrically connected to the first enable signal line ESL[1] of the main cable 60, and the first signal line SL1 of the nth signal cable 30[n] may be electrically connected to the nth enable signal line ESL[n] of the main cable 60.

The second signal line SL2 of each of the first to nth signal cables 30[1] to 30[n] may be connected to the clock line CL of the main cable 60 in common.

The third signal line SL3 of each of the first to nth signal cables 30[1] to 30[n] may be connected to the data line DL of the main cable 60 in common.

Each of the first and second driving signal supply lines VLa and VLb may be disposed in parallel at an end portion of a corresponding signal cable of the first to nth signal cables 30[1] to 30[n].

Each of the first and second protrusion lines 31a and 31b may be electrically connected to each of the first and second driving signal supply lines VLa and VLb, or may pass through one lateral surface of the body portion from the first and second driving signal supply lines VLa and VLb and may extend or protrude, respectively.

The first protrusion line 31a may be electrically connected to a first electrode portion of the vibration device 11 of a corresponding vibration apparatus, and the second protrusion line 31b may be electrically connected to a second electrode portion of the vibration device 11 of a corresponding vibration apparatus. This is as described above, and thus, their repetitive descriptions may be omitted for brevity.

The sound processing circuit 40 may be mounted on each of the first to nth signal cables 30[1] to 30[n] and may be electrically connected to each of the first to third signal lines SL1 to SL3 and each of the first and second driving signal supply lines VLa and VLb.

The sound processing circuit 40 may decode the reference clock CLK, the sound data Sdata, and the first to nth enable signals EN[1] to EN[n] supplied from the sound data generating circuit part 50 through the first to third signal lines SL1 to SL3, generate first and second vibration driving signals for vibrating each of the first to nth vibration apparatuses 10[1] to 10[n] based on the decoded reference clock CLK, sound data Sdata, and first to nth enable signals EN[1] to EN[n], and output the first and second vibration driving signals to the first and second driving signal supply lines VLa and VLb. Therefore, each of the first to nth vibration apparatuses 10[1] to 10[n] may vibrate based on the first and second vibration driving signals supplied through the first and second driving signal supply lines VLa and VLb and the first and second protrusion lines 31a and 31b of a corresponding signal cable of the first to nth signal cables 30[1] to 30[n] and output a sound corresponding to the sound data Sdata. For example, each of the first to nth vibration apparatuses 10[1] to 10[n] may be sequentially or simultaneously driven based on a corresponding enable signal of the first to nth enable signal lines ESL[1] to ESL[n].

According to an example embodiment of the present disclosure, the sound processing circuit 40 mounted on each of the first to nth signal cables 30[1] to 30[n] may be enabled based on an enable signal having a first logic level LL1 supplied through the first signal line SL1 of a corresponding signal cable to generate the first and second vibration driving signals, and may be disabled based on a disable signal having a second logic level LL2. For example, the sound processing circuit 40 mounted on the first signal cable 30[1] may be enabled based on the first enable signal EN[1] having the first logic level LL1 supplied through the first signal line SL1 of the first enable signal EN[1], generate the first and second vibration driving signals based on the reference clock CLK and the sound data Sdata, and output the first and second vibration driving signals to the first and second driving signal supply lines VLa and VLb. Likewise, the sound processing circuit 40 mounted on the nth signal cable 30[n] may be enabled based on the nth enable signal EN[n] having the first logic level LL1 supplied through the first signal line SL1 of the nth enable signal EN[n], generate the first and second vibration driving signals based on the reference clock CLK and the sound data Sdata, and output the first and second vibration driving signals to the first and second driving signal supply lines VLa and VLb.

As described above, in the vibration apparatus according to an example embodiment of the present disclosure, the sound data Sdata output from the sound data generating circuit part 50 may be transferred to each of the first to nth vibration apparatuses 10[1] to 10[n] based on a serial interface type using the main cable 60 and the first to nth signal cables 30[1] to 30[n], and thus, a line structure between the sound data generating circuit part 50 and the first to nth vibration apparatuses 10[1] to 10[n] may be simplified and assemblability may be enhanced. In addition, as the sound processing circuit 40 is mounted on each of the first to nth signal cables 30[1] to 30[n], a circuit configuration may be simplified, and a filter circuit including an inductor and a capacitor for preventing EMI occurring due to a length of each of the main cable 60 and the first to nth signal cables 30[1] to 30[n] may be omitted.

Figure 46:
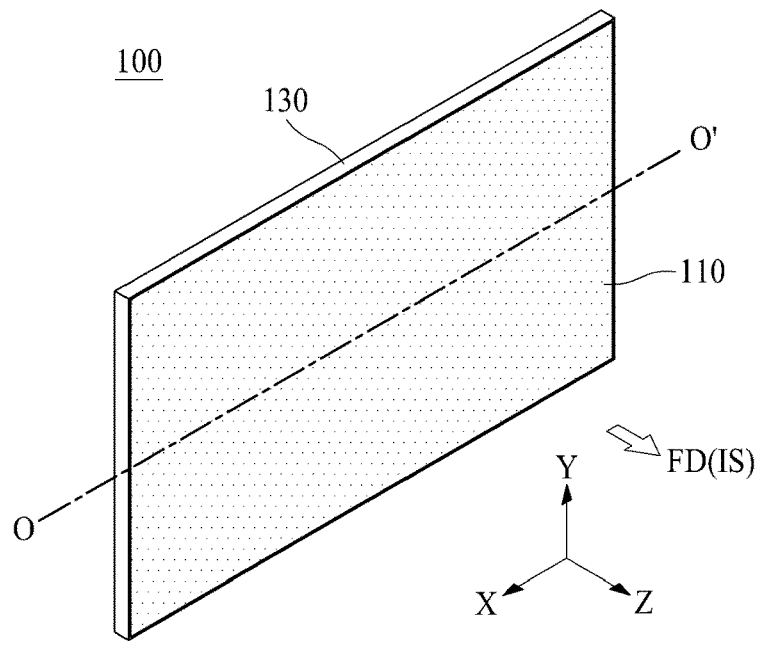
FIG. 46 illustrates an apparatus 100 according to another example embodiment of the present disclosure.
Figure 47:
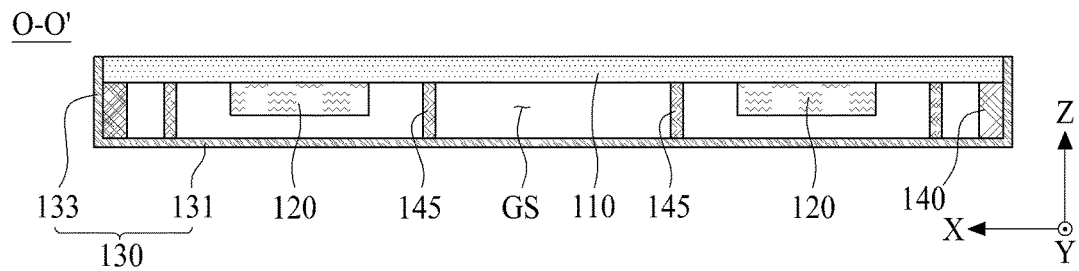
FIG. 47 is an example of a cross-sectional view taken along line O-O' illustrated in FIG. 46.

FIG. 46 illustrates an apparatus according to another example embodiment of the present disclosure. FIG. 47 is an example of a cross-sectional view taken along line O-O' illustrated in FIG. 46. FIGS. 46 and 47 illustrate an apparatus applying or including the vibration apparatus illustrated in one or more of FIGS. 1 to 42.

With reference to FIGS. 46 and 47, the apparatus 100 according to another example embodiment of the present disclosure may be referred to as a display apparatus or a display apparatus for vehicular apparatuses, or the like, but embodiments of the present disclosure are not limited thereto.

The apparatus 100 according to another example embodiment of the present disclosure may include a vibration member and one or more vibration generating apparatuses 120.

The vibration member may be referred to as a vibration object, a vibration target, a sound output member, a vibration panel, or a sound output panel, or the like, but embodiments of the present disclosure are not limited thereto.

The vibration member according to another example embodiment of the present disclosure may include a display panel configured to display an electronic image or a digital image. For example, the vibration member may be a display panel which outputs light through a plurality of self-emitting pixels to display an image. Hereinafter, in the following descriptions of FIGS. 46 and 47, an example where the vibration member is a display panel 110 will be described.

The display panel 110 according to an example embodiment of the present disclosure may be any type of display panel (or a curved display panel), such as an organic light-emitting display panel, a quantum dot light-emitting display panel, a micro light-emitting diode display panel, an electrophoresis display panel, and an electro-wetting display panel, but embodiments of the present disclosure are not limited thereto. According to another example embodiment of the present disclosure, the display panel 110 may be a flexible display panel. For example, the display panel 110 may be a flexible liquid crystal display panel, a flexible organic light-emitting display panel, a flexible quantum dot light-emitting display, a flexible micro light emitting diode display panel, a flexible electrophoretic display panel, or a flexible electro-wetting display panel, but embodiments of the present disclosure are not limited thereto. According to another example embodiment of the present disclosure, the display panel 110 may be a transparent display panel or a flexible display panel. According to another example embodiment of the present disclosure, the display panel 110 may be a display panel with an integrated touch panel. For example, the display panel with an integrated touch panel may include a touch panel attached at a display panel, or may include a touch electrode layer disposed inside the display panel.

The one or more vibration generating apparatuses 120 may be configured to vibrate the display panel 110. The one or more vibration generating apparatuses 120 may be connected or coupled to a rear surface of the display panel 110. For example, the one or more vibration generating apparatuses 120 may include one or more of the vibration apparatuses 10-1 to 10-7 described above with reference to FIGS. 1 to 42. Therefore, descriptions of the one or more vibration generating apparatuses 120 may be omitted for brevity.

The one or more vibration generating apparatuses 120 according to an example embodiment of the present disclosure may include the vibration apparatus 10-1 to 10-4 illustrated in one or more of FIGS. 1 to 8, and the one or more vibration generating apparatuses 120 (or the vibration apparatus 10-1 to 10-4 of the one or more vibration generating apparatuses 120) may be connected or coupled to the rear surface of the display panel 110 by an adhesive member 12 after a second auxiliary member 10b is stripped or removed.

The one or more vibration generating apparatuses 120 according to another example embodiment of the present disclosure may include the vibration apparatus 10-1 to 10-4 illustrated in one or more of FIGS. 1 to 8 including the vibration device 11 illustrated in one or more of FIGS. 29 to 42, and the one or more vibration generating apparatuses 120 (or the vibration apparatus 10-1 to 10-4 of the one or more vibration generating apparatuses 120) may be connected or coupled to the rear surface of the display panel 110 by the adhesive member 12 after the second auxiliary member 10b is stripped or removed.

The one or more vibration generating apparatuses 120 according to another example embodiment of the present disclosure may include the vibration apparatus 10-5 to 10-7 illustrated in one or more of FIGS. 9 to 19, and the one or more vibration generating apparatuses 120 (or the vibration apparatus 10-5 to 10-7 of the one or more vibration generating apparatuses 120) may be connected or coupled to the rear surface of the display panel 110 by the coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration plate 15 illustrated in one or more of FIGS. 20 to 28, and the one or more vibration generating apparatuses 120 (or the vibration apparatus 10-5 to 10-7 of the one or more vibration generating apparatuses 120) may be connected or coupled to the rear surface of the display panel 110 by a coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration device 11 illustrated in one or more of FIGS. 29 to 42, and the one or more vibration generating apparatuses 120 (or the vibration apparatus 10-5 to 10-7 of the one or more vibration generating apparatuses 120) may be connected or coupled to the rear surface of the display panel 110 by a coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration plate 15 illustrated in one or more of FIGS. 20 to 28 and the vibration device 11 illustrated in one or more of FIGS. 29 to 42, and the one or more vibration generating apparatuses 120 (or the vibration apparatus 10-5 to 10-7 of the one or more vibration generating apparatuses 120) may be connected or coupled to the rear surface of the display panel 110 by a coupling member 18 after the second auxiliary member is stripped or removed.

When the apparatus 100 according to another example embodiment of the present disclosure includes a plurality of vibration generating apparatuses 120, the plurality of vibration generating apparatuses 120 may be connected or coupled to the rear surface of the display panel 110 to have a certain interval along one or more directions of a first direction X and a second direction Y. Each of the plurality of vibration generating apparatuses 120 may include one or more of the vibration apparatuses 10-1 to 10-7 described above with reference to FIGS. 1 to 42. The plurality of vibration generating apparatuses 120 may include the same or different vibration apparatuses. One or more of the plurality of vibration generating apparatuses 120 may differ from one another.

One or more vibration generating apparatuses (or a plurality of vibration generating apparatuses) 120 according to an example embodiment of the present disclosure may vibrate or directly vibrate the display panel 110 in response to a vibration driving signal supplied from a sound processing circuit. For example, the one or more vibration generating apparatuses 120 may vibrate based on the vibration driving signal synchronized with an image displayed by the display panel 110 to vibrate the display panel 110, or may directly vibrate the display panel 110. In another example embodiment of the present disclosure, the one or more vibration generating apparatuses 120 may vibrate based on the vibration driving signal (or a haptic feedback signal) synchronized with a user touch applied to a touch panel (or a touch sensor layer) connected to or embedded into the display panel 110, or may directly vibrate the display panel 110. Accordingly, the display panel 110 may vibrate based on vibrations of the one or more vibration generating apparatuses 120 to provide the user (or a viewer) with at least one or more of a sound and a haptic feedback.

Like the vibration apparatus described above with reference to FIGS. 43 to 45, the plurality of vibration generating apparatuses 120 according to another example embodiment of the present disclosure may be connected to the sound data generating circuit part 50 through the plurality of signal cables 30[1] to 30[n] and the main cable 60 and may vibrate or directly vibrate the display panel 110 in response to a vibration driving signal supplied from the sound processing circuit 40 mounted on each of the plurality of signal cables 30[1] to 30[n].

The apparatus 100 according to another example embodiment of the present disclosure may further include a rear structure 130 and a panel connection member 140.

The rear structure 130 may be disposed at the rear surface of the display panel 110. For example, the rear structure 130 may cover the rear surface of the display panel 110. For example, the rear structure 130 may cover all of the rear surface of the display panel 110 with a gap space GS therebetween. For example, the rear structure 130 may be implemented as an arbitrary-type frame or arbitrary-type plate structure, or the like disposed at the rear surface of the display panel 110.

The rear structure 130 according to an example embodiment of the present disclosure may further cover a lateral surface of the display panel 110. For example, the rear structure 130 may include a rear cover (or a rear portion) 131 which covers the rear surface of the display panel 110 with the gap space GS therebetween, and a lateral cover (or a lateral portion or a side portion or a side cover) 133 which is connected to an end of the rear cover 131 and covers the lateral surface of the display panel 110. In the rear structure 130, the rear cover 131 and the lateral cover 133 may be integrated as one body, but embodiments of the present disclosure are not limited thereto.

The panel connection member 140 may be disposed between the display panel 110 and the rear structure 130. The panel connection member 140 may be connected or coupled between the display panel 110 and the rear structure 130 to surround the one or more vibration generating apparatuses 120, and thus, the gap space GS between the display panel 110 and the rear structure 130 may be provided.

According to an example embodiment of the present disclosure, when the panel connection member 140 is disposed between the display panel 110 and the rear structure 130, the lateral cover 133 of the rear structure 130 may be omitted.

The apparatus 100 according to another example embodiment of the present disclosure may further include a partition 145.

The partition 145 may be connected or coupled between the display panel 110 and the rear structure 130 to surround the one or more vibration generating apparatuses 120. For example, the partition 145 may be connected or coupled to one or more of the display panel 110 and the rear structure 130 to surround the one or more vibration generating apparatuses 120. The partition 145 may be configured in a circular shape, an oval shape, or a polygonal shape, but embodiments of the present disclosure are not limited thereto.

The partition 145 according to an example embodiment of the present disclosure may limit a vibration region by the one or more vibration generating apparatuses 120. For example, the partition 145 may be an air gap or a space, where a sound is generated when the one or more vibration generating apparatuses 120 vibrate. For example, the partition 145 may separate the sounds or a channel and may minimize or prevent or decrease the reduction of a sound characteristic caused by interference of the sounds. For example, the partition 145 may be referred to as a sound blocking member, a sound separation member, a space separation member, or a baffle, or the like, but embodiments of the present disclosure are not limited thereto.

Additionally, the apparatus 100 according to another example embodiment of the present disclosure may further include one or more pads.

The one or more pads may be configured to protrude toward the vibration generating apparatus 120 from one or more sides of the partition 145. The one or more pads may be configured to trap a reflected wave reflected from the partition 145, thereby preventing or minimizing a reduction in sound pressure level characteristic caused by a standing wave generated based on interference of the reflected wave and a progressive wave. The one or more pads may be substantially the same as the one or more pads 19 described above with reference to FIGS. 9 and 10, and thus, the repetitive description thereof may be omitted for brevity.

As described above, the apparatus 100 according to another example embodiment of the present disclosure may vibrate the display panel (or a vibration member) 110 based on vibrations of the one or more vibration generating apparatuses 120, and thus, may output a sound to an indoor space IS of a vehicular apparatus or in a forward direction FD of the display panel (or the vibration member) 110.

Figure 48:
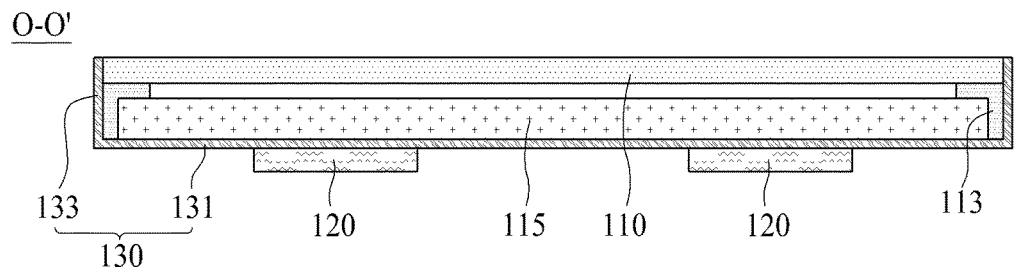
FIG. 48 is an example of another cross-sectional view taken along line O-O' illustrated in FIG. 46.

FIG. 48 is an example of another cross-sectional view taken along line O-O' illustrated in FIG. 46. FIG. 48 illustrates an example of an apparatus applying or including the vibration apparatus illustrated in one or more of FIGS. 1 to 42.

With reference to FIGS. 46 and 48, the apparatus 100 according to another example embodiment of the present disclosure may be referred to as a display apparatus, a sound output apparatus, or a display apparatus for vehicular apparatuses, or the like, but embodiments of the present disclosure are not limited thereto.

The apparatus 100 according to another example embodiment of the present disclosure may include a vibration member, a rear structure 130, a supporting frame 113, a backlight apparatus 115, and one or more vibration generating apparatuses 120.

The vibration member may be referred to as a vibration object, a vibration target, a sound output member, a vibration panel, or a sound output panel, or the like, but embodiments of the present disclosure are not limited thereto.

The vibration member according to another example embodiment of the present disclosure may include a display panel for displaying an electronic image or a digital image. For example, the vibration member may be a liquid crystal display panel which outputs light through a plurality of liquid crystal pixels to display an image. Hereinafter, in the following descriptions of FIGS. 46 and 48, an example where the vibration member is a liquid crystal display panel 110 will be described.

The rear structure 130 may be disposed at a rear surface of the liquid crystal display panel 110. For example, the rear structure 130 may cover the rear surface of the liquid crystal display panel 110. The rear structure 130 may further cover a lateral surface of the liquid crystal display panel 110. For example, the rear structure 130 according to an example embodiment of the present disclosure may include a rear cover (or a rear portion) 131 which covers the rear surface of the liquid crystal display panel 110 and a lateral cover (or a lateral portion or a side cover) 133 which is connected to an end of the rear cover 131 and covers the lateral surface of the liquid crystal display panel 110. Therefore, the rear structure 130 may include an accommodating space which is provided on the rear cover 131 under the rear surface of the liquid crystal display panel 110 and surrounds by the lateral cover 133.

The supporting frame 113 may be configured to support a rear periphery portion of the liquid crystal display panel 110. For example, the supporting frame 113 may be disposed at the accommodating space of the rear structure 130 and may support the rear periphery portion of the liquid crystal display panel 110. The supporting frame 113 may include an opening portion which overlaps a display area, other than the periphery portion, of the liquid crystal display panel 110.

The backlight apparatus 115 may be configured to irradiate light onto the liquid crystal display panel 110. For example, the backlight apparatus 115 may be disposed at the accommodating space of the rear structure 130 and may be surrounded by the supporting frame 113. The backlight apparatus 115 according to an example embodiment of the present disclosure may include a light guide member, a light source part including one or more light emitting diodes which irradiate light onto one or more lateral surfaces of the light guide member, a reflective sheet disposed between the light guide member and the rear cover 131 of the rear structure 130, and an optical sheet portion including one or more optical sheets stacked on the light guide member.

The one or more vibration generating apparatuses 120 may be configured so that the liquid crystal display panel 110 vibrates based on a vibration of the rear structure 130.

The one or more vibration generating apparatuses 120 according to another example embodiment of the present disclosure may be connected or coupled to the rear cover 131 of the rear structure 130. For example, the one or more vibration generating apparatuses 120 may be connected or coupled to a rear surface of the rear cover 131. For example, the one or more vibration generating apparatuses 120 may include one or more of the vibration apparatuses 10-1 to 10-7 described above with reference to FIGS. 1 to 42. Therefore, descriptions of the one or more vibration generating apparatuses 120 may be omitted for brevity.

The one or more vibration generating apparatuses 120 according to an example embodiment of the present disclosure may include the vibration apparatus 10-1 to 10-4 illustrated in one or more of FIGS. 1 to 8, and the one or more vibration generating apparatuses 120 (or the vibration apparatus 10-1 to 10-4 of the one or more vibration generating apparatuses 120) may be connected or coupled to the rear surface of the rear cover 131 by an adhesive member 12 after a second auxiliary member 10*b* is stripped or removed.

The one or more vibration generating apparatuses 120 according to another example embodiment of the present disclosure may include the vibration apparatus 10-1 to 10-4 illustrated in one or more of FIGS. 1 to 8 including the vibration device 11 illustrated in one or more of FIGS. 29 to 42, and the one or more vibration generating apparatuses 120 (or the vibration apparatus 10-1 to 10-4 of the one or more vibration generating apparatuses 120) may be connected or coupled to the rear surface of the rear cover 131 by the adhesive member 12 after the second auxiliary member 10*b* is stripped or removed.

The one or more vibration generating apparatuses 120 according to another example embodiment of the present disclosure may include the vibration apparatus 10-5 to 10-7 illustrated in one or more of FIGS. 9 to 19, and the one or more vibration generating apparatuses 120 (or the vibration apparatus 10-5 to 10-7 of the one or more vibration generating apparatuses 120) may be connected or coupled to the rear surface of the rear cover 131 by the coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration plate 15 illustrated in one or more of FIGS. 20 to 28, and the one or more vibration generating apparatuses 120 (or the vibration apparatus 10-5 to 10-7 of the one or more vibration generating apparatuses 120) may be connected or coupled to the rear surface of the rear cover 131 by a coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration device 11 illustrated in one or more of FIGS. 29 to 42, and the one or more vibration generating apparatuses 120 (or the vibration apparatus 10-5 to 10-7 of the one or more vibration generating apparatuses 120) may be connected or coupled to the rear surface of the rear cover 131 by a coupling member 18 after the second auxiliary member is stripped or removed.

The one or more vibration generating apparatuses 120 according to another example embodiment of the present disclosure may include the vibration apparatus 10-5 to 10-7 illustrated in one or more of FIGS. 9 to 19 including the vibration plate 15 illustrated in one or more of FIGS. 20 to 28 and the vibration device 11 illustrated in one or more of FIGS. 29 to 42, and the one or more vibration generating apparatuses 120 (or the vibration apparatus 10-5 to 10-7 of the one or more vibration generating apparatuses 120) may be connected or coupled to the rear surface of the rear cover 131 by a coupling member 18 after the second auxiliary member is stripped or removed.

When the apparatus 100 according to an example embodiment of the present disclosure includes a plurality of vibration generating apparatuses 120, the plurality of vibration generating apparatuses 120 may be connected or coupled to the rear surface of the rear cover 131 to have a certain interval along one or more directions of the first direction X and the second direction Y. Each of the plurality of vibration generating apparatuses 120 may include one or more of the vibration apparatuses 10-1 to 10-7 described above with reference to FIGS. 1 to 42. The plurality of vibration generating apparatuses 120 may include substantially the same or different vibration apparatuses. One or more of the plurality of vibration generating apparatuses 120 may differ from one another.

One or more vibration generating apparatuses (or a plurality of vibration generating apparatuses) 120 according to an example embodiment of the present disclosure may vibrate or directly vibrate the rear cover 131 in response to a vibration driving signal supplied from a sound processing circuit. For example, the one or more vibration generating apparatuses 120 may vibrate based on the vibration driving signal synchronized with an image displayed by the liquid crystal display panel 110 and vibrate the rear cover 131. In another example embodiment of the present disclosure, the one or more vibration generating apparatuses 120 may vibrate based on the vibration driving signal (or a haptic feedback signal) synchronized with a user touch applied to a touch panel (or a touch sensor layer) and vibrate the rear cover 131.

Like the vibration apparatus described above with reference to FIGS. 43 to 45, the plurality of vibration generating apparatuses 120 according to another example embodiment of the present disclosure may be connected to the sound data generating circuit part 50 through the plurality of signal cables 30[1] to 30[n] and the main cable 60 and may vibrate or directly vibrate the rear cover 131 in response to a vibration driving signal supplied from the sound processing circuit 40 mounted on each of the plurality of signal cables 30[1] to 30[n].

According to an example embodiment of the present disclosure, a vibration of the rear cover 131 based on vibrations of the one or more vibration generating apparatuses 120 may be transferred to the liquid crystal display panel 110 through the backlight apparatus 115 and may vibrate the liquid crystal display panel 110. Accordingly, the one or more vibration generating apparatuses 120 may vibrate the rear cover 131 and vibrate the liquid crystal display panel 110, and thus, may output a sound generated based on a vibration of the liquid crystal display panel 110.

As described above, the apparatus 100 according to another example embodiment of the present disclosure may vibrate the rear cover 131 of the rear structure 130 based on a vibration of the one or more vibration generating apparatuses 120, and thus, may provide a user (or a viewer) with at least one or more of a sound and a haptic feedback which are generated based on vibrations of the backlight apparatus 115 and the liquid crystal display panel 110 based on a vibration of the rear cover 131.

Figure 49:
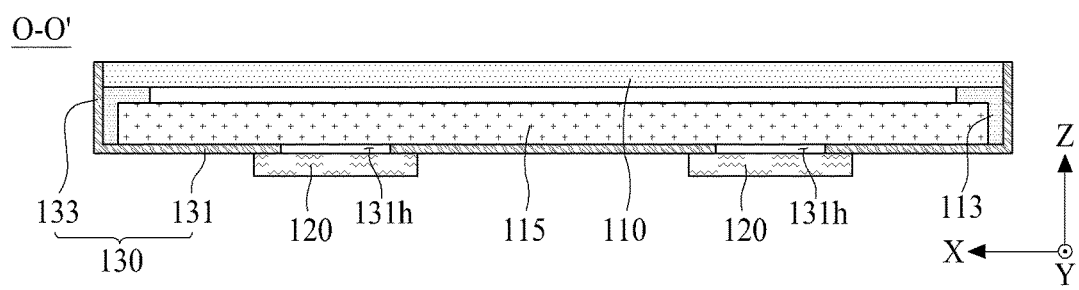
FIG. 49 is an example of another cross-sectional view taken along line O-O' illustrated in FIG. 46.

FIG. 49 is an example of another cross-sectional view taken along line O-O' illustrated in FIG. 46. FIG. 49 illustrates an example embodiment where one or more holes are provided at the rear cover of the rear structure of the apparatus described above with reference to FIG. 48. In the following description, therefore, the elements except a rear cover and relevant elements are referred to by like reference numerals, and their repetitive descriptions may be omitted for brevity.

With reference to FIGS. 46 and 49, in an apparatus 100 according to another example embodiment of the present disclosure, a rear cover 131 may include one or more holes 131h.

The one or more holes 131h may be configured to pass through the rear cover 131 overlapping one or more vibration generating apparatuses 120. For example, the one or more holes 131h may be disposed between the one or more vibration generating apparatuses 120 and the backlight apparatus 115. For example, the one or more holes 131h may be disposed between the one or more vibration generating apparatuses 120 and a reflective sheet of the backlight apparatus 115. Therefore, the one or more vibration generating apparatuses 120 may overlap the one or more holes 131h and may face a reflective sheet of a backlight apparatus 115 through the one or more holes 131h. For example, the one or more vibration generating apparatuses 120 may directly face a reflective sheet of a backlight apparatus 115 through the one or more holes 131h.

A size of each of the one or more holes 131h may be smaller than that of each of the one or more vibration generating apparatuses 120.

The one or more vibration generating apparatuses 120 may be connected or coupled to the rear cover 131 to cover the one or more holes 131h. The one or more vibration generating apparatuses 120 may vibrate in response to a vibration driving signal supplied from a sound processing circuit. Vibrations of the one or more vibration generating apparatuses 120 may be transferred to a liquid crystal display panel 110 through the backlight apparatus 115 and may vibrate the liquid crystal display panel 110. For example, a sound wave which is output toward the one or more holes 131h based on vibrations of the one or more vibration generating apparatuses 120 may vibrate the backlight apparatus 115, and a vibration of the backlight apparatus 115 may vibrate the liquid crystal display panel 110. Accordingly, the one or more vibration generating apparatuses 120 may vibrate the backlight apparatus 115 and vibrate the liquid crystal display panel 110, and thus, may output a sound based on a vibration of the liquid crystal display panel 110.

As described above, the apparatus 100 according to another example embodiment of the present disclosure may vibrate the backlight apparatus 115 based on vibrations of the one or more vibration generating apparatuses 120, and thus, may provide a user (or a viewer) with at least one or more of a sound and a haptic feedback, which are generated based on vibrations of the backlight apparatus 115 and the liquid crystal display panel 110 based on a vibration of the backlight apparatus 115.

Figure 50:
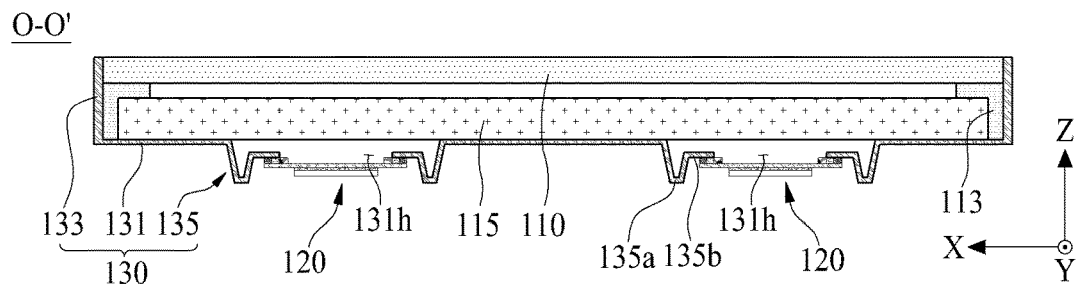
FIG. 50 is an example of another cross-sectional view taken along line O-O' illustrated in FIG. 46.

FIG. 50 is an example of another cross-sectional view taken along line O-O' illustrated in FIG. 46. FIG. 50 illustrates an example embodiment where a stiffness reinforcing portion is further provided at the rear cover of the rear structure of the apparatus described above with reference to FIG. 49. In the following description, therefore, the elements except a rear cover and relevant elements are referred to by like reference numerals, and their repetitive descriptions may be omitted for brevity.

With reference to FIGS. 46 and 50, a rear structure 130 according to another example embodiment of the present disclosure may further include a stiffness reinforcing portion (or a reinforcing portion) 135 which is configured in the rear cover 131 to surround one or more holes 131h.

The stiffness reinforcing portion 135 may be configured to increase the stiffness of the rear structure 130 or the rear cover 131 and prevent (or suppress) a vibration of the rear cover 131 based on a vibration of the vibration generating apparatus 120.

The stiffness reinforcing portion 135 according to an example embodiment of the present disclosure may be configured at the rear cover 131 near the one or more holes 131h to include one or more bending portions for increasing the stiffness of the rear cover 131. For example, the stiffness reinforcing portion 135 may protrude from the rear cover 131 near the one or more holes 131h to surround near (or around) the one or more holes 131h. For example, the stiffness reinforcing portion 135 may include a tetragonal shape, a trapezoid shape, or a convex curved shape, but embodiments of the present disclosure are not limited thereto.

The stiffness reinforcing portion 135 according to an example embodiment of the present disclosure may include a protrusion portion (or a first portion) 135a and a recessed portion (or a second portion) 135b. The protrusion portion 135a may protrude in a downward direction or toward a downward direction from the rear cover 131 near the one or more holes 131h. The recessed portion 135b may recess in an upward direction or toward upward direction of the rear structure 130 from the protrusion portion 135a.

The recessed portion 135b according to an example embodiment of the present disclosure may be configured to be recessed toward the liquid crystal display panel 110 from the protrusion portion 135a and may include the one or more holes 131h. For example, the recessed portion 135b may be disposed between the rear cover 131 and the protrusion portion 135a, and may be surrounded by the protrusion portion 135a. Therefore, an accommodating space (or a recessed space) surrounded by the protrusion portion 135a may be provided at the recessed portion 135b. The vibration generating apparatus 120 including one or more of the vibration apparatuses 10-1 to 10-7 described above with reference to FIGS. 1 to 13 and 15 to 42 may be connected or coupled to the accommodating space of the recessed portion 135b. Accordingly, the vibration generating apparatus 120 connected to the recessed portion 135b may be surrounded by the protrusion portion 135a, and thus, may be protected from an external impact.

The recessed portion 135b according to an example embodiment of the present disclosure may be disposed between the rear cover 131 and the protrusion portion 135a so as to be spaced apart from the backlight apparatus 115. The recessed portion 135b may be spaced apart from the backlight apparatus 115 or the rear cover 131, and thus, a physical contact with the backlight apparatus 115 may be prevented, thereby preventing a sound characteristic, generated based on a vibration of the vibration generating apparatus 120, from being reduced by a noise sound (or noise) caused by the physical contact between the recessed portion 135b and the backlight apparatus 115.

The protrusion portion 135a according to an example embodiment of the present disclosure may have a bending structure, and thus, may increase the stiffness of the rear structure 130 or the rear cover 131. The protrusion portion 135a may prevent a vibration of the rear cover 131 caused by a vibration of the vibration generating apparatus 120 connected to the recessed portion 135b. For example, a vibration which is transferred to the rear cover 131 based on a vibration of the vibration generating apparatus 120 may be blocked or prevented by the protrusion portion 135a having relatively high stiffness based on a bending structure. Accordingly, the protrusion portion 135a may block the transfer of a vibration of the vibration generating apparatus 120 to the rear cover 131, thereby preventing or minimizing the occurrence of a noise sound (or noise) caused by a vibration (or shaking) of the rear cover 131.

The stiffness reinforcing portion 135 according to an example embodiment of the present disclosure may have a cross-sectional shape which is substantially the same as the vibration blocking portion 17f described above with reference to FIG. 14. For example, the rear cover 131 may correspond to the second supporting portion 17b illustrated in FIG. 14, the stiffness reinforcing portion 135 or the protrusion portion 135a may correspond to the vibration blocking portion 17f described above with reference to FIG. 14, and the recessed portion 135b may correspond to the first supporting portion 17a described above with reference to FIG. 14. The one or more holes 131h provided in the recessed portion 135b may correspond to the hole 17h illustrated in FIG. 14.

When the one or more vibration generating apparatuses 120 according to an example embodiment of the present disclosure are included in the vibration apparatus 10-5 illustrated in FIG. 14, the supporting member 17 illustrated in FIG. 14 is omitted, and the vibration plate 15 may be connected or coupled to, through the connection member 16, the recessed portion 135b of the stiffness reinforcing portion 135 illustrated in FIG. 15.

As described above, the apparatus 100 according to another example embodiment of the present disclosure may vibrate the backlight apparatus 115 based on vibrations of the one or more vibration generating apparatuses 120, and thus, may provide a user (or a viewer) with at least one or more of a sound and a haptic feedback which are generated based on a vibration of the liquid crystal display panel 110 based on a vibration of the backlight apparatus 115. In addition, in the apparatus 100 according to another example embodiment of the present disclosure, a vibration (or shaking or undesired vibration) of the rear cover 131 caused by vibrations of the one or more vibration generating apparatuses 120 may be prevented or minimized by the stiffness reinforcing portion 135 provided in the rear cover 131, thereby providing a sound, generated based on a vibration of the liquid crystal display panel 110, to a user (or a viewer) without a noise sound (or noise).

The apparatus 100 described above with reference to FIGS. 46 to 50 may implement a display apparatus for vehicular apparatuses as well as a display apparatus. For example, the apparatus 100 implemented as a display apparatus for vehicular apparatuses may be a display apparatus which is disposed at at least one or more among an instrument panel device and an infotainment device which are classified as an interior material for vehicular apparatuses, or may be a display apparatus which is disposed at or embedded in at least one or more among a headrest and a rear surface of a seat of the vehicular apparatuses, but embodiments of the present disclosure is not limited thereto.

According to an example embodiment of the present disclosure, the display apparatus 100 implemented as the instrument panel device may provide a driver with various information such as vehicle state information and driving-related information such as a driving time, a velocity, fuel quantity, and engine revolutions per minute (RPM), or the like of a vehicle.

According to an example embodiment of the present disclosure, the display apparatus 100 implemented as the infotainment device (or an infotainment system) may be connected to a vehicle convenience system, such as an audio system, an air conditioning system, and a multimedia system, and a navigation system which are mounted inside the vehicular apparatuses, may display a control icon for controlling a corresponding vehicle convenience system and navigation information provided from the navigation system, and may provide a passenger of a vehicle with a sound corresponding to a sound signal provided from the audio system and/or the multimedia system.

Figure 51:
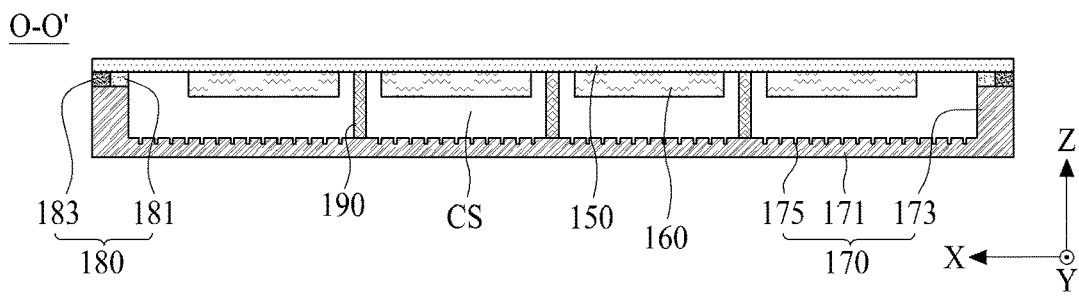
FIG. 51 is an example of another cross-sectional view taken along line O-O' illustrated in FIG. 46.

FIG. 51 is an example of another cross-sectional view taken along line O-O' illustrated in FIG. 46. FIG. 51 illustrates an example of an apparatus applying or including the vibration apparatus illustrated in one or more of FIGS. 1 to 42.

With reference to FIGS. 46 and 51, an apparatus 100 according to an example embodiment of the present disclosure may be applied to implement a sound apparatus, a sound output apparatus, a sound bar, a sound system, a sound apparatus for vehicular apparatuses, a sound output apparatus for vehicular apparatuses, or a sound bar for vehicular apparatuses, or the like. For example, the vehicular apparatuses may include one or more seats and one or more glass windows. For example, the vehicular apparatuses may include a vehicle, a train, a ship, or an aircraft, but embodiments of the present disclosure are not limited thereto. In addition, the apparatus 100 according to an example embodiment of the present disclosure may implement an analog signage or a digital signage, or the like such as an advertising signboard, a poster, or a noticeboard, or the like.

The apparatus 100 according to an example embodiment of the present disclosure may include a vibration member 150 and a plurality of vibration generating apparatuses 160.

The vibration member 150 may include a plate structure having a certain thickness. For example, the vibration member 150 may be referred to as a vibration object, a vibration target, a sound output member, a vibration panel, or a sound output panel, or the like, but embodiments of the present disclosure are not limited thereto. For example, the vibration member 150 may include any one among a screen panel on which an image is to be projected from a display apparatus, a lighting panel, a signage panel, a vehicular interior material, a vehicular exterior material, a vehicular glass window, a mirror, a building ceiling material, a building interior material, a building exterior material, a building glass window, an aircraft interior material, and an aircraft glass window, but embodiments of the present disclosure are not limited thereto.

The vibration member 150 according to an example embodiment of the present disclosure may include a metal material and/or a nonmetal material (or a composite nonmetal material) having a material characteristic suitable for outputting a sound based on a vibration. The metal material of the vibration member 150 according to an example embodiment of the present disclosure may include any one or more materials of a stainless steel, an aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the vibration member 150 may include one or more of a glass, a plastic, a fiber, a leather, wood, a cloth, a rubber, and a paper, but embodiments of the present disclosure are not limited thereto.

In a case where the apparatus 100 according to an example embodiment of the present disclosure implements an analog signage such as an advertising signboard, a poster, or a noticeboard, the analog signage may include signage content such as a sentence, a picture, and a sign. The signage content may be disposed in the vibration member 150 to be visible. For example, the signage content may be directly attached on one or more of a first surface (or a front surface) of the vibration member 150 and a second surface (or a rear surface) which differs from (or opposite to) the first surface. For example, the signage content may be printed on a medium such as paper, and the medium with the signage content printed thereon may be directly attached on one or more of the first surface and the second surface of the vibration member 150.

The plurality of vibration generating apparatuses 160 may be configured to vibrate the vibration member 150. The plurality of vibration generating apparatuses 160 may be connected or coupled to a rear surface of the vibration member 150. The plurality of vibration generating apparatuses 160 according to an example embodiment of the present disclosure may be connected or coupled to the rear surface of the vibration member 150 to have a certain interval along one or more directions of a first direction X and a second direction Y. Each of the plurality of vibration generating apparatuses 160 may include one or more of the vibration apparatuses 10-1 to 10-7 described above with reference to FIGS. 1 to 42. The plurality of vibration generating apparatuses 160 may include the same or different vibration apparatuses. One or more of the plurality of vibration generating apparatuses 160 may differ from one another. Therefore, a description of each of the plurality of vibration generating apparatuses 160 may be omitted for brevity.

The plurality of vibration generating apparatuses 160 according to an example embodiment of the present disclosure may include the vibration apparatus 10-1 to 10-4 illustrated in one or more of FIGS. 1 to 8, and the plurality of vibration generating apparatuses 160 (or the vibration apparatus 10-1 to 10-4 of the plurality of vibration generating apparatuses 160) may be connected or coupled to the rear surface of the vibration member 150 by an adhesive member 12 after a second auxiliary member 10*b* is stripped or removed.

The plurality of vibration generating apparatuses 160 according to another example embodiment of the present disclosure may include the vibration apparatus 10-1 to 10-4 illustrated in one or more of FIGS. 1 to 8 including the vibration device 11 illustrated in one or more of FIGS. 29 to 42, and the plurality of vibration generating apparatuses 160 (or the vibration apparatus 10-1 to 10-4 of the plurality of vibration generating apparatuses 160) may be connected or coupled to the rear surface of the vibration member 150 by the adhesive member 12 after the second auxiliary member 10*b* is stripped or removed.

The plurality of vibration generating apparatuses 160 according to another example embodiment of the present disclosure may include the vibration apparatus 10-5 to 10-7 illustrated in one or more of FIGS. 9 to 19, and the plurality of vibration generating apparatuses 160 (or the vibration apparatus 10-5 to 10-7 of the plurality of vibration generating apparatuses 160) may be connected or coupled to the rear surface of the vibration member 150 by the coupling member 18 after the second auxiliary member is stripped or removed.

The plurality of vibration generating apparatuses 160 according to another example embodiment of the present disclosure may include the vibration apparatus 10-5 to 10-7 illustrated in one or more of FIGS. 9 to 19 including the vibration plate 15 illustrated in one or more of FIGS. 20 to 28, and the plurality of vibration generating apparatuses 160 (or the vibration apparatus 10-5 to 10-7 of the plurality of vibration generating apparatuses 160) may be connected or coupled to the rear surface of the vibration member 150 by a coupling member 18 after the second auxiliary member is stripped or removed.

The plurality of vibration generating apparatuses 160 according to another example embodiment of the present disclosure may include the vibration apparatus 10-5 to 10-7 illustrated in one or more of FIGS. 9 to 19 including the vibration device 11 illustrated in one or more of FIGS. 29 to 42, and the plurality of vibration generating apparatuses 160 (or the vibration apparatus 10-5 to 10-7 of the plurality of vibration generating apparatuses 160) may be connected or coupled to the rear surface of the vibration member 150 by a coupling member 18 after the second auxiliary member is stripped or removed.

The plurality of vibration generating apparatuses 160 according to another example embodiment of the present disclosure may include the vibration apparatus 10-5 to 10-7 illustrated in one or more of FIGS. 9 to 19 including the vibration plate 15 illustrated in one or more of FIGS. 20 to 28 and the vibration device 11 illustrated in one or more of FIGS. 29 to 42, and the plurality of vibration generating apparatuses 160 (or the vibration apparatus 10-5 to 10-7 of the plurality of vibration generating apparatuses 160) may be connected or coupled to the rear surface of the vibration member 150 by a coupling member 18 after the second auxiliary member is stripped or removed.

Each of the plurality of vibration generating apparatuses 160 according to an example embodiment of the present disclosure may vibrate or directly vibrate the vibration member 150 in response to a vibration driving signal supplied from a sound processing circuit. For example, each of the plurality of vibration generating apparatuses 160 may vibrate based on the vibration driving signal (or a haptic feedback signal) synchronized with a user touch applied to a touch panel (or a touch sensor layer) connected to the vibration member 150 to vibrate or directly vibrate the vibration member 150. Accordingly, the vibration member 150 may vibrate based on one or more vibration of the plurality of vibration generating apparatuses 160 to provide a user (or a viewer) with at least one or more of a sound and a haptic feedback.

Like the vibration apparatus described above with reference to FIGS. 43 to 45, the plurality of vibration generating apparatuses 160 according to another example embodiment of the present disclosure may be connected to the sound data generating circuit part 50 through the plurality of signal cables 30[1] to **30[*n*] and the main cable 60 and may vibrate or directly vibrate the vibration member 150 in response to a vibration driving signal supplied from the sound processing circuit 40 mounted on each of the plurality of signal cables 30[1] to 30[*n*]**.

The apparatus 100 according to an example embodiment of the present disclosure may include a rear structure 170 and a coupling member 180.

The rear structure 170 may be disposed at the rear surface of the vibration member 150. For example, the rear structure 170 may cover the rear surface of the vibration member 150. For example, the rear structure 170 may cover all of the rear surface of the vibration member 150 with a gap space GS therebetween. For example, the rear structure 170 may be implemented as an arbitrary-type frame or arbitrary-type plate structure, or the like disposed at the rear surface of the vibration member 150.

The rear structure 170 according to an example embodiment of the present disclosure may include a rear cover (or a floor portion or a bottom portion) 171 which covers the rear surface of the vibration member 150, and a lateral cover (or a sidewall portion) 173 which is connected to an end of the rear cover 171 and a rear periphery portion of the vibration member 150. In the rear structure 170, the rear cover 171 and the lateral cover 173 may be integrated as one body, but embodiments of the present disclosure are not limited thereto.

The rear structure 170 according to an example embodiment of the present disclosure may further include a pattern portion 175 which is configured in a floor surface (or a bottom surface) of a rear cover 171 facing the vibration member 150.

The pattern portion 175 may be provided in the floor surface (or the bottom surface) of the rear cover 171 to have a concave-convex structure, and thus, may increase the stiffness of the rear cover 171. For example, the pattern portion 175 may be referred to as a concave-convex pattern portion, a floor pattern portion, a bottom pattern portion, or a reinforcing pattern portion, or the like, but embodiments of the present disclosure are not limited thereto.

The pattern portion 175 according to an example embodiment of the present disclosure may include a plurality of groove lines.

Each of the plurality of groove lines may be formed to be concave from the floor surface of the rear cover 171 along one or more directions among the first direction X, the second direction Y, and a diagonal direction between the first direction X and the second direction Y. For example, the pattern portion 175 may include a lattice pattern based on intersection between each of a plurality of groove lines parallel to the first direction X and each of a plurality of groove lines parallel to the second direction Y.

The coupling member 180 may be disposed between the vibration member 150 and the rear structure 170. For example, the coupling member 180 may connect or couple the vibration member 150 to the rear structure 170. For example, the coupling member 180 may be disposed between a lateral cover (or a side cover) 173 of the rear structure 170 and the vibration member 150 and may be connected or coupled to the lateral cover (or the side cover) 173 of the rear structure 170 and the vibration member 150.

The coupling member 180 according to an example embodiment of the present disclosure may be configured to minimize or prevent the transfer of a vibration of the vibration member 150 to the rear structure 170. The coupling member 180 may include a material characteristic suitable for blocking a vibration. For example, the coupling member 180 may include a material having an elasticity. For example, the coupling member 180 may include a material having an elasticity for vibration absorption (or impact absorption). The coupling member 180 according to an example embodiment of the present disclosure may be configured as polyurethane materials or polyolefin materials, but embodiments of the present disclosure are not limited thereto. For example, the coupling member 180 may include one or more of an adhesive, a double-sided tape, a double-sided foam tape, and a double-sided cushion tape, but embodiments of the present disclosure are not limited thereto.

The coupling member 180 according to an example embodiment of the present disclosure may be configured to have a thickness which is relatively thicker than the vibration member 150. For example, the coupling member 180 may have a thickness for minimizing or preventing the transfer of a vibration of the vibration member 150 to the rear structure 170. The coupling member 180 may absorb a vibration of the vibration member 150 based on a thickness and an elasticity, thereby minimizing or preventing the transfer of a vibration of the vibration member 150 to the rear structure 170. In addition, the coupling member 180 may prevent a physical contact (or friction) between the vibration member 150 and the rear structure 170, and thus, may prevent the occurrence of noise (or a noise sound) caused by the physical contact (or friction) between the vibration member 150 and the rear structure 170. For example, the coupling member 180 may be referred to as a middle member, an intermediate member, a buffer member, an elastic member, a damping member, a vibration absorption member, or a vibration blocking member, but embodiments of the present disclosure are not limited thereto.

The coupling member 180 according to another example embodiment of the present disclosure may be configured to minimize or prevent the transfer of a vibration of the vibration member 150 to the rear structure 170 and to decrease the reflection of a sound wave which is generated and input based on a vibration of the vibration member 150. For example, the coupling member 180 according to another example embodiment of the present disclosure may include a first coupling member 181 and a second coupling member 183.

The first coupling member 181 and the second coupling member 183 may be disposed in parallel between the vibrating member 150 and the rear structure 170. For example, each of the first coupling member 181 and the second coupling member 183 may connect or couple the vibration member 150 to the rear structure 170. For example, each of the first coupling member 181 and the second coupling member 183 may be disposed in parallel between the lateral cover (or the side cover) 173 of the rear structure 170 and the vibration member 150, and may be connected or coupled to each of the rear periphery portion of the vibration member 150 and the lateral cover 173 of the rear structure 170.

The first coupling member 181 may be disposed to be surrounded by the second coupling member 183. For example, the first coupling member 181 may be disposed inward (or an inner portion) from the second coupling member 183. The first coupling member 181 may be configured to have hardness which is lower than that of the second coupling member 183. For example, the first coupling member 181 may include a double-sided polyurethane tape, a double-sided polyurethane foam tape, or a double-sided sponge tape, or the like, but embodiments of the present disclosure are not limited thereto.

The second coupling member 183 may be disposed to surround the first coupling member 181. For example, the second coupling member 183 may be disposed outward (or an outer portion) from the first coupling member 181. The second coupling member 183 may be configured to have hardness which is higher than that of the first coupling member 181. For example, the second coupling member 183 may include a double-sided polyolefin tape, a double-sided polyolefin foam tape, a double-sided acrylic tape, or a double-sided acrylic foam tape, or the like, but embodiments of the present disclosure are not limited thereto.

The coupling member 180 according to another example embodiment of the present disclosure may absorb a sound which is generated and input based on a vibration of the vibration member 150 by the first coupling member 181 which is relatively soft and is disposed inward from the second coupling member 183 which is relatively stiff (or hard), and thus, a reflected sound (or a reflected wave) generated by the coupling member 180 may be minimized. Accordingly, each of a highest sound pressure level and a lowest sound pressure level generated in a reproduction frequency band of a sound generated based on a vibration of one or more among the plurality of vibration generating apparatuses 160 may be reduced, and thus, flatness of a sound pressure level may be reduced.

In the coupling member 180 according to another example embodiment of the present disclosure, the second coupling member 183 which is relatively stiff may be disposed inward from the first coupling member 181 which is relatively soft. In this case, a sound pressure level in a specific sound band of a sound may be reduced. For example, a sound pressure level in a pitched sound band of 2 kHz to 5 kHz and 7 kHz to 12 kHz may be reduced due to a reflected sound (or a reflected wave) generated by the second coupling member 183 having the relatively stiff. Accordingly, when a reduction in a sound pressure level in a pitched sound band of 2 kHz to 5 kHz and 7 kHz to 12 kHz is needed based on a shape and a size of the vibration member 150, the second coupling member 183 having the relatively stiff may be disposed inward from the first coupling member 181 having the relatively soft, and flatness of a sound pressure level may be improved based on a reduction in a sound pressure level in a pitched sound band of 2 kHz to 5 kHz and 7 kHz to 12 kHz generated by the second coupling member 183.

The apparatus 100 according to an example embodiment of the present disclosure may further include a partition 190.

The partition 190 may be configured between one or more of the plurality of vibration generating apparatuses 160. For example, the partition 190 may be configured between the plurality of vibration generating apparatuses 160.

The partition 190 according to an example embodiment of the present disclosure may provide a closed space CS near one or more of the plurality of vibration generating apparatuses 160, and thus, may define a vibration region of one or more of the plurality of vibration generating apparatuses 160. For example, the partition 190 may be an air gap or a space, where a sound is generated when each of the plurality of vibration generating apparatuses 160 is vibrating. For example, the partition 190 may separate the sounds or a channel and may minimize or prevent or decrease the reduction of a sound characteristic caused by interference of the sounds. For example, the partition 190 may be referred to as a sound blocking member, a sound separation member, a space separation member, or a baffle, or the like, but embodiments of the present disclosure are not limited thereto.

Additionally, the apparatus 100 according to another example embodiment of the present disclosure may further include one or more pads.

The one or more pads may be configured to protrude toward the vibration generating apparatus 160 from one or more sides of the partition 190. The one or more pads may be configured to trap a reflected wave reflected from the partition 190, thereby preventing or minimizing a reduction in sound pressure level characteristic caused by a standing wave generated based on interference of the reflected wave and a progressive wave. The one or more pads may be substantially the same as the one or more pads 19 described above with reference to FIGS. 9 and 10, and thus, the repetitive description thereof may be omitted for brevity.

Additionally, the apparatus 100 according to an example embodiment of the present disclosure may further include a sound absorption member disposed at a rear cover 171 of the rear structure 170.

The sound absorption member may be disposed to cover the pattern portion 175 provided at the rear cover 171 of the rear structure 170. For example, the sound absorption member may include a nonwoven or a foam pad. The sound absorption member according to an example embodiment of the present disclosure may attenuate a frequency resonance of a low-pitched sound band occurring in a space between the rear surface of the vibration member 150 and the rear cover 171 of the rear structure 170, and thus, may minimize a booming phenomenon caused by interference between frequencies of the low-pitched sound band and enhance sound quality. In addition, when the vibration member 150 vibrates, the sound absorption member may prevent a direct contact between one or more of the plurality of vibration generating apparatuses 160 and the rear cover 171, thereby preventing the damage or breakdown of the plurality of vibration generating apparatuses 160.

Figure 52:
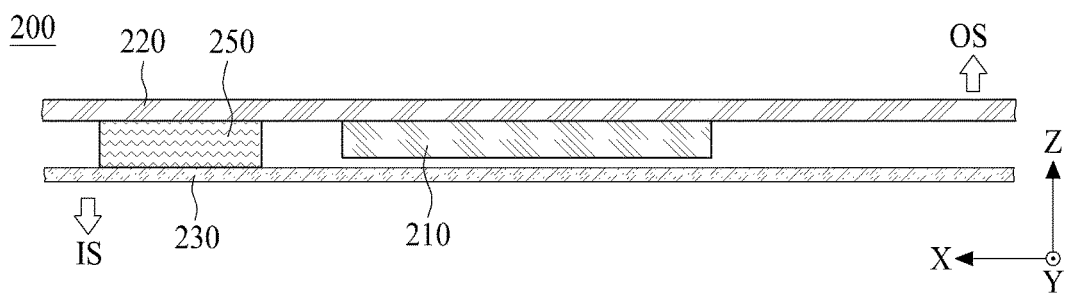
FIG. 52 illustrates an apparatus according to another example embodiment of the present disclosure.

FIG. 52 illustrates an apparatus according to another example embodiment of the present disclosure. FIG. 52 illustrates an apparatus applying or including the vibration apparatus illustrated in one or more of FIGS. 1 to 42.

With reference to FIG. 52, the apparatus 200 according to another example embodiment of the present disclosure may implement a sound apparatus for vehicular apparatuses, a sound generating apparatus for vehicular apparatuses, a speaker for vehicular apparatuses, an automobile sound apparatus, an automobile sound generating apparatus, or an automobile speaker, but embodiments of the present disclosure are not limited thereto.

The apparatus 200 according to another example embodiment of the present disclosure may include one or more vibration generating apparatuses 250 which are configured to output a sound to one or more of an indoor space (or an inner space) IS and an outdoor space (an outer space) OS of a vehicular apparatus.

The vehicular apparatus may include one or more seats and one or more glass windows. For example, the vehicular apparatus may include a vehicle, a train, a ship, or an aircraft, but embodiments of the present disclosure are not limited thereto.

The vehicular apparatus according to an example embodiment of the present disclosure may include a main structure 210, an exterior material 220, and an interior material 230.

The main structure (or a frame structure) 210 may include a main frame, a sub-frame, a side frame, a door frame, an under-frame, and a seat frame, or the like, but embodiments of the present disclosure are not limited thereto.

The exterior material 220 may be configured to cover the main structure 210. For example, the exterior material 220 may be configured to cover an outer portion of the main structure 210. The exterior material 220 according to an example embodiment of the present disclosure may include a hood panel, a front fender panel, a dash panel, a filler panel, a trunk panel, a roof panel, a floor panel, a door inner panel, and a door outer panel, but embodiments of the present disclosure are not limited thereto. The exterior material 220 according to an example embodiment of the present disclosure may include one or more of a planar portion and a curved portion. For example, the exterior material 220 may have a surface structure corresponding to a surface structure of a corresponding main structure 210, or may have a surface structure which differs from the surface structure of the corresponding main structure 210.

The interior material 230 may include all elements configuring an inner portion of the vehicular apparatus, or may include all elements disposed at the indoor space IS of the vehicular apparatus. For example, the interior material 230 may be an interior member or an inner finishing material of the vehicular apparatus, but embodiments of the present disclosure are not limited thereto.

The interior material 230 according to an example embodiment of the present disclosure may cover one or more of the main structure 210 and the exterior material 220 in the indoor space IS of the vehicular apparatus and may be configured to be exposed at the indoor space IS of the vehicular apparatus. For example, the interior material 230 may include a dashboard, a pillar interior material (or a pillar trim), a floor interior material (or a floor carpet), a roof interior material (or a headliner), a door interior material (or a door trim), a handle interior material (or a steering cover), a seat interior material, a rear package interior material (or a back seat shelf), an overhead console (or an indoor illumination interior material), a rear view mirror, a glove box, and a sun visor, or the like, but embodiments of the present disclosure are not limited thereto.

The interior material 230 according to an example embodiment of the present disclosure may include one or more material of a plastic, a fiber, a leather, a cloth, wood, a rubber, and a metal, but embodiments of the present disclosure are not limited thereto.

The interior material 230 according to another example embodiment of the present disclosure may include a base member and a surface member. For example, the base member may be an injection material, a first interior material, an inner interior material, or a rear interior material, but embodiments of the present disclosure are not limited thereto. The surface member may be a second interior material, an outer interior material, a front interior material, an outer surface member, a reinforcement member, or a decoration member, but embodiments of the present disclosure are not limited thereto.

The interior material 230 or the base member may include a plastic material. For example, the interior material 230 or the base member may be an injection material which is implemented by an injection process (or injection molding process) using a thermoplastic resin or a thermosetting resin, but embodiments of the present disclosure are not limited thereto. The interior material 230 or the base member may be configured to cover one or more of the main structure 210 and the exterior material 220 in the indoor space IS of the vehicular apparatus. For example, the interior material 230 or the base member may be configured to cover one or more one surfaces (or an inner surface) of at least one or more of a main frame, a side frame, a door frame, and a handle frame, which are exposed at the indoor space IS of the vehicular apparatus.

The surface member may be disposed to cover the base member. The surface member may cover the base member in the indoor space IS of the vehicular apparatus and may be configured to be exposed at the indoor space IS. For example, the surface member may be disposed at or coupled to a front surface of the base member exposed at the indoor space IS of the vehicular apparatus. For example, the surface member may include one or more materials of a plastic, a fiber, a leather, a cloth, wood, a rubber, and a metal, but embodiments of the present disclosure are not limited thereto.

The interior material 230 or the surface member including a fiber material may include at least one or more of a synthetic fiber, a carbon fiber (or an aramid fiber), and a natural fiber. For example, the interior material 230 or the surface member including a fiber material may be a textile sheet, a knit sheet, or a nonwoven fabric, but embodiments of the present disclosure are not limited thereto. For example, the interior material 230 or the surface member including a fiber material may be a fabric member, but embodiments of the present disclosure are not limited thereto. The synthetic fiber may be a thermoplastic resin and may include a polyolefin-based fiber which is an eco-friendly material which does not relatively release a harmful substance, but embodiments of the present disclosure are not limited thereto. For example, the polyolefin-based fiber may include a polyethylene fiber, a polypropylene fiber, or a polyethylene terephthalate fiber, but embodiments of the present disclosure are not limited thereto. The polyolefin-based fiber may be a fiber of a single resin or a fiber of a core-shell structure. The natural fiber may be a composite fiber of any one or two or more of a jute fiber, a kenaf fiber, an abaca fiber, a coconut fiber, and a wood fiber, but embodiments of the present disclosure are not limited thereto.

The one or more vibration generating apparatuses 250 may be configured to output a sound between the exterior material 220 and the interior material 230. For example, the one or more vibration generating apparatuses 250 may be disposed between the exterior material 220 and the interior material 230, and may directly or indirectly vibrate one or more of the exterior material 220 and the interior material 230 and output a sound.

One or more of the exterior material 220 and the interior material 230 of the vehicular apparatus may be a vibration plate, a sound vibration plate, or a sound generating plate, or the like so as to output a sound. For example, each of the exterior material 220 and the interior material 230 for outputting a sound may have a size which is greater than that of each of the one or more vibration generating apparatuses 250, and thus, may perform a function of a large-area vibration plate, a sound vibration plate, or a sound generating plate, thereby enhancing a sound characteristic and/or a sound pressure level characteristic of a low-pitched sound band generated by the one or more vibration generating apparatuses 250. For example, a frequency of a sound of the low-pitched sound band may be 500 Hz or less, but embodiments of the present disclosure are not limited thereto.

The one or more vibration generating apparatuses 250 according to an example embodiment of the present disclosure may output a sound between the exterior material 220 and the interior material 230 of the vehicular apparatus. For example, the one or more vibration generating apparatuses 250 may be connected or coupled to one or more of the exterior material 220 and the interior material 230 between the exterior material 220 and the interior material 230 and may indirectly or directly vibrate one or more of the exterior material 220 and the interior material 230 to output a sound.

The one or more vibration generating apparatuses 250 according to an example embodiment of the present disclosure may include one or more of the vibration apparatuses 10-1 to 10-7 described above with reference to FIGS. 1 to 42. Therefore, descriptions of the one or more vibration generating apparatuses 250 may be omitted for brevity.

The one or more vibration generating apparatuses 250 according to an example embodiment of the present disclosure may include the vibration apparatus 10-1 to 10-4 illustrated in one or more of FIGS. 1 to 8, and the one or more vibration generating apparatuses 250 (or the vibration apparatus 10-1 to 10-4 of the one or more vibration generating apparatuses 250) may be connected or coupled to the one or more of the exterior material 220 and the interior material 230 by an adhesive member 12 after a second auxiliary member 10b is stripped or removed.

The one or more vibration generating apparatuses 250 according to another example embodiment of the present disclosure may include the vibration apparatus 10-1 to 10-4 illustrated in one or more of FIGS. 1 to 8 including the vibration device 11 illustrated in one or more of FIGS. 29 to 42, and the one or more vibration generating apparatuses 250 (or the vibration apparatus 10-1 to 10-4 of the one or more vibration generating apparatuses 250) may be connected or coupled to the one or more of the exterior material 220 and the interior material 230 by the adhesive member 12 after the second auxiliary member 10b is stripped or removed.

The one or more vibration generating apparatuses 250 according to another example embodiment of the present disclosure may include the vibration apparatus 10-5 to 10-7 illustrated in one or more of FIGS. 9 to 19, and the one or more vibration generating apparatuses 250 (or the vibration apparatus 10-5 to 10-7 of the one or more vibration generating apparatuses 250) may be connected or coupled to the one or more of the exterior material 220 and the interior material 230 by the coupling member 18 after the second auxiliary member is stripped or removed.

The one or more vibration generating apparatuses 250 according to another example embodiment of the present disclosure may include the vibration apparatus 10-5 to 10-7 illustrated in one or more of FIGS. 9 to 19 including the vibration plate 15 illustrated in one or more of FIGS. 20 to 28, and the one or more vibration generating apparatuses 250 (or the vibration apparatus 10-5 to 10-7 of the one or more vibration generating apparatuses 250) may be connected or coupled to the one or more of the exterior material 220 and the interior material 230 by a coupling member 18 after the second auxiliary member is stripped or removed.

The one or more vibration generating apparatuses 250 according to another example embodiment of the present disclosure may include the vibration apparatus 10-5 to 10-7 illustrated in one or more of FIGS. 9 to 19 including the vibration device 11 illustrated in one or more of FIGS. 29 to 42, and the one or more vibration generating apparatuses 250 (or the vibration apparatus 10-5 to 10-7 of the one or more vibration generating apparatuses 250) may be connected or coupled to the one or more of the exterior material 220 and the interior material 230 by a coupling member 18 after the second auxiliary member is stripped or removed.

The one or more vibration generating apparatuses 250 according to another example embodiment of the present disclosure may include the vibration apparatus 10-5 to 10-7 illustrated in one or more of FIGS. 9 to 19 including the vibration plate 15 illustrated in one or more of FIGS. 20 to 28 and the vibration device 11 illustrated in one or more of FIGS. 29 to 42, and the one or more vibration generating apparatuses 250 (or the vibration apparatus 10-5 to 10-7 of the one or more vibration generating apparatuses 250) may be connected or coupled to the one or more of the exterior material 220 and the interior material 230 by a coupling member 18 after the second auxiliary member is stripped or removed.

As described above, the apparatus 200 according to another example embodiment of the present disclosure may indirectly or directly vibrate the one or more of the exterior material 220 and the interior material 230 and output a sound to one or more of the indoor space IS and the outdoor space OS of the vehicular apparatus.

Figure 53:
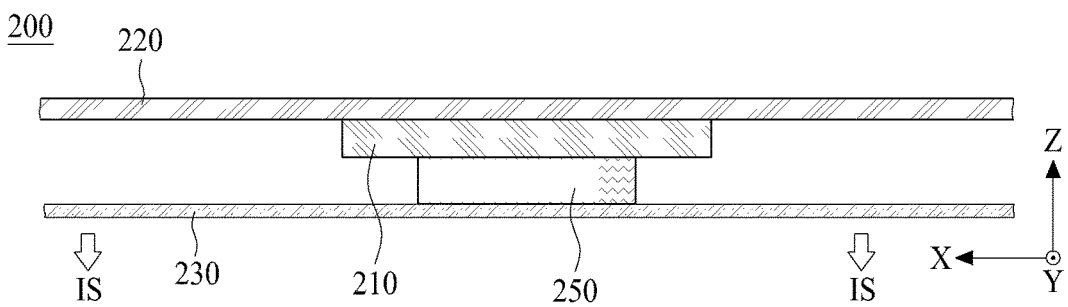
FIG. 53 illustrates an apparatus according to another example embodiment of the present disclosure.

FIG. 53 illustrates an apparatus according to another example embodiment of the present disclosure. FIG. 53 illustrates an example embodiment implemented by changing the arrangement positions of the one or more vibration generating apparatuses described above with reference to FIG. 52. In the following description, therefore, the elements except one or more vibration generating apparatuses and relevant elements are referred to by like reference numerals, and their repetitive descriptions may be omitted for brevity.

With reference to FIG. 53, the apparatus 200 according to another example embodiment of the present disclosure may include one or more vibration generating apparatuses 250 which are configured to output a sound to an indoor space IS of a vehicular apparatus.

The one or more vibration generating apparatuses 250 may output a sound to the indoor space IS of the vehicular apparatus between a main structure 210 and an interior material 230. For example, the one or more vibration generating apparatuses 250 may be connected or coupled to one or more of the main structure 210 and the interior material 230 between the main structure 210 and the interior material 230, and may indirectly or directly vibrate the interior material 230 to output a sound.

The one or more vibration generating apparatuses 250 according to an example embodiment of the present disclosure may include one or more of the vibration apparatuses 10-1 to 10-7 described above with reference to FIGS. 1 to 42. Except that the one or more vibration generating apparatuses 250 are connected or coupled to one or more of the main structure 210 and the interior material 230, the one or more vibration generating apparatuses 250 may be substantially the same as the one or more vibration generating apparatuses 250 described above with reference to FIG. 52, and thus, the repetitive description thereof may be omitted for brevity.

As described above, the apparatus 200 according to another example embodiment of the present disclosure may indirectly or directly vibrate the interior material 230 of the vehicular apparatus and output a sound to the indoor space IS of the vehicular apparatus.

Figure 54:
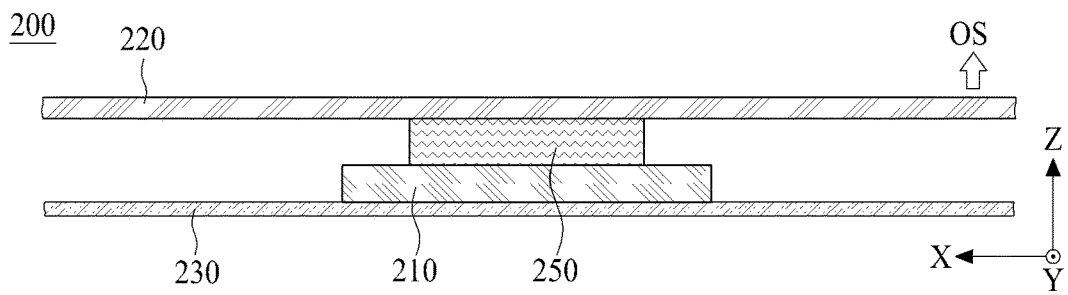
FIG. 54 illustrates an apparatus according to another example embodiment of the present disclosure.

FIG. 54 illustrates an apparatus according to another example embodiment of the present disclosure. FIG. 54 illustrates an example embodiment implemented by changing the arrangement positions of the one or more vibration generating apparatuses described above with reference to FIG. 52. In the following description, therefore, the elements except one or more vibration generating apparatuses and relevant elements are referred to by like reference numerals, and their repetitive descriptions may be omitted for brevity.

With reference to FIG. 54, the apparatus 200 according to another example embodiment of the present disclosure may include one or more vibration generating apparatuses 250 which are configured to output a sound to an outdoor space OS of a vehicular apparatus.

The one or more vibration generating apparatuses 250 may output a sound to the outdoor space OS of the vehicular apparatus between a main structure 210 and an exterior material 220. For example, the one or more vibration generating apparatuses 250 may be connected or coupled to one or more of the main structure 210 and the exterior material 220 between the main structure 210 and the exterior material 220, and may indirectly or directly vibrate the exterior material 220 to output a sound.

The one or more vibration generating apparatuses 250 according to an example embodiment of the present disclosure may include one or more of the vibration apparatuses 10-1 to 10-7 described above with reference to FIGS. 1 to 42. Except that the one or more vibration generating apparatuses 250 are connected or coupled to one or more of the main structure 210 and the exterior material 220, the one or more vibration generating apparatuses 250 may be substantially the same as the one or more vibration generating apparatuses 250 described above with reference to FIG. 52, and thus, the repetitive description thereof may be omitted for brevity.

As described above, the apparatus 200 according to another example embodiment of the present disclosure may indirectly or directly vibrate the exterior material 220 of the vehicular apparatus and output a sound to the outdoor space OS of the vehicular apparatus.

Figure 55:
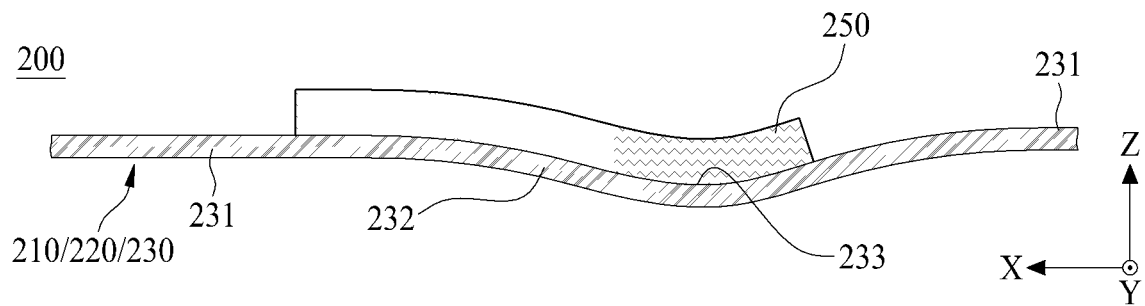
FIG. 55 illustrates an apparatus according to another example embodiment of the present disclosure.

FIG. 55 illustrates an apparatus according to another example embodiment of the present disclosure and illustrates an example embodiment implemented by modifying structures of one or more of the main structure, the exterior material, and the interior material illustrated in FIG. 52. In the following description, their repetitive descriptions of substantially the same elements as those of the apparatus described above with reference to FIG. 52 may be omitted for brevity.

With reference to FIG. 55, the apparatus 200 according to another example embodiment of the present disclosure may include one or more vibration generating apparatuses 250 connected to one or more of an exterior material 220, an interior material 230, and a main structure 210 including a nonplanar structure.

At least a portion of each of one or more of the main structure 210, the exterior material 220, and the interior material 230 may be configured to protrude to an indoor space IS of a vehicular apparatus.

One or more of the main structure 210, the exterior material 220, and the interior material 230 may include one or more of a planar portion 231 and a protrusion portion 233.

The planar portion 231 may be disposed in parallel with one or more of a first direction X and a second direction Y.

The protrusion portion 233 may protrude to the indoor space IS or an outdoor space OS of the vehicular apparatus from the planar portion 231. For example, the protrusion portion 233 may protrude convexly to the indoor space IS or the outdoor space OS of the vehicular apparatus from the planar portion 231. For example, an opposite surface of the protrusion portion 233 may be configured concavely to correspond to the protrusion portion 233.

One or more of the main structure 210, the exterior material 220, and the interior material 230 may further include an inclined surface 232 between the planar portion 231 and the protrusion portion 233.

The inclined surface 232 may be configured in a rectilinear shape or curved shape between the planar portion 231 and the protrusion portion 233.

Each of the main structure 210, the exterior material 220, and the interior material 230 may be connected or coupled to the one or more vibration generating apparatuses 250.

One or more vibration generating apparatuses 250 connected to the main structure 210 may be bent in an equiangular shape (or a conformal shape) based on a nonplanar structure of the interior material 230. One or more vibration generating apparatuses 250 connected to the exterior material 220 may be bent in an equiangular shape based on a nonplanar structure of the exterior material 220. One or more vibration generating apparatuses 250 connected to the interior material 230 may be disposed based on the nonplanar structure of the main structure 210. For example, the one or more vibration generating apparatuses 250 connected to the interior material 230 may be bent in an equiangular shape based on the nonplanar structure of the interior material 230.

The one or more vibration generating apparatuses 250 according to an example embodiment of the present disclosure may include the vibration apparatuses 10-1 to 10-7 illustrated in one or more of FIGS. 1 to 19 including the vibration device 11 illustrated in one or more of FIGS. 29 to 42, and thus, their repetitive descriptions may be omitted for brevity. For example, the vibration device 11 provided in the one or more vibration generating apparatuses 250 may have a modulus which is greater than that of an adhesive member, and thus, may be bent in an equiangular shape based on a shape (or a surface shape) of a nonplanar structure of each of the main structure 210, the exterior material 220, and the interior material 230, thereby enhancing the reliability of sound reproduction. Accordingly, the one or more vibration generating apparatuses 250 may indirectly or directly vibrate one or more of the exterior material 220 and the interior material 230 including the nonplanar structure and output a sound.

Figure 56:
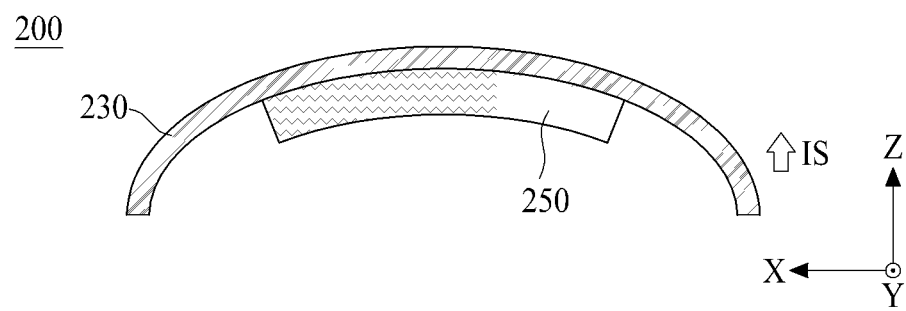
FIG. 56 illustrates an apparatus according to another example embodiment of the present disclosure.

FIG. 56 illustrates an apparatus according to another example embodiment of the present disclosure and illustrates an example embodiment implemented by modifying a structure of the interior material illustrated in FIG. 55. In the following description, therefore, their repetitive descriptions of substantially the same elements as those of the apparatus described above with reference to FIG. 55 may be omitted for brevity.

With reference to FIG. 56, the apparatus 200 according to another example embodiment of the present disclosure may include one or more vibration generating apparatuses 250 connected to one or more of an interior material 230 including a curved structure.

The interior material 230 may include a curved structure. For example, the interior material 230 may include a headrest interior material which covers a headrest frame connected to a seat, but embodiments of the present disclosure are not limited thereto. The interior material 230 may be connected or coupled to one or more vibration generating apparatuses 250.

The one or more vibration generating apparatuses 250 may be connected or coupled to an inner surface of the interior material 230 including a curved structure. For example, the one or more vibration generating apparatuses 250 may be bent in an equiangular shape based on the curved structure of the interior material 230, and may be connected or coupled to the inner surface of the interior material 230.

The one or more vibration generating apparatuses 250 according to an example embodiment of the present disclosure may include the vibration apparatuses 10-1 to 10-7 illustrated in one or more of FIGS. 1 to 19 including the vibration device 11 illustrated in one or more of FIGS. 29 to 42, and thus, their repetitive descriptions may be omitted for brevity. For example, the vibration device 11 provided in the one or more vibration generating apparatuses 250 may have a modulus which is greater than that of an adhesive member, and thus, may be bent in an equiangular shape based on a shape (or a surface shape) of the curved structure of the interior material 230, thereby enhancing the reliability of sound reproduction. Accordingly, the one or more vibration generating apparatuses 250 may indirectly or directly vibrate the interior material 230 including a curved structure and output a sound.

Figure 57:
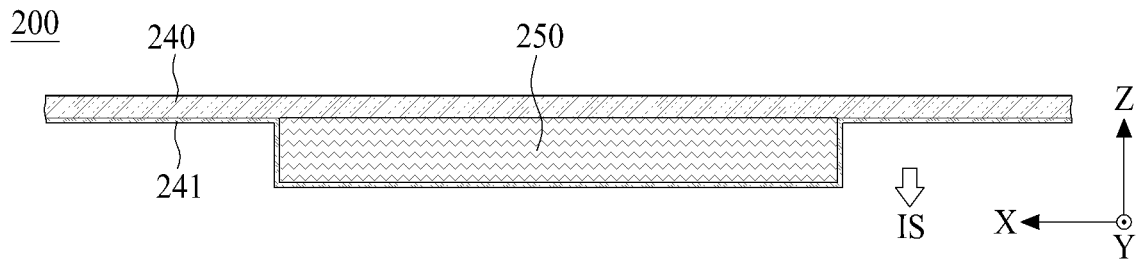
FIG. 57 illustrates an apparatus according to another example embodiment of the present disclosure.

FIG. 57 illustrates an apparatus according to another example embodiment of the present disclosure and illustrates an apparatus where the vibration apparatus illustrated in one or more of FIGS. 1 to 42 is applied to a glass window of a vehicular apparatus.

With reference to FIG. 57, the apparatus 200 according to another example embodiment of the present disclosure may include one or more vibration generating apparatuses 250 which are disposed in a glass window 240 of a vehicular apparatus and output a sound.

The glass window 240 of the vehicular apparatus may include at least one or more of a front glass window and a side glass window. The glass window 240 of the vehicular apparatus may further include at least one or more of a rear glass window and a roof glass window.

The glass window 240 according to an example embodiment of the present disclosure may be configured to be wholly transparent. The glass window 240 according to another example embodiment of the present disclosure may include a transparent portion and a semitransparent portion surrounding the transparent portion. The glass window 240 according to another example embodiment of the present disclosure may include a transparent portion and an opaque portion surrounding the transparent portion.

The one or more vibration generating apparatuses 250 may be configured to be transparent or semitransparent. For example, when the glass window 240 is wholly transparent, the one or more vibration generating apparatuses 250 may be configured to be transparent and may be disposed at a middle region or a peripheral region of the glass window 240. When the glass window 240 includes the semitransparent portion or the opaque portion, the one or more vibration generating apparatuses 250 may be configured to be semitransparent or opaque and may be disposed at the semitransparent portion or the opaque portion of the glass window 240. For example, the one or more vibration generating apparatuses 250 may be referred to as a transparent vibration generating apparatus or a transparent sound generating device, or the like, but embodiments of the present disclosure are not limited thereto.

The one or more vibration generating apparatuses 250 may be connected to or coupled to one surface (or an indoor surface) of the glass window 240 exposed at the indoor space IS of the vehicular apparatus. For example, the one or more vibration generating apparatuses 250 may be disposed at at least one or more of the front glass window and the side glass window, and may be further disposed at at least one or more of the rear glass window and the roof glass window.

The one or more vibration generating apparatuses 250 may indirectly or directly vibrate the glass window 240 and output a sound. For example, the one or more vibration generating apparatuses 250 may be configured to output a sound to an indoor space IS based on a self-vibration thereof, or may vibrate the glass window 240 and output a sound to the indoor space IS.

The one or more vibration generating apparatuses 250 according to an example embodiment of the present disclosure may include one or more of the vibration apparatuses 10-1 to 10-7 described above with reference to FIGS. 1 to 42 and may be configured to be transparent, semitransparent, or opaque. Except that the one or more vibration generating apparatuses 250 is connected or coupled to the glass window 240, the one or more vibration generating apparatuses 250 may be substantially the same as the one or more vibration generating apparatuses 250 described above with reference to FIG. 52, and thus, their repetitive descriptions may be omitted for brevity.

The one or more vibration generating apparatuses 250 may be covered by an optical film 241 attached on one surface (or an indoor surface) of the glass window 240. The optical film 241 may be attached on the one surface (or the indoor surface) of the glass window 240 to cover the one or more vibration generating apparatuses 250, and thus, may protect the one or more vibration generating apparatuses 250 or may fix the one or more vibration generating apparatuses 250 to the glass window 240. The optical film 241 may include one or more of an infrared ray blocking film for blocking an infrared ray, a light block film for blocking light, and a heat blocking film for blocking heat.

Therefore, the apparatus 200 according to another example embodiment of the present disclosure may be connected to the glass window 240 and may output a sound toward the indoor space IS by vibrating itself or by the glass window 240 as a sound vibration plate.

With reference to FIGS. 52 to 57, each of the plurality of vibration generating apparatuses 250 may include one or more of the vibration apparatuses 10-1 to 10-7 described above with reference to FIGS. 1 to 42. The plurality of vibration generating apparatuses 250 may include the same or different vibration apparatuses. One or more of the plurality of vibration generating apparatuses 250 may differ from one another.

Figure 58:
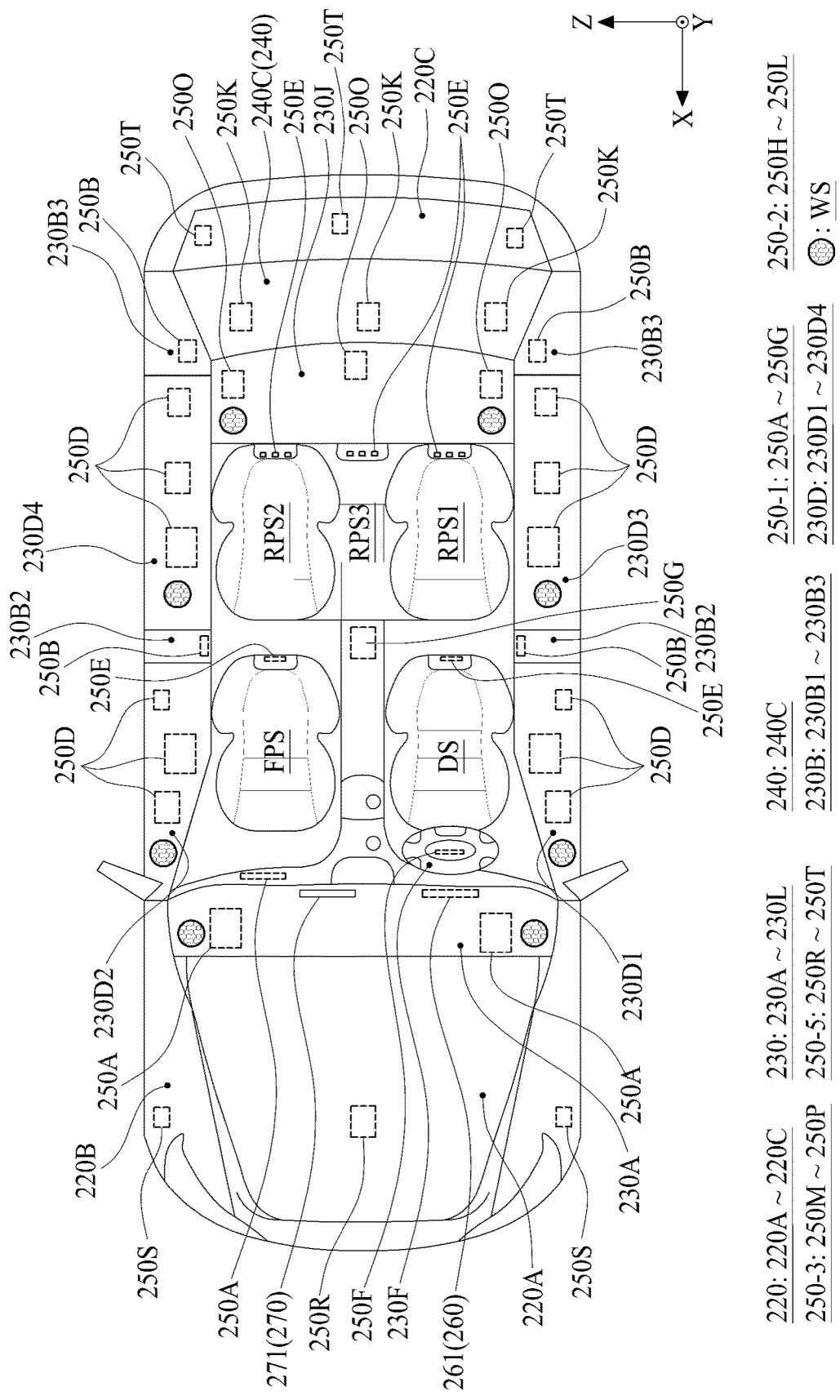
FIG. 58 illustrates a vehicular apparatus according to an example embodiment of the present disclosure.
Figure 59:
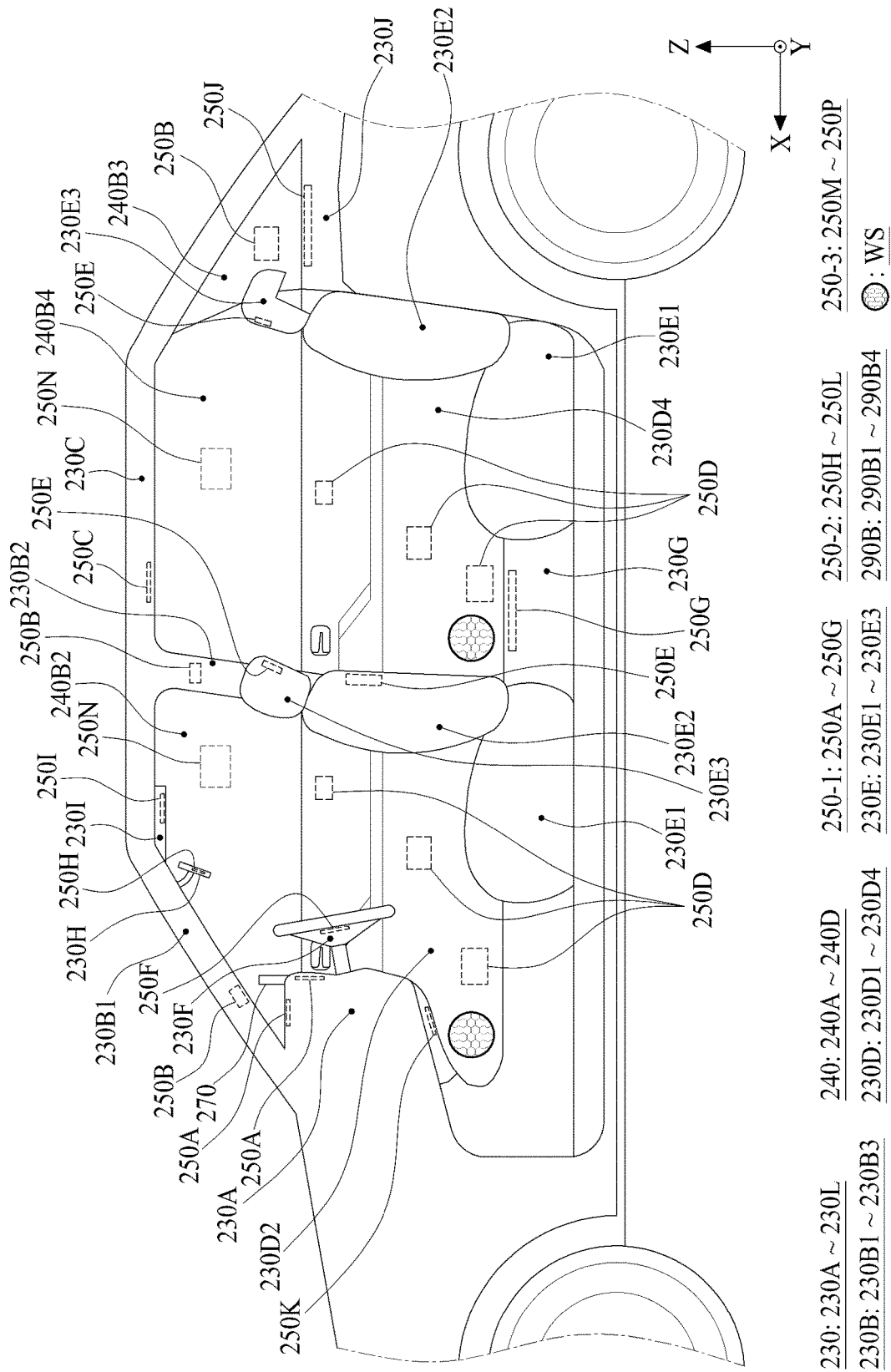
FIG. 59 is a cross-sectional view illustrating a vehicular apparatus according to an example embodiment of the present disclosure.
Figure 60:
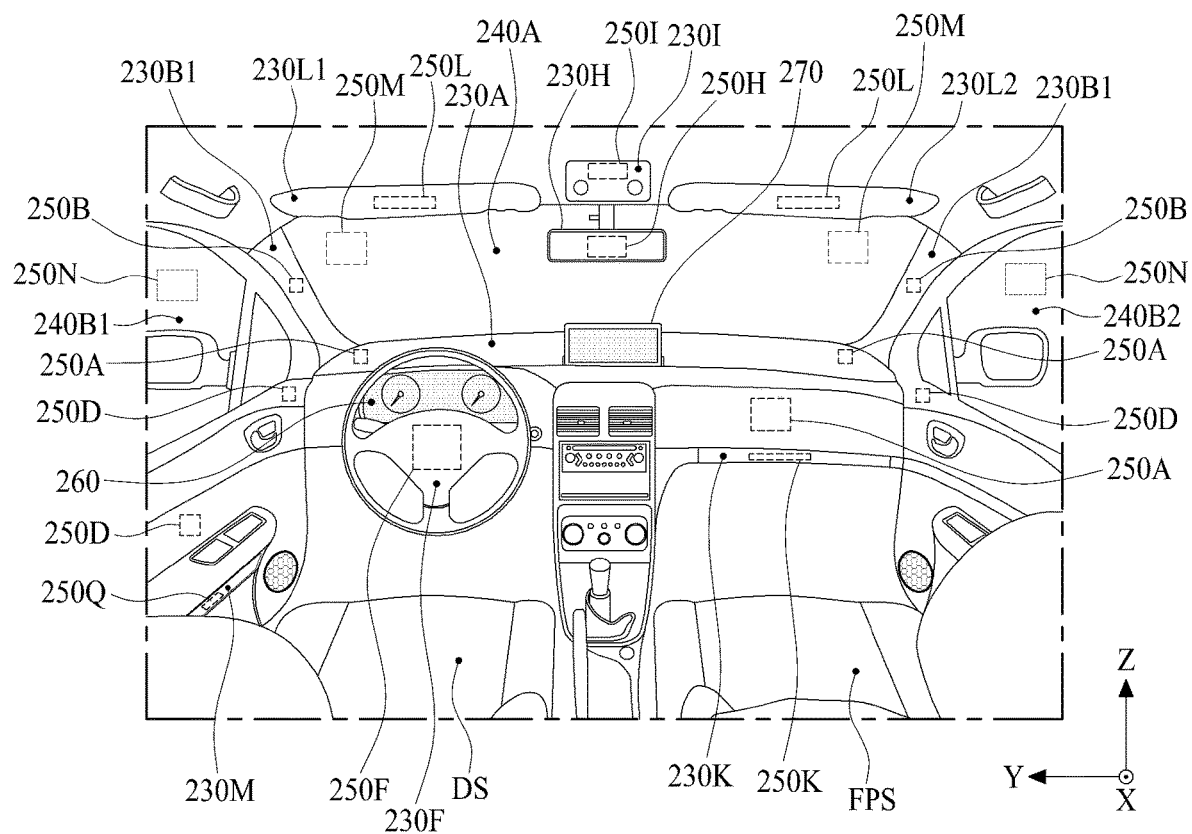
FIG. 60 illustrates an example of a sound generating apparatus disposed near a driver seat and a passenger seat of FIGS. 58 and 59.
Figure 61:
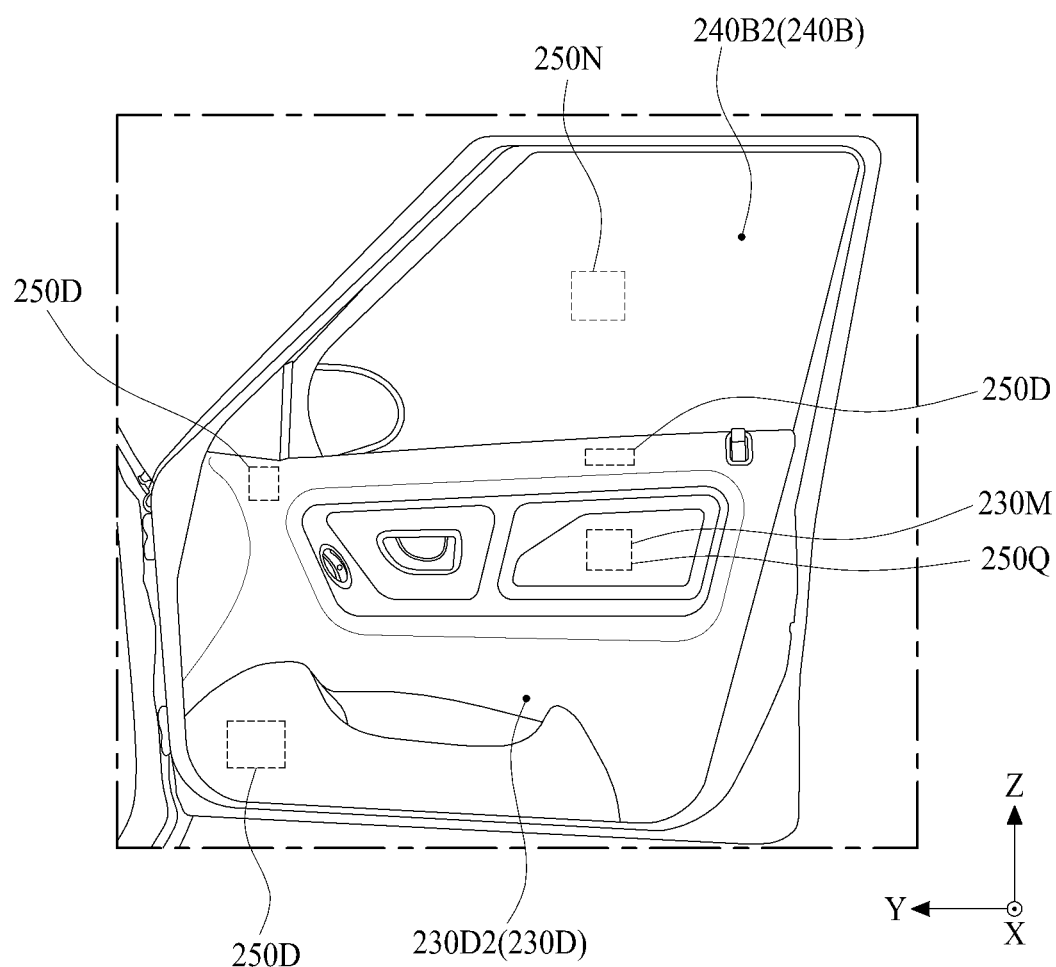
FIG. 61 illustrates an example of a sound generating apparatus disposed at a door and a glass window of FIGS. 58 and 59.
Figure 62:
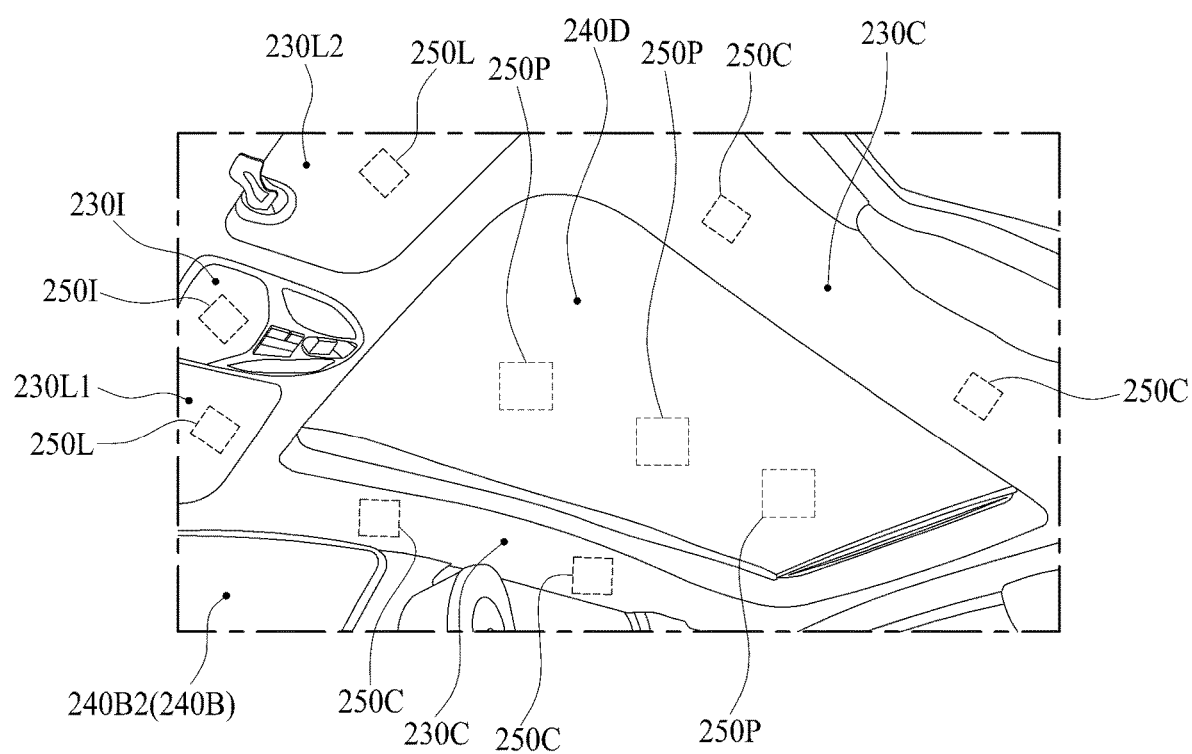
FIG. 62 illustrates an example of a sound generating apparatus disposed at a roof panel of FIGS. 58 and 59.
Figure 63:
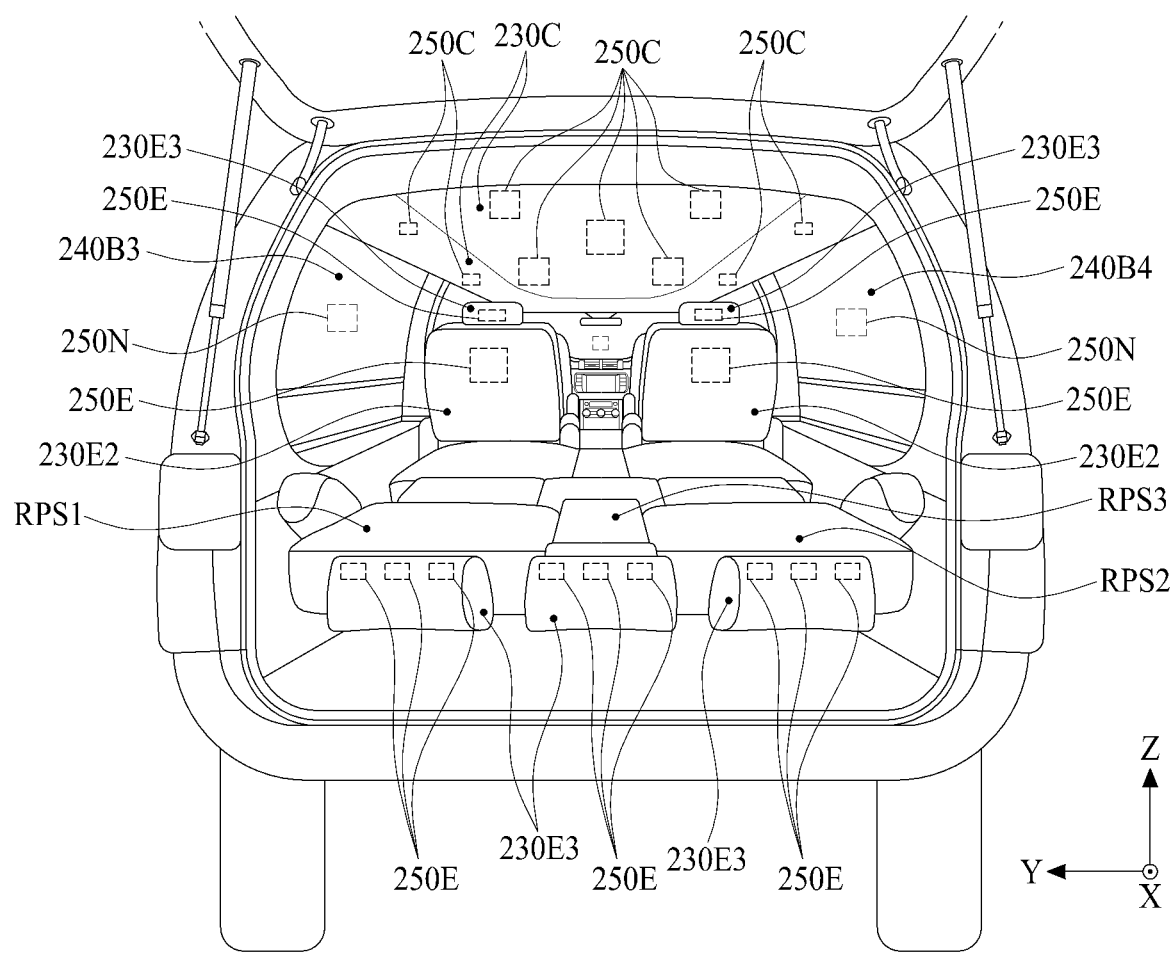
FIG. 63 illustrates an example of a sound generating apparatus disposed at a roof panel, a glass window, and a seat of FIGS. 58 and 59.

FIG. 58 illustrates a vehicular apparatus according to an example embodiment of the present disclosure. FIG. 59 is a cross-sectional view illustrating a vehicular apparatus according to an example embodiment of the present disclosure. FIG. 60 illustrates an example of a sound generating apparatus disposed near a driver seat and a passenger seat of FIGS. 58 and 59. FIG. 61 illustrates an example of a sound generating apparatus disposed at a door and a glass window of FIGS. 58 and 59. FIG. 62 illustrates an example of a sound generating apparatus disposed at a roof panel of FIGS. 58 and 59. FIG. 63 illustrates an example of a sound generating apparatus disposed at a roof panel, a glass window, and a seat of FIGS. 58 and 59.

With reference to FIGS. 58 to 63, the vehicular apparatus according to an example embodiment of the present disclosure may include a first sound generating apparatus 250-1 configured to output a sound between at least two of the following: a main structure 210; an exterior material 220; and an interior material 230. For example, the first sound generating apparatus 250-1 may be disposed in a region between the main structure 210 and the exterior material 220, a region between the main structure 210 and the interior material 230, or a region between the exterior material 220 and the interior material 230 of the vehicular apparatus and may output a sound.

The first sound generating apparatus 250-1 may include at least one or more vibration generating devices 250A to 250G which are disposed between the main structure (or the exterior material) and one or more of a dashboard interior material 230A, a pillar interior material 230B, a roof interior material 230C, a door interior material 230D, a seat interior material 230E, a handle interior material 230F, and a floor interior material 230G. For example, the first sound generating apparatus 250-1 may include at least one or more of the first to seventh vibration generating devices 250A to 250G and may output sounds of one or more channels by the one or more vibration generating devices 250A to 250G.

With reference to FIGS. 58 to 60, the first vibration generating device 250A according to an example embodiment of the present disclosure may be disposed between the dashboard 230A and a dash panel and may be configured to indirectly or directly vibrate the dashboard 230A to output a sound. For example, the first vibration generating device 250A may include a vibration generating apparatus 250 described above with reference to FIGS. 52 to 55, and thus, the repetitive description thereof may be omitted for brevity. For example, the first vibration generating device 250A may be referred to as the term such as a dashboard speaker or a first speaker, or the like, but embodiments of the present disclosure are not limited thereto.

According to an example embodiment of the present disclosure, at least one or more of the dash panel and the dashboard 230A may include a first region corresponding to a driver seat DS, a second region corresponding to a passenger seat FPS, and a third region (or a middle region) between the first region and the second region. At least one or more of the dash panel and the dashboard 230A may further include a fourth region which is inclined to face the passenger seat FPS.

According to an example embodiment of the present disclosure, the first vibration generating device 250A may be configured to vibrate at least one or more of the first to fourth regions of the dashboard 230A. For example, the first vibration generating device 250A may be disposed at each of the first and second regions of the dashboard 230A, or may be disposed at each of the first to fourth regions of the dashboard 230A. For example, the first vibration generating device 250A may be disposed at each of the first and second regions of the dashboard 230A, or may be disposed at at least one or more of the first to fourth regions of the dashboard 230A. For example, the first vibration generating device 250A may be configured to output a sound of about 150 Hz to about 20 kHz. For example, the first vibration generating device 250A configured to vibrate at least one or more of the first to fourth regions of the dashboard 230A may have the same sound output characteristic or different sound output characteristics. For example, the first vibration generating device 250A configured to vibrate each of the first to fourth regions of the dashboard 230A may have the same sound output characteristic or different sound output characteristics.

The second vibration generating device 250B according to an example embodiment of the present disclosure may be disposed between a pillar panel and the pillar interior material 230B, and may be configured to indirectly or directly vibrate the pillar interior material 230B and output a sound. For example, the second vibration generating device 250B may include a vibration generating apparatus 250 described above with reference to FIGS. 52 to 55, and thus, the repetitive description thereof may be omitted for brevity. For example, the second vibration generating device 250B may be referred to as the term such as a pillar speaker, a tweeter speaker, or a second speaker, or the like, but embodiments of the present disclosure are not limited thereto.

According to an example embodiment of the present disclosure, the pillar panel may include a first pillar (or an A pillar) disposed at both sides of a front glass window, a second pillar (or a B pillar) disposed at both sides of a center of a vehicle body, and a third pillar (or a C pillar) disposed at both sides of a rear portion of the vehicle body. The pillar interior material 230B may include a first pillar interior material 230B1 covering the first pillar, a second pillar interior material 230B2 covering the second pillar, and a third pillar interior material 230B3 covering the third pillar. According to an example embodiment of the present disclosure, the second vibration generating device 250B may be disposed in at least one or more of a region between the first pillar and the first pillar interior material 230B1, a region between the second pillar and the second pillar interior material 230B2, and a region between the third pillar and the third pillar interior material 230B3, and thus, may vibrate at least one or more of the first to third pillar interior materials 230B1 to 230B3. For example, the second vibration generating device 250B may be configured to output a sound at about 2 kHz to about 20 kHz, but embodiments of the present disclosure are not limited thereto. For example, the second vibration generating device 250B may be configured to output a sound at about 150 Hz to about 20 kHz. For example, the second vibration generating device 250B configured to vibrate at least one or more of the first to third pillar interior materials 230B1 to 230B3 may have the same sound output characteristic or different sound output characteristics.

With reference to FIGS. 59, 62, and 63, the third vibration generating device 250C according to an example embodiment of the present disclosure may be disposed between a roof panel and the roof interior material 230C and may be configured to indirectly or directly vibrate the roof interior material 230C and output a sound. For example, the third vibration generating device 250C may include a vibration generating apparatus 250 described above with reference to FIGS. 52 to 55, and thus, the repetitive description thereof may be omitted for brevity. For example, the third vibration generating device 250C may be referred to as the term such as a roof speaker or a third speaker, or the like, but embodiments of the present disclosure are not limited thereto.

According to an example embodiment of the present disclosure, at least one or more of the roof panel and the roof interior material 230C covering the roof panel may include the first region corresponding to the driver seat DS, the second region corresponding to the passenger seat FPS, a third region corresponding to a region between the driver seat DS and the passenger seat FPS, a fourth region corresponding to a first rear seat RPS1 behind the driver seat DS, a fifth region corresponding to a second rear seat RPS2 behind the passenger seat FPS, a sixth region corresponding to a region between the first rear seat RPS1 and the second rear seat RPS2, and a seventh region between the third region and the sixth region. For example, the third vibration generating device 250C may be configured to vibrate at least one or more of the first to seventh regions of the roof interior material 230C. For example, the third vibration generating device 250C may be configured to output a sound of about 150 Hz to about 20 kHz. For example, the third vibration generating device 250C configured to vibrate at least one or more of the first to seventh regions of the roof interior material 230C may have the same sound output characteristic or different sound output characteristics. For example, the third vibration generating device 250C configured to vibrate each of the first to seventh regions of the roof interior material 230C may have the same sound output characteristic or different sound output characteristics. For example, at least one or more third vibration generating devices 250C configured to vibrate at least one or more of the first to seventh regions of the roof interior material 230C may be configured to output a sound of about 2 kHz to about 20 kHz, and the other third vibration generating devices 250C may be configured to output a sound at about 150 Hz to about 20 kHz. For example, at least one or more of third vibration generating devices 250C configured to vibrate each of the first to seventh regions of the roof interior material 230C may be configured to output a sound of about 2 kHz to about 20 kHz, and the other third vibration generating devices 250C may be configured to output a sound at about 150 Hz to about 20 kHz.

With reference to FIGS. 58 to 61, the fourth vibration generating device 250D according to an example embodiment of the present disclosure may be disposed between the door frame and the door interior material 230D, and may be configured to indirectly or directly vibrate the door interior material 230D and output a sound. For example, the fourth vibration generating device 250D may include a vibration generating apparatus 250 described above with reference to FIGS. 52 to 55, and thus, the repetitive description thereof may be omitted for brevity. For example, the fourth vibration generating device 250D may be referred to as the term such as a door speaker or a fourth speaker, or the like, but embodiments of the present disclosure are not limited thereto.

According to an example embodiment of the present disclosure, at least one or more of the door frame and the door interior material 230D may include an upper region, a middle region, and a lower region with respect to a height direction Z of the vehicular apparatus. For example, the fourth vibration generating device 250D may be disposed at at least one or more of an upper region, a middle region, and a lower region between the door frame and the door interior material 230D, and thus, may vibrate at least one or more of an upper region, a middle region, and a lower region of the door interior material 230D.

According to an example embodiment of the present disclosure, the upper region of the door interior material 230D may include a curved portion having a relatively small curvature radius. As described above with reference to FIG. 55, the fourth vibration generating device 250D for vibrating the upper region of the door interior material 230D may have flexibility based on a second portion 11a2 of the vibration device 11 illustrated in one or more of FIGS. 29 to 42, and thus, may be bent in an equiangular shape based on a shape (or a surface shape) of the curved portion of the upper region of the door interior material 230D.

According to an example embodiment of the present disclosure, the door frame may include a first door frame (or a left front door frame), a second door frame (or a right front door frame), a third door frame (or a left rear door frame), and a fourth door frame (or a right rear door frame). According to an example embodiment of the present disclosure, the door interior material 230D may include a first door interior material (or a left front door interior material)

230D1 covering the first door frame, a second door interior material (or a right front door interior material) 230D2 covering the second door frame, a third door interior material (or a left rear door interior material) 230D3 covering the third door frame, and a fourth door interior material (or a right rear door interior material) 230D4 covering the fourth door frame. For example, the fourth vibration generating device 250D may be disposed at at least one or more of an upper region, a middle region, and a lower region between each of the first to fourth door frames and each of the first to fourth door interior materials 230D1 to 230D4 and may vibrate at least one or more of an upper region, a middle region, and a lower region of each of the first to fourth door interior materials 230D1 to 230D4.

According to an example embodiment of the present disclosure, the fourth vibration generating device 250D configured to vibrate the upper region of each of the first to fourth door interior materials 230D1 to 230D4 may be configured to output a sound of about 2 kHz to about 20 kHz, or may be configured to output a sound of about 150 Hz to about 20 kHz. For example, the fourth vibration generating device 250D configured to vibrate the upper regions of at least one or more of the first to fourth door interior materials 230D1 to 230D4 may be configured to output a sound of about 2 kHz to about 20 kHz, or may be configured to output a sound of about 150 Hz to about 20 kHz.

According to an example embodiment of the present disclosure, the fourth vibration generating device 250D configured to vibrate the middle regions or/and the lower regions of at least one or more of the first to fourth door interior materials 230D1 to 230D4 may be configured to output a sound of about 150 Hz to about 20 kHz. For example, the fourth vibration generating device 250D configured to vibrate the middle region or/and the lower region of each of the first to fourth door interior materials 230D1 to 230D4 may be configured to output a sound of about 150 Hz to about 20 kHz. For example, the fourth vibration generating device 250D configured to vibrate the middle regions or/and the lower regions of at least one or more of the first to fourth door interior materials 230D1 to 230D4 may be one or more of a woofer, a mid-woofer, and a sub-woofer, but embodiments of the present disclosure are not limited thereto. For example, the fourth vibration generating device 250D configured to vibrate the middle region or/and the lower region of each of the first to fourth door interior materials 230D1 to 230D4 may be referred to as the term such as one or more of a woofer, a mid-woofer, and a sub-woofer, but embodiments of the present disclosure are not limited thereto.

Sounds, which are respectively output from the fourth vibration generating device 250D disposed at the first door interior material 230D1 and the fourth vibration generating device 250D disposed at the second door interior material 230D2, may be combined and output. For example, sounds, which are output from at least one or more of the fourth vibration generating device 250D disposed at the first door interior material 230D1 and the fourth vibration generating device 250D disposed at the second door interior material 230D2, may be combined and output. In addition, a sound output from the fourth vibration generating device 250D disposed at the third door interior material 230D3 and a sound output from the fourth vibration generating device 250D disposed at the fourth door interior material 230D4 may be combined and output.

According to an example embodiment of the present disclosure, an upper region of each of the first to fourth door interior materials 230D1 to 230D4 may include a first upper region adjacent to the dashboard 230A, a second upper region adjacent to the rear seats RPS1, RPS2, and RPS3, and a third upper region between the first upper region and the second upper region. For example, the fourth vibration generating device 250D may be disposed at one or more of the first to third upper regions of each of the first to fourth door interior materials 230D1 to 230D4. For example, the fourth vibration generating device 250D may be disposed at the first upper region of each of the first and second door interior materials 230D1 and 230D2 and may be disposed at one or more of the second and third upper regions of each of the first and second door interior materials 230D1 and 230D2. For example, the fourth vibration generating device 250D may be disposed at one or more of the first to third upper regions of one or more of the first to fourth door interior materials 230D1 to 230D4. For example, the fourth vibration generating device 250D configured to vibrate the first upper regions of one or more of the first and second door interior materials 230D1 and 230D2 may be configured to output a sound of about 2 kHz to about 20 kHz, and the fourth vibration generating device 250D configured to vibrate one or more of the second and third upper regions of each of the first and second door interior materials 230D1 and 230D2 may be configured to output a sound of about 2 kHz to about 20 kHz, or may be configured to output a sound of about 150 Hz to about 20 kHz. For example, the fourth vibration generating device 250D configured to vibrate one or more of the second and third upper regions of one or more of the first and second door interior materials 230D1 and 230D2 may be configured to output a sound of about 2 kHz to about 20 kHz, or may be configured to output a sound of about 150 Hz to about 20 kHz.

With reference to FIGS. 58, 59, and 63, the fifth vibration generating device 250E according to an example embodiment of the present disclosure may be disposed between a seat frame and the seat interior material 230E and may be configured to indirectly or directly vibrate the seat interior material 230E to output a sound. For example, the fifth vibration generating device 250E may include a vibration generating apparatus 250 described above with reference to FIGS. 53 to 56, and thus, the repetitive description thereof may be omitted for brevity. For example, the fifth vibration generating device 250E may be referred to as the term such as a seat speaker, a headrest speaker, or a fifth speaker, or the like, but embodiments of the present disclosure are not limited thereto.

According to an example embodiment of the present disclosure, the seat frame may include a first seat frame (or a driver seat frame), a second seat frame (or a passenger seat frame), a third seat frame (or a first rear seat frame), a fourth seat frame (or a second rear seat frame), and a fifth seat frame (or a third rear seat frame). According to an example embodiment of the present disclosure, the seat interior material 230E may include a first seat interior material surrounding the first seat frame, a second seat interior material surrounding the second seat frame, a third seat interior material surrounding the third seat frame, a fourth seat interior material surrounding the fourth seat frame, and a fifth seat interior material surrounding the fifth seat frame.

According to an example embodiment of the present disclosure, at least one or more of the first to fifth seat frames may include a seat bottom frame, a seat rear frame, and a headrest frame. The seat interior material 230E may include a seat bottom interior material 230E1 surrounding the seat bottom frame, a seat rear interior material 230E2 surrounding the seat rear frame, and a headrest interior material 230E3 surrounding the headrest frame. At least one or more of the seat bottom interior material 230E1, the seat rear interior material 230E2, and the headrest interior material 230E3 may include a seat inner interior material and a seat outer interior material. The seat inner interior material may include a foamed layer. The seat outer interior material may include a surface layer including a fiber or a leather. The seat outer interior material may further include a base layer including a plastic material which supports the surface layer.

According to an example embodiment of the present disclosure, the fifth vibration generating device 250E may be disposed at at least one or more of a region between the seat rear frame and the seat rear interior material 230E2 and a region between the headrest frame and the headrest interior material 230E3, and thus, may vibrate at least one or more of the seat outer interior material of the seat rear interior material 230E2 and the seat outer interior material of the headrest interior material 230E3.

According to an example embodiment of the present disclosure, the fifth vibration generating device 250E disposed at at least one or more of the driver seat DS and the passenger seat FPS may be disposed at at least one or more of the region between the seat rear frame and the seat rear interior material 230E2 and the region between the headrest frame and the headrest interior material 230E3.

According to an example embodiment of the present disclosure, the fifth vibration generating device 250E disposed at at least one or more of the first to third rear seats RPS1, RPS2, and RPS3 may be disposed between the headrest frame and the headrest interior material 230E3. For example, at least one or more of the first to third rear seats RPS1, RPS2, and RPS3 may include at least one or more fifth vibration generating devices 250E disposed between the headrest frame and the headrest interior material 230E3.

According to an example embodiment of the present disclosure, the fifth vibration generating device 250E vibrating the seat rear interior materials 230E2 of at least one or more of the driver seat DS and the passenger seat RPS may be configured to output a sound of about 150 Hz to about 20 kHz.

According to an example embodiment of the present disclosure, the fifth vibration generating device 250E vibrating the headrest interior materials 230E3 of at least one or more of the driver seat DS, the passenger seat FPS, and the first to third rear seats RPS1, RPS2, and RPS3 may be configured to output a sound of about 2 kHz to about 20 kHz, or may be configured to output a sound of about 150 Hz to about 20 kHz.

With reference to FIGS. 58 to 60, the sixth vibration generating device 250F according to an example embodiment of the present disclosure may be disposed between a handle frame and the handle interior material 230F and may be configured to indirectly or directly vibrate the handle interior material 230F to output a sound. For example, the sixth vibration generating device 250F may include a vibration generating apparatus 250 described above with reference to FIGS. 52 to 55, and thus, the repetitive description thereof may be omitted for brevity. For example, the sixth vibration generating device 250F may be referred to as the term such as a handle speaker, a steering speaker, or a sixth speaker, or the like, but embodiments of the present disclosure are not limited thereto.

According to an example embodiment of the present disclosure, the sixth vibration generating device 250F may be configured to indirectly or directly vibrate the handle interior material 230F to provide a driver with a sound. For example, a sound output by the sixth vibration generating device 250F may be a sound which is the same as or different from a sound output from each of the first to fifth vibration generating devices 250A to 250E. For example, a sound output by the sixth vibration generating device 250F may be a sound which is the same as or different from sounds output from at least one or more of the first to fifth vibration generating devices 250A to 250E. In an example embodiment of the present disclosure, the sixth vibration generating device 250F may output a sound which is to be provided to only the driver. In another example embodiment of the present disclosure, the sound output by the sixth vibration generating device 250F and a sound output by each of the first to fifth vibration generating devices 250A to 250E may be combined and output. For example, the sound output by the sixth vibration generating device 250F and the sound output by at least one or more of the first to fifth vibration generating devices 250A to 250E may be combined and output.

With reference to FIGS. 58 and 59, the seventh vibration generating device 250G may be disposed between the floor panel and the floor interior material 230G and may be configured to indirectly or directly vibrate the floor internal material 230G to output a sound. The seventh vibration generating device 250G may be disposed between the floor interior material 230G and the floor panel disposed between the front seats DS and FPS and the third rear seat RPS3. For example, the seventh vibration generating device 250G may include a vibration generating apparatus 250 described above with reference to FIGS. 52 to 55, and thus, the repetitive description thereof may be omitted for brevity. For example, the seventh vibration generating device 250G may be configured to output a sound of about 150 Hz to about 20 kHz. For example, the seventh vibration generating device 250G may be referred to as the term such as a floor speaker, a bottom speaker, an under speaker, or a seventh speaker, or the like, but embodiments of the present disclosure are not limited thereto.

With reference to FIGS. 58 to 62, the vehicular apparatus according to an example embodiment of the present disclosure may further include a second sound generating apparatus 250-2 which is disposed at the interior material exposed at an indoor space. For example, the vehicular apparatus according to an example embodiment of the present disclosure may include only the second sound generating apparatus 250-2 instead of the first sound generating apparatus 250-1, or may include all of the first sound generating apparatus 250-1 and the second sound generating apparatus 250-2.

According to an example embodiment of the present disclosure, the interior material 230 may further include a rear view mirror 230H, an overhead console 230I, a rear package interior material 230J, a glove box 230K, and a sun visor 230L, or the like.

The second sound generating apparatus 250-2 according to an example embodiment of the present disclosure may include at least one or more vibration generating devices 250H to 250L which are disposed at at least one of the rear view mirror 230H, the overhead console 230I, the rear package interior material 230J, the glove box 230K, and the sun visor 230L. For example, the second sound generating apparatus 250-2 may include at least one or more of eighth to twelfth vibration generating devices 250H to 250L, and thus, may output sounds of one or more channels by the one or more vibration generating devices 250H to 250L.

With reference to FIGS. 58 to 62, the eighth vibration generating device 250H may be disposed at the rear view mirror 230H and may be configured to indirectly or directly vibrate the rear view mirror 230H and output a sound. The eighth vibration generating device 250H may be disposed between a mirror housing connected to the main structure and the rear view mirror 230H supported by the mirror housing. For example, the eighth vibration generating device 250H may include the vibration generating apparatus 250 described above with reference to FIG. 55, and thus, the repetitive description thereof may be omitted for brevity. For example, the eighth vibration generating device 250H may be configured to output a sound of about 150 Hz to about 20 kHz. For example, the eighth vibration generating device 250H may be referred to as the term such as a mirror speaker or an eighth speaker, or the like, but embodiments of the present disclosure are not limited thereto.

With reference to FIGS. 59, 60, and 62, the ninth vibration generating device 250I may be disposed at the overhead console 230I and may be configured to indirectly or directly vibrate a console cover of the overhead console 230I to output a sound. According to an example embodiment of the present disclosure, the overhead console 230I may include a console box embedded (or built-in) into the roof panel, a lighting device disposed at the console box, and a console cover covering the lighting device and the console box.

The ninth vibration generating device 250I may be disposed between the console box and the console cover of the overhead console 230I and may vibrate the console cover. For example, the ninth vibration generating device 250I may be disposed between the console box and the console cover of the overhead console 230I and may directly vibrate the console cover. For example, the ninth vibration generating device 250I may include a vibration generating apparatus 250 described above with reference to FIG. 55, and thus, the repetitive description thereof may be omitted for brevity. For example, the ninth vibration generating device 250I may be configured to output a sound of about 150 Hz to about 20 kHz. For example, the ninth vibration generating device 250I may be referred to as the term such as a console speaker, a lighting speaker, or a ninth speaker, or the like, but embodiments of the present disclosure are not limited thereto.

The vehicular apparatus according to the thirteenth example embodiment of the present disclosure may further include a center lighting box disposed at a center region of the roof interior material 230C, a center lighting device disposed at the center lighting box, and a center lighting cover covering the center lighting device. In this case, the ninth vibration generating device 250I may be further disposed between the center lighting box and the center lighting cover of the center lighting device and may further vibrate the center lighting cover.

With reference to FIGS. 58 and 59, the tenth vibration generating device 250J may be disposed at the rear package interior material 230J and may be configured to indirectly or directly vibrate the rear package interior material 230J and output a sound. The rear package interior material 230J may be disposed behind (or back portion or rear portion) the first to third rear seats RPS1, RPS2, and RPS3. For example, a portion of the rear package interior material 230J may be disposed under a rear glass window 240C.

The tenth vibration generating device 250J may be disposed at a rear surface of the rear package interior material 230J and may vibrate the rear package interior material 230J. For example, the tenth vibration generating device 250J may directly vibrate the rear package interior material 230J. For example, the tenth vibration generating device 250J may include a vibration generating apparatus 250 described above with reference to FIG. 55, and thus, the repetitive description thereof may be omitted for brevity. For example, the tenth vibration generating device 250J may be referred to as the term such as a rear speaker or a tenth speaker, or the like, but embodiments of the present disclosure are not limited thereto.

According to an example embodiment of the present disclosure, the rear package interior material 230J may include a first region corresponding to a rear portion of the first rear seat RPS1, a second region corresponding to a rear portion of the second rear seat RPS2, and a third region corresponding to a rear portion of the third passenger seat RPS3. According to an example embodiment of the present disclosure, the tenth vibration generating device 250J may be disposed to vibrate at least one or more of the first to third regions of the rear package interior material 230J. For example, the tenth vibration generating device 250J may be disposed at each of the first and second regions of the rear package interior material 230J, or may be disposed at each of the first to third regions of the rear package interior material 230J. For example, the tenth vibration generating device 250J may be disposed at at least one or more of the first and second regions of the rear package interior material 230J, or may be disposed at at least one or more of the first to third regions of the rear package interior material 230J. For example, the tenth vibration generating device 250J may be configured to output a sound at about 150 Hz to about 20 kHz. For example, the tenth vibration generating device 250J configured to vibrate each of the first to third regions of the rear package interior material 230J may have the same sound output characteristic or different sound output characteristics. For example, the tenth vibration generating device 250J configured to vibrate at least one or more of the first to third regions of the rear package interior material 230J may have the same sound output characteristic or different sound output characteristics.

With reference to FIGS. 58 to 60, the eleventh vibration generating device 250K may be disposed at a glove box 230K and may be configured to indirectly or directly vibrate the glove box 230K and output a sound. The glove box 230K may be disposed at a dashboard 230A corresponding to a front portion of the passenger seat FPS.

The eleventh vibration generating device 250K may be disposed at an inner surface of the glove box 230K and may vibrate the glove box 230K. For example, the eleventh vibration generating device 250K may include a vibration generating apparatus 250 described above with reference to FIG. 55, and thus, the repetitive description thereof may be omitted for brevity. For example, the eleventh vibration generating device 250K may be configured to output a sound of about 150 Hz to about 20 kHz, or may be one or more of a woofer, a mid-woofer, and a sub-woofer, but embodiments of the present disclosure are not limited thereto. For example, the eleventh vibration generating device 250K may be referred to as the term such as a glove box speaker or an eleventh speaker, or the like, but embodiments of the present disclosure are not limited thereto.

With reference to FIG. 60, the twelfth vibration generating device 250L may be disposed at the sun visor 230L and configured to indirectly or directly vibrate the sun visor 230L to output a sound. The sun visor 230L may include a first sun visor 230L1 corresponding to the driver seat DS and a second sun visor 230L2 corresponding to the passenger seat FPS.

The twelfth vibration generating device 250L may be disposed at at least one or more of the first sun visor 230L1 and the second sun visor 230L2 and may indirectly or directly vibrate at least one or more of the first sun visor 230L1 and the second sun visor 230L2. For example, the twelfth vibration generating device 250L may include a vibration generating apparatus 250 described above with reference to FIG. 55, and thus, the repetitive description thereof may be omitted for brevity. For example, the twelfth vibration generating device 250L may be configured to output a sound of about 150 Hz to about 20 kHz. For example, the twelfth vibration generating device 250L may be referred to as the term such as a sun visor speaker or a twelfth speaker, or the like, but embodiments of the present disclosure are not limited thereto.

According to an example embodiment of the present disclosure, at least one or more of the first sun visor 230L1 and the second sun visor 230L2 may further include a sun visor mirror. In this case, the twelfth vibration generating device 250L may be configured to indirectly or directly vibrate a sun visor mirror of at least one or more of the first sun visor 230L1 and the second sun visor 230L2. The twelfth vibration generating device 250L vibrating the sun visor mirror may include a vibration generating apparatus 250 described above with reference to FIG. 55, and thus, the repetitive description thereof may be omitted for brevity.

With reference to FIGS. 58 to 62, the vehicular apparatus according to the thirteenth example embodiment of the present disclosure may further include a third sound generating apparatus 250-3 at the glass window. For example, the vehicular apparatus according to the thirteenth example embodiment of the present disclosure may include the third sound generating apparatus 250-3 instead of at least one or more of the first and second sound generating apparatuses 250-1 and 250-2, or may include all of the first to third sound generating apparatuses 250-1, 250-2, and 250-3.

The third sound generating apparatus 250-3 may include at least one or more vibration generating devices 250M to 250P disposed at the glass window. For example, the third sound generating apparatus 250-3 may include at least one or more of thirteenth to sixteenth vibration generating devices 250M to 250P, and thus, may output sounds of one or more channels by one or more vibration generating devices 250M to 250P. For example, the third sound generating apparatus 250-3 may be referred to as the term such as a window speaker, a transparent sound generating apparatus, a transparent speaker, or an opaque speaker, or the like, but embodiments of the present disclosure are not limited thereto.

At least one or more of the thirteenth to sixteenth vibration generating devices 250M to 250P according to an example embodiment of the present disclosure may be configured to indirectly or directly vibrate the glass window. For example, at least one or more of the thirteenth to sixteenth vibration generating devices 250M to 250P may include one or more of the vibration apparatus 11-1 to 11-7 described above with reference to FIGS. 1 to 42, may be configured to be transparent, semitransparent, or opaque. One or more vibration generating devices 250M to 250P may include a vibration generating apparatus 250 described above with reference to FIG. 57, and thus, the repetitive description thereof may be omitted for brevity.

According to an example embodiment of the present disclosure, the glass window 240 may include a front glass window 240A, a side glass window 240B, and a rear glass window 240C. According to an example embodiment of the present disclosure, the glass window may further include a roof glass window 240D. For example, when the vehicular apparatus includes the roof glass window 240D, a portion of a region of the roof frame and the roof interior material 230C may be replaced with the roof glass window 240D. For example, when the vehicular apparatus includes the roof glass window 240D, the third vibration generating device 250C may be configured to indirectly or directly vibrate a periphery portion of the roof interior material 230C surrounding the roof glass window 240D and output a sound.

With reference to FIGS. 58 to 60, the thirteenth vibration generating device 250M according to an example embodiment of the present disclosure may be disposed at the front glass window 240A and may be configured to output a sound by vibrating itself or may be configured to indirectly or directly vibrate the front glass window 240A to output a sound.

According to an example embodiment of the present disclosure, the front glass window 240A may include a first region corresponding to the driver seat DS, a second region corresponding to the passenger seat FPS, and a third region (or a middle region) between the first region and the second region. For example, the thirteenth vibration generating device 250M may be disposed at at least one or more of the first to third regions of the front glass window 240A. For example, the thirteenth vibration generating device 250M may be disposed at each of the first and second regions of the front glass window 240A, or may be disposed at each of the first to third regions of the front glass window 240A. For example, the thirteenth vibration generating device 250M may be disposed at at least one or more of the first and second regions of the front glass window 240A, or may be disposed at at least one or more of the first to third regions of the front glass window 240A. For example, the thirteenth vibration generating device 250M disposed at each of the first to third regions of the front glass window 240A may have the same sound output characteristic or different sound output characteristics. For example, the thirteenth vibration generating device 250M disposed at at least one or more of the first to third regions of the front glass window 240A may have the same sound output characteristic or different sound output characteristics. For example, the thirteenth vibration generating device 250M may be configured to output a sound of about 150 Hz to about 20 kHz. For example, the thirteenth vibration generating device 250M may be referred to as the term such as a front window speaker or a thirteenth speaker, or the like, but embodiments of the present disclosure are not limited thereto.

With reference to FIGS. 59 to 61 and 63, the fourteenth vibration generating device 250N according to an example embodiment of the present disclosure may be disposed at the side glass window 240B and may be configured to output a sound by vibrating itself or may be configured to indirectly or directly vibrate the side glass window 240B to output a sound.

According to an example embodiment of the present disclosure, the side glass window 240B may include a first side glass window (or a left front window) 240B1, a second side glass window (or a right front window) 240B2, a third side glass window (or a left rear window) 240B3, and a fourth side glass window (or a right rear window) 240B4.

According to an example embodiment of the present disclosure, the fourteenth vibration generating device 250N may be disposed at at least one or more of the first to fourth side glass windows 240B1 to 240B4. For example, at least one or more of the first to fourth side glass windows 2300B1 to 240B4 may include at least one or more fourteenth vibration generating devices 250N.

According to an example embodiment of the present disclosure, the fourteenth vibration generating device 250N may be disposed at at least one or more of the first to fourth side glass windows 240B1 to 240B4 and may be configured to output a sound by vibrating itself or may be configured to indirectly or directly vibrate a corresponding side glass window to output the sound. For example, the fourteenth vibration generating device 250N may be configured to output a sound of about 150 Hz to about 20 kHz. For example, the fourteenth vibration generating device 250N disposed at at least one or more of the first to fourth side glass windows 240B1 to 240B4 may have the same sound output characteristic or different sound output characteristics. For example, the fourteenth vibration generating device 250N may be configured to output a sound of about 150 Hz to about 20 kHz. For example, the fourteenth vibration generating device 250N may be a side window speaker or a fourteenth speaker, or the like, but embodiments of the present disclosure are not limited thereto.

With reference to FIG. 58, the fifteenth vibration generating device 250O according to an example embodiment of the present disclosure may be disposed at the rear glass window 240C and may be configured to output a sound by vibrating itself, or may be configured to indirectly or directly vibrate the rear glass window 240C and output a sound.

According to an example embodiment of the present disclosure, the rear glass window 240C may include a first region corresponding to a rear portion of the first rear seat RPS1, a second region corresponding to a rear portion of the second rear seat RPS2, and a third region corresponding to a rear portion of the third rear seat RPS3. According to an example embodiment of the present disclosure, the fifteenth vibration generating device 250O may be disposed at each of first to third regions of the rear glass window 240C. For example, the fifteenth vibration generating device 250O may be disposed at at least one or more of the first to third regions of the rear glass window 240C. For example, the fifteenth vibration generating device 250O may be disposed at each of the first and second regions of the rear glass window 240C, or may be disposed at each of the first to third regions of the rear glass window 240C. For example, the fifteenth vibration generating device 250O may be disposed at at least one or more of the first and second regions of the rear glass window 240C, or may be disposed at at least one or more of the first to third regions of the rear glass window 240C. For example, the fifteenth vibration generating device 250O may be configured to output a sound of about 150 Hz to about 20 kHz. For example, the fifteenth vibration generating device 250O disposed at each of the first to third regions of the rear glass window 240C may have the same sound output characteristic or different sound output characteristics. For example, the fifteenth vibration generating device 250O disposed at at least one or more of the first to third regions of the rear glass window 240C may have the same sound output characteristic or different sound output characteristics. For example, the fifteenth vibration generating device 250O disposed at at least one or more of the first to third regions of the rear glass window 240C may be configured to output a sound of about 150 Hz to about 20 kHz, or may be one or more of a woofer, a mid-woofer, and a sub-woofer, or the like, but embodiments of the present disclosure are not limited thereto. For example, the fifteenth vibration generating device 250O may be referred to as the term such as a rear window speaker or a fifteenth speaker, or the like, but embodiments of the present disclosure are not limited thereto.

With reference to FIG. 62, the sixteenth vibration generating device 250P according to an example embodiment of the present disclosure may be disposed at the roof glass window 240D and may output a sound by vibrating itself, or may be configured to indirectly or directly vibrate the roof glass window 240D and output a sound.

The roof glass window 240D according to an example embodiment of the present disclosure may be disposed over the front seats DS and FPS. For example, the sixteenth vibration generating device 250P may be disposed at a middle region of the roof glass window 240D. For example, the sixteenth vibration generating device 250P may be configured to output a sound of about 150 Hz to about 20 kHz. For example, the sixteenth vibration generating device 250P may be referred to as the term such as a roof window speaker or a sixteenth speaker, or the like, but embodiments of the present disclosure are not limited thereto.

According to another example embodiment of the present disclosure, the roof glass window 240D may be disposed on the front seats DS and FPS or may be disposed on the front seats DS and FPS and the rear seats RPS1, RPS2, and RPS3. For example, the roof glass window 240D may include a first region corresponding to the front seats DS and FPS and a second region corresponding to the rear seats RPS1, RPS2, and RPS3. In addition, the roof glass window 240D may include a third region between the first region and the second region. For example, the sixteenth vibration generating device 250P may be disposed at at least one or more of the first and second regions of the roof glass window 240D or may be disposed at at least one or more of the first to third regions of the roof glass window 240D. For example, the sixteenth vibration generating device 250P may be configured to output a sound of about 150 Hz to about 20 kHz. For example, the sixteenth vibration generating device 250P disposed at at least one or more of the first to third regions of the roof glass window 240D may have the same sound output characteristic or different sound output characteristics.

With reference to FIGS. 58 to 60, the vehicular apparatus according to the thirteenth example embodiment of the present disclosure may further include a woofer speaker WS which is disposed at at least one or more of a dashboard 230A, a door frame, and a rear package interior material 230J.

The woofer speaker WS according to an example embodiment of the present disclosure may include at least one or more of a woofer, a mid-woofer, and a sub-woofer, but embodiments of the present disclosure are not limited thereto. For example, the woofer speaker WS may be referred to as the term such as a speaker or the like which outputs a sound of about 60 Hz to about 150 Hz, but embodiments of the present disclosure are not limited thereto. Therefore, the woofer speaker WS may output a sound of about 60 Hz to about 150 Hz, and thus, may enhance a low-pitched sound band characteristic of a sound which is output to an indoor space.

According to an example embodiment of the present disclosure, the woofer speaker WS may be disposed at at least one or more of first and second regions of the dashboard 230A. According to an example embodiment of the present disclosure, the woofer speaker WS may be disposed at each of first to fourth door frames of the door frame and may be exposed at a lower region among each of the first to fourth door interior materials 230D1 to 230D4 of the door interior material 230D. For example, the woofer speaker WS may be disposed at at least one or more of the first to fourth door frames of the door frame and may be exposed at the lower regions of at least one or more of the first to fourth door interior materials 230D1 to 230D4 of the door interior material 230D. According to another example embodiment of the present disclosure, the woofer speaker WS may be disposed at at least one or more of the first and second regions of the rear package interior material 230J. For example, the fourth vibration generating device 250D disposed at the lower region of each of the first to fourth door interior materials 230D1 to 230D4 may be replaced by the woofer speaker WS. For example, the fourth vibration generating device 250D disposed at the lower regions of at least one or more of the first to fourth door interior materials 230D1 to 230D4 may be replaced by the woofer speaker WS.

With reference to FIGS. 60 and 61, the vehicular apparatus according to an example embodiment of the present disclosure may further include a garnish member 230M which covers a portion of an interior material 230 exposed at an indoor space and a fourth sound generating apparatus 250-4 disposed in the interior material 230.

The garnish member 230M may be configured to cover a portion of a door interior member 230D exposed at an indoor space, but embodiments of the present disclosure are not limited thereto. For example, the garnish member 230M may be configured to cover a portion of each of one or more of a dashboard 230A, a filler interior 230B, and a roof interior 230C, which are exposed at the indoor space, but embodiments of the present disclosure are not limited thereto.

The garnish member 230M according to an example embodiment of the present disclosure may include a metal material or a nonmetal material (or a composite nonmetal material) having a material characteristic suitable for generating a sound based on a vibration. For example, the metal material of the garnish member 230M may include any one or more materials of a stainless steel, an aluminum (Al), an Al alloy, a magnesium (Mg), a Mg alloy, and a magnesium-lithium (Mg—Li) alloy, but embodiments of the present disclosure are not limited thereto. The nonmetal material (or the composite nonmetal material) of the garnish member 230M may include one or more of a plastic, a fiber, a leather, wood, a cloth, a rubber, and a paper, but embodiments of the present disclosure are not limited thereto. For example, the garnish member 230M may include a metal material having a material characteristic suitable for generating a sound of a high-pitched sound band, but embodiments of the present disclosure are not limited thereto. For example, the high-pitched sound band may have a frequency of 1 kHz or more or 3 kHz or more, but embodiments of the present disclosure are not limited thereto.

The fourth sound generating apparatus 250-4 may include a seventeenth vibration generating apparatus 250Q disposed between the garnish member 230M and the interior member 230. For example, the fourth sound generating apparatus 250-4 may include the seventeenth vibration generating apparatus 250Q. For example, the fourth sound generating apparatus 250-4 or the seventeenth vibration generating apparatus 250Q may be referred to as a garnish speaker or a seventeenth speaker, but embodiments of the present disclosure are not limited thereto.

The seventeenth vibration generating apparatus 250Q may include one or more of the vibration apparatuses 10-1 to 10-7 described above with reference to FIGS. 1 to 42. Except that the seventeenth vibration generating apparatus 250Q is disposed at a main interior material 230 and a garnish member 230M and is connected or coupled to the garnish member 230M, the seventeenth vibration generating apparatus 250Q may be substantially the same as the one or more vibration generating apparatuses 250 described above with reference to FIG. 55, and thus, the repetitive description thereof may be omitted for brevity.

The seventeenth vibration generating apparatus 250Q according to an example embodiment of the present disclosure may indirectly or directly vibrate the garnish member 230M to output a sound to an indoor space of the vehicular apparatus. For example, the seventeenth vibration generating apparatus 250Q may be configured to output a sound of a high-pitched sound band, but embodiments of the present disclosure are not limited thereto.

With reference to FIG. 60, the vehicular apparatus according to an example embodiment of the present disclosure may further include a fifth sound generating apparatus 250-5 disposed at an inner surface of an interior material 230.

The fifth sound generating apparatus 250-5 may include one or more vibration generating apparatuses 250R, 250S, and 250T disposed between a main structure and one or more of a hood panel 220A, a front fender panel 220B, and a trunk panel 220C. For example, the fifth sound generating apparatus 250-5 may include one or more of eighteenth to twentieth vibration generating apparatuses 250R, 250S, and 250T, and thus, may output sounds of one or more channels by the one or more vibration generating apparatuses 250R, 250S, and 250T.

The one or more eighteenth vibration generating apparatuses 250R according to an example embodiment of the present disclosure may be connected or coupled to an inner surface of the hood panel 220A and may indirectly or directly vibrate the hood panel 220A and output a sound to an outdoor space of the vehicular apparatus. For example, the one or more eighteenth vibration generating apparatuses 250R may be connected or coupled to one or more of a center portion and a periphery portion of the inner surface of the hood panel 220A.

The one or more eighteenth vibration generating apparatuses 250R according to an example embodiment of the present disclosure may include the one or more of the vibration apparatuses 10-1 to 10-7 described above with reference to FIGS. 1 to 42. Except that the one or more eighteenth vibration generating apparatus 250R is connected or coupled to an inner surface of the hood panel 220A, the one or more eighteenth vibration generating apparatus 250R may be substantially the same as the one or more vibration generating apparatuses 250 described above with reference to FIG. 55, and thus, the repetitive description thereof may be omitted for brevity. For example, one or more the eighteenth vibration generating apparatus 250R may be configured to output a sound of about 150 Hz to about 20 kHz. For example, the one or more eighteenth vibration generating apparatus 250R may be referred to as the term such as a hood panel speaker or an eighteenth speaker, or the like, but embodiments of the present disclosure are not limited thereto.

The one or more nineteenth vibration generating apparatuses 250S according to an example embodiment of the present disclosure may be connected or coupled to an inner surface of the front fender panel 220B, and may indirectly or directly vibrate the front fender panel 220B and output a sound to an outdoor space of the vehicular apparatus. For example, the one or more nineteenth vibration generating apparatuses 250S may be disposed to have a certain interval in the inner surface of the front fender panel 220B.

The one or more nineteenth vibration generating apparatuses 250S according to an example embodiment of the present disclosure may include the one or more of the vibration apparatuses 10-1 to 10-7 described above with reference to FIGS. 1 to 42. Except that the one or more nineteenth vibration generating apparatus 250S is connected or coupled to an inner surface of the front fender panel 220B, the one or more nineteenth vibration generating apparatus 250S may be substantially the same as the one or more vibration generating apparatuses 250 described above with reference to FIG. 55, and thus, the repetitive description thereof may be omitted for brevity. For example, the one or more nineteenth vibration generating apparatuses 250S may be configured to output a sound of about 150 Hz to about 20 kHz. For example, the one or more nineteenth vibration generating apparatuses 250S may be referred to as the term such as a fender panel speaker or a nineteenth speaker, or the like, but embodiments of the present disclosure are not limited thereto.

The one or more twentieth vibration generating apparatuses 250T according to an example embodiment of the present disclosure may be connected or coupled to an inner surface of the trunk panel 220C, and may be configured to indirectly or directly vibrate the trunk panel 220C and output a sound to the outdoor space of the vehicular apparatus. For example, the one or more twentieth vibration generating apparatuses 250T may be configured to be connected or coupled to one or more of a center portion and a periphery portion of the inner surface of the trunk panel 220C.

The one or more twentieth vibration generating apparatuses 250T according to an example embodiment of the present disclosure may include the one or more of the vibration apparatuses 10-1 to 10-7 described above with reference to FIGS. 1 to 42. Except that the one or more twentieth vibration generating apparatus 250T is connected or coupled to an inner surface of the trunk panel 220C, the one or more twentieth vibration generating apparatus 250S may be substantially the same as the one or more vibration generating apparatuses 250 described above with reference to FIG. 55, and thus, the repetitive description thereof may be omitted for brevity. For example, the one or more twentieth vibration generating apparatuses 250T may be configured to output a sound of about 150 Hz to about 20 kHz. For example, the one or more twentieth vibration generating apparatuses 250T may be referred to as the term such as a trunk panel speaker or a nineteenth speaker, or the like, but embodiments of the present disclosure are not limited thereto.

Additionally, the fifth sound generating apparatus 250-5 may further include one or more vibration generating apparatuses disposed between the main structure and at least one or more of the door inner panel and the door outer panel.

With reference to FIGS. 58 to 60, the vehicular apparatus according to an example embodiment of the present disclosure may further include an instrument panel apparatus 260 and an infotainment apparatus 270.

The instrument panel apparatus 260 according to an example embodiment of the present disclosure may be disposed at a first region of the dashboard 230A toward the driver seat DS. The instrument panel apparatus 260 may include a display (or a first display) 261 which is disposed at the first region of the dashboard 230A toward the driver seat DS.

The first display 261 may include any one of the apparatus 100 described above with reference to FIGS. 46 to 50, and thus, the repetitive description thereof may be omitted for brevity. For example, the instrument panel apparatus 260 may output a sound, generated by a vibration of a vibration member (or a display panel) based on a vibration of one or more vibration generating apparatuses 120 included in the first display 261, toward the driver seat DS. For example, the vibration generating apparatuses 120 disposed at the first display 261 of the instrument panel apparatus 260 may be configured to output a sound of about 150 Hz to about 20 kHz.

The infotainment apparatus 270 may be disposed at a third region of the dashboard 230A.

The infotainment apparatus 270 according to an example embodiment of the present disclosure may be fixed on the third region of the dashboard 230A in an upright state.

The infotainment apparatus 270 according to another example embodiment of the present disclosure may be installed to be raised and lowered at the third region of the dashboard 230A. For example, the infotainment apparatus 270 may be received or accommodated into the dashboard 230A based on the power turn-off of the vehicular apparatus or the manipulation of a vehicle passenger, and may protrude to a region on the dashboard 230A based on the power turn-on of the vehicular apparatus or the manipulation of the vehicle passenger.

The infotainment apparatus 27 according to an example embodiment of the present disclosure may include a display (or a second display) 271 disposed at the third region of the dashboard 230A, and a display elevation device.

The second display 271 may include any one of the apparatus 100 described above with reference to FIGS. 46 to 50, and thus, the repetitive description thereof may be omitted for brevity. For example, the infotainment apparatus 270 may output a sound, generated by a vibration of a vibration member (or a display panel) based on a vibration of one or more vibration generating apparatuses 120 included in the second display 271 toward the driver seat DS. For example, the one or more vibration generating apparatuses 120 disposed at the second display 271 of the infotainment apparatus 270 may be configured to output a sound of about 150 Hz to about 20 kHz.

The display elevation device may be disposed at an inner portion of the third region of the dashboard 230A and may support the second display 271 so as to be raised and lowered. For example, the display elevation device may raise the second display 271 based on the power turn-on of the vehicular apparatus or the manipulation of the vehicle passenger, thereby allowing the second display 271 to protrude to a region on the dashboard 230A. In addition, the display elevation device may lower the second display 271 based on the power turn-off of the vehicular apparatus or the manipulation of the vehicle passenger, thereby allowing the second display 271 to be received or accommodated into the dashboard 230A.

As described above, the vehicular apparatus according to an example embodiment of the present disclosure may output a sound to one or more of the indoor space and the outdoor space through at least one or more of the first sound generating apparatus 250-1 disposed between the main structure and the interior material 230, the second sound generating apparatus 250-2 disposed at the interior material 230 exposed at the indoor space, the third sound generating apparatus 250-3 disposed at the glass window, the fourth sound generating apparatus 250-4 disposed at the garnish member 230M, and the fifth sound generating apparatus 250-5 disposed at the exterior material 220, and thus, may output the sound by one or more of the exterior material 220 and the interior material 330 as a sound vibration plate, thereby outputting a multichannel surround stereo sound. In addition, the vehicular apparatus according to an example embodiment of the present disclosure may output a sound by, as a sound vibration plate, a display panel of at least one or more of the displays 261 and 271 of at least one or more of the instrument panel apparatus 260 and the infotainment apparatus 270, and may output a more realistic multi-channel surround stereo sound through each of the first to fourth sound generating apparatuses 250-1 to 250-4, the instrument panel apparatus 260, and the infotainment apparatus 270.

Figure 64:
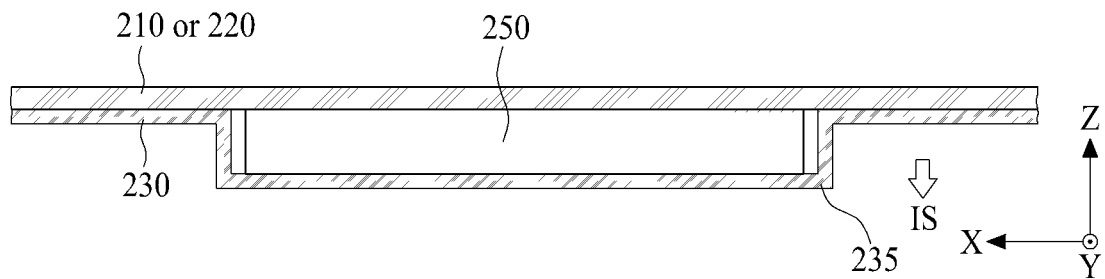
FIG. 64 illustrates a modification example embodiment of an interior material of a vehicular apparatus according to an example embodiment of the present disclosure.

FIG. 64 illustrates a modification embodiment of an interior material of a vehicular apparatus according to an example embodiment of the present disclosure. FIG. 64 illustrates an example embodiment implemented by modifying a structure of the interior material illustrated in FIGS. 58 to 63. In the following description, therefore, their repetitive descriptions of the elements except an interior material and relevant elements may be omitted for brevity.

With reference to FIG. 64, in the vehicular apparatus according to an example embodiment of the present disclosure, an interior material 230 may include an accommodating portion 235 which accommodates one or more vibration generating apparatuses 250A to 250P.

The accommodating portion 235 may protrude from the interior material 230 to an indoor space IS, and thus, may provide an accommodating space between a main structure 210 and an interior material 230 or may provide an accommodating space between an exterior material 220 and the interior material 230. For example, the accommodating portion 235 may be a protrusion portion of the interior material 230 which protrudes to the indoor space IS of the vehicular apparatus.

The one or more vibration generating apparatuses 250A to 250P may be accommodated or received into the accommodating portion 235, and thus, may be surrounded by the accommodating portion 235 or the interior material 230. For example, the one or more vibration generating apparatuses 250A to 250P may be connected to one or more of the main structure 210 and the interior material 230 in the accommodating portion 235, or may be connected to one of the exterior material 220 and the interior material 230. For example, the one or more vibration generating apparatuses 250A to 250P may be connected or coupled to the main structure 210 or the exterior material 220 so as to be spaced apart from a floor surface (or a bottom surface) of the accommodating portion 235. The one or more vibration generating apparatuses 250A to 250P may indirectly or directly vibrate the interior material 230 in the accommodating portion 235 and output a sound to the indoor space IS.

Figure 65:
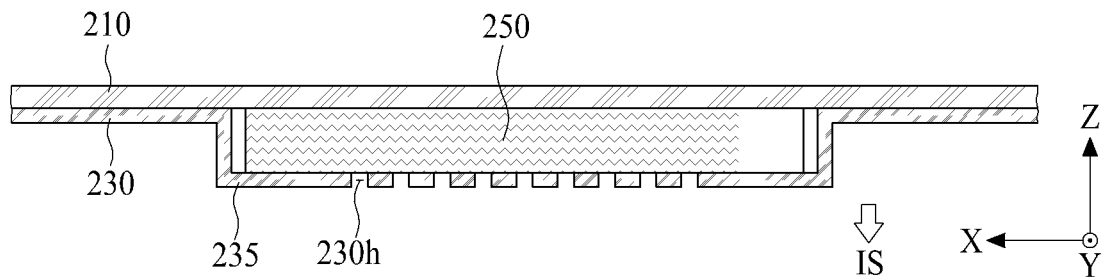
FIG. 65 illustrates another modification embodiment of an interior material of a vehicular apparatus according to an example embodiment of the present disclosure.

FIG. 65 illustrates another modification embodiment of an interior material of a vehicular apparatus according to an example embodiment of the present disclosure. FIG. 65 illustrates an example embodiment where one or more holes are added to the interior material illustrated in FIG. 64. In the following description, therefore, their repetitive descriptions of the elements except an interior material and relevant elements may be omitted for brevity.

With reference to FIG. 65, in the vehicular apparatus according to an example embodiment of the present disclosure, an interior material 230 may include one or more holes 230h which overlap one or more vibration generating apparatuses 250A to 250P.

The one or more holes 230h may be configured to pass through the interior material 230 overlapping the one or more vibration generating apparatuses 250A to 250P in a thickness direction Z of the interior material 230. For example, the one or more holes 230h may be configured to vertically pass through a floor surface (or a bottom surface) of the accommodating portion 235 to overlap the one or more vibration generating apparatuses 250A to 250P. For example, the one or more holes 230h may include a circular shape, an oval shape, or a slit shape, but embodiments of the present disclosure are not limited thereto. The one or more holes 230h may be a path through which a sound generated by a vibration of the one or more vibration generating apparatuses 250A to 250P is output to an indoor space of the vehicular apparatus.

The one or more holes 230h according to an example embodiment of the present disclosure may reduce a space pressure (or an air pressure) between the one or more vibration generating apparatuses 250A to 250P and the interior material 230. For example, the one or more holes 230h may decrease an internal space pressure (or air pressure) of the accommodating portion 235. Therefore, the one or more holes 230h may expand a band of a low-pitched sound band of a sound generated by a vibration of the one or more vibration generating apparatuses 250A to 250P, and thus, a sound characteristic of the low-pitched sound band may be improved.

Figure 66:
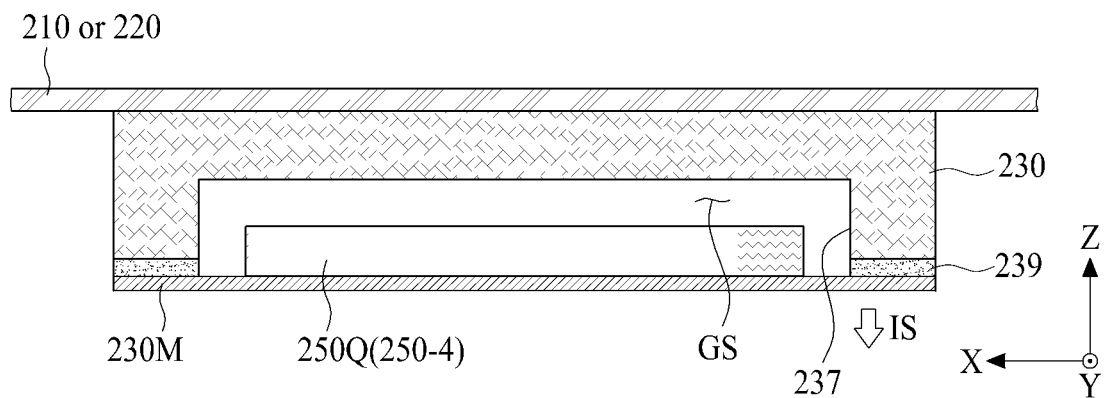
FIG. 66 illustrates an example of the garnish member and the fourth sound generating apparatus illustrated in FIGS. 60 and 61.

FIG. 66 illustrates an example of the garnish member and the fourth sound generating apparatus illustrated in FIGS. 60 and 61.

With reference to FIG. 66, in a vehicular apparatus according to an example embodiment of the present disclosure, an interior material 230 may include a groove portion 237 overlapping a garnish member 230M.

The groove portion 237 may be configured concavely to have a certain depth from a surface of the interior material 230. For example, the groove portion 237 may be configured to have a depth which enables the fourth sound generating apparatus 250-4 to be accommodated thereinto. For example, the groove portion 237 may be configured to have a depth which is greater than a total thickness of the seventeenth vibration generating apparatus 250Q.

The garnish member 230M may be connected or coupled to the interior material 230 to cover the groove portion 237 of the interior material 230 by a coupling member 239.

The fourth sound generating apparatus 250-4 or the seventeenth vibration generating apparatus 250Q may be connected or coupled to a rear surface of the garnish member 230M, or/and may be received or accommodated into the groove portion 237 of the interior material 230.

The seventeenth vibration generating apparatus 250Q coupled to the garnish member 230M may be accommodated into the groove portion 237 of the interior material 230 with a gap space GS therebetween. For example, the gap space GS may be a separation space between a floor surface (or a bottom surface) of the groove portion 237 and the seventeenth vibration generating apparatus 250Q. The gap space GS may enable a vibration of the seventeenth vibration generating apparatus 250Q to be smoothly performed or may increase a vibration displacement amount (or a bending force) of the seventeenth vibration generating apparatus 250Q, and thus, may enhance a sound characteristic and/or a sound pressure level characteristic of a middle-low-pitched sound band generated based on a vibration of the seventeenth vibration generating apparatus 250Q.

The seventeenth vibration generating apparatus 250Q may indirectly or directly vibrate the garnish member 230M and output a sound to an indoor space IS of the vehicular apparatus. For example, the seventeenth vibration generating apparatus 250Q may output a sound of a high-pitched sound band, but embodiments of the present disclosure are not limited thereto.

In one or more aspects, a sound generating apparatus may be sometimes referred to as a sound generating device, and a vibration generating apparatus may be sometimes referred to as a vibration generating device. With reference to FIGS. 58 to 63, each of the sound generating apparatuses and the vibration generating apparatuses (e.g., each of 250, 250-1 through 250-5, and 250A through 250T) may include one or more of the vibration apparatuses 10-1 to 10-7 described above with reference to FIGS. 1 to 42. The sound generating apparatuses and the vibration generating apparatuses (e.g., some or all of 250, 250-1 through 250-5, and 250A through 250T) may include the same or different vibration apparatuses. One or more of the sound generating apparatuses (e.g., some or all of 250-1 through 250-5) may differ from one another. One or more of the vibration generating apparatuses (e.g., some or all of 250 and 250A through 250T) may differ from one another.

A vibration apparatus and apparatus comprising the same according to an example embodiment of the present disclosure may be applied to all electronic devices. The vibration apparatus and apparatus comprising the same according to an example embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, sliding apparatuses, variable apparatuses, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, and home appliances, or the like. In addition, the vibration apparatus according to some example embodiments of the present disclosure may be applied to organic light-emitting lighting apparatuses or inorganic light-emitting lighting apparatuses. When the vibration apparatus of an example embodiment of the present disclosure is applied to lighting apparatuses, the vibration apparatus may act as a lighting device and a speaker. In addition, when the vibration apparatus according to some example embodiments of the present disclosure is applied to a mobile device, or the like, the vibration apparatus may be one or more of a speaker, a receiver, and a haptic device, but embodiments of the present disclosure are not limited thereto.

A vibration apparatus, an apparatus including the same, and a vehicular apparatus including the vibration apparatus according to an example embodiment of the present disclosure will be described below.

A vibration apparatus according to an example embodiments of the present disclosure may include a vibration device, and an adhesive member at a rear surface of the vibration device, a modulus of the vibration device may be equal to a modulus of the adhesive member or may be greater than the modulus of the adhesive member.

According to some example embodiments of the present disclosure, the vibration apparatus may further include a reinforcing member between the vibration device and the adhesive member, and an intermediate adhesive member between the vibration device and the reinforcing member.

According to some example embodiments of the present disclosure, the modulus of the vibration device may be greater than a modulus of the reinforcing member and may be greater than or equal to a modulus of each of the adhesive member and the intermediate adhesive member.

According to some example embodiments of the present disclosure, the reinforcing member may include one or more materials of a plastic, a fiber, a leather, wood, a cloth, and a paper.

According to some example embodiments of the present disclosure, an area of the vibration device may be greater than an area of the reinforcing member.

According to some example embodiments of the present disclosure, the reinforcing member may include one or more holes, and the intermediate adhesive member and the adhesive member may be connected to each other in the one or more holes.

According to some example embodiments of the present disclosure, the reinforcing member may be surrounded by the intermediate adhesive member and the adhesive member.

According to some example embodiments of the present disclosure, the vibration apparatus may further include a vibration plate at a rear surface of the adhesive member, and a supporting member connected to a rear periphery portion of the vibration plate.

According to some example embodiments of the present disclosure, the supporting member may include a first supporting portion connected to the rear periphery portion of the vibration plate, a second supporting portion parallel to the first supporting portion, and a third supporting portion connected between the first supporting portion and the second supporting portion.

According to some example embodiments of the present disclosure, the third supporting portion may be perpendicular to both of the first supporting portion and the second supporting portion, and the first supporting portion does not overlap the second supporting portion.

According to some example embodiments of the present disclosure, the vibration apparatus may further include a housing including an inner space, the vibration device, the vibration plate, and the supporting member may be accommodated into the inner space of the housing, and the supporting member may be connected to an inner surface of the housing.

According to some example embodiments of the present disclosure, the housing may include a first housing member disposed spaced apart from the vibration plate and facing the vibration plate, a second housing member disposed spaced apart from the vibration device and facing the vibration device, and one or more holes configured at the first housing member and overlapping the vibration plate.

According to some example embodiments of the present disclosure, the supporting member may be connected to one or more of the first housing member and the second housing member.

According to some example embodiments of the present disclosure, the vibration apparatus may further include a connection member connected between the second housing member and the vibration plate, the supporting member may be connected to the first housing member.

According to some example embodiments of the present disclosure, the vibration apparatus may further include a connection member between the vibration plate and the supporting member, the connection member may include a first connection member and a second connection member disposed outward from the first connection member, and the first connection member may have a hardness lower than or higher than that of the second connection member.

According to some example embodiments of the present disclosure, the vibration apparatus may further include one or more pads protruding toward the vibration device from the connection member.

According to some example embodiments of the present disclosure, the vibration apparatus may further include a coupling member coupled to a rear surface of the supporting member and configured to couple the supporting member or the vibration apparatus to a vibration member.

According to some example embodiments of the present disclosure, the supporting member may comprise a first supporting portion connected to the rear periphery portion of the vibration plate, a second supporting portion parallel to the first supporting portion and disposed under the first supporting portion, and a vibration blocking portion protruding convexly between the first supporting portion and the second supporting portion to surround lateral surfaces of the vibration device.

According to some example embodiments of the present disclosure, the vibration blocking portion may protrude to an upper portion with respect to a front surface opposite to the rear surface of the vibration device.

According to some example embodiments of the present disclosure, the vibration apparatus may further include a vibration plate at a rear surface of the adhesive member, and an enclosure connected to the vibration plate and surrounding the vibration device.

According to some example embodiments of the present disclosure, the vibration apparatus may further include a connection member connected between the enclosure and the vibration plate.

According to some example embodiments of the present disclosure, the vibration apparatus may further include a vibration plate at a rear surface of the adhesive member, the vibration plate may include a plurality of regions having different stiffnesses, and the vibration device may overlap one or more of the plurality of regions.

According to some example embodiments of the present disclosure, the plurality of regions may include different materials.

According to some example embodiments of the present disclosure, the plurality of regions may include different materials of a metal, a plastic, a fiber, a leather, wood, a cloth, and a paper.

According to some example embodiments of the present disclosure, the vibration apparatus may further include an enclosure connected to the vibration plate and surrounding the vibration device.

According to some example embodiments of the present disclosure, the vibration apparatus may further include a connection member connected between the enclosure and the vibration plate.

According to some example embodiments of the present disclosure, the vibration apparatus may further include a vibration plate at a rear surface of the adhesive member, the vibration plate may include a first plate including a first region and a second region, and one or more second plates at the first region of the first plate, and the vibration device may overlap the one or more second plates.

According to some example embodiments of the present disclosure, the first plate may include one or more holes at the first region, and the one or more second plates may overlap the first plate to cover the one or more holes.

According to some example embodiments of the present disclosure, the vibration apparatus may further include a vibration plate at a rear surface of the adhesive member, the vibration plate may include a flat portion connected to the vibration device, and a flexural portion configured at a peripheral region of the flat portion.

According to some example embodiments of the present disclosure, the vibration apparatus may further include a vibration plate at a rear surface of the adhesive member, the vibration plate may comprise a first region where the vibration device is disposed and a second region surrounding the first region, and the second region may have a stiffness lower than that of the first region.

According to some example embodiments of the present disclosure, the vibration apparatus may further include a signal cable electrically connected to the vibration device, and a sound processing circuit mounted on the signal cable.

According to some example embodiments of the present disclosure, the vibration device may include a piezoelectric vibration portion including a plurality of piezoelectric portions and a ductile portion connected between the plurality of piezoelectric portions, a first electrode portion at a first surface of the piezoelectric vibration portion, and a second electrode portion at a second surface different from the first surface of the piezoelectric vibration portion.

According to some example embodiments of the present disclosure, the vibration apparatus may further include a signal cable electrically connected between the first electrode portion and the second electrode portion, and a sound processing circuit mounted on the signal cable.

According to some example embodiments of the present disclosure, the vibration device may further include a first cover member covering the first electrode portion, and a second cover member covering the second electrode portion, and the signal cable may include a first protrusion line disposed between the first cover member and the first electrode portion and electrically connected to the first electrode portion, and a second protrusion line disposed between the second cover member and the second electrode portion and electrically connected to the second electrode portion.

According to some example embodiments of the present disclosure, the vibration device may include two or more vibration generating portions separated from each other on the same plane, and each of the two or more vibration generating portions may include a piezoelectric vibration portion including a plurality of piezoelectric portions and a ductile portion connected between the plurality of piezoelectric portions, a first electrode portion at a first surface of the piezoelectric vibration portion, and a second electrode portion at a second surface different from the first surface of the piezoelectric vibration portion.

According to some example embodiments of the present disclosure, an interval between the two or more vibration generating portions may be 0.1 mm or more and smaller than 3 cm.

According to some example embodiments of the present disclosure, the two or more vibration generating portions may be driven as a single-body without being independently driven.

According to some example embodiments of the present disclosure, the vibration apparatus may further include one or more signal cables electrically connected to each of the first electrode portion and the second electrode portion of each of the two or more vibration generating portions, and a sound processing circuit mounted at the one or more signal cables.

According to some example embodiments of the present disclosure, the vibration device may include a first cover member at the first electrode portion of each of the two or more vibration generating portions, and a second cover member at the second electrode portion of each of the two or more vibration generating portions, and the one or more signal cables may include one or more first protrusion lines disposed between the first cover member and the first electrode portion of each of the two or more vibration generating portions and electrically connected to the first electrode portion, and one or more second protrusion lines disposed between the second cover member and the second electrode portion of each of the two or more vibration generating portions and electrically connected to the second electrode portion.

According to some example embodiments of the present disclosure, a portion of the one or more signal cables may be inserted between the first cover member and the second cover member.

An apparatus according to some example embodiments of the present disclosure may include a vibration member, and one or more vibration generating apparatuses connected to the vibration member, the one or more vibration generating apparatuses may include the vibration apparatus, the vibration apparatus may include a vibration device, and an adhesive member at a rear surface of the vibration device, a modulus of the vibration device may be equal to a modulus of the adhesive member or may be greater than a modulus of the adhesive member.

According to some example embodiments of the present disclosure, the vibration member may output a sound based on vibrations of the one or more vibration generating apparatuses, and the vibration member may include one or more materials of a metal, a plastic, a fiber, a leather, wood, a cloth, a paper, a rubber, and a glass.

According to some example embodiments of the present disclosure, the vibration member may include any one of a display panel including a pixel configured to display an image, a screen panel on which an image is to be projected from a display apparatus, a light emitting diode lighting panel, a signage panel, a vehicular interior material, a vehicular exterior material, a vehicular glass window, a mirror, a building ceiling material, a building interior material, a building exterior material, a building glass window, an aircraft interior material, and an aircraft glass window.

According to some example embodiments of the present disclosure, the vibration device may be configured to be bent in a shape based on a surface shape of the vibration member.

According to some example embodiments of the present disclosure, the vibration member may comprise a display panel, and the one or more vibration generating apparatuses may comprise the vibration apparatus, and the second supporting portion may be constituted by a rear structure disposed at a rear surface of the display panel.

A vehicular apparatus according to some example embodiments of the present disclosure may include an exterior material covering a main structure, an interior material covering one or more of the main structure and the exterior material, a garnish member covering a portion of the interior material, and one or more sound generating apparatuses between the main structure and the exterior material and interior material or between the garnish member and the interior material, the one or more sound generating apparatuses comprise the vibration apparatus, the vibration apparatus may include a vibration device, and an adhesive member at a rear surface of the vibration device, a modulus of the vibration device may be equal to a modulus of the adhesive member or may be greater than a modulus of the adhesive member, one or more of the interior material, the exterior material, and the garnish member may output sound based on vibrations of the one or more sound generating apparatuses.

According to some embodiments of the present disclosure, one or more of the interior material and the garnish member may include one or more materials of a metal, a plastic, a fiber, a leather, wood, a cloth, a paper, a rubber, and a glass.

According to some example embodiments of the present disclosure, the interior material may include one or more of a dashboard, a pillar interior material, a roof interior material, a door interior material, a seat interior material, a handle interior material, a floor interior material, a rear package interior material, a rear view mirror, an overhead console, a glove box, and a sun visor; and the one or more sound generating apparatuses may be configured to vibrate at least one or more of the dashboard, the pillar interior material, the roof interior material, the door interior material, the seat interior material, the handle interior material, the floor interior material, the rear package interior material, the rear view mirror, the overhead console, the glove box, and the sun visor.

According to some example embodiments of the present disclosure, the vehicular apparatus may further include a glass window, and a transparent sound generating device disposed at the glass window.

According to some example embodiments of the present disclosure, the glass window may include at least one or more of a front glass window, a side glass window, a rear glass window, and a roof glass window, and the transparent sound generating device may be configured to vibrate at least one or more of the front glass window, the side glass window, the rear glass window, and the roof glass window.

According to some example embodiments of the present disclosure, the interior material may include a groove portion formed concavely from a surface of the interior material facing the garnish member, and the groove portion may accommodate the one or more sound generating apparatuses connected to the garnish member.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. A vibration apparatus, comprising:
    a vibration device;
    an adhesive member at a rear surface of the vibration device;
    a reinforcing member between the vibration device and the adhesive member; and
    an intermediate adhesive member between the vibration device and the reinforcing member,
    wherein:
    a modulus of the vibration device is equal to a modulus of the adhesive member or is greater than the modulus of the adhesive member;
    the reinforcing member comprises one or more holes; and
    the intermediate adhesive member and the adhesive member are connected to each other in the one or more holes.

2. The vibration apparatus of claim 1, wherein the modulus of the vibration device is greater than a modulus of the reinforcing member and is greater than or equal to a modulus of the intermediate adhesive member.

3. The vibration apparatus of claim 1, wherein the reinforcing member comprises one or more materials of a plastic, a fiber, a leather, wood, a cloth, and a paper.

4. The vibration apparatus of claim 1, wherein an area of the vibration device is greater than an area of the reinforcing member.

5. The vibration apparatus of claim 1, further comprising:
a vibration plate at a rear surface of the adhesive member; and
a supporting member connected to a rear periphery portion of the vibration plate.

6. The vibration apparatus of claim 5, wherein the supporting member comprises:
a first supporting portion connected to the rear periphery portion of the vibration plate;
a second supporting portion parallel to the first supporting portion; and
a third supporting portion connected between the first supporting portion and the second supporting portion.

7. The vibration apparatus of claim 5, further comprising a housing including an inner space,
wherein the vibration device, the vibration plate, and the supporting member are accommodated into the inner space of the housing, and
wherein the supporting member is connected to an inner surface of the housing.

8. The vibration apparatus of claim 7, wherein the housing comprises:
a first housing member disposed spaced apart from the vibration plate and facing the vibration plate;
a second housing member disposed spaced apart from the vibration device and facing the vibration device; and
one or more holes configured at the first housing member and overlapping the vibration plate.

9. The vibration apparatus of claim 8, wherein the supporting member is connected to one or more of the first housing member and the second housing member.

10. The vibration apparatus of claim 8, further comprising a connection member connected between the second housing member and the vibration plate,
wherein the supporting member is connected to the first housing member.

11. The vibration apparatus of claim 1, further comprising:
a vibration plate at a rear surface of the adhesive member; and
an enclosure connected to the vibration plate and surrounding the vibration device.

12. The vibration apparatus of claim 11, further comprising a connection member connected between the enclosure and the vibration plate.

13. The vibration apparatus of claim 1, further comprising a vibration plate at a rear surface of the adhesive member,
wherein the vibration plate comprises a plurality of regions having different stiffnesses, and
wherein the vibration device overlaps one or more of the plurality of regions.

14. The vibration apparatus of claim 13, wherein the plurality of regions comprise different materials.

15. The vibration apparatus of claim 13, wherein the plurality of regions comprise different materials of a metal, a plastic, a fiber, a leather, wood, a cloth, and a paper.

16. The vibration apparatus of claim 13, further comprising an enclosure connected to the vibration plate and surrounding the vibration device.

17. The vibration apparatus of claim 16, further comprising a connection member connected between the enclosure and the vibration plate.

18. The vibration apparatus of claim 1, further comprising a vibration plate at a rear surface of the adhesive member,
wherein the vibration plate comprises:
a first plate including a first region and a second region; and
one or more second plates at the first region of the first plate, and
wherein the vibration device overlaps the one or more second plates.

19. The vibration apparatus of claim 18, wherein:
the first plate comprises one or more holes at the first region, and
the one or more second plates overlap the first plate to cover the one or more holes of the first plate.

20. The vibration apparatus of claim 1, further comprising a vibration plate at a rear surface of the adhesive member,
wherein the vibration plate comprises:
a flat portion connected to the vibration device; and
a flexural portion configured at a peripheral region of the flat portion.

21. The vibration apparatus of claim 1, further comprising:
a signal cable electrically connected to the vibration device; and
a sound processing circuit mounted on the signal cable.

22. The vibration apparatus of claim 1, wherein the vibration device comprises:
a piezoelectric vibration portion including a plurality of piezoelectric portions and a ductile portion connected between the plurality of piezoelectric portions;
a first electrode portion at a first surface of the piezoelectric vibration portion; and
a second electrode portion at a second surface different from the first surface of the piezoelectric vibration portion.

23. The vibration apparatus of claim 22, further comprising:
a signal cable electrically connected between the first electrode portion and the second electrode portion; and
a sound processing circuit mounted on the signal cable.

24. The vibration apparatus of claim 23,
wherein the vibration device further comprises:
a first cover member covering the first electrode portion; and
a second cover member covering the second electrode portion, and
wherein the signal cable comprises:
a first protrusion line disposed between the first cover member and the first electrode portion and electrically connected to the first electrode portion; and
a second protrusion line disposed between the second cover member and the second electrode portion and electrically connected to the second electrode portion.

25. The vibration apparatus of claim 1,
wherein the vibration device comprises two or more vibration generating portions separated from each other on the same plane, and
wherein each of the two or more vibration generating portions comprises:
a piezoelectric vibration portion including a plurality of piezoelectric portions and a ductile portion connected between the plurality of piezoelectric portions;
a first electrode portion at a first surface of the piezoelectric vibration portion; and
a second electrode portion at a second surface different from the first surface of the piezoelectric vibration portion.

26. The vibration apparatus of claim 25, wherein an interval between the two or more vibration generating portions is 0.1 mm or more and smaller than 3 cm.

27. The vibration apparatus of claim 25, further comprising:

one or more signal cables electrically connected to each of the first electrode portion and the second electrode portion of each of the two or more vibration generating portions; and
a sound processing circuit mounted at the one or more signal cables.

28. The vibration apparatus of claim 27,
wherein the vibration device comprises:
a first cover member at the first electrode portion of each of the two or more vibration generating portions; and
a second cover member at the second electrode portion of each of the two or more vibration generating portions, and
wherein the one or more signal cables comprise:
one or more first protrusion lines disposed between the first cover member and the first electrode portion of each of the two or more vibration generating portions and electrically connected to the first electrode portion; and
one or more second protrusion lines disposed between the second cover member and the second electrode portion of each of the two or more vibration generating portions and electrically connected to the second electrode portion.

29. The vibration apparatus of claim 28, wherein a portion of the one or more signal cables is inserted between the first cover member and the second cover member.

30. An apparatus, comprising:
a vibration member; and
one or more vibration generating apparatuses connected to the vibration member,
wherein the one or more vibration generating apparatuses comprise the vibration apparatus of claim 1.

31. The apparatus of claim 30, wherein the vibration member is configured to output a sound based on vibrations of the one or more vibration generating apparatuses, and
wherein the vibration member comprises one or more materials of a metal, a plastic, a fiber, a leather, wood, a cloth, a paper, a rubber, and a glass.

32. The apparatus of claim 30, wherein the vibration member comprises any one of a display panel including a pixel configured to display an image, a screen panel on which an image is to be projected from a display apparatus, a light emitting diode lighting panel, a signage panel, a vehicular interior material, a vehicular exterior material, a vehicular glass window, a mirror, a building ceiling material, a building interior material, a building exterior material, a building glass window, an aircraft interior material, and an aircraft glass window.

33. A vehicular apparatus, comprising:
an exterior material covering a main structure;
an interior material covering one or more of the main structure and the exterior material;
a garnish member covering a portion of the interior material; and
one or more sound generating apparatuses between at least two of the main structure, the exterior material, and interior material or between the garnish member and the interior material,
wherein the one or more sound generating apparatuses comprise the vibration apparatus of claim 1, and
wherein one or more of the interior material, the exterior material, and the garnish member are configured to output sound based on vibrations of the one or more sound generating apparatuses.

34. The vehicular apparatus of claim 33, wherein one or more of the interior material and the garnish member comprises one or more materials of a metal, a plastic, a fiber, a leather, wood, a cloth, a paper, a rubber, and a glass.

35. The vehicular apparatus of claim 33, wherein:
the interior material comprises one or more of a dashboard, a pillar interior material, a roof interior material, a door interior material, a seat interior material, a handle interior material, a floor interior material, a rear package interior material, a rear view mirror, an overhead console, a glove box, and a sun visor; and
the one or more sound generating apparatuses are configured to vibrate at least one or more of the dashboard, the pillar interior material, the roof interior material, the door interior material, the seat interior material, the handle interior material, the floor interior material, the rear package interior material, the rear view mirror, the overhead console, the glove box, and the sun visor.

36. The vehicular apparatus of claim 33, further comprising:
a glass window; and
a transparent sound generating device disposed at the glass window.

37. The vehicular apparatus of claim 36, wherein:
the glass window comprises at least one or more of a front glass window, a side glass window, a rear glass window, and a roof glass window, and
the transparent sound generating device is configured to vibrate at least one or more of the front glass window, the side glass window, the rear glass window, and the roof glass window.

38. The vehicular apparatus of claim 33, wherein:
the interior material comprises a groove portion formed concavely from a surface of the interior material facing the garnish member, and
the groove portion accommodates the one or more sound generating apparatuses connected to the garnish member.

39. The vibration apparatus of claim 1,
wherein the one or more holes of the reinforcing member is at a center portion of the vibration device, and
wherein:
the reinforcing member has a size which is smaller than a size of the vibration device; or
the reinforcing member is connected to a periphery portion of the vibration device.

40. The vibration apparatus of claim 1, wherein the intermediate adhesive member includes a same material as the adhesive member.

41. The vibration apparatus of claim 1, wherein:
the reinforcing member has an outer surface exposed to an outside of a lateral surface of the vibration device; and
surfaces other than the outer surface of the reinforcing member are surrounded by the intermediate adhesive member and the adhesive member.

* * * * *